US006790763B2

(12) United States Patent
Kondo et al.

(10) Patent No.: US 6,790,763 B2
(45) Date of Patent: Sep. 14, 2004

(54) SUBSTRATE PROCESSING METHOD

(75) Inventors: Fumio Kondo, Tokyo (JP); Koji Mishima, Tokyo (JP); Akira Tanaka, Tokyo (JP); Yoko Suzuki, Tokyo (JP); Tetsuji Togawa, Tokyo (JP); Hiroaki Inoue, Tokyo (JP)

(73) Assignee: Ebara Corporation, Tokyo (JP)

( * ) Notice: Subject to any disclaimer, the term of this patent is extended or adjusted under 35 U.S.C. 154(b) by 79 days.

(21) Appl. No.: 10/182,835

(22) PCT Filed: Dec. 4, 2001

(86) PCT No.: PCT/JP01/10590

§ 371 (c)(1),
(2), (4) Date: Oct. 11, 2002

(87) PCT Pub. No.: WO02/47139

PCT Pub. Date: Jun. 13, 2002

(65) Prior Publication Data

US 2003/0092261 A1 May 15, 2003

(30) Foreign Application Priority Data

Dec. 4, 2000 (JP) ........................................ 2000-403889

(51) Int. Cl.[7] .......................................... H01L 21/4763

(52) U.S. Cl. ...................................................... 438/622

(58) Field of Search ................................ 438/622, 643, 438/687, 618; 205/82, 84, 148; 204/230.1, 230.7, 193

(56) References Cited

U.S. PATENT DOCUMENTS

| 4,724,874 | A | 2/1988 | Parikh et al. |
| 6,074,544 | A | 6/2000 | Reid et al. |
| 6,136,163 | A | 10/2000 | Cheung et al. |
| 6,162,344 | A | 12/2000 | Reid et al. |
| 6,179,983 | B1 | 1/2001 | Reid et al. |
| 6,251,236 | B1 | 6/2001 | Stevens |
| 6,258,220 | B1 | 7/2001 | Dordi et al. |
| 6,294,059 | B1 | 9/2001 | Hongo et al. |
| 6,352,467 | B1 | 3/2002 | Somekh et al. |

FOREIGN PATENT DOCUMENTS

| EP | 0 903 774 | 3/1999 |
| WO | 00/51782 | 9/2000 |
| WO | 00/61498 | 10/2000 |

*Primary Examiner*—Evan Pert
*Assistant Examiner*—Monica D. Harrison
(74) *Attorney, Agent, or Firm*—Wenderoth, Lind & Ponack, L.L.P.

(57) ABSTRACT

A substrate processing method comprising steps for forming a copper film on a surface of a substrate. These steps includes the step of filling a first metal in the trenches so as to form a plated film of the first metal on an entire surface of the substrate by electroplating, wherein the electromagnetic field is adjusted by the virtual anode so that differences of thickness of the plated film between the central portion and the peripheral portion of the substrate being minimized, and polishing and removing the plated film by pressing the substrate to the polishing surface, wherein the pressures pressing the substrate to the polishing surface at a central portion and a peripheral portion are adjusted.

39 Claims, 89 Drawing Sheets

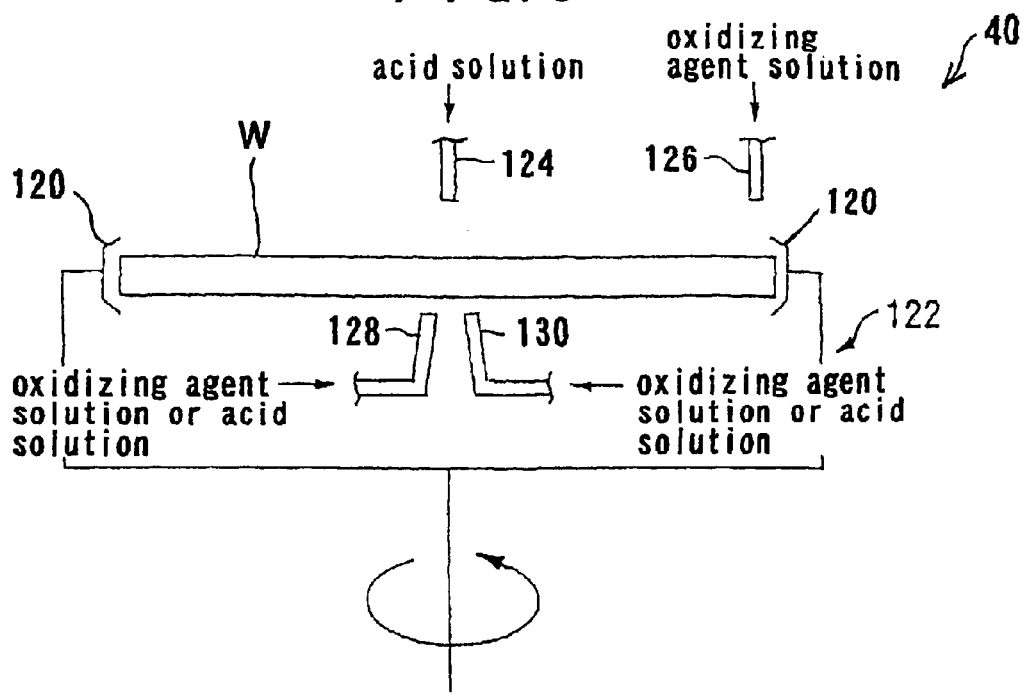
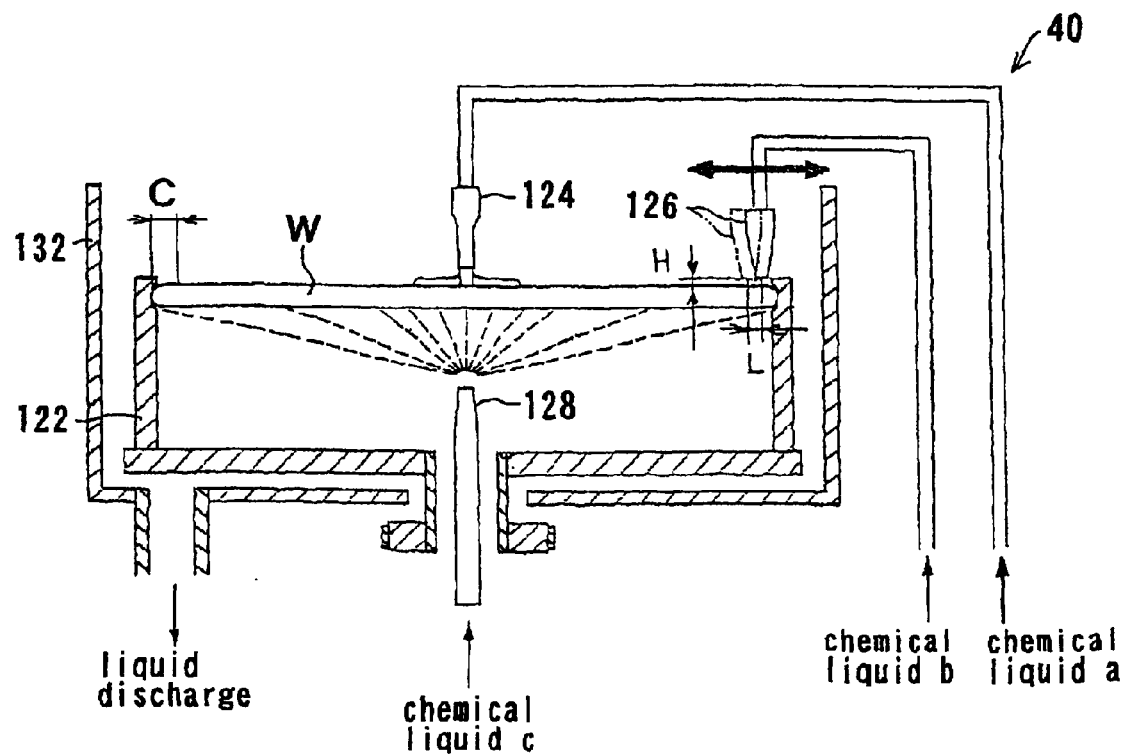

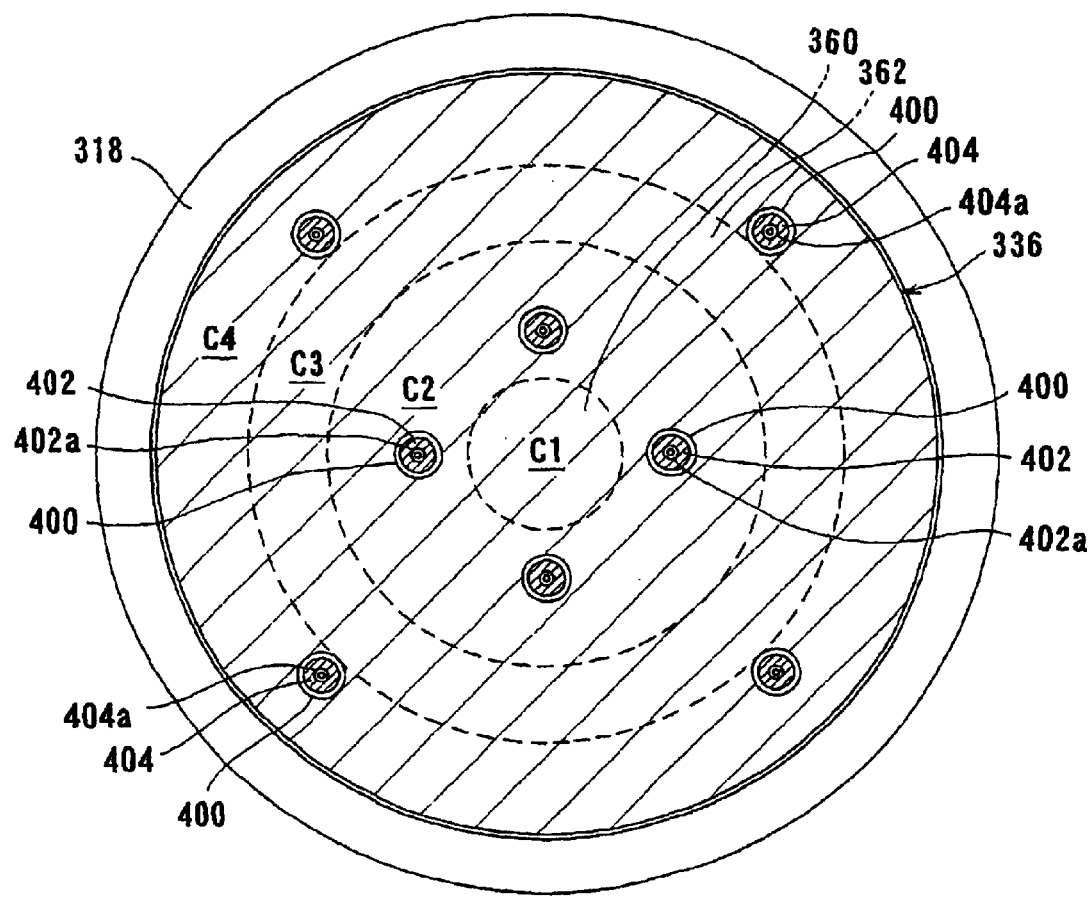
F I G. 11

F I G. 1 3
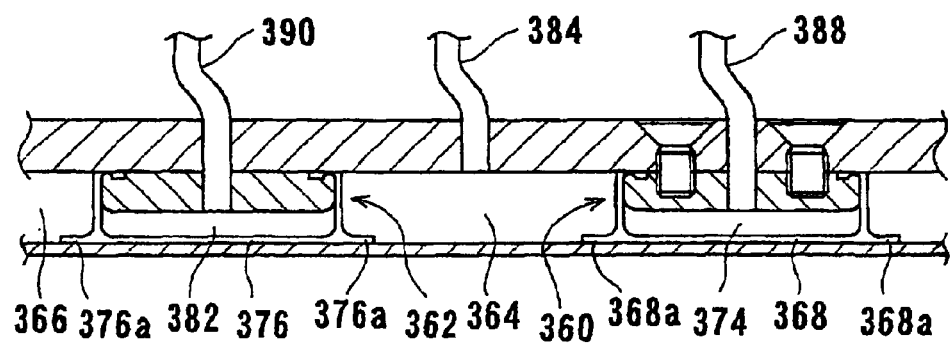

F I G. 1 8
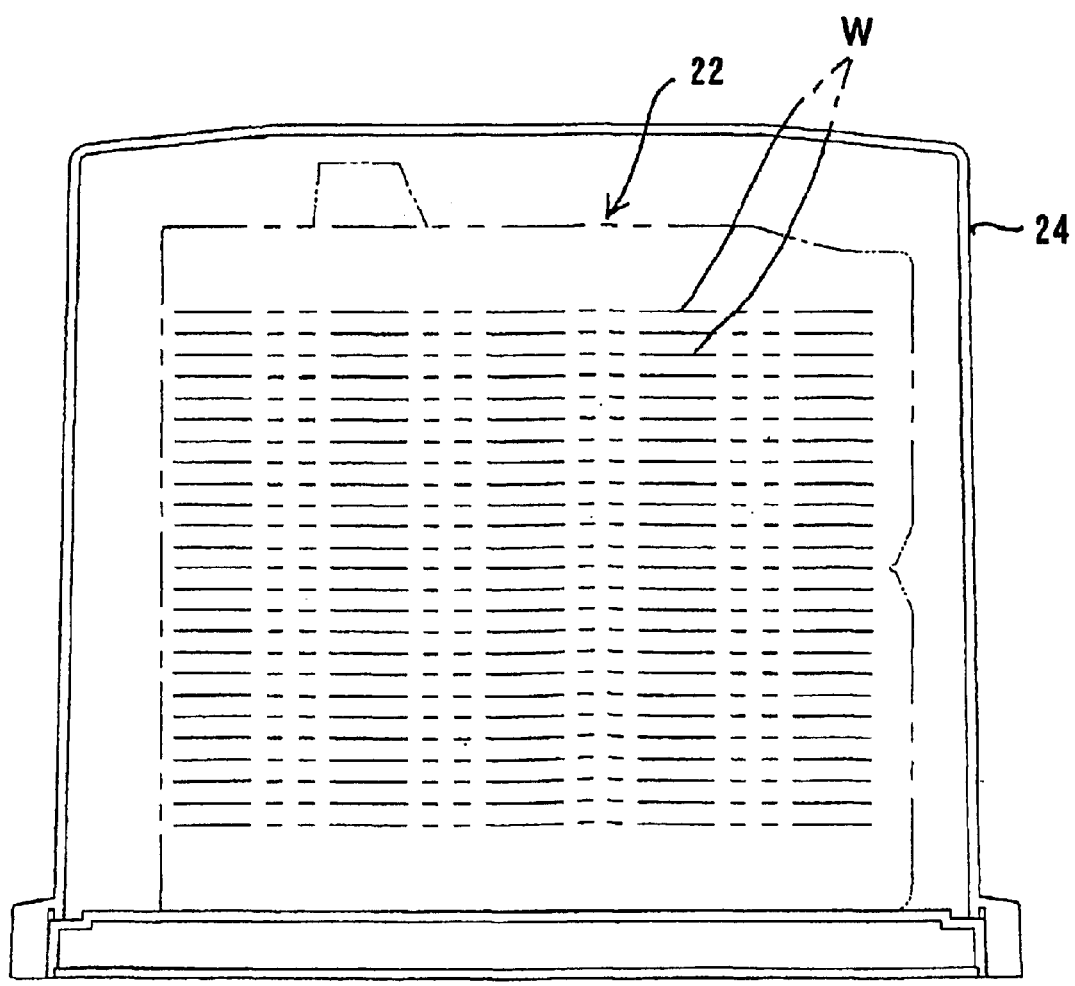

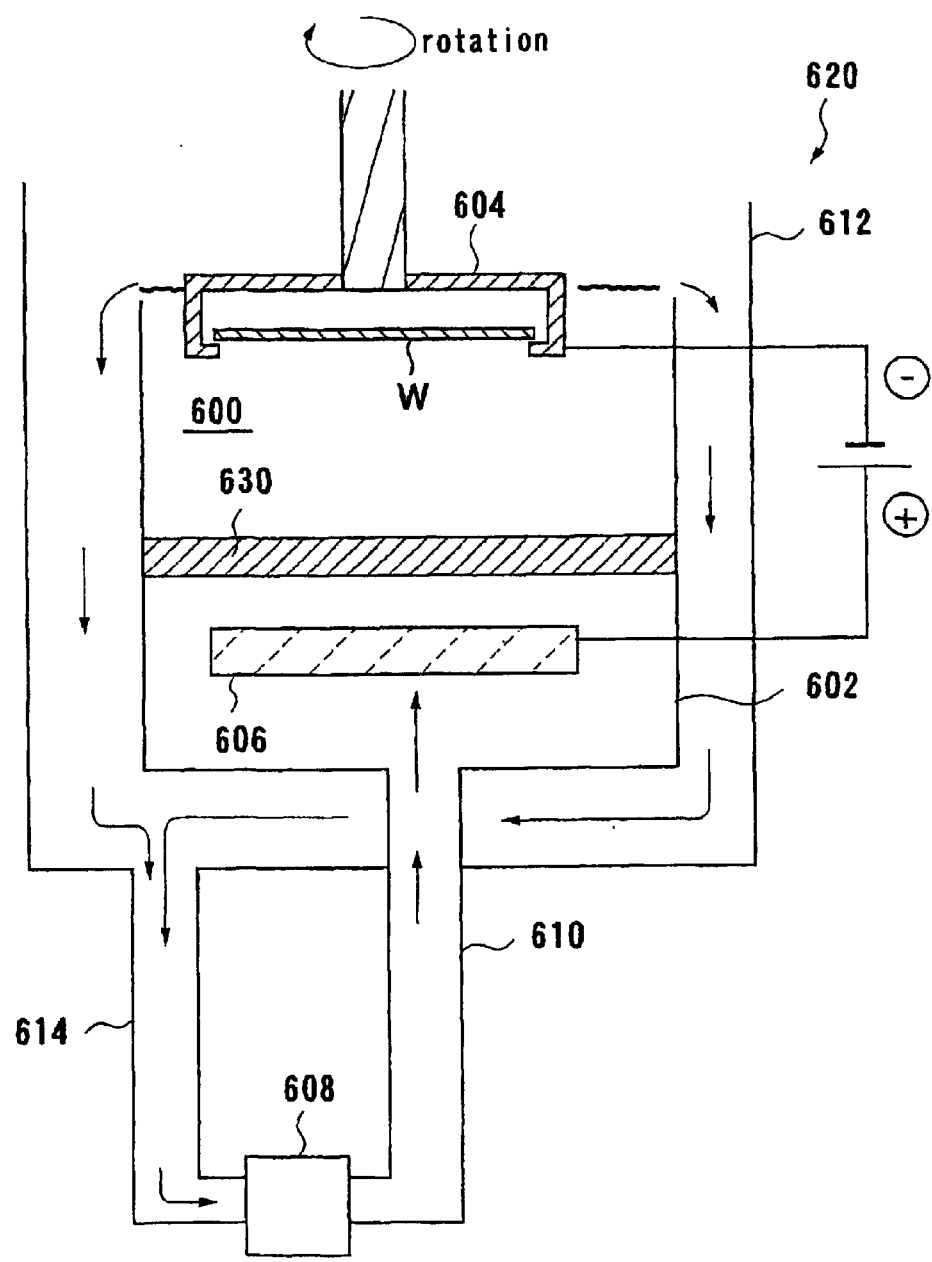
F I G. 2 8

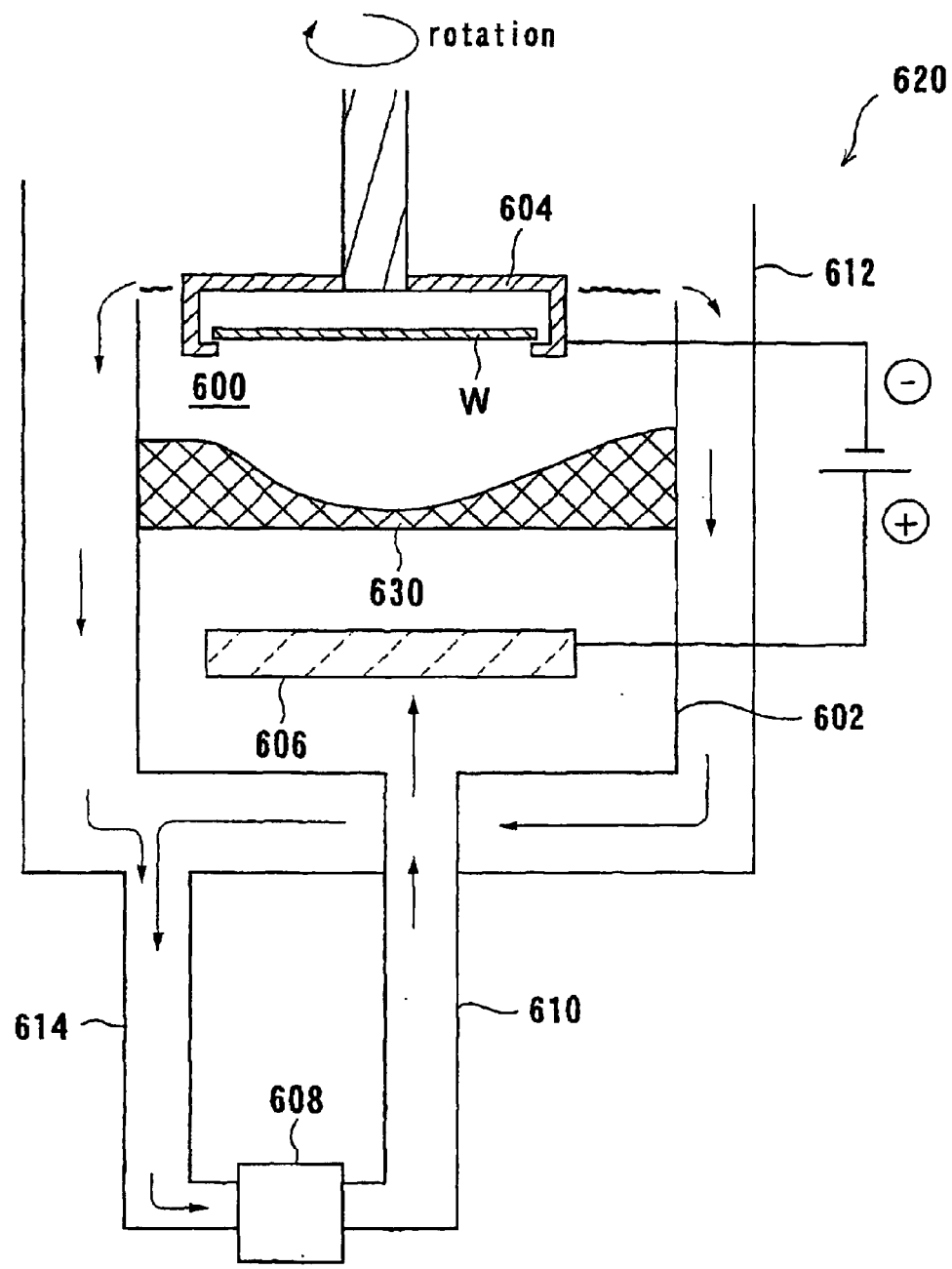
F I G. 34

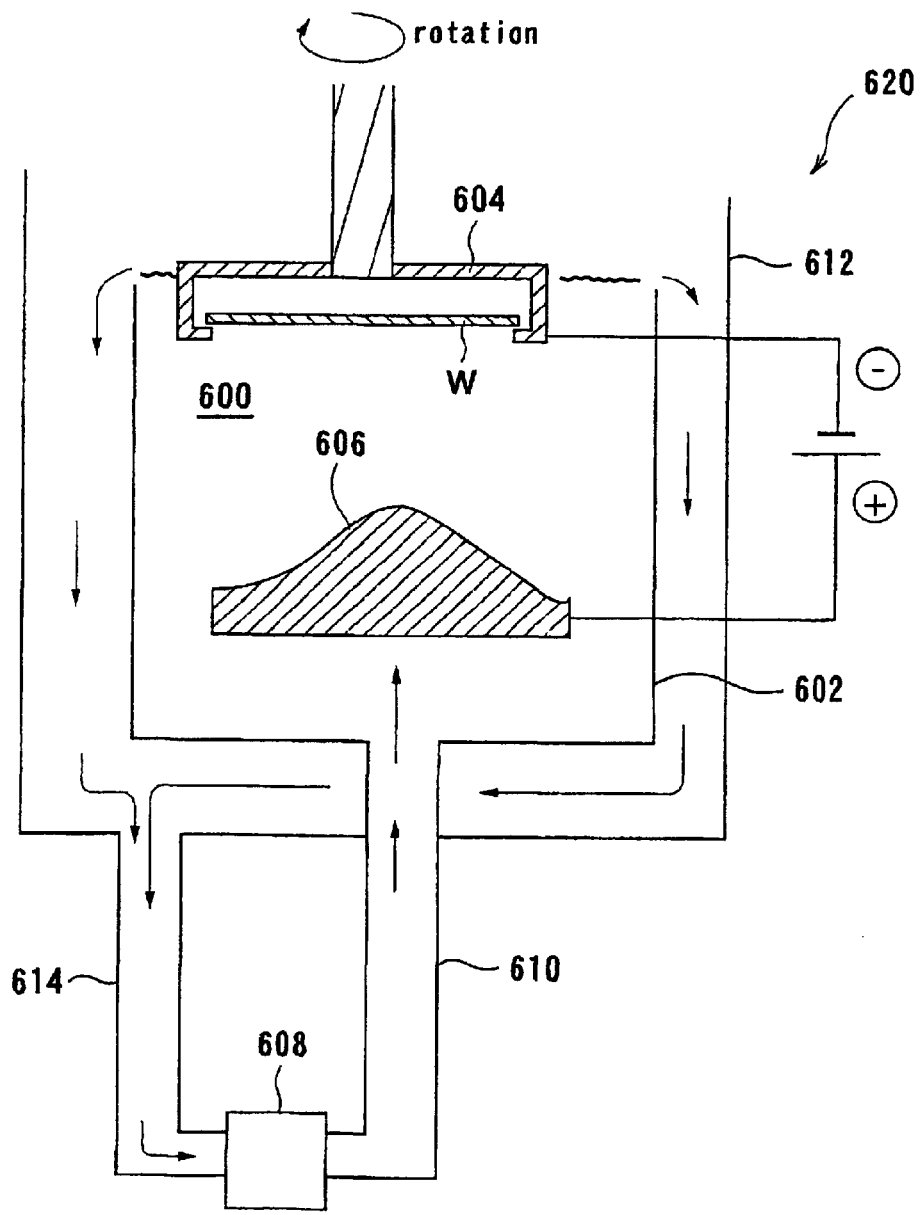
F I G. 36

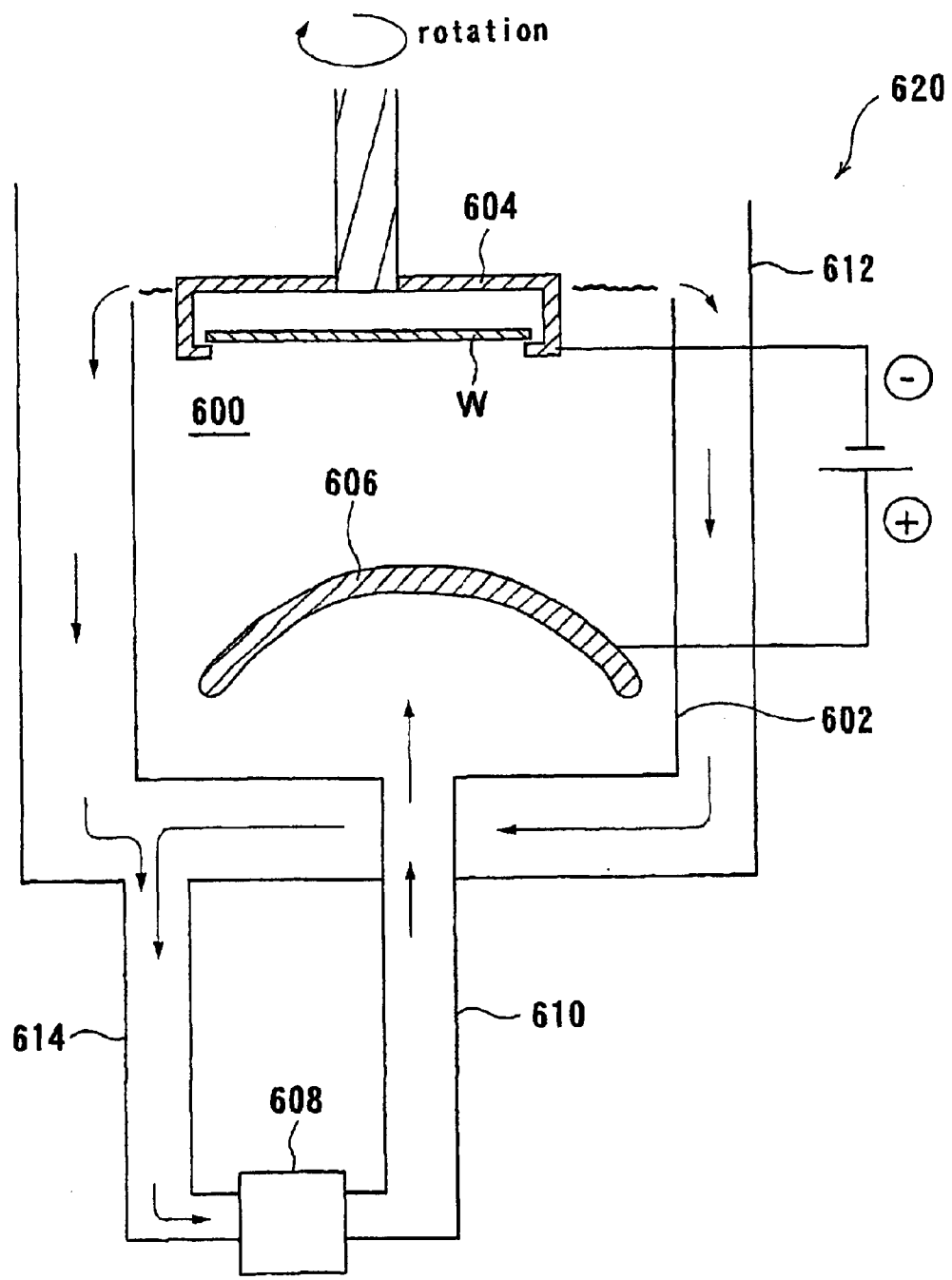
F I G. 37

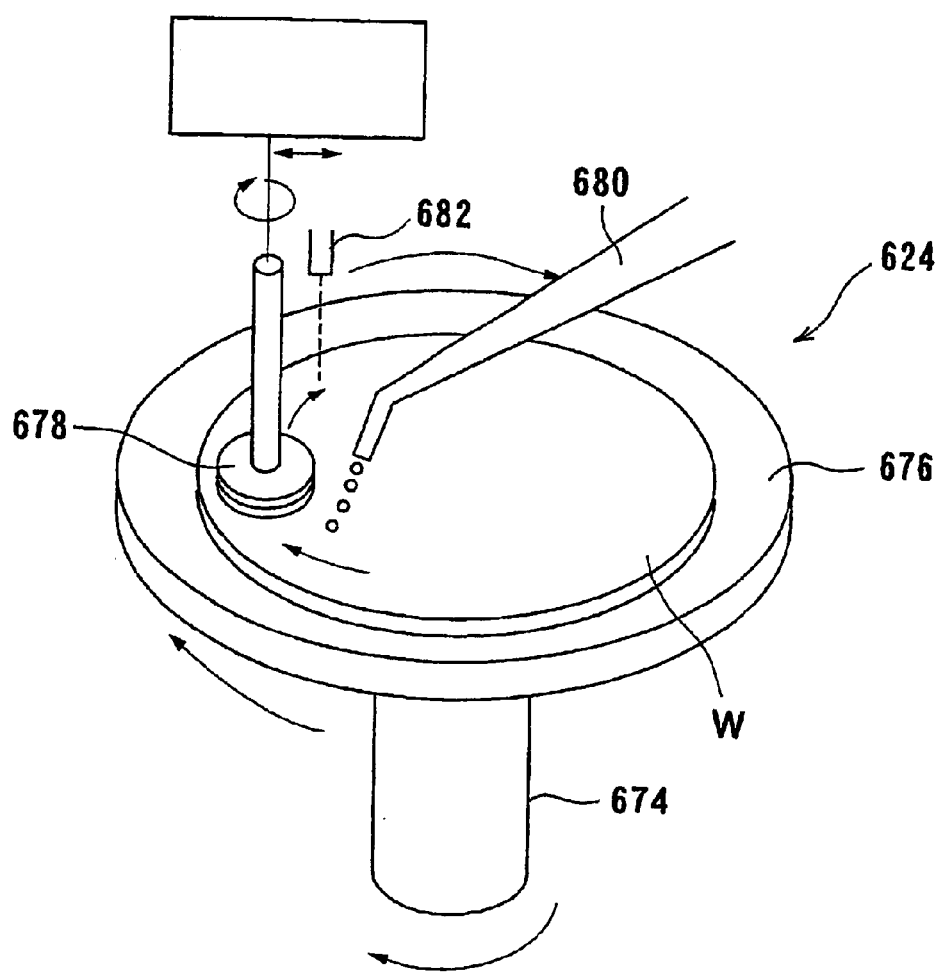
F I G. 44

F I G. 5 0
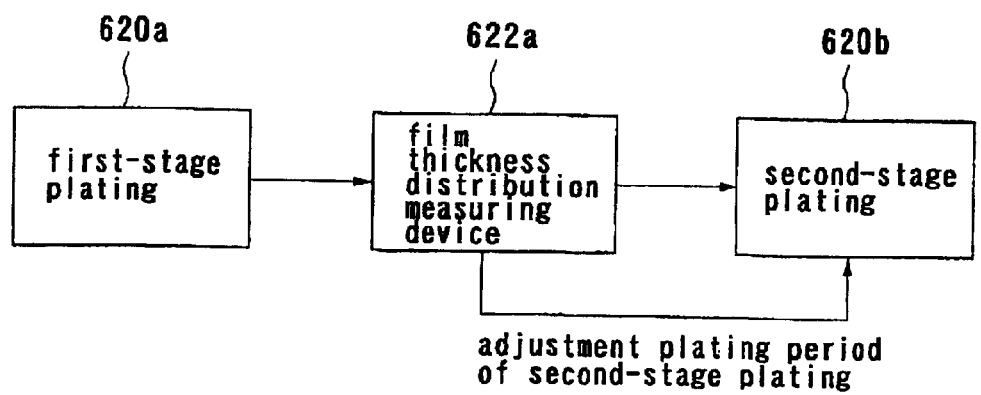

F I G. 5 2
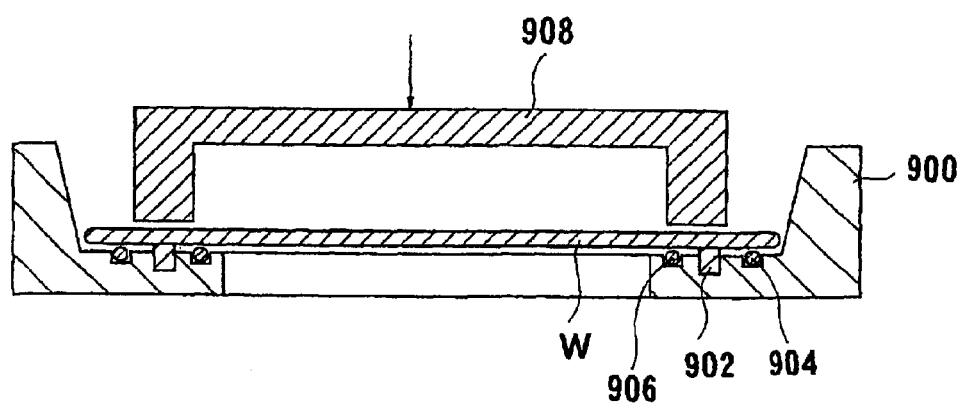
F I G. 5 3
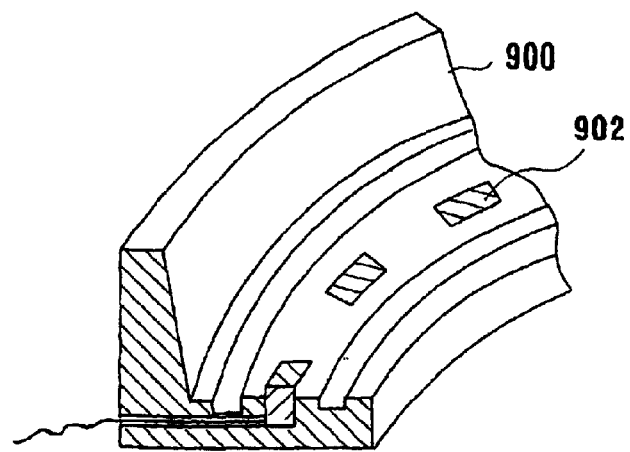

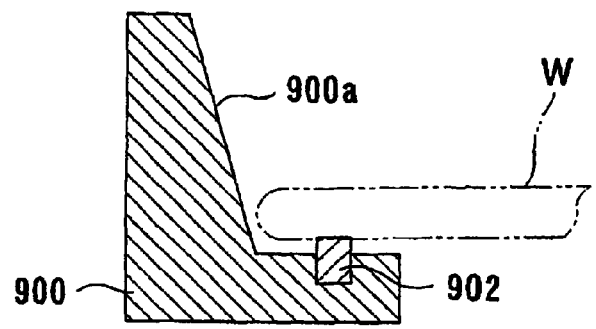
F I G. 55A
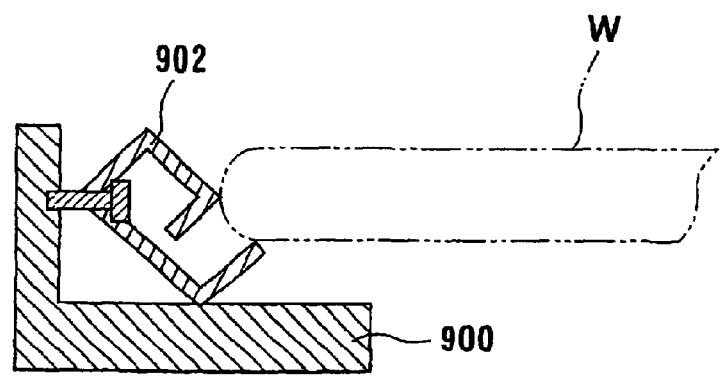
F I G. 55B

F I G. 5 7
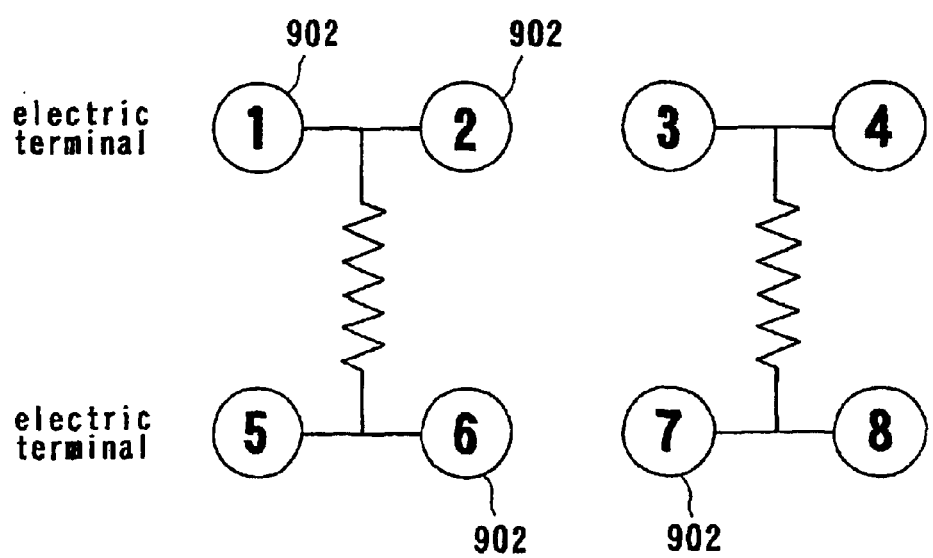

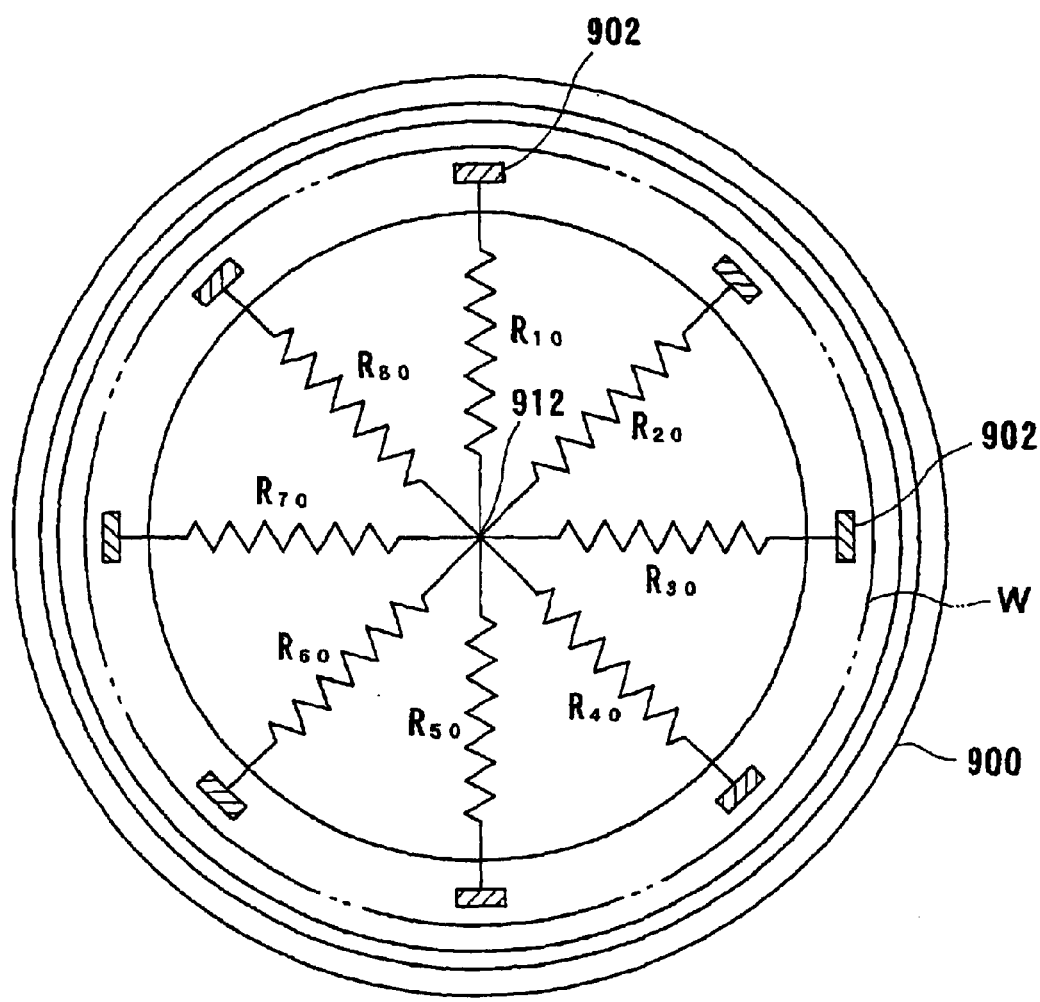
F I G. 6 1

SUBSTRATE PROCESSING METHOD

TECHNICAL FIELD

This invention relates to a substrate processing method, and more particularly, to those used to fill fine recesses formed on the surface of a semiconductor substrate with copper, thereby forming a copper interconnection pattern.

BACKGROUND ART

In recent years, with the increased throughput and the higher integration of semiconductor chips, moves to use copper (Cu) with low electric resistivity and high electromigration resistance as a metallic material for forming an interconnection circuit on a semiconductor substrate, instead of aluminum or aluminum alloy, have become noticeable. A copper interconnection of this type is generally formed by filling fine recesses formed on the surface of the substrate with copper. Methods for forming the copper interconnection include CVD, sputtering, and plating.

FIGS. 62A to 62C show an example to form a copper interconnection by copper plating in the sequence of steps. As shown in FIG. 62A, an insulating film 2 of $SiO_2$ is deposited on a conductive layer 1a on a semiconductor substrate 1 having formed a semiconductor device. A contact hole 3 and a trench 4 for an interconnection are formed in the insulating film 2 by lithography and etching technology. A barrier layer 5 of TaN or the like is formed on the contact hole 3 and the trench 4, and a copper seed layer 7 is further formed thereon as a power supply layer for electroplating.

As shown in FIG. 62B, copper plating is applied to the surface of a semiconductor substrate W to fill copper into the contact hole 3 and the trench 4 of the semiconductor substrate 1 and also deposit a copper film 6 on the insulating film 2. Then, the copper film 6 and the barrier layer 5 on the insulating film 2 is removed by chemical mechanical polishing (CMP), thus making the surface of the copper film 6 filled into the contact hole 3 and the trench 4 for an interconnection lie flush with the surface of the insulating film 2. In this manner, an interconnection composed of the plated copper film 6 is formed as shown in FIG. 62C.

FIG. 63 shows the entire constitution of a substrate processing apparatus for performing the above series of interconnection formation steps in a clean room. In the clean room, an insulating film forming device 10, a lithography and etching device 12, a barrier layer forming device 14, a copper seed layer forming device 26, a copper plating device 18, and a CMP device 20 are housed. The substrate W having the insulating film 2 formed by the insulating film forming device 10 is accommodated into a substrate cassette 22, and transported to the lithography and etching device 12 for a subsequent step. The substrate W having the contact hole 3 and the trench 4 for an interconnection formed in the lithography and etching device 12 is transported, while being housed in the substrate cassette 22, to the barrier layer forming device 14 for a subsequent step. The substrate W thus processed in the respective devices is transported, while being accommodated in the substrate cassette 22, to subsequent steps, whereby the series of interconnection formation steps are sequentially performed.

FIG. 64 schematically shows a conventional general configuration of a copper plating device for use in the above type of copper plating. This plating device includes a cylindrical plating tank 602 opening upward and holding a plating liquid 600 inside, and a rotatable substrate holder 604 adapted to detachably hold a substrate W, such as a substrate, so as to face downward, and disposing the substrate W at a position at which it closes the upper end opening portion of the plating tank 602. Inside the plating tank 602, a flat plate-shaped anode plate (anode) 606 immersed in the plating liquid 600 to serve as an anodic electrode is horizontally placed, and the seed layer of the substrate W is to serve as cathodic electrode. The anode plate 606 comprises a copper plate or a gathering of copper balls.

A plating liquid supply pipe 610 having a pump 608 mounted inside is connected to the center of the bottom of the plating tank 602. Outside of the plating tank 602, a plating liquid receptacle 612 is placed. Further, the plating liquid which has flowed into the plating liquid receptacle 612 is returned to the pump 608 through a plating liquid return pipe 614.

Because of this structure, the substrate W is held face-down at the top of the plating tank 602 by the substrate holder 604, and rotated in this condition. With a predetermined voltage being applied between the anode plate 606 (anodic electrode) and the seed layer of the substrate W (cathodic electrode), the pump 608 is driven to introduce the plating liquid 600 into the plating tank 602, whereby a plating electric current is flowed between the anode plate 606 and the seed layer of the substrate W to form a plated copper film on the lower surface of the substrate W. At this time, the plating liquid 600 which has overflowed the plating tank 602 is recovered by the plating liquid receptacle 612, and circulated.

Copper easily diffuses into a silicon dioxide film during a semiconductor manufacturing process to deteriorate the insulating properties of the silicon dioxide film, and causes cross contamination during the steps of transportation, storage and processing of the substrate. Copper may also contaminate the interior of the clean room.

In detail, the substrate having the copper seed layer formed thereon used to be transported, while being placed in the substrate cassette, to the copper plating device, and the substrate having the copper film formed in the copper plating device used to be transported, while being put in the substrate cassette, to the CMP device. Thus, copper particles and copper ions adhering to the substrate, which are very active and harmful to other processes, were likely to diffuse into the clean room.

When a plated copper film is deposited on the surface of the substrate by use of a copper electroplating device, a voltage between the center of the seed layer of the substrate and the anode differs from a voltage between the periphery of the seed layer of the substrate and the anode, because of the electrical resistance of the copper seed layer formed on the surface of the substrate. Thus, the film thickness of the plated copper film on the periphery of the substrate is greater than the film thickness of the plated copper film at the center of the substrate.

When the plated copper film thicker on the periphery than at the center of the substrate is polished by a polishing device, the plated copper film remains unpolished on the periphery of the substrate, or the plated copper film at the center is scraped excessively, which is a phenomenon called dishing.

The distance between the anode and the substrate may be fully lengthened to increase the electric resistance of the plating liquid itself, thereby diminishing the influence of the electric resistance of the copper seed layer. This measure can make the film thickness of the plated copper film more uniform, but leads to upsizing of the apparatus.

DISCLOSURE OF INVENTION

The present invention has been accomplished in light of the foregoing circumstances. Its object is to provide a substrate processing method which can deposit the plated copper film on the surface of the substrate more uniformly; which can polish away a surplus plated copper film without leaving unscraped portions or causing dishing; and which can prevent the contamination of the interior of the clean room with hazardous copper coming from the copper film, such as the copper seed layer or copper film, formed on the surface of the substrate.

According to an aspect of the present invention, there is provided a method of filling a metal in fine trenches in a surface of a substrate, comprising: forming a barrier layer on the substrate, and a seed layer on the barrier layer; providing an electroplating apparatus having a first substrate holder for holding the substrate, a plating bath containing a plating liquid, an anode, and a virtual anode to adjust electromagnetic field; providing a polishing apparatus having a second substrate holder for holding the substrate to press the substrate against a polishing surface at different pressures at a central portion and a peripheral portion of the substrate; transferring the substrate with the barrier layer and the seed layer to the electroplating apparatus; holding the substrate in the first substrate holder and placing the substrate in the plating liquid; generating electromagnetic field; filling a first metal in the trenches and forming a plated film of the first metal on an entire surface of the substrate by electroplating, wherein the electromagnetic field is adjusted by the virtual anode so that differences of thickness of the plated film between the central portion and the peripheral portion of the substrate being minimized; removing the substrate from the plating bath; washing and drying the substrate in the electroplating apparatus; transferring the substrate to the polishing apparatus; holding the substrate in the second substrate holder; polishing and removing the plated film by pressing the substrate to the polishing surface, wherein the pressures pressing the substrate to the polishing surface at a central portion and a peripheral portion are adjusted; washing and drying the substrate in the polishing apparatus; and transferring the substrate from the polishing apparatus.

According to another aspect of the present invention there is provided a method of filling a metal in trenches in a surface of a substrate, comprising; providing an electroplating apparatus; providing a polishing apparatus having a substrate holder for holding the substrate to press the substrate against a polishing surface at different pressures at a central portion and a peripheral portion of the substrate; forming a barrier layer on the substrate; transferring the substrate with the barrier layer to the electroplating apparatus; holding the substrate in a first plating liquid in the electroplating apparatus; electroplating a first layer on the entire surface of the barrier layer using the first plating liquid; holding the substrate in a second plating liquid in the electroplating apparatus; filling a metal in the trenches covered by the first layer and forming a second plating layer of the metal on the surface of the substrate using the second plating liquid; washing and drying the substrate in the electroplating apparatus; transferring the substrate to the polishing apparatus; holding the substrate in the substrate holder; polishing the second plating layer by pressing the substrate to the polishing surface, wherein the pressures pressing the substrate to the polishing surface at a central portion and a peripheral portion are adjusted; washing and drying the substrate in the polishing apparatus; and transferring the substrate from the polishing apparatus.

According to still another aspect of the present invention there is provided a method of filling a metal in trenches in a surface of a substrate, comprising: forming a barrier layer on the substrate, and a seed layer on the barrier layer; providing an electroplating apparatus having a first substrate holder for holding the substrate, a plating bath containing a plating liquid, and an anode; providing a polishing apparatus having a second substrate holder for holding the substrate to press the substrate against a polishing surface; transferring the substrate with the barrier layer and the seed layer to the electroplating apparatus; reinforcing the seed layer by depositing an additional metal in electroplating unit or electroless-plating unit; holding the substrate in the first substrate holder and placing the substrate in the plating liquid; generating electromagnetic field; filling a first metal in the trenches and forming a plated film of the first metal on an entire surface of the substrate by electroplating; removing the substrate from the plating bath; washing and drying the substrate in the electroplating apparatus; transferring the substrate to the polishing apparatus; holding the substrate in the second substrate holder; polishing and removing the plated film by pressing the substrate to the polishing surface; cap-plating a second metal to form a protective plated layer on the plated film of the polished substrate after polishing; and washing and drying the substrate.

According to still another aspect of the present invention there is provided a method of filling a metal in trenches in a surface of a substrate, comprising; providing a plating apparatus; providing a polishing apparatus having a substrate holder for holding the substrate to press the substrate against a polishing surface at different pressures at a central portion and a peripheral portion of the substrate; forming a barrier layer on the substrate; transferring the substrate with the barrier layer to the plating apparatus; holding the substrate in a first plating liquid in the plating apparatus; electroless-plating a first layer on the entire surface of the barrier layer using the first plating liquid in the electroplating apparatus; holding the substrate in a second plating liquid in the plating apparatus; generating electromagnetic field between the substrate and an anode; filling a metal in the trenches covered by the first layer and forming a second plating layer of the metal on the surface of the substrate using the second plating liquid; washing and drying the substrate in the plating apparatus; transferring the substrate to the polishing apparatus; holding the substrate in the substrate holder; polishing the second plating layer by pressing the substrate to the polishing surface, wherein the pressures pressing the substrate to the polishing surface at a central portion and a peripheral portion are adjusted; washing and drying the substrate in the polishing apparatus; and transferring the substrate from the polishing apparatus.

The above and other objects, features, and advantages of the present invention will be apparent from the following description when taken in conjunction with the accompanying drawings which illustrates preferred embodiments of the present invention by way of example.

BRIEF DESCRIPTION OF DRAWINGS

FIG. 5 is a schematic view of a substrate cleaning device of the plating device;

FIG. 6 is a schematic sectional view showing another example of the substrate cleaning device of the plating device;

FIG. 11 is a bottom view of the top ring shown in FIG. 9;

FIG. 13 is a vertical cross-sectional view showing another example of contact members (central bag and ring tube) in a top ring of the CMP device;

FIG. 18 is a front view showing the substrate transport box;

FIG. 28 is a schematic sectional view showing an example of a copper plating device having a film thickness distribution adjusting function;

FIG. 34 is a schematic sectional view showing another example of the copper plating device having the film thickness distribution adjusting function;

FIG. 36 is a schematic sectional view showing another example of the copper plating device having the film thickness distribution adjusting function;

FIG. 37 is a schematic sectional view showing another example of the copper plating device having the film thickness distribution adjusting function;

FIG. 44 is a perspective view showing another example of the CMP device having the polishing amount adjusting function;

FIG. 50 is a view attached to a description of a modification of FIGS. 49A through 49E;

FIG. 52 is a sectional view showing an example of an electric terminal member serving concurrently as a copper seed layer resistance measuring terminal and a cathode;

FIG. 53 is a perspective view showing a part of FIG. 52;

FIGS. 55A and 55B are sectional views attached to a description of a centering mechanism with different electric terminal members;

FIG. 57 is a view attached to a description of another method for measuring the electric resistance of the copper seed layer;

FIG. 61 is a view attached to a description of measurement of the electric resistance of the copper seed layer with the use of the electric terminal member shown in FIG. 60;

BEST MODE FOR CARRYING OUT THE INVENTION

Preferred embodiments of the present invention will now be described in detail with reference to the accompanying drawings, which in no way limit the invention.

Figure 1:
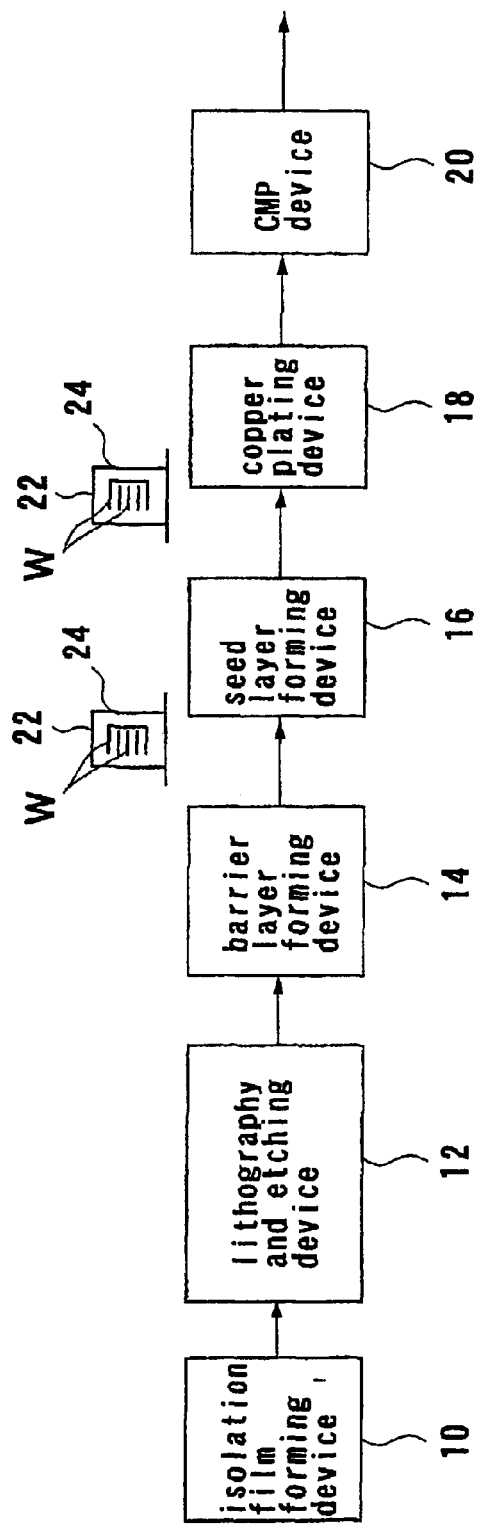
FIG. 1 is a view showing the entire constitution of a substrate processing apparatus according to an embodiment of the present invention.
Figure 62A:
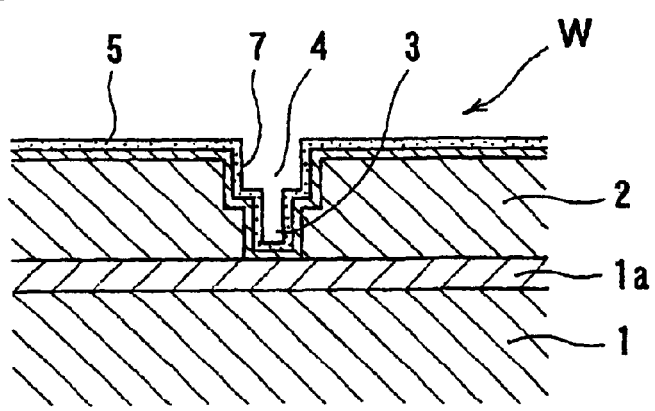
FIGS. 62A through 62C are views showing an example of forming a copper interconnection by copper plating in the sequence of steps.
Figure 62B:
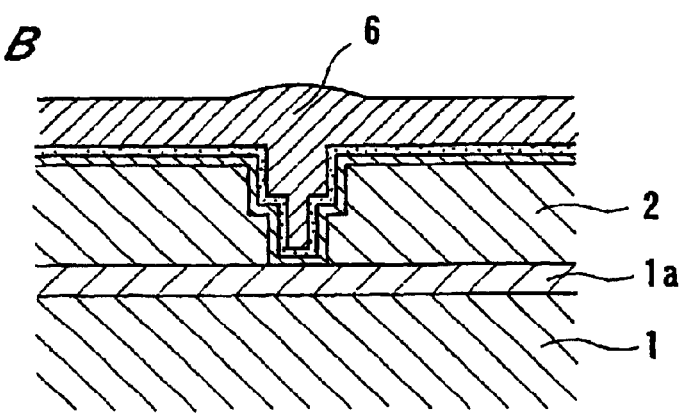

FIG. 1 shows the entire constitution of a substrate processing apparatus according to an embodiment of the present invention. In a clean room, an insulating film forming device 10, a lithography and etching device 12, a barrier layer forming device 14, a copper seed layer forming device 16, a copper plating device 18, and a CMP device 20 are housed. On the surface of a substrate W, an insulating film 2 is formed by the insulating film forming device 10, a contact hole 3 and a trench 4 for an interconnection are formed by the lithography and etching device 12, a barrier layer 5 is formed by the barrier layer forming device 14, and a copper seed layer 7 is formed by the copper seed layer forming device 16, in this sequence, as shown in FIG. 62A. Copper plating is applied to the surface of the substrate W by the copper plating device 18 to form a copper film 6, as shown in FIG. 62B. Then, chemical mechanical polishing is carried out on the surface of the substrate W by the CMP device 20 to form an interconnection composed of the copper film 6 shown in FIG. 62C.

The copper seed layer forming device 16 for forming the copper seed layer 7 on the surface of the substrate W, the copper plating device 18 for forming the copper film 6 by applying copper plating to the surface of the substrate W, and the CMP device 20 for treating the substrate W exposed the copper film 6 are separated by partition walls in the clean room, and are also isolated from the clean room. The substrates W with the copper seed layer 7 or the copper film 6 exposed on the surface thereof are housed in a substrate cassette 22. The substrate cassette 22 is placed in a substrate transport box 24, and the substrates W are transported, in a hermetically sealed condition, to a next step by the substrate transport box 24 together with the substrate cassette 22. That is, transport of the substrates W from the copper seed layer forming device 16 to the copper plating device 18, transport of the substrates W from the copper plating device 18 to the CMP device 20, and transport of the substrates W from the CMP device 20 are performed, with the substrates W being housed in the substrate cassette 22, and with the substrate cassette 22 being sealed up in the substrate transport box 24. Namely, these transport activities are performed, with the substrates W being isolated from the clean room.

Figure 2:
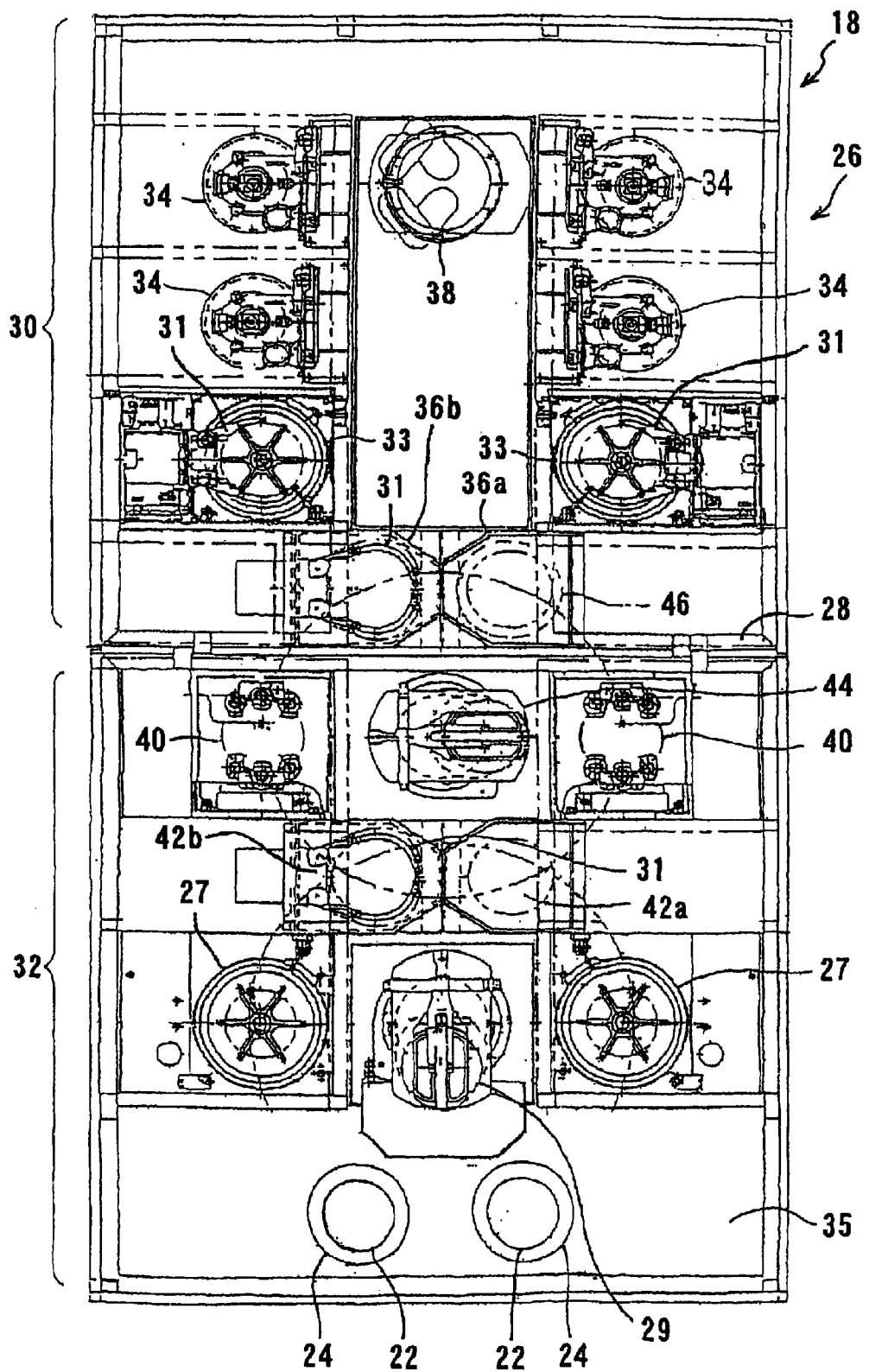
FIG. 2 is an entire layout drawing of a plating device.

FIG. 2 shows the entire configuration of the copper plating device 18. This plating device 18 is housed in a rectangular facility 26 separated by partition walls, and is adapted to perform copper plating of a semiconductor substrate continuously. This facility 26 is partitioned by a partition wall 28 into a plating space 30 and a clean space 32, and the plating space 30 and the clean space 32 are each capable of air intake and exhaust independently. The partition wall 28 is provided with an openable/closable shutter (not shown). The pressure of the clean space 32 is lower than the atmospheric pressure, and higher than the pressure of the plating space 30. Thus, air inside the clean space 32 does not flow out into the clean room outside the facility 26, and air inside the plating space 30 does not flow into the clean space 32.

A loading/unloading portion 35 for placing the substrate transport box 24 housing the substrate cassettes 22, and two cleaning/drying devices 27 for cleaning (rinsing) a plated substrate with pure water and drying the cleaned substrate are disposed inside the clean space 32. A fixed and rotatable first transport device (four-axis robot) 29 for transporting the substrate is further provided. The cleaning/drying device 27 used is, for example, of the type which has cleaning liquid supply nozzles for supplying ultrapure water to both of the face side and the back side of the substrate, and spins the substrate at a high speed to dewater and dry it.

Inside the plating space 30, there are disposed two pretreatment units 33 for pretreating the substrate before plating, and turning the substrate upside down by an inverting machine 31; four plating units 34 for applying copper plating to the surface of the substrate facedown; and two first substrate stages 36a and 36b for placing and holding the substrate. A self-propelled, rotatable second transport device (four-axis robot) 38 for transporting the substrate is also provided.

In the clean space 32, there are disposed two substrate cleaning devices 40 for cleaning the plated substrate with a chemical solution, such as an acid solution or an oxidizing agent solution; and two second substrate stages 42a and 42b located between the substrate cleaning devices 40 and the cleaning/drying devices 27. A fixed, rotatable third transport device (four-axis robot) 44 for transporting the substrate is provided at a position interposed between the two substrate cleaning devices 40.

One of the first substrate stages 36b, and one of the second substrate stages 42b, are adapted to allow the substrate to be washed with water, and are each provided with an inverting machine 31 for turning the substrate upside down.

The first transport device 29 is adapted to transport the substrate among the substrate cassette 22 placed and housed in the loading/unloading portion 35, the cleaning/drying devices 27, and the second substrate stages 42a, 42b. The second transport device 38 is adapted to transport the substrate among the first substrate stages 36a, 36b, the pretreatment units 33, and the plating units 34. The third transport device 44 is adapted to transport the substrate among the first substrate stages 36a, 36b, the substrate cleaning devices 40, and the second substrate stages 42a, 42b.

Inside the facility 26, a container 46 for accommodating an adjusting-operation substrate is incorporated below the first substrate stage 36a. The second transport device 38 is adapted to withdraw the adjusting-operation substrate from the container 46, and return this substrate to the container 46 after an adjusting operation ends. In this manner, the container 46 for accommodating the adjusting-operation substrate is disposed inside the facility 26, thus making it possible to prevent contamination or a decrease in throughput associated with the introduction of the adjusting-operation substrate from the outside for an adjusting operation.

The position of disposition of the container 46 may be any position in the facility 26 as long as it is a position allowing the adjusting-operation substrate to be withdrawn and accommodated by any of the transport devices. By disposing the container 46 near the first substrate stage 36a, an adjusting operation using the adjusting-operation substrate can be started for pretreatment, followed by plating, and the substrate after cleaning/drying can be returned into the container 46.

The pretreatment units for applying pretreatment for increasing wettability of the substrate with a plating can be omitted. Alternatively, a preplating unit for performing preplating for the purpose of reinforcing the copper seed layer formed on the substrate before execution of plating can be installed in place of one of the plating units or one of the pretreatment units. In this case, a water-washing unit for performing water washing between preplating and plating and/or after plating is installed instead of the pretreatment unit.

The transport device 29 used is one having two drop-in hands, one of which located upper side is a dry hand, the other located lower side being a wet hand. The transport devices 38, 44 used are each one having two drop-in hands, both of which are wet hands. Needless to say, however, such transport devices are not restrictive.

Next, the flow of the substrate in the plating device 18 will be outlined. The substrate is housed in the substrate cassette 22 with its surface (semiconductor device formation side, or processing side) directed upward, and the substrate cassette 22 is housed in the substrate transport box 24. In this state, the substrates are transported to and placed in the loading/unloading portion 35. The first transport device 29 withdraws the substrate from the substrate cassette 22, moves it toward the second substrate stage 42a, and places it on the second substrate stage 42a. The third transport device 44 transfers the substrate present on the second substrate stage 42a to the first substrate stage 36a. Then, the second transport device 38 receives the substrate from the first substrate stage 36a, and passes it on to the pretreatment unit 33. After completion of pretreatment by the pretreatment unit 33, the inverting machine 31 turns the substrate upside down so that the surface of the substrate faces downward. The inverted substrate is handed to the second transport device 38 again. The second transport device 38 passes the substrate on to a plating head of the plating unit 34.

After the substrate is plated and dehydrated of the plating liquid in the plating unit 34, the substrate is passed on to the second transport device 38, which carries the substrate to the first substrate stage 36b. The substrate is inverted by the inverting machine 31 of the first substrate stage 36b so that its face side faces upward. In the inverted state, the substrate is moved to the substrate cleaning device 40 by the third transport device 44. The substrate, which has been cleaned with the chemical solution, rinsed with pure water, and spin-extracted in the substrate cleaning device 40, is carried to the first substrate stage 42b by the third transport device 44. Then, the first transport device 29 receives the substrate from the first substrate stage 42b, and transfers the substrate to the cleaning/drying device 27, which rinses the substrate with pure water and spin-dries it. The spin-dried substrate is transported by the first transport device 29, and returned to the substrate cassette 22 within the substrate transport box 24 transported to the loading/unloading portion 35.

Here, pretreatment by the pretreatment unit can be omitted. When the preplating unit is installed, the substrate withdrawn from the substrate cassette is subjected to preplating by the preplating unit, and after a water-washing step or without a water-washing step, the substrate is plated by the plating unit. After plating, the substrate is put to, or not put to, a water-washing step, and transported to the first cleaning device.

Figure 3:
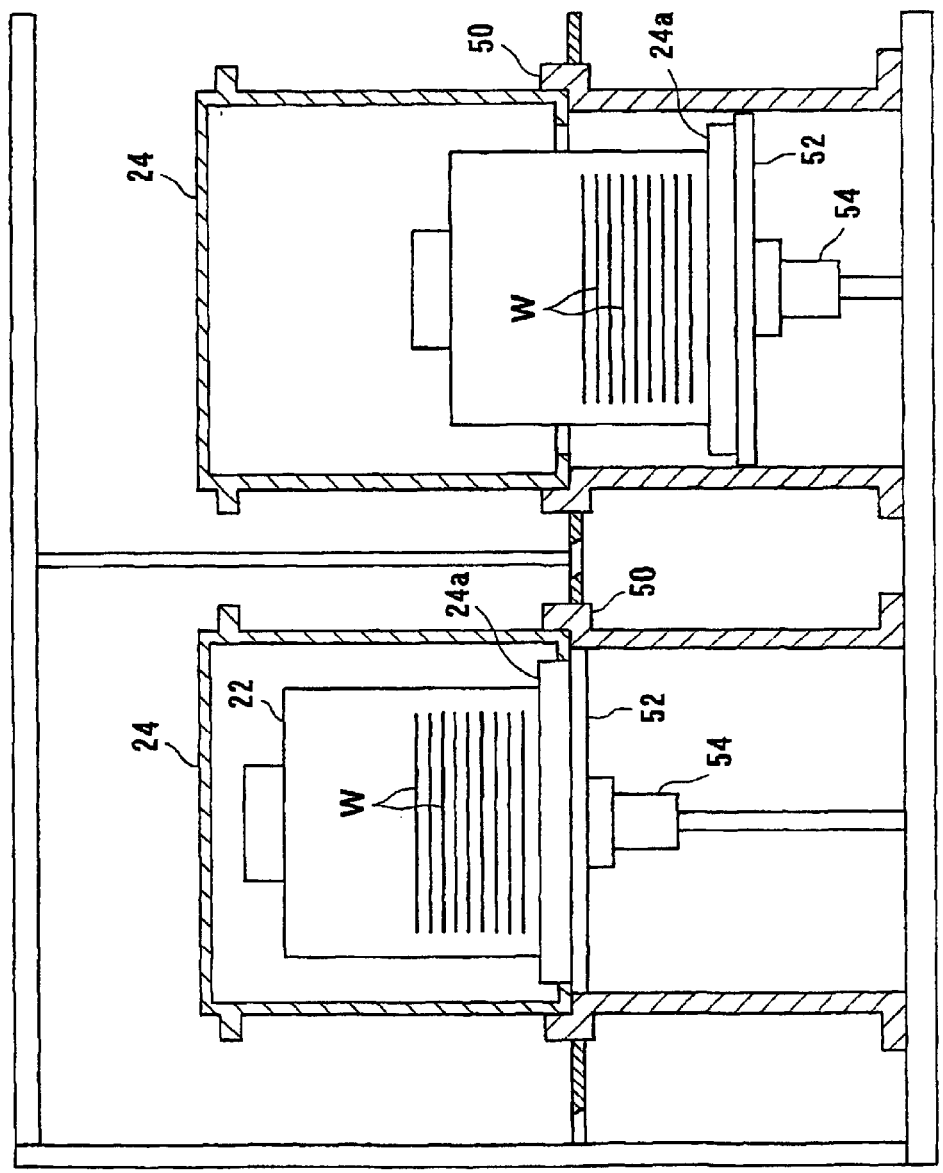
FIG. 3 is a view showing a loading/unloading portion of the plating device.

FIG. 3 is a view showing the loading/unloading portion 35. The loading/unloading portion 35 is provided with stages 50 placing the substrate transport boxes 24 housing substrate cassettes 22. When the substrate transport box 24 is placed on an elevating stand 52 of the stage 50, the elevating stand 52 and a bottom plate 24a of the substrate transport box 24 are locked together. The bottom plate 24a is mounted on the bottom of the substrate transport box 24 so as to close an opening of the bottom of substrate transport box 24. However, simultaneously with the locking of the elevating stand 52 and the bottom plate 24a, the stage 50 and the substrate transport box 24 intimately contact each other, and the bottom plate 24a is liberated from the substrate transport box 24 for a free state.

The elevating stand 52 is coupled to an elevating mechanism 54, and the bottom plate 24a placing the substrate cassette 22, once released from the substrate transport box 24 to become free, is moved up and down integrally with the elevating stand 52. When the elevating stand 52 and the bottom plate 24a are confirmed to have been locked, the elevating stand 52 descends, and the bottom plate 24a placing the substrate cassette 22 moves downward, thereby making it possible to withdraw the substrate W from the substrate cassette 22.

Figure 4:
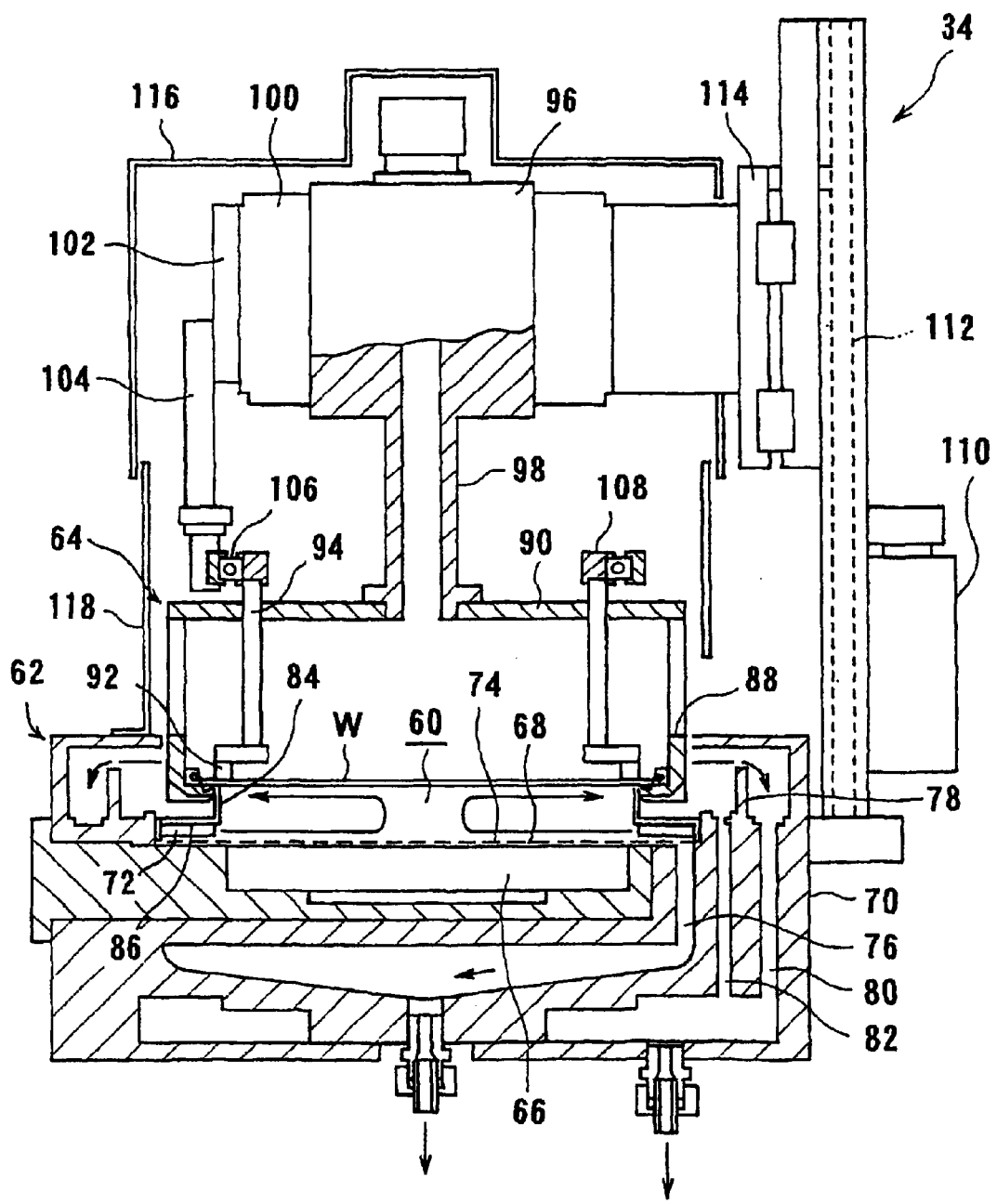
FIG. 4 is a schematic sectional view of a plating unit of the plating device.

FIG. 4 shows the plating unit 34, which mainly comprises a substantially cylindrical plating tank 62 holding a plating liquid 60, and a plating head 64 disposed above the plating tank 62 and adapted to hold the substrate W. FIG. 4 shows a state of the plating unit 34 being at a plating position at which the substrate W is held by the plating head 64 and the liquid level of the plating liquid 60 is raised.

The plating tank 62 has a plating chamber 68 open upward and having an anode 66 disposed at the bottom, and a plating vessel 70 containing the plating liquid 70 in the plating chamber 68. On the inner circumferential wall of the plating vessel 70, plating liquid ejection nozzles 72 horizontally protruding toward the center of the plating chamber 68 are arranged at equal intervals along the circumferential direction. These plating liquid ejection nozzles 72 communicate with a plating liquid supply passage extending vertically within the plating vessel 70.

A punch plate 74 provided with many holes, for example, of about 3 mm is disposed at a position above the anode 66 in the plating chamber 68 so as to thereby prevent a black film, which is formed on the surface of the anode 66, from being brought up by the plating liquid 60 and flowed out.

The plating vessel 70 is also provided with a first plating liquid discharge port 76 for pulling out the plating liquid 60 in the plating chamber 68 from the peripheral edge of the bottom of the plating chamber 68, a second plating liquid discharge port 80 for discharging the plating liquid 60 which has overflowed a dam member 78 provided in an upper end portion of the plating vessel 70, and a third plating liquid discharge port 82 for discharging the plating liquid before overflowing the dam member 78. The plating liquids flowing through the second plating liquid discharge port 80 and the third plating liquid discharge port 82 are mixed at a lower end portion of the plating vessel 70 and discharged.

Because of this structure, when the amount of a plating supplied is large during plating, the plating liquid is discharged to the outside through the third plating liquid discharge port 82, and simultaneously caused to overflow the dam member 78 and discharged to the outside through the second plating liquid discharge port 80. When the amount of a plating supplied is small during plating, the plating liquid is discharged to the outside through the third plating liquid discharge port 82, and simultaneously caused to pass through an opening (not shown) provided in the dam member 78, and discharged to the outside through the second plating liquid discharge port 80. These contrivances permit easy adaptation to the magnitude of the amount of a plating.

Near the periphery of the interior of the plating chamber 68, a vertical stream regulating ring 84 and a horizontal stream regulating ring 86 are disposed by having the outer peripheral end of the horizontal stream regulating ring 86 secured to the plating vessel 70. These stream regulating rings 84 and 86 serve to push up the center of the plating liquid surface by an upper flow of the plating liquid 60 divided into upper and lower flows in the plating chamber 68, to smooth the lower flow, and make the distribution of an electric current density more uniform.

The plating head 64 has a rotatable, bottomed, cylindrical housing 90 open downward and having an opening 88 in a circumferential wall thereof, and vertically movable press rods 94 having a press ring 92 attached to the lower ends thereof.

The housing 90 is connected to an output shaft 98 of a motor 96, and is adapted to rotate by driving of the motor 96. The press rods 94 are suspended at predetermined positions along the circumferential direction of a ring-shaped support frame 108 rotatably supported via a bearing 106 at the lower end of a slider 104 movable upward and downward by the actuation of a guide-equipped cylinder 102 secured to a support 100 surrounding the motor 96. Thus, the press rods 94 move up and down according to the actuation of the cylinder 102, and when the substrate W is held, are adapted to rotate integrally with the housing 90.

The support 100 is mounted on a slide base 114 screwed to, and moving upward and downward integrally with, a ball screw 112 rotating in accordance with the driving of a motor 110. Further, the support 100 is surrounded with an upper housing 116, and moved up and down together with the upper housing 116 in accordance with the driving of the motor 110. A lower housing 118 surrounding the periphery of the housing 90 during plating is attached to the upper surface of the plating vessel 70.

Figure 84:
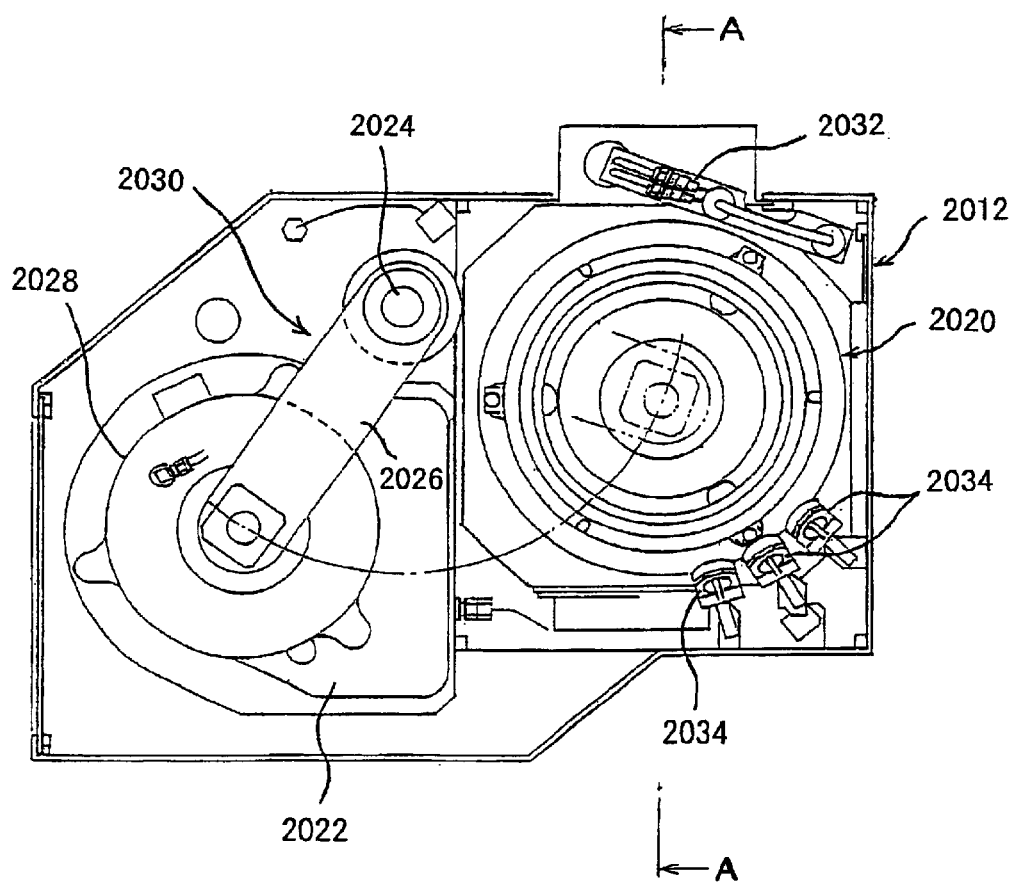
FIG. 84 is a plan view showing another plating unit.

FIGS. 84 to 93 shows another example of a plating unit 2012. The plating unit 2012, as shown in FIG. 84, is provided with a substrate treatment section 2020 for performing plating treatment and treatment incidental thereto. A plating liquid tray 2022 for containing the plating liquid is disposed adjacent to the substrate treatment section 2020. There is also provided an electrode arm portion 2030 having an electrode portion 2028 which is held at the free end of an arm 2026 swingable about a rotating shaft 2024 and which is swung between the substrate treatment section 2020, and a plating liquid tray 2022. Furthermore, a pre-coating/recovering arm 2032, and fixed nozzles 2034 for ejecting pure water or a chemical liquid such as ion water, and further a gas or the like toward a substrate are disposed laterally of the substrate treatment section 2020. In this embodiment, three of the fixed nozzles 2034 are disposed, and one of them is used for supplying pure water.

Figure 85:
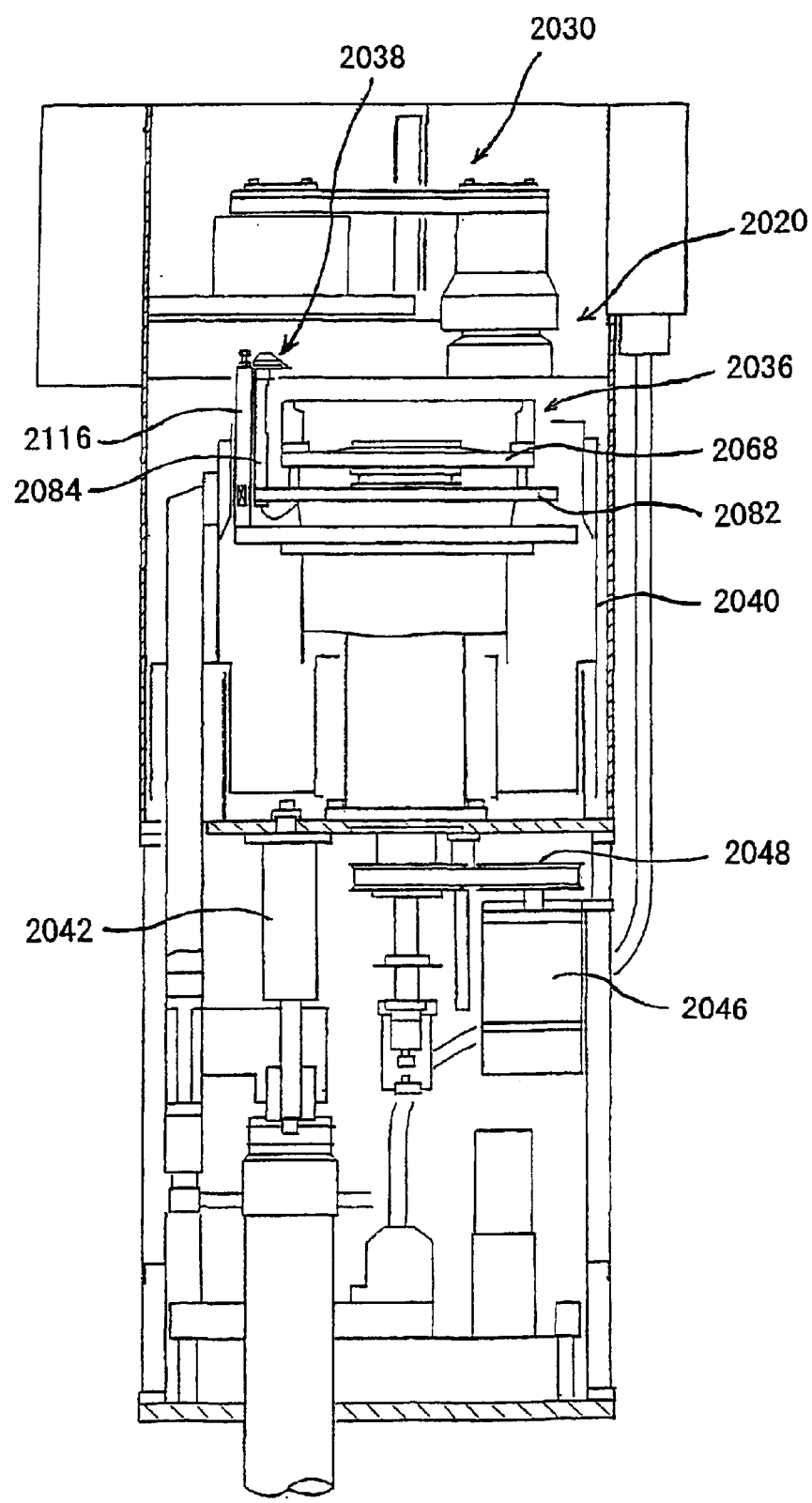
FIG. 85 is a sectional view taken on line A—A of FIG. 84.
Figure 86:
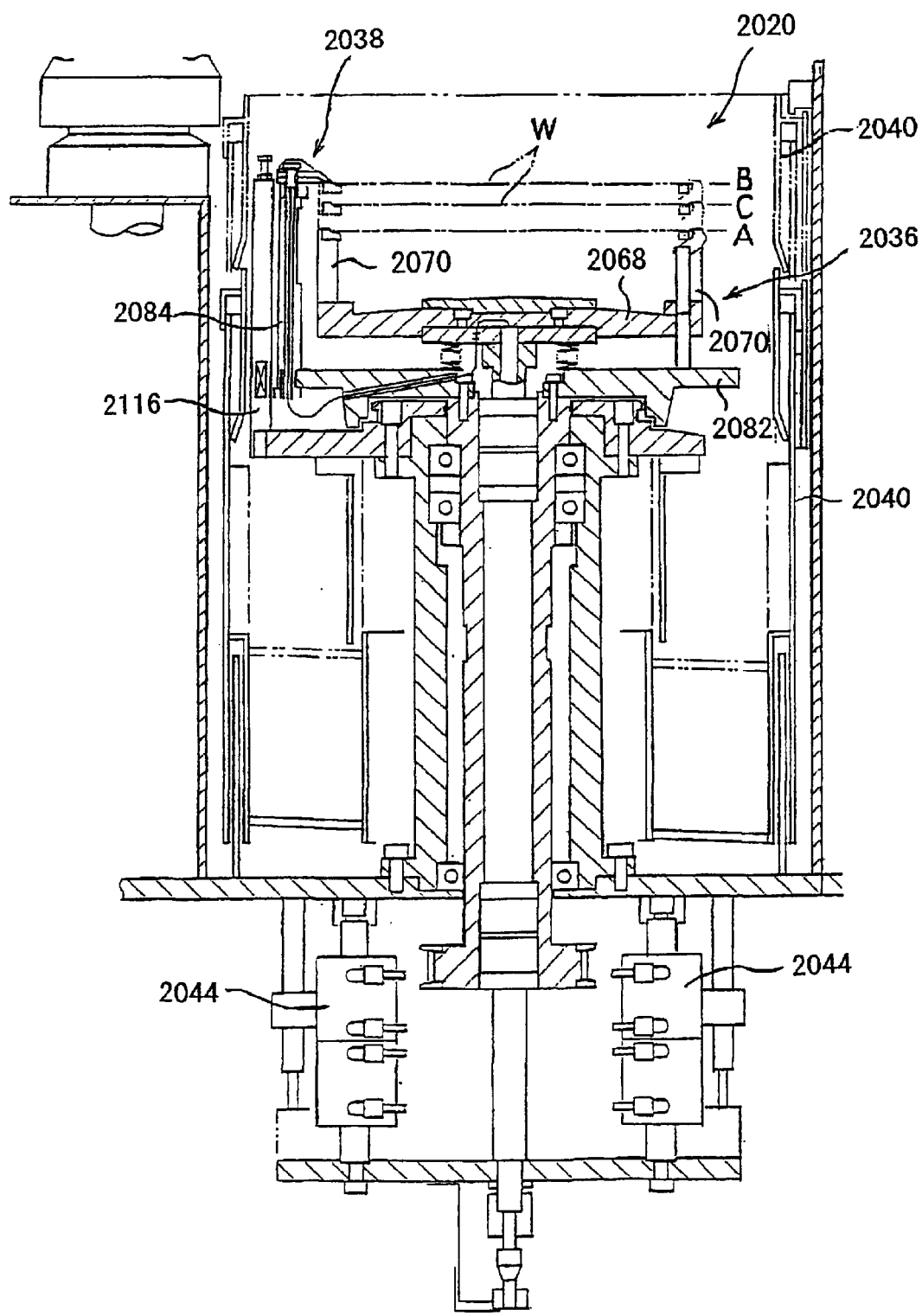
FIG. 86 is an enlarged sectional view of a substrate holder and a cathode portion.

The substrate treatment section 2020, as shown in FIGS. 85 and 86, has a substrate holder 2036 for holding a substrate W with its surface, to be plated, facing upward, and a cathode portion 2038 located above the substrate holder 2036 so as to surround a peripheral portion of the substrate holder 2036. Further, a substantially cylindrical bottomed cup 2040 surrounding the periphery of the substrate holder 2036 for preventing scatter of various chemical liquids used during treatment is provided so as to be vertically movable by an air cylinder 2042.

The substrate holder 2036 is adapted to be raised and lowered by air cylinders 2044 between a lower substrate transfer position A, an upper plating position B, and a pretreatment/cleaning position C intermediate between these positions. The substrate holder 2036 is also adapted to rotate at an arbitrary acceleration and an arbitrary velocity integrally with the cathode portion 2038 by a rotating motor 2046 and a belt 2048. A substrate carry-in and carry-out opening (not shown) is provided in confrontation with the substrate transfer position A in a side surface of the plating unit 2012. When the substrate holder 2036 is raised to the plating position B, a seal member 2090 and cathode electrodes 2088 (to be described below) of the cathode portion 2038 are brought into contact with the peripheral edge portion of the substrate W held by the substrate holder 2036. On the other hand, the cup 2040 has an upper end located below the substrate carry-in and carry-out opening, and when the cup 2040 ascends, the upper end of the cup 2040 reaches a position above the cathode portion 2038 closing the substrate carry-in and carry-out opening, as shown by imaginary lines in FIG. 86.

The plating liquid tray 2022 serves to wet a plating liquid impregnated material 2110 and an anode 2098 (to be described later on) of the electrode arm portion 2030 with a plating liquid, when plating has not been performed.

Figure 87:
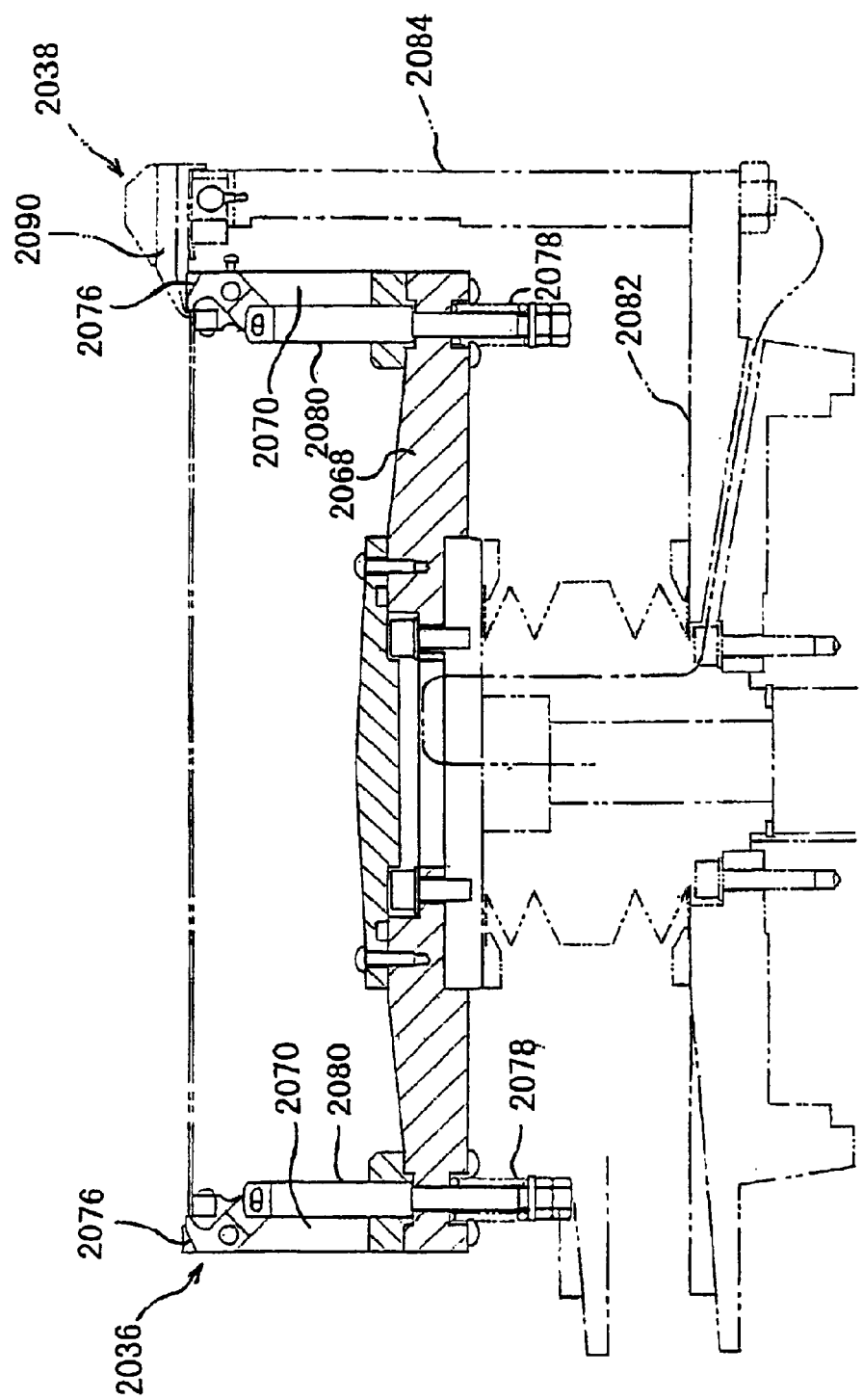
FIG. 87 is a front view of a substrate holder.

As shown in FIG. 87, the substrate holder 2036 has a disk-shaped substrate stage 2068 and six vertical support arms 2070 disposed at spaced intervals on the outer circumferential edge of the substrate stage 2068 for holding a substrate W in a horizontal plane on respective upper surfaces of the support arms 2070. Chucking fingers 2076 are rotatably mounted on upper ends of the support arms 2070 for pressing the substrate W downwardly and gripping the outer circumferential edge of the substrate W.

The chucking fingers 2076 have respective lower ends coupled to upper ends of pressing pins 2080 that are normally urged to move downwardly by coil springs 2078. When the pressing pins 2080 are moved downwardly, the chucking fingers 2076 are rotated radially inwardly into a closed position. A support plate 2082 is disposed below the substrate stage 2068 for engaging lower ends of the opening pins 2080 and pushing them upwardly.

When the substrate holder 2036 is located in the substrate transfer position A shown in FIG. 85, the pressing pins 2080 are engaged and pushed upwardly by the support plate 2082, so that the chucking fingers 2076 rotate outwardly and open. When the substrate stage 2068 is elevated, the opening pins 2080 are lowered under the resiliency of the coil springs 2078, so that the chucking fingers 2076 rotate inwardly and close.

Figure 88:
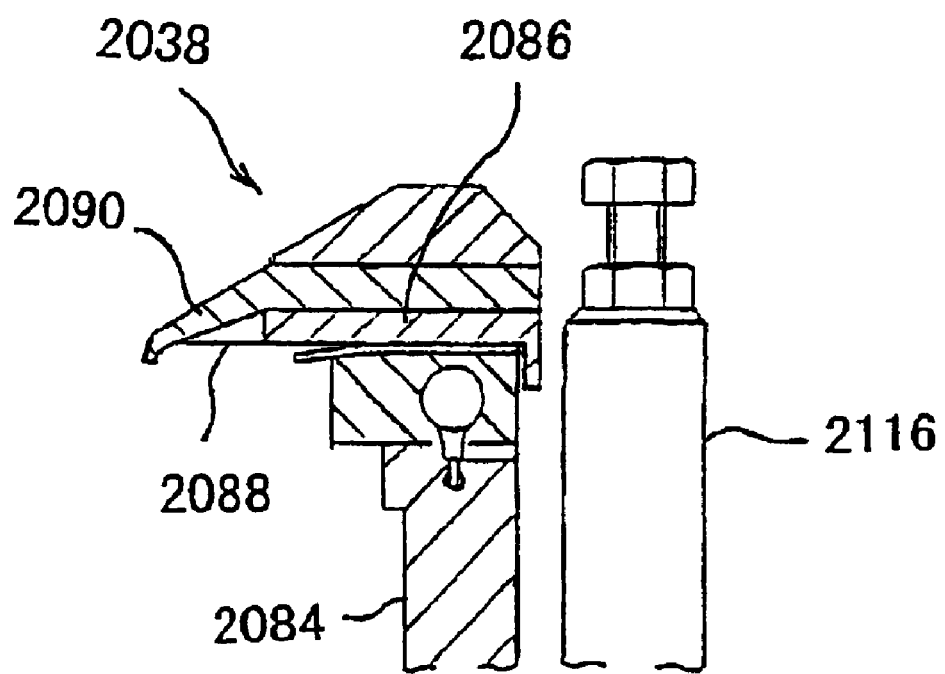
FIG. 88 is a sectional view of a cathode portion.
Figure 89:
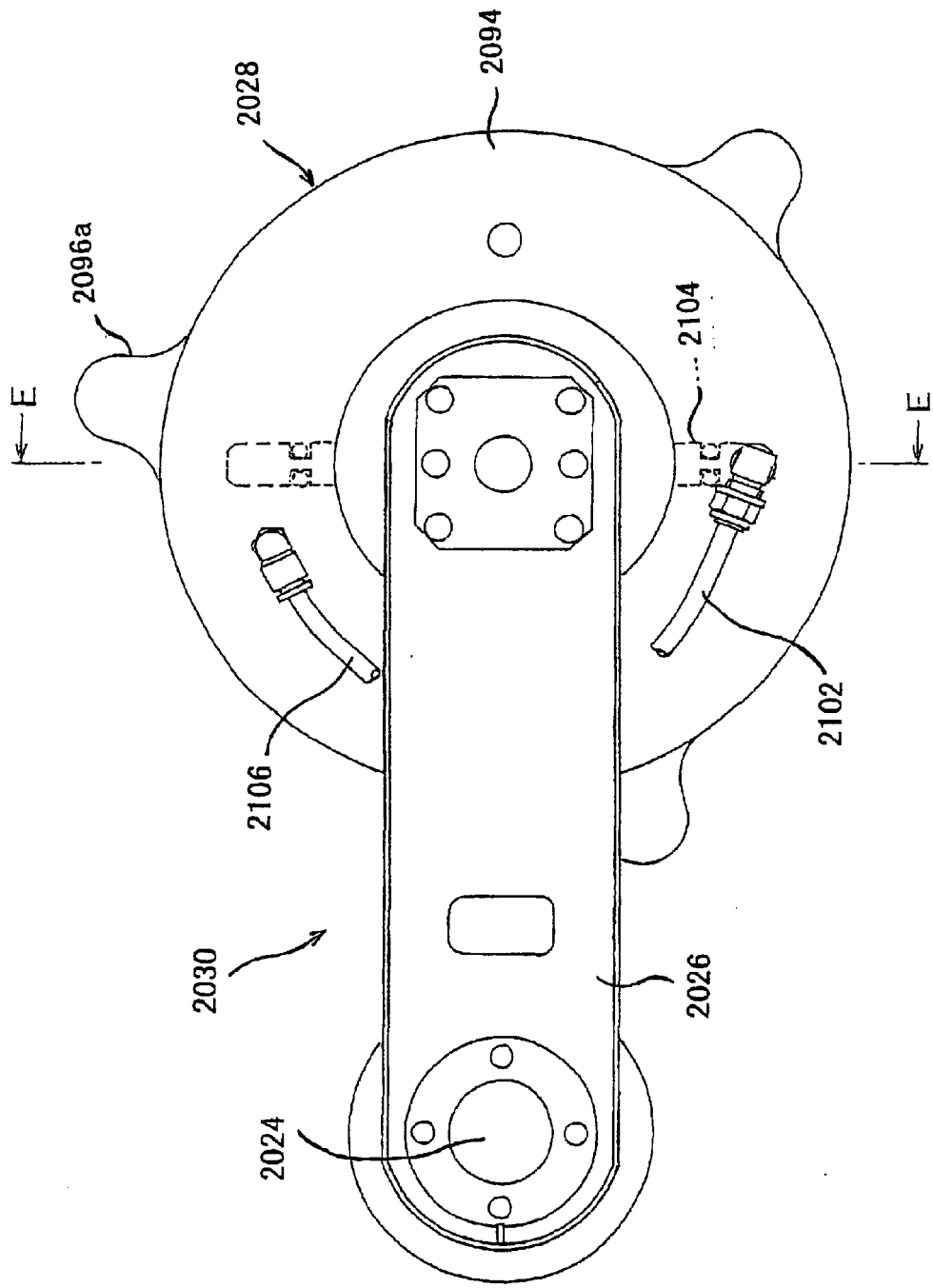
FIG. 89 is a plan view of an electrode arm.
Figure 90:
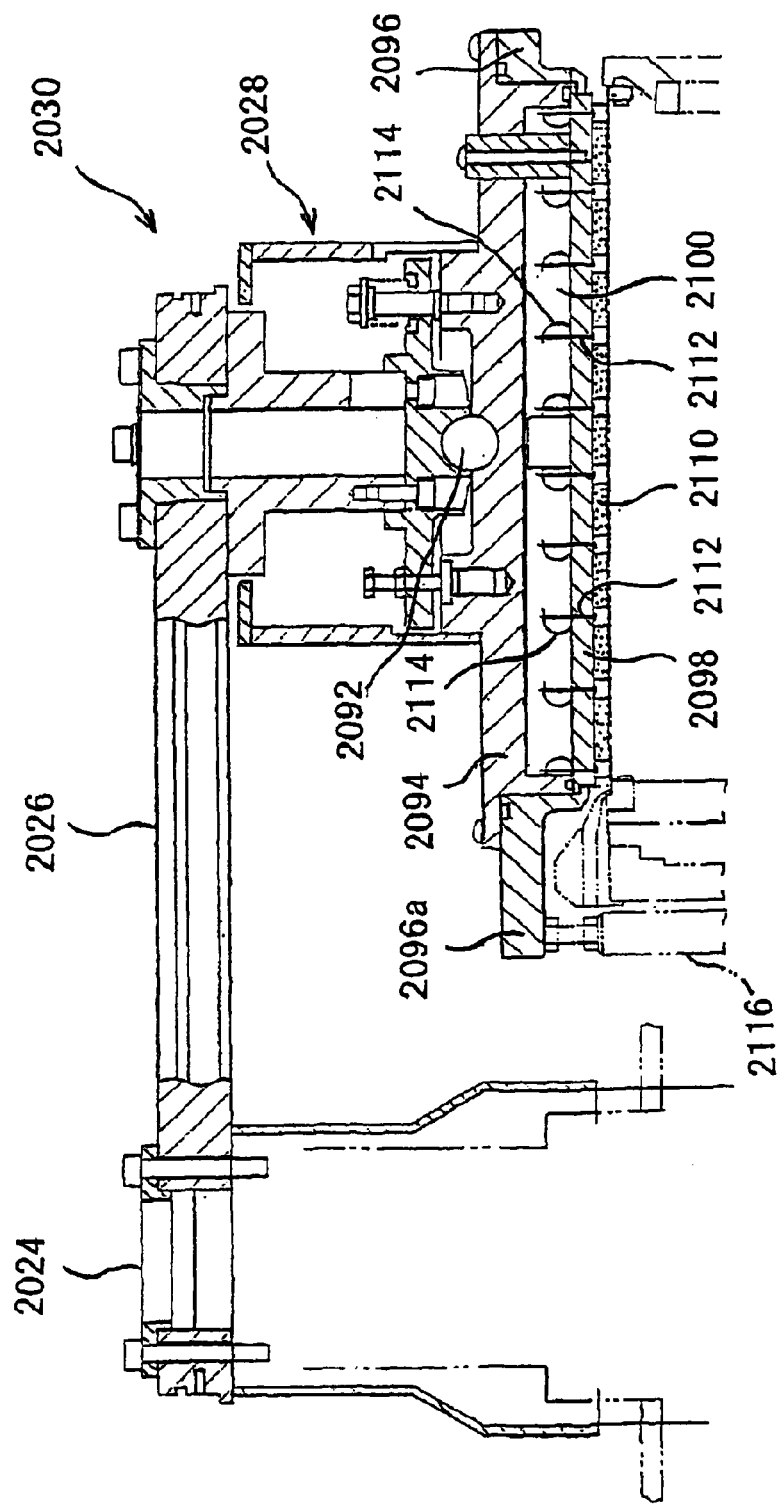
FIG. 90 is a longitudinal sectional front view of FIG. 89.
Figure 91:
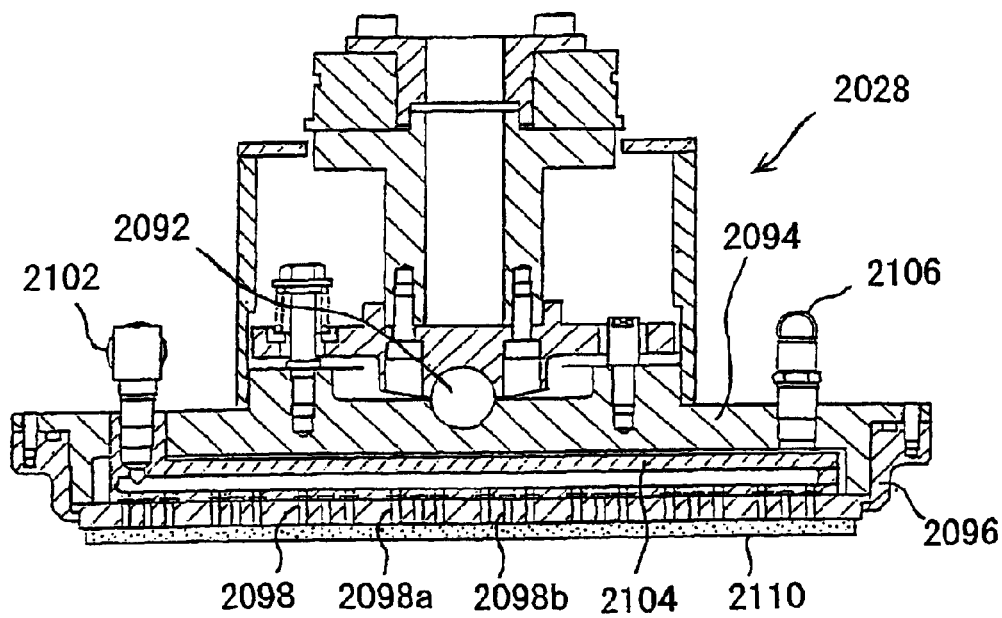
FIG. 91 is a sectional view taken on line E—E of FIG. 89.
Figure 92:
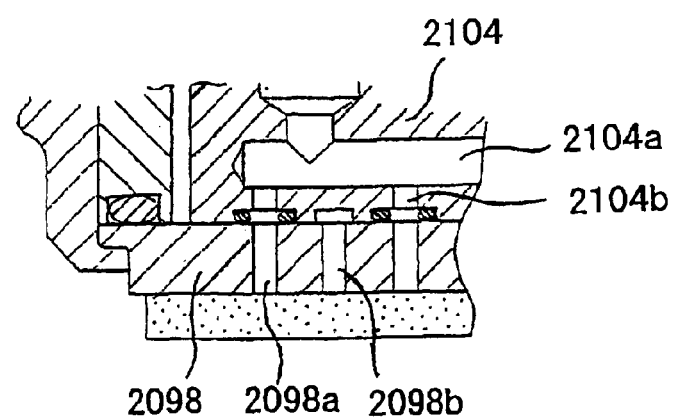
FIG. 92 is an enlarged view showing a part of FIG. 91 in an enlarged manner.
Figure 93:
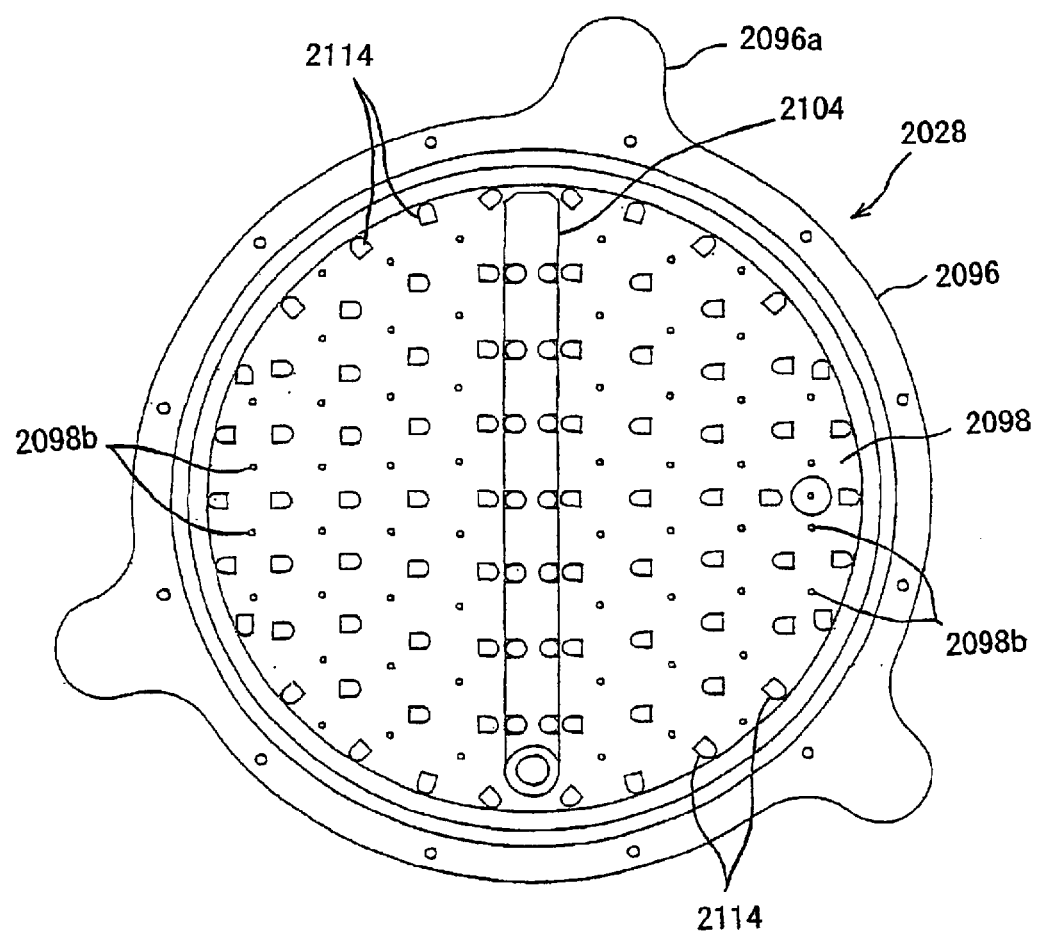
FIG. 93 is a plan view of a state in which a housing of an electro portion of the electrode arm has been removed.

As shown in FIG. 88, the cathode portion 2038 comprises an annular frame 2086 fixed to upper ends of vertical support columns 2084 mounted on the peripheral edge of the support plate 2082 (see FIG. 87), a plurality of cathode electrodes 2088 attached to a lower surface of the annular frame 2086 and projecting inwardly, and an annular sealing member 2090 mounted on an upper surface of the annular frame 2086 in covering relation to upper surfaces of the cathode electrodes 2088. The sealing member 2090 is adapted to have an inner circumferential edge portion inclined inwardly downwardly and progressively thin-walled, and to have an inner circumferential end suspending downwardly.

When the substrate holder 2036 has ascended to the plating position B, as shown FIG. 86, the cathode electrodes 2088 are pressed against the peripheral edge portion of the substrate W held by the substrate holder 2036 for thereby allowing electric current to pass through the substrate W. At the same time, an inner circumferential end portion of the seal member 2090 is brought into contact with an upper surface of the peripheral edge of the substrate W under pressure to seal its contact portion in a watertight manner. As a result, the plating liquid supplied onto the upper surface (surface to be plated) of the substrate W is prevented from seeping from the end portion of the substrate W, and the plating liquid is prevented from contaminating the cathode electrodes 2088.

As shown in FIGS. 89 through 93, the electrode head 2028 of the electrode arm portion 2030 comprises a housing 2094 coupled to a free end of the swing arm 2026 through a ball bearing 2092, a cylindrical support frame 2096 surrounding the housing 2094, and an anode 2098 fixed by having a peripheral edge portion gripped between the housing 2094 and the support frame 2096. The anode 2098 covers an opening of the housing 2094, which has a suction chamber 2100 defined therein. In the suction chamber 2100, there is disposed a diametrically extending plating liquid introduction pipe 2104 connected to a plating liquid supply pipe 2102 which extends from the plating liquid supply unit (not shown), and held in abutment against an upper surface of the anode 2098. A plating liquid discharge pipe 2106 communicating with the suction chamber 2100 is connected to the housing 2094.

The plating liquid introduction pipe 2104 is effective to supply the plating liquid uniformly to the surface, to be plated, if the plating liquid introduction pipe 2104 is of a manifold structure. Specifically, the plating liquid introduction pipe 2104 has a plating liquid introduction passage 104a extending continuously in its longitudinal direction, and a plurality of plating liquid introduction ports 2104b spaced at a given pitch along the plating liquid introduction passage 2104a and extending downwardly therefrom in communication therewith. The anode 2098 has a plurality of plating liquid supply ports 2098a defined therein at positions corresponding to the plating liquid introduction ports 2104b. The anode 2098 also has a number of vertically extending through holes 2098b defined therein over its entire region. The plating liquid that is introduced from the plating liquid supply pipe 2102 into the plating liquid introduction pipe 2104 flows through the plating liquid introduction ports 2104b and the plating liquid supply ports 2098a to a position below the anode 2098. With the anode 2098 being immersed in the plating liquid, the plating liquid discharge pipe 2106 is evacuated to discharge the plating liquid below the anode 2098 via the through holes 2098b and the suction chamber 2100 from the plating liquid discharge pipe 2106.

In this embodiment, a plating liquid impregnated material 2110 comprising a water-retaining material and covering the entire surface of the anode 2098 is attached to the lower surface of the anode 2098. The plating liquid impregnated material 2110 is impregnated with the plating liquid to wet the surface of the anode 2098, thereby preventing a black film from falling onto the plated surface of the substrate by drying, and oxidizing, and simultaneously facilitating escape of air to the outside when the plating liquid is poured between the surface, to be plated, of the substrate and the anode 2098.

The plating liquid impregnated material 2110 has both functions of retaining liquid and passing liquid therethrough, and has excellent chemical resistance. Specially, the plating liquid impregnated material 2110 has endurance against an acid plating liquid including sulfuric acid having high concentration. The plating liquid impregnated material 2110 comprises, for example, a woven fabric of polypropylene to prevent elution of the impurity in the sulfuric acid solution from having a bad influence to the plating efficiency (plating speed, resistivity and filling characteristics). The plating liquid impregnated material 2110 may comprises at least one material of polyethylene, polyester, polyvinyl chloride, Teflon, polyvinyl alcohol, polyurethane, and derivatives of these materials, other than polypropylene. Nonwoven fabric or sponge-like structure may use in place of woven fabric. Porous ceramics and sintered polypropylene made of Alumina and SiC and the like are available.

Many fixing pins 2112 each having a head portion at the lower end are arranged such that the head portion is provided in the plating liquid impregnated material 2110 so as not to be releasable upward and a shaft portion pierces the interior of the anode 2098, and the fixing pins 2112 are urged upward by U-shaped plate springs 2114, whereby the plating liquid impregnated material 2110 is brought in close contact with the lower surface of the anode 2098 by the resilient force of the plate springs 2114 and is attached to the anode 2098. With this arrangement, even when the thickness of the anode 2098 gradually decreases with the progress of plating, the plating liquid impregnated material 2110 can be reliably brought in close contact with the lower surface of the anode 2098. Thus, it can be prevented that air enters between the lower surface of the anode 2098 and the plating liquid impregnated material 2110 to cause poor plating.

When the impregnated material 2110 has a sufficient strength such as a porous ceramics, the anode may be placed on the impregnated material without using pins for fixing the impregnated material.

When the substrate holder 2036 is in the plating position B (see FIG. 86), the electrode head 2028 is lowered until the gap between the substrate W held by the substrate holder 2036 and the plating liquid impregnated material 2110 becomes about 0.5 to 3 mm, for example. Then, the plating liquid is supplied from the plating liquid supply pipe 2102 to fill the gap between the upper surface, to be plated, of the substrate W and the anode 2098 while impregnating the plating liquid impregnated material 2110 with the plating liquid, thus plating the upper surface of the substrate W.

FIG. 5 is a schematic view of the substrate cleaning device 40. As shown in FIG. 5, the substrate W, such as a substrate, having a circuit formed in areas excluding a peripheral edge portion of its surface is gripped by spin chucks 120 at a plurality of locations along the circumferential direction of the peripheral edge portion, and horizontally held by a substrate holder 122. Thus, the substrate W is adapted to rotate horizontally at a high speed. The substrate may be held vertically by a holding mechanism, but its horizontal holding will be described herein. A center nozzle 124 is disposed downwardly above a nearly central part of the surface of the substrate W held by the substrate holder 122, and an edge nozzle 126 is disposed downwardly above the peripheral edge portion of the surface of the substrate. Furthermore, two back nozzles 128 and 130 are disposed upwardly beneath a nearly central part of the back side of the substrate W. The peripheral edge portion of the substrate refers to an area at the peripheral edge of the substrate where no circuit has been formed, or an area at the peripheral edge of the substrate where a circuit has been formed and which is finally not used as a chip. The center nozzle 124 can be installed at a desired position between the center and the peripheral edge portion of the surface of the substrate, but a feed solution from the nozzle is supplied to the center of the substrate. The center of the substrate refers to, preferably, within 20% of the diameter of the substrate, more preferably within 10% of the diameter of the substrate. Similarly, the back nozzles 128, 130 can be installed at desired positions between the center and the peripheral edge portion of the back side of the substrate, but the feed solution from the nozzles is preferably supplied to the center of the substrate.

As shown in FIG. 6, there may be one back nozzle 128 provided, and the edge nozzle 126 may be movable vertically or movable horizontally along the diametrical direction of the substrate W so that a height H from the substrate W or a range of movement width L, in the horizontal direction is adjustable. Moreover, the periphery of the substrate holder 122 may be surrounded with a waterproof cover 132. Besides, a fixed nozzle (not shown) may be installed on an intra-device side surface of the waterproof cover 132 or the like, and pure water, de-ionized water or other chemical solution (an acid solution, an alkali solution, a surface active agent, or a corrosion inhibitor) may be supplied to the substrate according to the purpose.

Next, a cleaning method by this cleaning device will be described.

First, the substrate W is horizontally rotated integrally with the substrate holder 122, with the substrate W being horizontally held by the substrate holder 122 via the spin chucks 120. In this condition, an acid solution is supplied from the center nozzle 124 to the center of the surface of the substrate W. Even though a natural oxide film of copper has been formed at a circuit formation portion on the surface of the substrate W, this natural oxide film is immediately removed by the acid solution spreading over the entire surface of the substrate W as the substrate W rotates. Thus, the natural oxide film does not grow. For the acid solution, there may be used, for example, any one of, or a combination of, hydrochloric acid, hydrofluoric acid, sulfuric acid, citric acid, and oxalic acid which are generally used in a cleaning step of a semiconductor device manufacturing process. However, the acid solution may be a solution of any non-oxidizing acid. Hydrofluoric acid can be used for cleaning of the back side of the substrate W (to be described later on), and thus is preferred for sharing of the same chemical for different purposes. Also, hydrofluoric acid is preferably in a concentration of 0.1% by weight or more, in consideration of its effect of removing the oxide film. To avoid roughening of the copper surface, its concentration is preferably 5% by weight or less.

On the other hand, an oxidizing agent solution is supplied continuously or intermittently from the edge nozzle 126 to the peripheral edge portion of the substrate W. By this treatment, the copper film, etc. formed on the upper surface and end surface of the peripheral edge portion of the substrate W are rapidly oxidized with the oxidizing agent solution, and etched with the acid solution, which has been simultaneously supplied from the center nozzle 124 and has spread over the entire surface of the substrate W. As a result, the copper film, etc. are dissolved and removed. Etching with the acid solution occurs also at sites other than the location of supply of the oxidizing agent solution, so that the concentration and the amount of supply of the acid solution need not be increased. For the oxidizing agent solution, there may be used, for example, any one of, or a combination of, ozone, hydrogen peroxide, nitric acid, and hypochlorite which are generally used in a cleaning step of a semiconductor device manufacturing process. If an ozone water is used, its amount is preferably 20 ppm or more, but 200 ppm or less. In the case of hydrogen peroxide, its preferred concentration is 10% by weight or more, but 80% by weight or less. If hypochlorite is used, its preferred concentration is 1% by weight or more, but 50% by weight or less.

At the same time, an oxidizing agent solution and an acid solution, such as hydrofluoric acid, are supplied simultaneously or alternately from the back nozzles 128 and 130 to the center of the back side of the substrate W. By this treatment, copper, etc. adhering to the back side of the substrate W can be oxidized with the oxidizing agent solution, along with the silicon of the substrate, and etched away with the acid solution.

In supplying the oxidizing agent solution and the acid solution from the two back nozzles 128 and 130 separately, simultaneously or alternately, if the supply of the oxidizing agent solution is stopped first, a hydrophobic surface is obtained; if the supply of the acid solution is stopped first, a hydrophilic surface is obtained. In either case, the backside of the substrate can be adjusted to one suitable for fulfilling the requirements of the subsequent process.

For the oxidizing agent solution, there can be cited, for example, any one of, or a combination of, ozone, hydrogen peroxide, nitric acid, and hypochlorite, as stated earlier. For the acid solution, there may be used the aforementioned non-oxidizing acid, such as hydrochloric acid, hydrofluoric acid, sulfuric acid, citric acid, or oxalic acid. In addition, copper can be removed with the use of an oxidizing acid, such as nitric acid, because there is no circuit on the back side of the substrate W unlike its face side. If an acid solution of an oxidizing acid such as nitric acid is used, this acid solution itself plays the role of an oxidizing agent solution, so that the oxidizing acid solution can be used alone, without using an oxidizing agent solution. Preferably, the oxidizing agent solution should be the same as the oxidizing agent solution supplied to the peripheral edge portion of the surface of the substrate W in order to decrease the types of the chemicals used.

Figure 7:
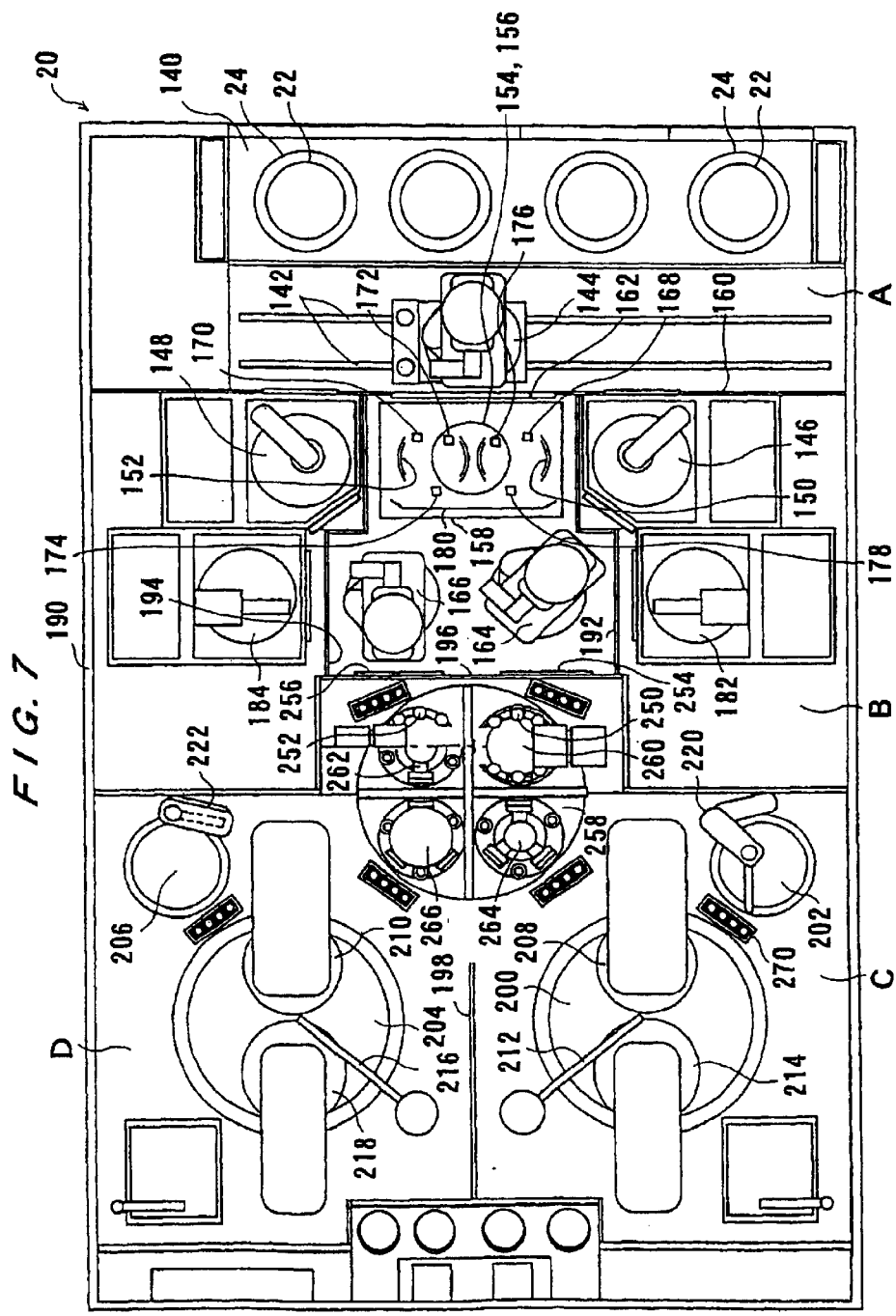
FIG. 7 is an entire layout drawing of a CMP device.

FIG. 7 shows a whole structure of CMP device 20. As shown in FIG. 7, the CMP device 20 comprises a loading/unloading portion 140 for placing substrate transport boxes 24 which house the substrate cassette 24. The loading/unloading portion 140 includes four stages 50 shown in FIG. 3. A transfer robot 144 having two hands is provided on rails 142 so that the transfer robot 144 can move along the rails 142 and access the respective substrate cassettes 22 on the respective loading/unloading stages 50.

The transfer robot 144 has two hands which are located in a vertically spaced relationship, and the lower hand is used only for taking out a substrate from the substrate cassette 22 and the upper hand is used only for returning the substrate to the substrate cassette 22. This arrangement allows that a clean substrate which has been cleaned is placed at an upper side and is not contaminated. The lower hand is a vacuum attraction-type hand for holding a substrate under vacuum, and the upper hand is a recess support-type hand for supporting a peripheral edge of a substrate by a recess formed on the hand. The vacuum attraction-type hand can hold a substrate and transport the substrate even if the substrate is not located at a normal position in the substrate cassette 22 due to a slight displacement, and the recess support-type hand can transport a substrate while keeping the substrate clean because dust is not collected unlike the vacuum attraction-type hand. Two cleaning apparatuses 146 and 148 are disposed at the opposite side of the substrate cassettes 22 with respect to the rails 142 of the transfer robot 144. The cleaning apparatuses 146 and 148 are disposed at positions that can be accessed by the hands of the transfer robot 144. Between the two cleaning apparatuses 146 and 148 and at a position that can be accessed by the transfer robot 144, there is provided a wafer station 158 having four wafer supports 150, 152, 154 and 156. The cleaning apparatuses 146 and 148 have a spin-dry mechanism for drying a substrate by spinning the substrate at a high speed, and hence the two-stage cleaning or three-stage cleaning of the substrate can be conducted without replacing any cleaning module.

An area B in which the cleaning apparatuses 146 and 148 and the wafer station 158 having the wafer supports 150, 152, 154 and 156 are disposed and an area A in which the substrate cassettes 22 and the transfer robot 144 are disposed are partitioned by a partition wall 160 so that the cleanliness of the area B and the area A can be separated. The partition wall 160 has an opening for allowing substrates to pass therethrough, and a shutter 162 is provided at the opening of the partition wall 160. A transfer robot 164 having two hands is disposed at a position where the transfer robot 164 can access the cleaning apparatus 146 and the three wafer supports 150, 154 and 156, and a transfer robot 166 having two hands is disposed at a position where the transfer robot 166 can access the cleaning apparatus 148 and the three wafer supports 152, 154 and 156.

The wafer support 150 is used to transfer a substrate between the transfer robot 144 and the transfer robot 164 and has a sensor 168 for detecting whether there is a substrate or not. The wafer support 152 is used to transfer a substrate between the transfer robot 144 and the transfer robot 166 and has a sensor 170 for detecting whether there is a substrate or not. The wafer support 154 is used to transfer a substrate from the transfer robot 166 to the transfer robot 164, and has a sensor 172 for detecting whether there is a substrate or not and rinsing nozzles 178 for supplying a rinsing liquid to prevent a substrate from drying or to conduct rinsing of a substrate. The wafer support 156 is used to transfer a substrate from the transfer robot 164 to the transfer robot 166, and has a sensor 176 for detecting whether there is a substrate or not and rinsing nozzles 178 for supplying a rinsing liquid to prevent a substrate from drying or to conduct rinsing of a substrate. The wafer supports 154 and 156 are disposed in a common water-scatter-prevention cover which has an opening defined therein for transferring substrates therethrough, the opening being combined with a shutter 188. The wafer support 154 is disposed above the wafer support 156, and the wafer support 154 serves to support a substrate which has been cleaned and the wafer support 156 serves to support a substrate to be cleaned, so that the cleaned substrate is prevented from being contaminated by rinsing water which would otherwise fall thereon. The sensors 168, 170, 172 and 174, the rinsing nozzles 174 and 178, and the shutter 180 are schematically shown in FIG. 7, and their positions and shapes are not illustrated exactly.

The transfer robot 164 and the transfer robot 166 have the respective two hands which are located in a vertically spaced relationship. The respective upper hands of the transfer robot 164 and the transfer robot 166 are used for transporting a substrate which has been cleaned to the cleaning apparatuses or the wafer supports of the wafer station 158, and the respective lower hands of the transfer robot 164 and the transfer robot 166 are used for transporting a substrate which has not cleaned or a substrate to be polished. Since the lower hand is used to transfer a substrate to or from a reversing device, the upper hand is not contaminated by drops of a rinsing water which fall from an upper wall of the reversing device.

A cleaning apparatus 182 is disposed at a position adjacent to the cleaning apparatus 146 and accessible by the hands of the transfer robot 164, and another cleaning apparatus 184 is disposed at a position adjacent to the cleaning apparatus 148 and accessible by the hands of the transfer robot 166.

All the cleaning apparatuses 146, 148, 182 and 184, the wafer supports 150, 152, 154 and 156 of the wafer station 158, and the transfer robots 164 and 166 are placed in the area B. The pressure in the area B is adjusted so as to be lower than the pressure in the area A. Each of the cleaning apparatuses 182 and 184 is capable of cleaning both surfaces of a substrate.

The CMP device 20 has a housing 190 composed of partition walls for enclosing various components therein. The housing 190 constitutes an enclosing structure. The interior of the housing 190 is partitioned into a plurality of compartments or chambers (including the areas A and B) by partitions 160, 192, 194, 196 and 198.

A polishing chamber separated from the area B by the partition wall 198 is formed, and is further divided into two areas C and D by the partition wall 198. In each of the two areas C and D, there are provided two turntables, and a top ring for holding a substrate and pressing the substrate against the turntables during polishing. That is, the turntables 200 and 202 are provided in the area C, and the turntables 204 and 206 are provided in the area D. Further, the top ring 208 is provided in the area C and the top ring 210 is provided in the area D.

An abrasive liquid nozzle 212 for supplying an abrasive liquid to the turntable 200 in the area C and a dresser 214 for dressing the turntable 200 are disposed in the area C. An abrasive liquid nozzle 216 for supplying an abrasive liquid to the turntable 204 in the area D and a dresser 218 for dressing the turntable 204 are disposed in the area D. A dresser 220 for dressing the turntable 202 in the area C is disposed in the area C, and a dresser 222 for dressing the turntable 206 in the area D is disposed in the area D. The turntables 202 and 206 may be replaced with wet-type thickness measuring devices for measuring the thickness of a layer on a substrate. If such wet-type thickness measuring devices are provided, then they can measure the thickness of a layer on a substrate immediately after it is polished, and hence it is possible to further polish the polished substrate or control a polishing process for polishing a next substrate based on the measured value.

Figure 8:
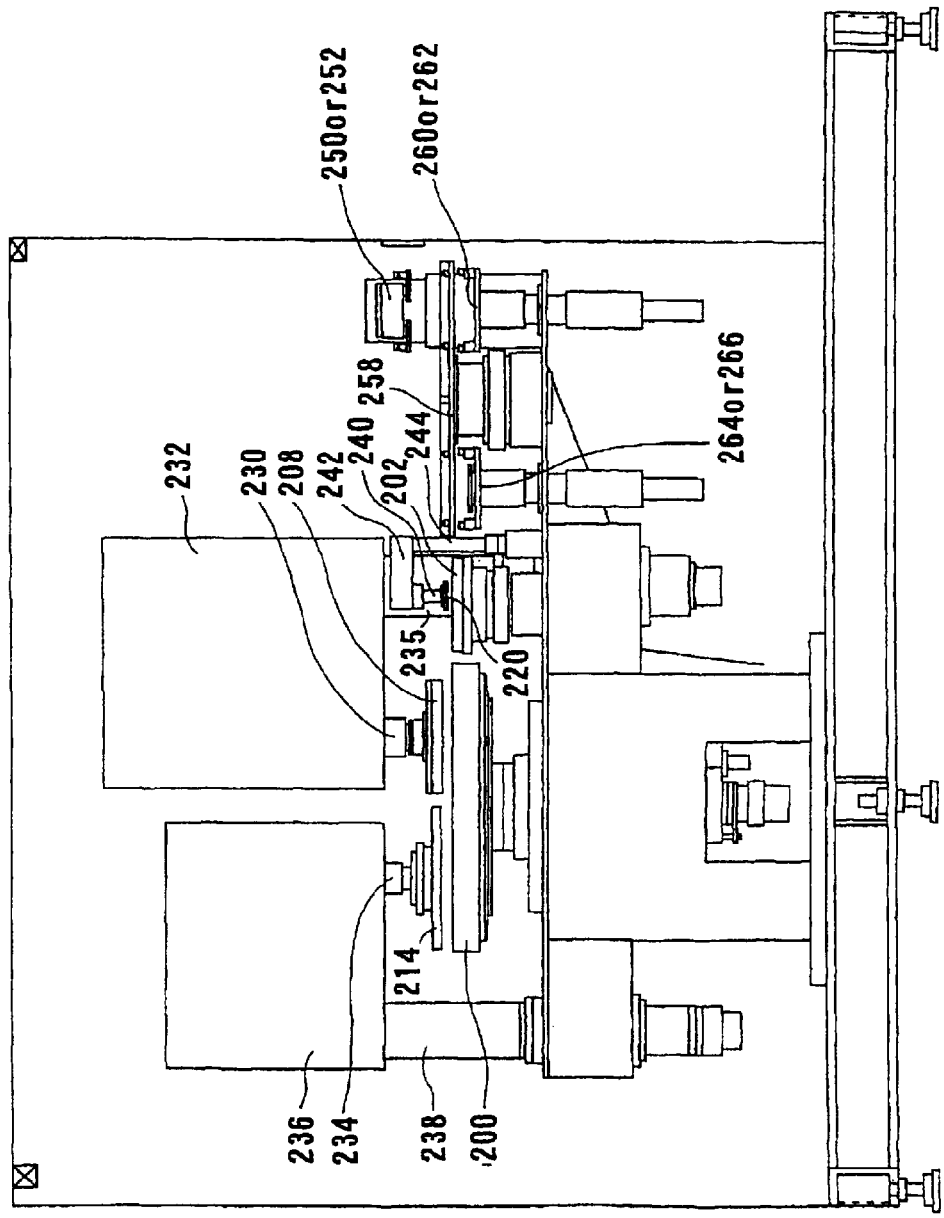
FIG. 8 is a view showing the relationship between a top ring and a polishing table of the CMP device.

FIG. 8 shows the relationship between the top ring 208 and the turntables 200 and 202. The relationship between the top ring 210 and the turntables 204 and 206 is the same as that of the top ring 208 and the turntables 200 and 202. As shown in FIG. 8, the top ring 208 is supported from a top ring head 232 by a top ring drive shaft 230 which is rotatable. The top ring head 232 is supported by a support shaft 235 which can be angularly positioned, and the top ring 210 can access the turntables 200 and 202. The dresser 214 is supported from a dresser head 236 by a dresser drive shaft 234 which is rotatable. The dresser head 236 is supported by an angularly positionable support shaft 238 for moving the dresser 214 between a standby position and a dressing position over the turntable 204. The dresser 220 is similarly supported from a dresser head 242 by a dresser drive shaft 240 which is rotatable. The dresser head 242 is supported by an angularly positionable support shaft 244 for moving the dresser 220 between a standby position and a dressing position over the turntable 202.

As shown in FIG. 7, in the area C separated from the area B by the partition wall 196 and at a position that can be accessed by the hands of the transfer robot 164, there is provided a reversing device 250 for reversing a substrate, and at a position that can be accessed by the hands of the transfer robot 166, there is provided a reversing device 252 for reversing a substrate. The partition wall 196 between the area B and the areas C, D has two openings each for allowing substrates to pass therethrough, one of which is used for transferring the substrate to or from the reversing device 250 and the other of which is used for transferring the substrate to or from the reversing device 252. Shutters 254 and 256 are provided at the respective openings of the partition wall 196.

The reversing devices 250 and 252 have a chuck mechanism for chucking a substrate, a reversing mechanism for reversing a substrate, and a substrate detecting sensor for detecting whether the chuck mechanism chucks a substrate or not, respectively. The transfer robot 164 transfers a substrate to the reversing device 250, and the transfer robot 164 transfers a substrate to the reversing device 252.

A rotary transporter 258 is disposed below the reversing devices 250 and 252, and the top rings 208 and 210, for transferring substrates between the cleaning chamber (area B) and the polishing chamber (areas C and D). The rotary transporter 258 has four stages for placing a substrate at equal angular intervals, and can hold a plurality of substrates thereon at the same time. The substrate which has been transported to the reversing device 250 or 252 is transferred to the rotary transporter 258 by actuating a lifter 260 or 262 disposed below the rotary transporter 258 when the center of the stage of the rotary transporter 258 is aligned with the center of the substrate held by the reversing device 250 or 252. The substrate placed on the stage of the rotary transporter 258 is transported to a position below the top ring 208 or 210 by rotating the rotary transporter 258 by an angle of 90°. At this time, the top ring 208 or 210 is positioned above the rotary transporter 258 beforehand by a swing motion thereof. The substrate is transferred from the rotary transporter 258 to the top ring 208 or 210 by actuating a pusher 264 or 266 disposed below the rotary transporter 258 when the center of the top ring 208 or 210 is aligned with the center of the substrate placed on the stage of the rotary transporter 258.

The substrate transferred to the top ring 208 or 210 is held under vacuum by a vacuum attraction mechanism of the top ring 208 or 210, and transported to the turntable 200 or 204. Thereafter, the substrate is polished by a polishing surface comprising a polishing cloth or a grinding stone (or a fixed abrasive plate) attached on the turntable 200 or 204. The second turntables 202 and 206 are disposed at positions that can be accessed by the top rings 208 and 210, respectively. With this arrangement, a primary polishing of the substrate can be conducted by the first turntable 200 or 204, and then a secondary polishing of the substrate can be conducted by the second turntable 202 or 206. Alternatively, the primary polishing of the substrate can be conducted by the second turntable 202 or 206, and then the secondary polishing of the substrate can be conducted by the first turntable 200 or 204. In this case, since the second turntable 202 or 206 has a smaller-diameter polishing surface than the first turntable 200 or 204, a grinding stone (or a fixed abrasive plate) which is more expensive than a polishing cloth is attached to the second turntable 202 or 206 to thereby conduct a primary polishing of the substrate. On the other hand, the polishing cloth having a shorter life but being cheaper than the grinding stone (or the fixed abrasive plate) is attached to the first turntable 200 or 204 to thereby conduct a finish polishing of the substrate. This arrangement or utilization may reduce the running cost of the polishing apparatus. If the polishing cloth is attached to the first turntable and the grinding stone (or fixed abrasive plate) is attached to the second turntable, then the turntable system may be provided at a lower cost. This is because the grinding stone (or the fixed abrasive plate) is more expensive than the polishing cloth, and the price of the grinding stone (or the fixed abrasive plate) is substantially proportional to the diameter of the grinding stone. Further, since the polishing cloth has a shorter life than the grinding stone (or the fixed abrasive plate), if the polishing cloth is used under a relatively light load such as a finish polishing, then the life of the polishing cloth is prolonged. Further, if the diameter of the polishing cloth is large, the chance or frequency of the contact with the substrate is distributed to thus provide a longer life, a longer maintenance period, and an improved productivity of the semiconductor devices.

After a substrate is polished by the first turntable 200 and before the top ring 208 moves to the second turntable 202, a cleaning liquid is supplied from cleaning liquid nozzles 270 disposed adjacent to the turntable 200 to the substrate held by the top ring 208 at a position where the top rind 208 is spaced from the turntable 200. Because the substrate is rinsed before moving to the second turntable 202, the transfer of contamination between the turntables is prevented to thus avoid cross contamination of the turntables.

Further, two-stage polishing can be performed in such a manner that a polishing cloth sold under the tradename of IC1000/SUBA400 manufactured by Rodel Nitta corporation is used for the first polishing surface and a polishing cloth sold under the tradename of POLITEX manufactured by Rodel Nitta corporation is used for the second polishing surface, and the substrate is first polished by the first polishing surface, and then polished by the second polishing surface. This two-stage polishing may be carried out by the use of the two large-sized turntables even if the small-sized second turntable is not used. In the above, although the two-stage polishing has been described as being conducted by two different polishing cloths, it may be conducted by the same polishing cloth or the same grinding stone. After the substrate is polished by the first polishing surface and the second polishing surface, the first and second polishing surfaces are dressed by the dressers 214, 218, 220 and 222, respectively. The dressing process is a process for recovering the polishing surface of the turntable which has been degraded by polishing of the substrates. This process is also called conditioning or rectification.

The substrate which has been polished is returned to the reversing device 250 or 252 in the reverse route to the above. The substrate returned to the reversing device 250 or 252 is rinsed by pure water or chemicals supplied from rinsing nozzles. Further, the substrate holding surface of the top ring 208 or 210 from which the substrate has been removed is also cleaned by pure water or chemicals supplied from cleaning nozzles, and in some cases, the substrate holding surface of the top ring 208 or 210 is rinsed for preventing the substrate holding surface from being dried. A cleaning nozzle or nozzles for cleaning the pusher are provided on the partition wall. In order to improve yield of the semiconductor device or cleaning effect of the substrate, the substrate may be rinsed by chemicals in such a state that the substrate is held by the top ring 208 or 210. Further, the substrate may be rinsed by chemicals in such a state that the substrate is held by the rotary transporter 258. Further, the lifter 260 or 262 may be cleaned by nozzles (described later).

On the right side of FIG. 8, the relationship of the rotary transporter 258, the reversing device 250 or 252, the lifter 260 or 262, and the pusher 264 or 266 is shown. As shown in FIG. 8, the reversing unit 250 or 252 is disposed above the rotary transporter 258, and the lifters 260 or 262 and the pushers 264 or 266 are disposed below the rotary transporter 258.

Next, transport routes for transporting substrates will be described.

All software is constructed such that all units or devices are freely combined and set in normal processing routes of the substrates in the polishing apparatus. Examples of the processing routes are the following:

1) Method (2 cassette parallel processing) in which substrates in one substrate cassette 22 are processed in one of the two areas C and D, and substrates in another substrate cassette 22 are processed in the other of the two areas C and D;

2) Method (1 cassette parallel processing) in which substrates in one substrate cassette 22 are distributed into the area C and the area D arbitrarily; and 3) Method (serial processing) in which substrates in one substrate cassette 22 are processed in one of the areas C and D, and then processed in the other of the areas C and D.

In the cleaning chamber, polished substrates discharged from the polishing chambers are processed according to any one of the following six processes:

A) Process in which substrates are cleaned in two-stages by two arrays of cleaning apparatuses and discharged, i.e., from the cleaning apparatus 182 to the cleaning apparatus 146 and from the cleaning apparatus 184 to the cleaning apparatus 148;

B) Process in which substrates are cleaned in three-stages by one array of cleaning apparatuses and discharged, i.e., from the cleaning apparatus 184 to the cleaning apparatus 148 and then to the cleaning apparatus 146 or in three-stages by one array of cleaning apparatuses and discharged, i.e., from the cleaning apparatus 182 to the cleaning apparatus 184 or 148 and then to the cleaning apparatus 146;

C) Process in which substrates are cleaned in three-stages and discharged, i.e., in one-stage by two cleaning apparatuses, i.e., either one of the cleaning apparatuses 182, 184 where no cleaning is being conducted, and in two-stages by one array of cleaning apparatuses, i.e., from the cleaning apparatus 148 to the cleaning apparatus 146;

D) Process in which substrates are cleaned in four-stages by one array of cleaning apparatuses and discharged, i.e., from the cleaning apparatus 184 to the cleaning apparatus 148 and then to the cleaning apparatus 182 and then to the cleaning apparatus 146;

E) Process in which substrates are cleaned in four-stages by one array of cleaning apparatuses and discharged, i.e., from the cleaning apparatus 182 to the cleaning apparatus 184 and then to the cleaning apparatus 148 and then to the cleaning apparatus 146; and F) Process in which substrates are cleaned in three-stages by one array of cleaning apparatuses and discharged, i.e., from the cleaning apparatus 184 to the cleaning apparatus 148 and then to the cleaning apparatus 146, after the substrates which have been polished in a first stage are cleaned by the cleaning apparatus 182 and then polished again in a second stage.

Combinations of the methods 1)–3) and the processes A)–F) provide their respective features as follows:

(1-A):

This combination is effective in a case where different processes are carried out for two substrate cassettes and a case where a plurality of lots of substrates are discharged at a high throughput. If different processes are carried out for the two substrate cassettes, then an apparatus configuration or arrangement provided by a combination of two dry-in and dry-out type polishing apparatuses, for example, is employed. Since this combination offers the greatest throughput, it is used to achieve a higher production capability with the same process being carried out on substrates from the two substrate cassettes.

(2-A):

This combination is effective to process substrates in one substrate cassette in a short period of time. This combination also allows substrates in one substrate cassette to be processed in two arbitrary different types of processes.

(3-A):

In the case where the time required to clean a substrate in at least one of the two cleaning stages is longer than the time required to polish a substrate in either one of the two polishing stages, if the two cleaning stages are carried out by one array of cleaning apparatuses, then the polishing capability is lowered because of the long cleaning time. In this case, if the two cleaning stages are carried out by two arrays of cleaning apparatuses, then polished substrates can be delivered without being affected by the cleaning time. This combination is highly effective in this case.

(1-B):

This combination is used in a case where three or more types of cleaning process are required after the polishing process. Since the cleaning process is carried out by one array of cleaning apparatuses, the processing capability of the cleaning process according to this combination is reduced, and the combination is highly effective in a case where the polishing time is longer than the cleaning time.

(2-B):

This combination is used in a case where only one lot is processed, but not a plurality of lots are processed at once as with the combination (1-B), and offers the same advantages as with the combination (1-B).

(3-B):

This combination is used in a case where three cleaning stages are needed as with the combination (1-B).

(1-C):

This combination offers the same advantages as with the combination (1-B). If the cleaning time in the first cleaning stage is longer than the processing time in another wafer processing unit, then the first cleaning stage is carried out by two cleaning apparatuses for preventing substrates from being jammed at the first cleaning apparatus, thereby increasing the processing capability.

(2-C):

As with the combination (1-C), this combination is used for the same reason as the combination (2-B).

(3-C):

As with the combination (1-C), this combination is used for the same reason as the combination (3-B).

(1, 2, 3-D, E):

This combination is used in a case where four cleaning stages are required in addition to the use of the respective polishing chambers.

(3-F):

In the two-stage polishing process, this combination is used to transport substrates through a cleaning process before the second polishing stage for preventing the substrates to which the abrasive liquid used in the first polishing stage is attached from being polished in the second polishing stage.

As described above, since the polishing apparatus according to the present invention has the two polishing sections having the respective turntables 200 and 204, one of the polishing sections can be inspected and serviced for maintenance while the polishing apparatus is in operation using the other polishing section.

A cleaning section has the cleaning apparatuses 146, 148, 182 and 184 for cleaning substrates. While the polishing apparatus is in operation using at least one of the cleaning apparatuses, the other cleaning apparatuses can be inspected and serviced for maintenance.

Figure 9:
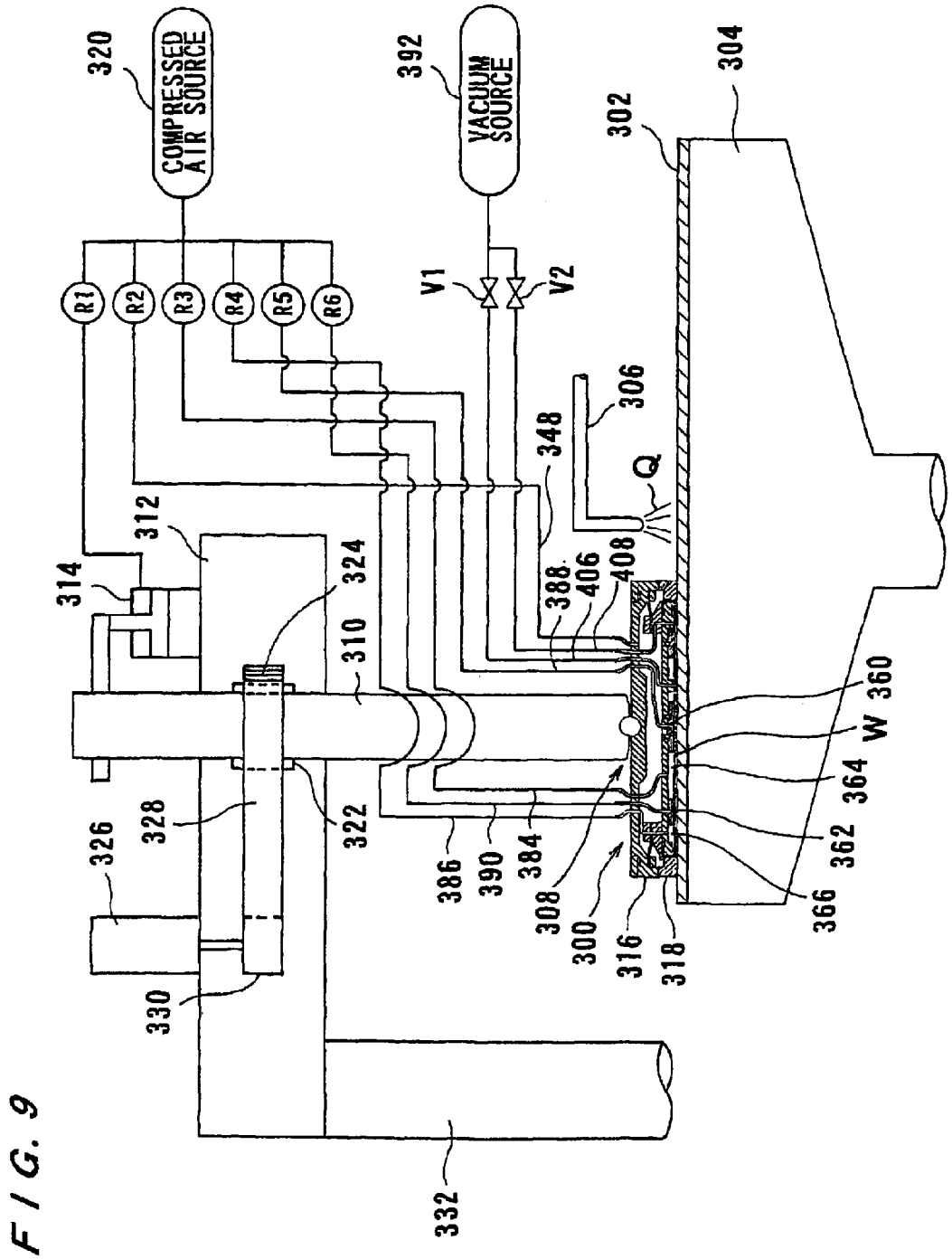
FIG. 9 is a cross-sectional view showing a relationship between a top ring and a polishing table of the CMP device.

FIG. 9 is a cross-sectional view showing a relationship between a top ring and a polishing table of the CMP device. As shown in FIG. 9, a polishing table 304 is disposed underneath a top ring 300, and has a polishing pad 302 attached to an upper surface thereof. A polishing liquid supply nozzle 306 is disposed above the polishing table 304 and supplies a polishing liquid Q onto the polishing pad 302 on the polishing table 304.

Various kinds of polishing pads are sold on the market. For example, some of these are SUBA800, IC-1000, and IC-1000/SUBA400 (two-layer cloth) manufactured by Rodel Inc., and Surfin xxx-5 and Surfin 000 manufactured by Fujimi Inc. SUBA800, Surfin xxx-5, and Surfin 000 are non-woven fabrics bonded by urethane resin, and IC-1000 is rigid foam polyurethane (single-layer). Foam polyurethane is porous and has a large number of fine recesses or holes formed in its surface.

The top ring 300 is connected to a top ring drive shaft 310 by a universal joint 308. The top ring drive shaft 310 is coupled to a top ring air cylinder 314 fixed to a top ring head 312. The top ring air cylinder 314 operates to vertically move the top ring drive shaft 310 to thus lift and lower the top ring 300 as a whole. The top ring air cylinder 314 also operates to press a retainer ring 318 fixed to the lower end of a top ring body 316 against the polishing table 304. The top ring air cylinder 314 is connected to a compressed air source (fluid source) 320 via a regulator R1, which regulates the pressure of air supplied to the top ring air cylinder 314 for thereby adjusting a pressing force with which the retainer ring 318 presses the polishing pad 302.

The top ring drive shaft 310 is connected to a rotary sleeve 322 by a key (not shown). The rotary sleeve 322 has a timing pulley 324 fixedly disposed therearound. A top ring motor 326 having a drive shaft is fixed to the upper surface of the top ring head 312. The timing pulley 328 is operatively coupled to a timing pulley 324 mounted on the drive shaft of the top ring motor 326 by a timing belt 328. When the top ring motor 326 is energized, the timing pulley 330, the timing belt 328, and the timing pulley 324 are rotated to rotate the rotary sleeve 322 and the top ring drive shaft 310 in unison, thus rotating the top ring 300. The top ring head 312 is supported on a top ring head shaft 332 fixedly supported on a frame (not shown).

Figure 10:
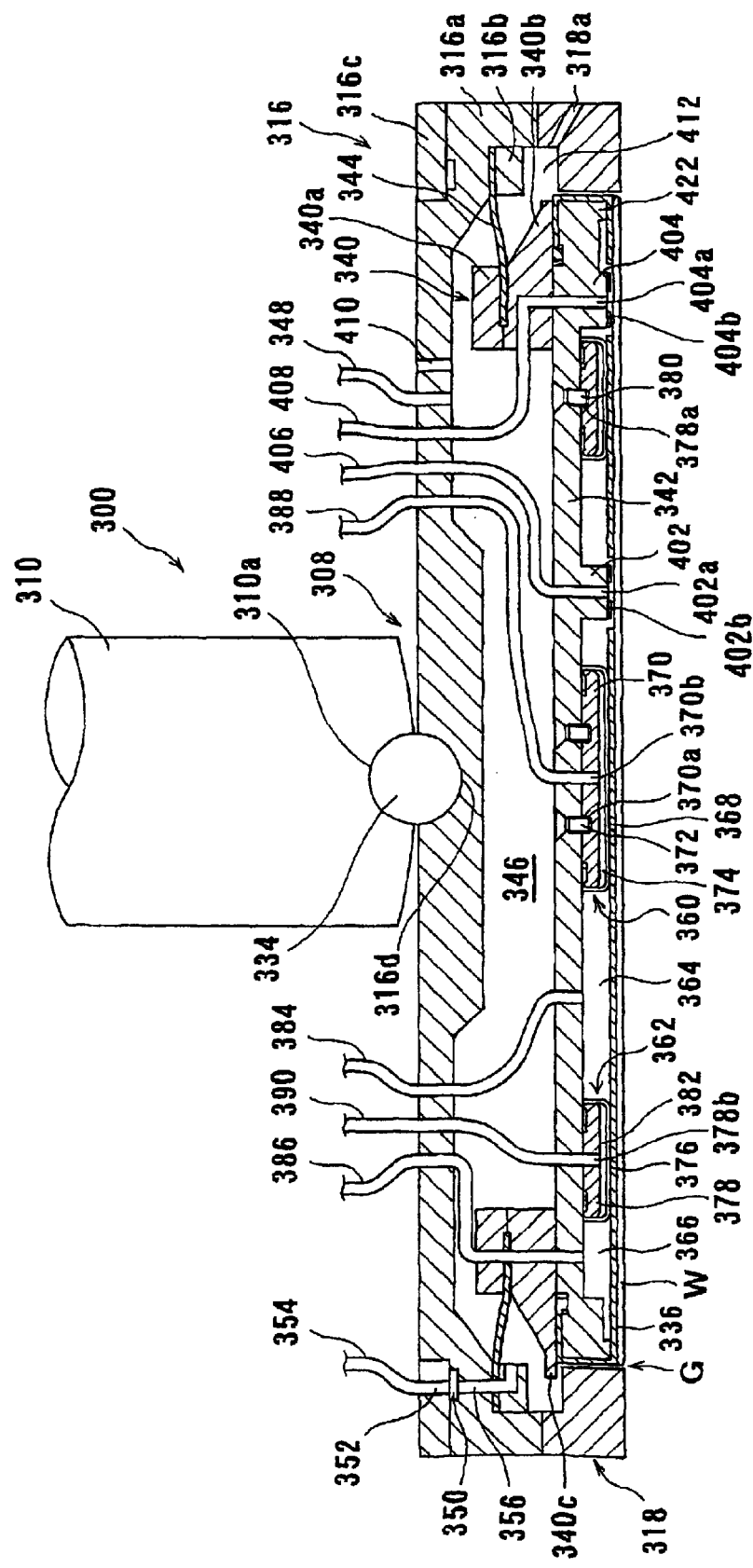
FIG. 10 is a vertical cross-sectional view showing the top ring shown in FIG. 9.

FIG. 10 is a vertical cross-sectional view showing the top ring 300, and FIG. 11 is a bottom view of the top ring 300 shown in FIG. 10. As shown in FIG. 10, the top ring 300 comprises the top ring body 316 in the form of a cylindrical housing with a storage space defined therein, and the retainer ring 318 fixed to the lower end of the top ring body 316. The top ring body 316 is made of a material having high strength and rigidity, such as metal or ceramics. The retainer ring 318 is made of highly rigid synthetic resin, ceramics, or the like.

The top ring body 316 comprises a cylindrical housing 316a, an annular pressurizing sheet support 316b fitted in the cylindrical housing 316a, and an annular seal 316c fitted over an outer circumferential edge of an upper surface of the cylindrical housing 316a. The retainer ring 316 is fixed to the lower end of the cylindrical housing 316a and has a lower portion projecting radially inwardly. The retainer ring 318 may be integrally formed with the top ring body 316.

The top ring drive shaft 310 is disposed above the center of the cylindrical housing 316a of the top ring body 316. The top ring body 316 is coupled to the top ring drive shaft 310 by the universal joint 310. The universal joint 310 has a spherical bearing mechanism by which the top ring body 316 and the top ring drive shaft 310 are tiltable with respect to each other, and a rotation transmitting mechanism for transmitting the rotation of the top ring drive shaft 310 to the top ring body 316. The rotation transmitting mechanism and the spherical bearing mechanism transmit pressing and rotating forces from the top ring drive shaft 310 to the top ring body 316 while allowing the top ring body 316 and the top ring drive shaft 310 to be tilted with respect to each other.

The spherical bearing mechanism comprises a spherical recess 310a defined centrally in the lower surface of the top ring drive shaft 310, a spherical recess 316d defined centrally in the upper surface of the housing 316a, and a bearing ball 334 made of a highly hard material such as ceramics and interposed between the spherical recesses 310a and 316d. The rotation transmitting mechanism comprises a drive pin (not shown) fixed to the top ring drive shaft 310, and a driven pin (not shown) fixed to the housing 316a. The drive pin is held in driving engagement with the driven pin while the drive pin and the driven pin are being vertically movable relatively to each other. The rotation of the top ring drive shaft 310 is transmitted to the top ring body 316 through the drive and driven pins. Even when the top ring body 316 is tilted with respect to the top ring drive shaft 310, the drive and driven pins remain in engagement with each other at a moving point of contact, so that the torque of the top ring drive shaft 310 can reliably be transmitted to the top ring body 316.

The top ring body 316 and the retainer ring 318 secured to the top ring body 316 jointly have a space defined therein, which accommodates therein an elastic pad 336 having a lower end surface brought into contact with the upper surface of the substrate W held by the top ring 300, an annular holder ring 340, and a disk-shaped chucking plate (support member) 342 for supporting the elastic pad 336. The elastic pad 336 has a radially outer edge clamped between the holder ring 340 and the chucking plate 342 secured to the lower end of the holder ring 340 and extends radially inwardly so as to cover the lower surface of the chucking plate 342, thus forming a space between the elastic pad 336 and the chucking plate 342.

The chucking plate 342 may be made of metal. However, when the thickness of a thin film formed on a surface of a substrate is measured by a method using eddy current in such a state that the substrate to be polished is held by the top ring, the chucking plate 342 should preferably be made of a non-magnetic material, e.g., an insulating material such as fluororesin or ceramics.

A pressurizing sheet 344, which comprises an elastic membrane, extends between the holder ring 340 and the top ring body 316. The pressurizing sheet 344 has a radially outer edge clamped between the housing 316a and the pressurizing sheet support 316b of the top ring body 316, and a radially inner edge clamped between an upper portion 340a and a stopper 340b of the holder ring 340. The top ring body 316, the chucking plate 342, the holder ring 340, and the pressurizing sheet 344 jointly define a pressure chamber 346 in the top ring body 316. As shown in FIG. 10, a fluid passage 348 comprising tubes and connectors communicates with the pressure chamber 346, which is connected to the compressed air source 320 via a regulator R2 connected to the fluid passage 348. The pressurizing sheet 344 is made of a highly strong and durable rubber material such as ethylene propylene rubber (ethylene-propylene terpolymer (EPDM)), polyurethane rubber, silicone rubber, or the like.

In the case of a pressurizing sheet 344 made of an elastic material such as rubber, if the pressurizing sheet 344 is clamped between the retainer ring 318 and the top ring body 316, then the pressurizing sheet 344 is elastically deformed as an elastic material, and a desired horizontal surface cannot be maintained on the lower surface of the retainer ring 318. In order to maintain the desired horizontal surface on the lower surface of the retainer ring 318, the pressurizing sheet 344 is clamped between the housing 316a of the top ring body 316 and the pressurizing sheet support 316b provided as a separate member in the present embodiment. The retainer ring 318 may vertically be movable with respect to the top ring body 316, or the retainer ring 318 may have a structure capable of pressing the polishing surface independently of the top ring body 316. In such cases, the pressurizing sheet 344 is not necessarily fixed in the aforementioned manner.

A cleaning liquid passage 350 in the form of an annular groove is defined in the upper surface of the housing 316a near its outer circumferential edge over which the seal 316c is fitted. The cleaning liquid passage 350 communicates with a fluid passage 354 via a through hole 352 formed in the seal 316c, and is supplied with a cleaning liquid (pure water) via the fluid passage 354. A plurality of communication holes 356 are defined in the housing 316a and the pressurizing sheet support 316b in communication with the cleaning liquid passage 350. The communication holes 356 communicate with a small gap G defined between the outer circumferential surface of the elastic pad 336 and the inner circumferential surface of the retainer ring 318. The fluid passage 354 is connected to a cleaning liquid source (not shown) through a rotary joint (not shown).

The space defined between the elastic pad 336 and the chucking plate 342 accommodates therein a central bag 360 as a central contact member brought into contact with the elastic pad 336, and a ring tube 362 as an outer contact member brought into contact with the elastic pad 336. These contact members may be brought into abutment against the elastic pad 336. In the present embodiment, as shown in FIGS. 10 and 11, the central bag 360 having a circular contact surface is disposed centrally on the lower surface of the chucking plate 342, and the ring tube 362 having an annular contact surface is disposed radially outwardly of the central bag 360 in surrounding relation thereto. Specifically, the central bag 360 and the ring tube 362 are spaced at predetermined intervals. Each of the elastic pad 336 and the central bag 360 and the ring tube 362 is made of a highly strong and durable rubber material such as ethylene propylene rubber (ethylene-propylene terpolymer (EPDM)), polyurethane rubber, silicone rubber, or the like.

The space defined between the chucking plate 342 and the elastic pad 336 is divided into a plurality of spaces (second pressure chambers) by the central bag 360 and the ring tube 362. Specifically, a pressure chamber 364 is defined between the central bag 360 and the ring tube 362, and a pressure chamber 366 is defined radially outwardly of the ring tube 362.

The central bag 360 comprises an elastic membrane 368 brought into contact with the upper surface of the elastic pad 336, and a central bag holder (holding member) 370 for detachably holding the elastic membrane 368 in position. The central bag holder 370 has threaded holes 370a defined therein, and is detachably fastened to the center of the lower surface of the chucking plate 342 by screws 372 threaded into the threaded holes 370a. The central bag 360 has a central pressure chamber 374 (first pressure chamber) defined therein by the elastic membrane 368 and the central bag holder 370.

Similarly, the ring tube 362 comprises an elastic membrane 376 brought into contact with the upper surface of the elastic pad 336, and a ring tube holder (holding member) 378 for detachably holding the elastic membrane 376 in position. The ring tube holder 378 has threaded holes 378a defined therein, and is detachably fastened to the lower surface of the chucking plate 342 by screws 380 threaded into the threaded holes 378a. The ring tube 362 has an intermediate pressure chamber 382 (first pressure chamber) defined therein by the elastic membrane 376 and the ring tube holder 378.

Fluid passages 384, 386, 388 and 390 comprising tubes and connectors communicate with the pressure chambers 364, 366, the central pressure chamber 374, and the intermediate pressure chamber 382, respectively. The pressure chambers 364, 366, 374 and 382 are connected to the compressed air source 320 via respective regulators R3, R4, R5 and R6 connected respectively to the fluid passages 384, 386, 388 and 390. The fluid passages 348, 384, 386, 388 and 390 are connected to the respective regulators R2, R3, R4, R5 and R6 through a rotary joint (not shown) mounted on the upper end of the top ring drive shaft 310.

The pressure chamber 346, 364, 366, 374 and 382 are supplied with a pressurized fluid such as pressurized air or atmospheric air or evacuated, via the fluid passages 348, 384, 386, 388 and 390. As shown in FIG. 9, the regulators R2 to R6 connected to the fluid passages 348, 384, 386, 388 and 390 of the pressure chambers 346, 364, 366, 374 and 382 can respectively regulate the pressures of the pressurized fluids supplied to the pressure chambers 346, 364, 366, 374 and 382, for thereby independently controlling the pressures in the pressure chambers 346, 364, 366, 374 and 382 or independently introducing atmospheric air or vacuum into the pressure chambers 346, 364, 366, 374 and 382. Thus, the pressures in the pressure chambers 346, 364, 366, 374 and 382 are independently varied with the regulators R2 to R6, so that the pressing forces, which are pressures per unit area for pressing the substrate W against the polishing pad 302, can be adjusted in local areas of the substrate W via the elastic pad 336. In some applications, the pressure chambers 346, 364, 366, 374 and 382 may be connected to a vacuum source 392.

In this case, the pressurized fluid or the atmospheric air supplied to the pressure chambers 364, 366, 374 and 382 may independently be controlled in temperature, for thereby directly controlling the temperature of the substrate from the backside of the surface to be polished. Particularly, when each of the pressure chambers is independently controlled in temperature, the rate of chemical reaction can be controlled in the chemical polishing process of CMP.

As shown in FIG. 11, a plurality of openings 400 are formed in the elastic pad 336. The chucking plate 342 has radially inner suction portions 402 and radially outer suction portions 404 extended downwardly therefrom. The openings 400 positioned between the central bag 360 and the ring tube 362 allow the inner suction portions 402 to be exposed externally, and the openings 400 positioned outside of the ring tube 362 allow the outer suction portions 404 to be exposed externally. In the present embodiment, the elastic pad 336 has eight openings 400 for allowing the eight suction portions 402, 404 to be exposed.

Each of the inner suction portions 402 has a hole 402a communicating with a fluid passage 406, and each of the outer suction portions 404 has a hole 404a communicating with a fluid passage 408. Thus, the inner suction portion 402 and the outer suction portion 404 are connected to the vacuum source 392 such as a vacuum pump via the respective fluid passages 406, 408 and valves V1, V2. When the suction portions 402, 404 are evacuated by the vacuum source 392 to develop a negative pressure at the lower opening ends of the communicating holes 402a, 404a thereof, a substrate W is attracted to the lower ends of the suction portions 402, 404 by the negative pressure. The suction portions 402, 404 have elastic sheets 402b, 404b, such as thin rubber sheets, attached to their lower ends, for thereby elastically contacting and holding the substrate W on the lower surfaces thereof.

As shown in FIG. 10, when the substrate W is polished, the lower ends of the suction portions 402, 404 are positioned above the lower surface of the elastic pad 336, without projecting downwardly from the lower surface of the elastic pad 336. When the substrate W is attracted to the suction portions 402, 404, the lower ends of the suction portions 402, 404 are positioned at the same level as the lower surface of the elastic pad 336.

Since there is the small gap G between the outer circumferential surface of the elastic pad 336 and the inner circumferential surface of the retainer ring 318, the holder ring 340, the chucking plate 342, and the elastic pad 336 attached to the chucking plate 342 can vertically be moved with respect to the top ring body 316 and the retainer ring 318, and hence are of a floating structure with respect to the top ring body 316 and the retainer ring 318. A plurality of teeth 340c project radially outwardly from the outer circumferential edge of the stopper 340b of the holder ring 340. When the teeth 340c engage the upper surface of the radially inwardly projecting portion of the retainer ring 318 upon downward movement of the holder ring 340, the holder ring 340 is limited against any further downward movement.

Operation of the top ring 300 thus constructed will be described below.

When the substrate W is to be delivered to the polishing apparatus, the top ring 300 is moved to a position to which the substrate W is transferred, and the communicating holes 402a, 404a of the suction portions 402, 404 are evacuated via the fluid passages 406, 408 by the vacuum source 392. The substrate W is attracted to the lower ends of the suction portions 402, 404 by suction effect of the communicating holes 402a, 404a. With the substrate W attracted to the top ring 300, the top ring 300 is moved to a position above the polishing table 304 having the polishing surface (polishing pad 302) thereon. The retainer ring 318 holds the outer circumferential edge of the substrate W so that the substrate W is not removed from the top ring 300.

For polishing the lower surface of the substrate W, the substrate W is thus held on the lower surface of the top ring 300, and the top ring air cylinder 314 connected to the top ring drive shaft 310 is actuated to press the retainer ring 318 fixed to the lower end of the top ring 300 against the polishing surface on the polishing table 304 under a predetermined pressure. Then, the pressurized fluids are respectively supplied to the pressure chambers 364, 366, the central pressure chamber 374, and the intermediate pressure chamber 382 under respective pressures, thereby pressing the substrate W against the polishing surface on the polishing table 304. The polishing liquid supply nozzle 306 then supplies the polishing liquid Q onto the polishing pad 302. Thus, the substrate W is polished by the polishing pad 302 with the polishing liquid Q being present between the lower surface, to be polished, of the substrate W and the polishing pad 302.

The local areas of the substrate W that are positioned beneath the pressure chambers 364, 366 are pressed against the polishing pad 302 under the pressures of the pressurized fluids supplied to the pressure chambers 364, 366. The local area of the substrate W that is positioned beneath the central pressure chamber 374 is pressed via the elastic membrane 368 of the central bag 360 and the elastic pad 336 against the polishing pad 302 under the pressure of the pressurized fluid supplied to the central pressure chamber 374. The local area of the substrate W that is positioned beneath the intermediate pressure chamber 382 is pressed via the elastic membrane 376 of the ring tube 362 and the elastic pad 336 against the polishing pad 302 under the pressure of the pressurized fluid supplied to the intermediate pressure chamber 382.

Therefore, the polishing pressures acting on the respective local areas of the substrate W can be adjusted independently by controlling the pressures of the pressurized fluids supplied to each of the pressure chambers 364, 366, 374 and 382. Specifically, each of the regulators R3 to R6 independently regulates the pressure of the pressurized fluid supplied to the pressure chambers 364, 366, 374 and 382 for thereby adjusting the pressing forces applied to press the local areas of the substrate W against the polishing pad 302 on the polishing table 304. With the polishing pressures on the respective local areas of the substrate W being adjusted independently, the substrate W is pressed against the polishing pad 302 on the polishing table 304 that is being rotated. Similarly, the pressure of the pressurized fluid supplied to the top ring air cylinder 314 can be regulated by the regulator R1 to adjust the force with which the retainer ring 318 presses the polishing pad 302. While the substrate W is being polished, the force with which the retainer ring 318 presses the polishing pad 302 and the pressing force with which the substrate W is pressed against the polishing pad 302 can appropriately be adjusted for thereby applying polishing pressures in a desired pressure distribution to a central area C1, an inner area C2, an intermediate area C3, and a peripheral area C4 of the substrate W (see FIG. 11).

The local areas of the substrate W that are positioned beneath the pressure chambers 364, 366 are divided into areas to which a pressing force from a fluid is applied via the elastic pad 336, and areas to which the pressure of a pressurized fluid is directly applied, such as areas positioned beneath the openings 400. However, the pressing forces applied to these two areas are equal to each other. When the substrate W is polished, the elastic pad 336 is brought into close contact with the upper surface of the substrate W near the openings 400, so that the pressurized fluids supplied to the pressure chambers 364, 366 are prevented from flowing out to the exterior.

In this manner, the substrate W is divided into the concentric circular and annular areas C1 to C4, which can be pressed under independent pressing forces. The polishing rates of the circular and annular areas C1 to C4, which depend on the pressing forces applied to those areas, can independently be controlled because the pressing forces applied to those areas can independently be controlled. Consequently, even if the thickness of a thin film to be polished on the surface of the substrate W suffers radial variations, the thin film on the surface of the substrate W can be polished uniformly without being insufficiently or excessively polished. More specifically, even if the thickness of the thin film to be polished on the surface of the substrate W differs depending on the radial position on the substrate W, the pressure in a pressure chamber positioned over a thicker area of the thin film is made higher than the pressure in a pressure chamber positioned over a thinner area of the thin film, or the pressure in a pressure chamber positioned over a thinner area of the thin film is made lower than the pressure in a pressure chamber positioned over a thicker area of the thin film. In this manner, the pressing force applied to the thicker area of the thin film is made higher than the pressing force applied to the thinner area of the thin film, thereby selectively increasing the polishing rate of the thicker area of the thin film. Consequently, the entire surface of the substrate W can be polished exactly to a desired level irrespective of the film thickness distribution obtained at the time the thin film is formed.

Any unwanted edge rounding on the circumferential edge of the substrate W can be prevented by controlling the pressing force applied to the retainer ring 318. If the thin film to be polished on the circumferential edge of the substrate W has large thickness variations, then the pressing force applied to the retainer ring 318 is intentionally increased or reduced to thus control the polishing rate of the circumferential edge of the substrate W. When the pressurized fluids are supplied to the pressure chambers 364, 366, 374 and 382, the chucking plate 342 is subjected to upward forces. In the present embodiment, the pressurized fluid is supplied to the pressure chamber 346 via the fluid passage 348 to prevent the chucking plate 342 from being lifted under the forces from the pressure chambers 364, 366, 374 and 382.

As described above, the pressing force applied by the top ring air cylinder 314 to press the retainer ring 318 against the polishing pad 302 and the pressing forces applied by the pressurized fluids supplied to the pressure chambers 364, 366, 374 and 382 to press the local areas of the substrate W against the polishing pad 302 are appropriately adjusted to polish the substrate W. When the polishing of the substrate W is finished, the substrate W is attracted to the lower ends of the suction portions 402, 404 under vacuum in the same manner as described above. At this time, the supply of the pressurized fluids into the pressure chambers 364, 366, 374 and 382 is stopped, and the pressure chambers 364, 366, 374 and 382 are vented to the atmosphere. Accordingly, the lower ends of the suction portions 402, 404 are brought into contact with the substrate W. The pressure chamber 346 is vented to the atmosphere or evacuated to develop a negative pressure therein. If the pressure chamber 346 is maintained at a high pressure, then the substrate W is strongly pressed against the polishing surface only in areas brought into contact with the suction portions 402, 404. Therefore, it is necessary to decrease the pressure in the pressure chamber 346 immediately. Accordingly, a relief port 410 penetrating through the top ring body 316 may be provided for decreasing the pressure in the pressure chamber 346 immediately, as shown in FIG. 10. In this case, when the pressure chamber 346 is pressurized, it is necessary to continuously supply the pressurized fluid into the pressure chamber 346 via the fluid passage 348. The relief port 410 comprises a check valve (not shown) for preventing an outside air from flowing into the pressure chamber 346 at the time when a negative pressure is developed in the pressure chamber 346.

After the substrate W is attracted to the lower ends of the suction portions 402, 404, the entire top ring 300 is moved to a position to which the substrate W is to be transferred. Then, a fluid such as compressed air or a mixture of nitrogen and pure water is ejected to the substrate W via the communicating holes 402a, 404a of the suction portions 402, 404 to release the substrate W from the top ring 300.

The polishing liquid Q used to polish the substrate W tends to flow through the gap G between the outer circumferential surface of the elastic pad 336 and the retainer ring 318. If the polishing liquid Q is firmly deposited in the gap G, then the holder ring 340, the chucking plate 342, and the elastic pad 336 are prevented from smoothly moving vertically with respect to the top ring body 316 and the retainer ring 318. To avoid such a drawback, a cleaning liquid (pure water) is supplied through the fluid passage 354 to the cleaning liquid passage 350. Accordingly, the pure water is supplied via the communication holes 356 to a region above the gap G, thus cleaning members defining the gap G to remove deposits of the polishing liquid Q. The pure water should preferably be supplied after the polished substrate W is released and until a next substrate to be polished is attracted to the top ring 300. It is also preferable to discharge all the supplied pure water out of the top ring 300 before the next substrate is polished, and hence to provide the retainer ring 318 with a plurality of through holes 318a shown in FIG. 10 for discharging the pure water. Furthermore, if a pressure buildup is developed in a space 412 defined between the retainer ring 318, the holder ring 340, and the pressurizing sheet 344, then it acts to prevent the chucking plate 342 from being elevated in the top ring body 316. Therefore, in order to allow the chucking plate 342 to be elevated smoothly in the top ring body 316, the through holes 318a should preferably be provided for equalizing the pressure in the space 412 with the atmospheric pressure.

As described above, according to the embodiment, the pressures in the pressure chambers 364, 366, the pressure chamber 374 in the central bag 360, and the pressure chamber 382 in the ring tube 362 are independently controlled to control the pressing forces acting on the substrate W. Further, according to the embodiment, regions in which a pressing force applied to the substrate W is controlled can easily be changed by changing positions or sizes of the central bag 360 and the ring tube 362. Examples of changing the regions in which the pressing force applied to the substrate W is controlled will be described below.

FIGS. 12A through 12E and FIG. 13 are vertical cross-sectional views showing other examples of the contact members (central bag 360 and ring tube 362) in the substrate holder of a CMP device.

Figure 12A:
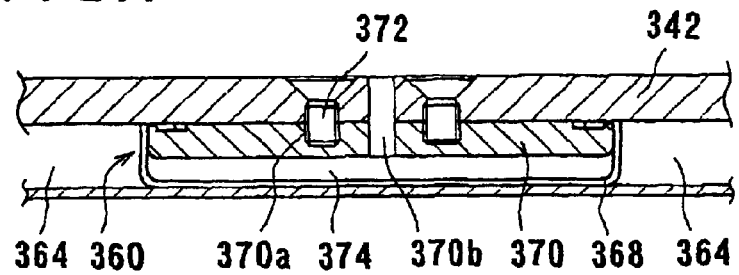
FIGS. 12A through 12E are vertical cross-sectional views showing other examples of contact members (central bag and ring tube) in a top ring of the CMP device.
Figure 12B:
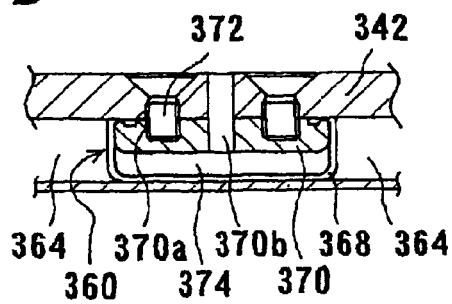

As shown in FIGS. 12A and 12B, the area C1 in which the pressing force applied to the substrate is controlled can be changed by another central bag 360 having a different size. In this case, when the size and shape of a hole 370b for allowing the pressure chamber 374 defined in the central bag 360 to communicate with the fluid passage 388, and the size and position of the threaded holes 370a for mounting the central bag holder 370 on the chucking plate 342 are predetermined, the range in which the pressing force applied to the substrate is controlled can be changed simply by preparing a central bag holder 370 having a different size. In this case, it is not necessary to modify the chucking plate 342.

Figure 12C:
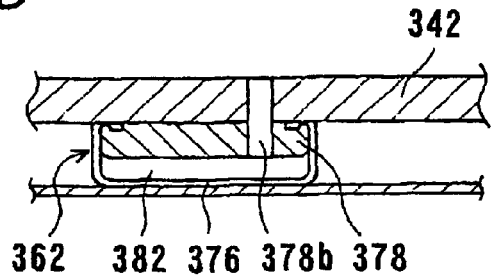
Figure 12D:
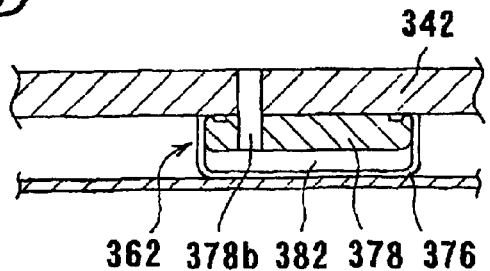
Figure 12E:
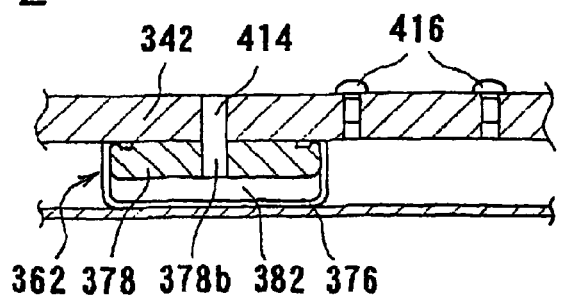

As shown in FIGS. 12C and 12D, the width and/or position of the area C3 in which the pressing force applied to the substrate is controlled can be changed by another ring tube 362 having a different size and/or shape. Further, as shown in FIG. 12E, a plurality of holes 414 and threaded holes (not shown) may be provided in predetermined radial positions of the chucking plate 342. In this case, the communicating hole 378b is positioned at a position corresponding to one of the communicating holes 414, and the other communicating holes (and threaded holes) are filled with screws 416 for sealing fluids. Thus, the ring tube 362 can flexibly be mounted in the radial direction, so that the region in which the pressing force is controlled can flexibly be changed.

As shown in FIG. 13, a protrusion 368a protruding radially outwardly from the circumferential edge of the elastic membrane 368 may be provided on the lower surface of the central bag 360, and protrusions 376a protruding radially from the circumferential edges of the elastic membrane 376 may be provided on the lower surface of the ring tube 362. The protrusions 368a, 376a are made of the same material as the central bag 360 and the ring tube 362. As described above, when the substrate is polished, pressurized fluids are supplied to the pressure chamber 364 positioned between the central bag 360 and the ring tube 362, and the pressure chamber 366 surrounding the ring tube 362. Therefore, the protrusions 368a, 376a are brought into close contact with the elastic pad 336 by the pressurized fluids supplied to the pressure chambers 364, 366. Thus, even if the pressure of the pressurized fluid supplied to the pressure chamber 364 adjacent to the central bag 360 is considerably higher than the pressure of the pressurized fluid supplied to the pressure chamber 374 defined in the central bag 360, the high-pressure fluid adjacent to the central bag 360 is prevented from flowing into the lower portion of the central bag 360. Similarly, even if the pressure of the pressurized fluid supplied to the pressure chamber 364 or 366 adjacent to the ring tube 362 is considerably higher than the pressure of the pressurized fluid supplied to the pressure chamber 382 defined in the ring tube 362, the high-pressure fluid adjacent to the ring tube 362 is prevented from flowing into the lower portion of the ring tube 362. Therefore, the protrusions 368a, 376a can widen the range of pressure control in each of the pressure chambers, for thereby pressing the substrate more stably.

Figure 14A:
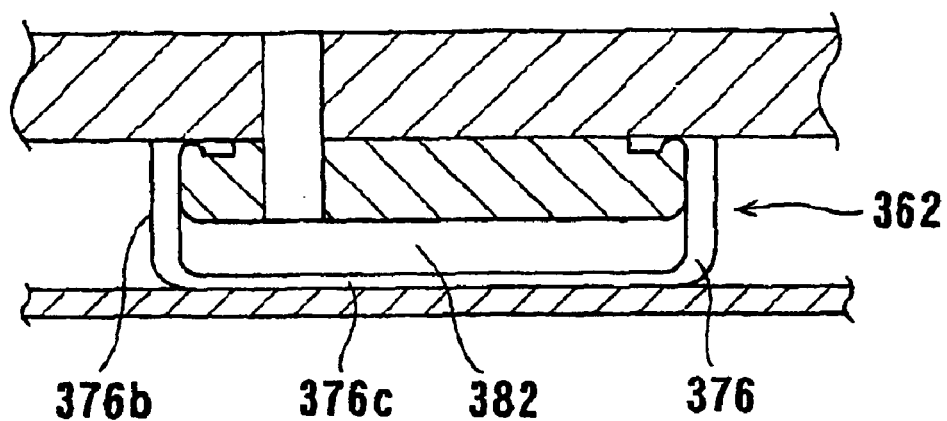
FIGS. 14A and 14B are vertical cross-sectional views showing other examples of contact members (central bag and ring tube) in a top ring of the CMP device.
Figure 14B:
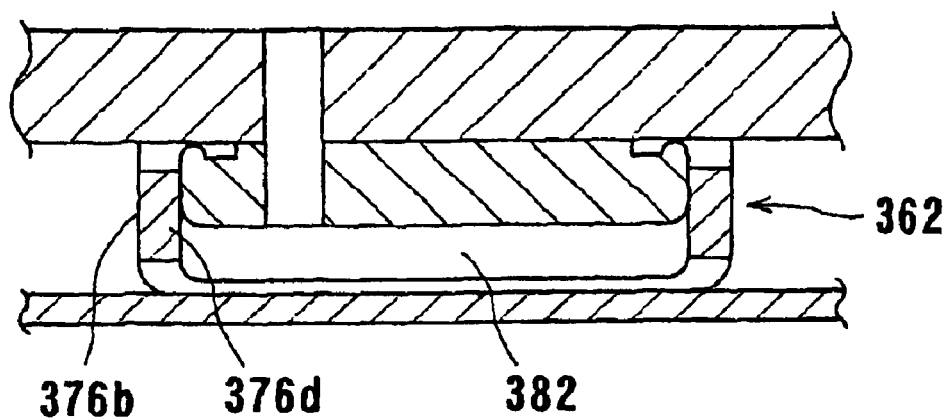

The elastic membrane 368, 376 may have a partially different thickness or may partially include an inelastic member, so that deformations of the elastic membrane 368 of the central bag 360 and of the elastic membrane 376 of the ring tube 362 are ideal. FIG. 14A shows an example in which the elastic membrane 376 of the ring tube 362 has side surfaces 376b thicker than the surface brought into contact with the elastic pad 336. FIG. 14B shows an example in which the elastic membrane 376 of the ring tube 362 partially includes inelastic members 376d in the side surfaces thereof. In these examples, deformation of the side surfaces of the elastic membrane due to the pressure in the pressure chambers can appropriately be limited.

As described above, the distribution of the thin film formed on the surface of the substrate varies depending on a deposition method or a deposition apparatus. According to the embodiment, a substrate holding apparatus can change the position and size of the pressure chambers for applying the pressing force to the substrate simply by change of the central bag 360 and the central bag holder 370, or the ring tube 362 and the ring tube holder 378. Therefore, the position and region in which the pressing force is controlled can easily be changed in accordance with the distribution of the thin film to be polished at low cost. In other words, the substrate holder can cope with various thickness distributions of the thin film formed on the substrate to be polished.

The change of the shape and position of the central bag 360 or the ring tube 362 leads to the change of the size of the pressure chamber 364 positioned between the central bag 360 and the ring tube 362, and the pressure chamber 366 surrounding the ring tube 362.

Figure 15:
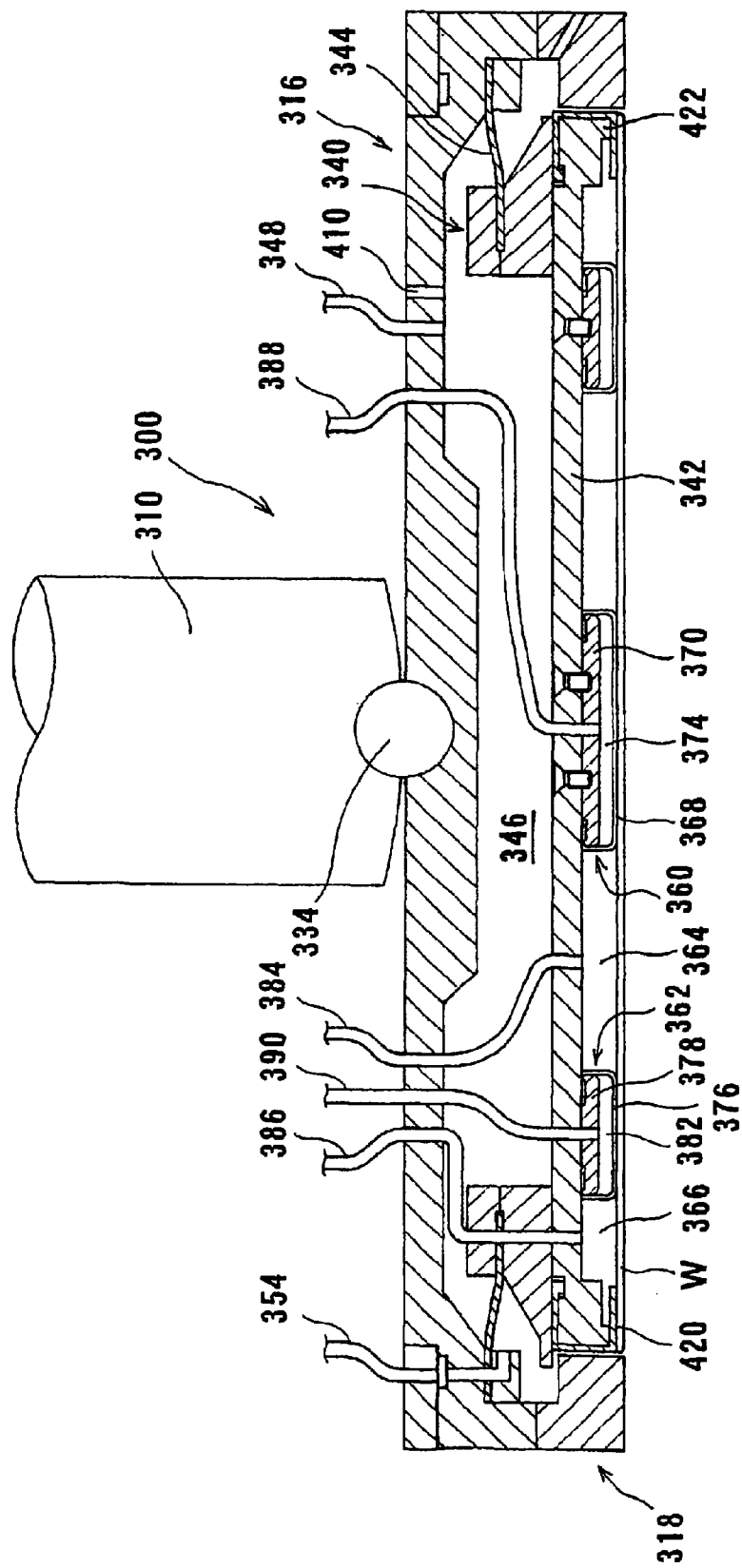
FIG. 15 is a vertical cross-sectional view showing another top ring of the CMP device.

FIG. 15 is a vertical cross-sectional view showing an another top ring 300 of a CMP device. The top ring 300 has a seal ring 420 instead of an elastic pad. The seal ring 420 comprises an elastic membrane covering only a lower surface of a chucking plate 342 near its outer circumferential edge. In this embodiment, neither an inner suction portion (indicated by the reference numeral 402 in FIG. 10) nor an outer suction portion (indicated by the reference numeral 402 in FIG. 10) is provided on the chucking plate 342, for a simple configuration. However, suction portions for attracting a substrate may be provided on the chucking plate 342, as described above. The seal ring 420 is made of a highly strong and durable rubber material such as ethylene propylene rubber (ethylene-propylene terpolymer (EPDM)), polyurethane rubber, silicone rubber, or the like.

The seal ring 420 is provided in such a state that the lower surface of the seal ring 420 is brought into contact with the upper surface of the substrate W. The seal ring 420 has a radially outer edge clamped between the chucking plate 342 and a holder ring 340. The substrate W has a recess defined in an outer edge thereof, which is referred to as a notch or orientation flat, for recognizing or identifying the orientation of the substrate. Therefore, the seal ring 420 should preferably extend radially inwardly from the innermost position of the recess such a notch or orientation flat.

A central bag 360 is disposed centrally on the lower surface of the chucking plate 342, and a ring tube 362 is disposed radially outwardly of the central bag 360 in surrounding relation thereto, as with described above.

In this embodiment, a substrate W to be polished is held by the top ring 300 in such a state that the substrate W is brought into contact with the seal ring 420, an elastic membrane 368 of the central bag 360, and an elastic membrane 376 of the ring tube 362. Therefore, the substrate W, the chucking plate 342, and the seal ring 420 jointly define a space therebetween. This space is divided into a plurality of spaces (second pressure chambers) by the central bag 360 and the ring tube 362. Specifically, a pressure chamber 364 is defined between the central bag 360 and the ring tube 362, and a pressure chamber 366 is defined radially outwardly of the ring tube 362.

Fluid passages 384, 386, 388 and 390 comprising tubes and connectors communicate with the pressure chambers 364, 366, a central pressure chamber (first pressure chamber) 374 defined in the central bag 360, and an intermediate pressure chamber (first pressure chamber) 382 defined in the ring tube 362, respectively. The pressure chambers 364, 366, 374 and 382 are connected to the compressed air source via respective regulators connected respectively to the fluid passages 384, 386, 388 and 390. The regulators connected to the fluid passages 348, 384, 386, 388 and 390 of the pressure chambers 346, 364, 366, 374 and 382 can respectively regulate the pressures of the pressurized fluids supplied to the pressure chambers 346, 364, 366, 374 and 382, for thereby independently controlling the pressures in the pressure chambers 346, 364, 366, 374 and 382 or independently introducing atmospheric air or vacuum into the pressure chambers 346, 364, 366, 374 and 382. Thus, the pressures in the pressure chambers 346, 364, 366, 374 and 382 are independently varied with the regulators, so that the pressing forces can be adjusted in local areas of the substrate W. In some applications, the pressure chambers 346, 364, 366, 374 and 382 may be connected to a vacuum source 392.

Operation of the top ring 300 thus constructed will be described below.

When the substrate W is to be delivered to the polishing apparatus, the top ring 300 is moved to a position to which the substrate W is delivered, and the central bag 360 and the ring tube 362 are supplied with a pressurized fluid under a predetermined pressure for bringing the lower surfaces of the central bag 360 and the ring tube 362 into close contact with the upper surface of the substrate W. Thereafter, the pressure chambers 364, 366 are connected to a vacuum source via the fluid passages 384, 386 to develop a negative pressure in the pressure chambers 364, 366 for thereby attracting the substrate W under vacuum.

For polishing the lower surface of the substrate W, the substrate W is thus held on the lower surface of the top ring 300, and the top ring air cylinder 314 connected to the top ring drive shaft 310 is actuated to press the retainer ring 318 fixed to the lower end of the top ring 300 against the polishing surface on the polishing table 304 under a predetermined pressure. Then, the pressurized fluids are respectively supplied to the pressure chambers 364, 366, the central pressure chamber 374, and the intermediate pressure chamber 382 under respective pressures, thereby pressing the substrate W against the polishing surface on the polishing table 304. The polishing liquid supply nozzle 306 then supplies the polishing liquid Q onto the polishing pad 302. Thus, the substrate W is polished by the polishing pad 302 with the polishing liquid Q being present between the lower surface, to be polished, of the substrate W and the polishing pad 302.

The local areas of the substrate W that are positioned beneath the pressure chambers 364, 366 are pressed against the polishing pad 302 under the pressures of the pressurized fluids supplied to the pressure chambers 364, 366. The local area of the substrate W that is positioned beneath the central pressure chamber 374 is pressed via the elastic membrane 368 of the central bag 360 against the polishing pad 302 under the pressure of the pressurized fluid supplied to the central pressure chamber 374. The local area of the substrate W that is positioned beneath the intermediate pressure chamber 382 is pressed via the elastic membrane 376 of the ring tube 362 against the polishing pad 302 under the pressure of the pressurized fluid supplied to the intermediate pressure chamber 382.

Therefore, the polishing pressures acting on the respective local areas of the substrate W can be adjusted independently by controlling the pressures of the pressurized fluids supplied to each of the pressure chambers 364, 366, 374 and 382. Thus, the substrate W is divided into the concentric circular and annular areas, which can be pressed under independent pressing forces. The polishing rates of the circular and annular areas, which depend on the pressing forces applied to those areas, can independently be controlled because the pressing forces applied to those areas can independently be controlled. Consequently, even if the thickness of a thin film to be polished on the surface of the substrate W suffers radial variations, the thin film on the surface of the substrate W can be polished uniformly without being insufficiently or excessively polished. More specifically, even if the thickness of the thin film to be polished on the surface of the substrate W differs depending on the radial position on the substrate W, the pressure in a pressure chamber positioned over a thicker area of the thin film is made higher than the pressure in a pressure chamber positioned over a thinner area of the thin film, or the pressure in a pressure chamber positioned over a thinner area of the thin film is made lower than the pressure in a pressure chamber positioned over a thicker area of the thin film. In this manner, the pressing force applied to the thicker area of the thin film is made higher than the pressing force applied to the thinner area of the thin film, thereby selectively increasing the polishing rate of the thicker area of the thin film. Consequently, the entire surface of the substrate W can be polished exactly to a desired level irrespective of the film thickness distribution obtained at the time the thin film is formed.

When the substrate W is polished, the seal ring 420 is brought into close contact with a part of the upper surface of the substrate for thereby sealing this space. Hence, the pressurized fluid is prevented from flowing out to the exterior of the pressure chamber 366.

When the polishing of the substrate W is finished, the substrate W is attracted under vacuum in the same manner as described above, and then the pressure chamber 346 is vented to the atmosphere or evacuated to develop a negative pressure therein. After the substrate W is attracted, the entire top ring 300 is moved to a position from which the substrate W is to be delivered. Then, a fluid such as compressed air or a mixture of nitrogen and pure water is ejected to the substrate W via the fluid passages 384, 386 to release the substrate W from the top ring 300. If the elastic membrane 368 of the central bag 360 and the elastic membrane 376 of the ring tube 362 have through holes defined in their lower surfaces, then since downward forces are applied to the substrate W by the fluid flowing through these through holes, the substrate W can be smoothly released from the top ring 300. After the substrate W is released from the top ring 300, most of the lower surface of the top ring 300 is exposed. Therefore, the lower surface of the top ring 300 can be cleaned relatively easily after the substrate W is polished and released.

In the embodiments described above, the fluid passages 348, 384, 386, 388 and 390 are provided as separate passages. However, the arrangement of the fluid passages and the pressure chambers may be modified in accordance with the magnitude of the pressing force to be applied to the substrate W and the position to which the pressing force is applied. For example, these passages may be joined to each other, or the pressure chambers may be connected to each other.

The pressure chambers 364, 366 may be connected to the pressure chamber 346 to form one pressure chamber, without the fluid passage 384 communicating with the pressure chamber 364 and the fluid passage 386 communicating with the pressure chamber 366. In this case, the pressures in the pressure chambers 346, 364, 366 are controlled at an equal pressure by a pressurized fluid supplied via the fluid passage 348. If it is not necessary to provide a pressure difference between the pressure chamber 364 and the pressure chamber 366, and the pressures in the central pressure chamber 374 and the intermediate pressure chamber 382 are not larger than the pressures in the pressure chambers 346, 364, 366, then the above arrangement can be adopted to dispense with the fluid passages 384, 386, for thereby decreasing the number of the fluid passages and simplifying the fluid passages.

When the inner suction portions 402 and the outer suction portions 404 are provided on the chucking plate 342, as shown in FIGS. 10 and 11, not only a vacuum is created in the fluid passages 406, 408 communicating with the suction portions 402, 404, but also pressurized fluids may be supplied to the fluid passages 406, 408. In this case, suction of the substrate in the suction portions 402, 404 and supply of the pressurized fluids to the pressure chambers 364, 366 can be performed with one respective passage. Hence, it is not necessary to provide two fluid passages, i.e., the fluid passages 384, 386, for thereby decreasing the number of the fluid passages and simplifying the fluid passages.

Figure 16:
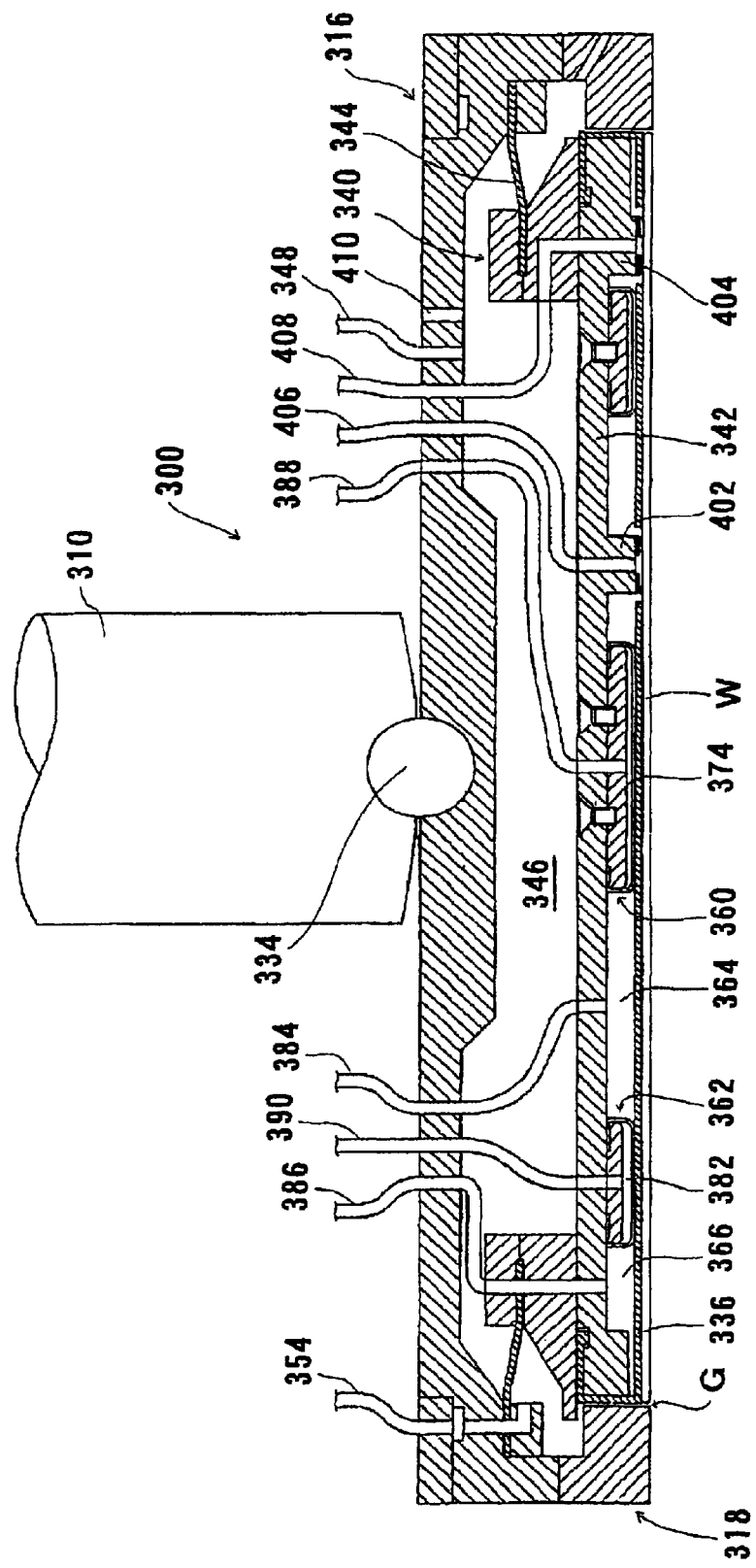
FIG. 16 is a vertical cross-sectional view showing still another example of contact members (central bag and ring tube) in a top ring of the CMP device.

The chucking plate 342 has a protuberance 422 projecting downwardly from the outer circumferential edge thereof for maintaining the shape of the lower peripheral portion of the elastic membrane 336 or the seal ring 420 (see FIGS. 10 and 15). However, if it is not necessary to maintain the shape of the elastic membrane 336 or the seal ring 420 because of its material or the like, then the chucking plate 342 does not need to have such a protuberance. FIG. 16 is a vertical cross-sectional view showing a top ring 300 in which the chucking plate 342 has no protuberance 422 in the embodiment shown in FIGS. 10 and 11. In this case, the substrate W can uniformly be pressed from the central portion thereof to the outer peripheral portion thereof. Further, the substrate can easily follow the large waviness or undulation on the polishing surface by omitting the protuberance 422.

In the embodiments described above, the polishing surface is constituted by the polishing pad. However, the polishing surface is not limited to this. For example, the polishing surface may be constituted by a fixed abrasive. The fixed abrasive is formed into a flat plate comprising abrasive particles fixed by a binder. With the fixed abrasive, the polishing process is performed by the abrasive particles self-generated from the fixed abrasive. The fixed abrasive comprises abrasive particles, a binder, and pores. For example, cerium dioxide ($CeO_2$) having an average particle diameter of 0.5 $\mu$m is used as an abrasive particle, and epoxy resin is used as a binder. Such a fixed abrasive forms a harder polishing surface. The fixed abrasive includes a fixed abrasive pad having a two-layer structure formed by a thin layer of a fixed abrasive and an elastic polishing pad attached to the layer of the fixed abrasive. IC-1000 described above may be used for another hard polishing surface.

Figure 17:
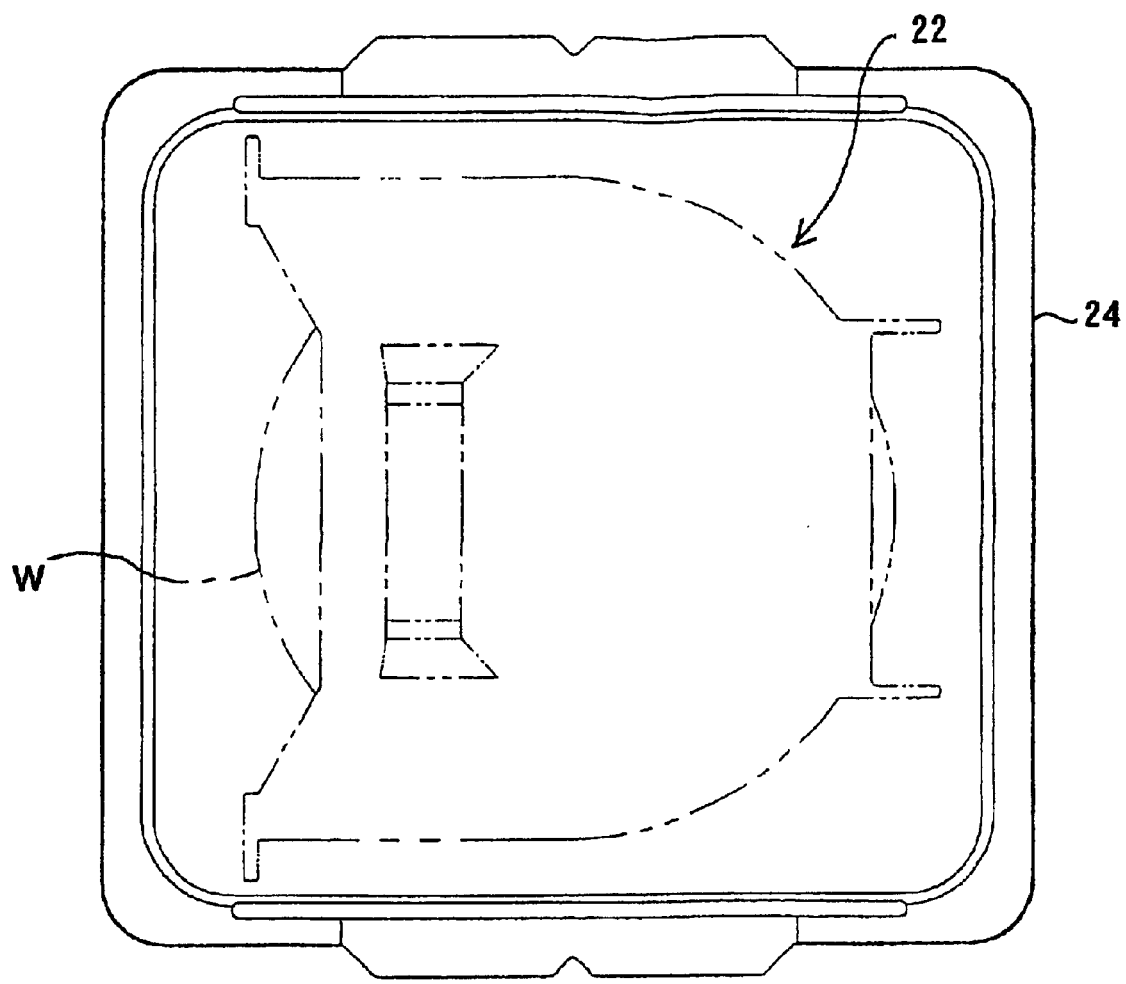
FIG. 17 is a plan view showing a substrate transport box.
Figure 19:
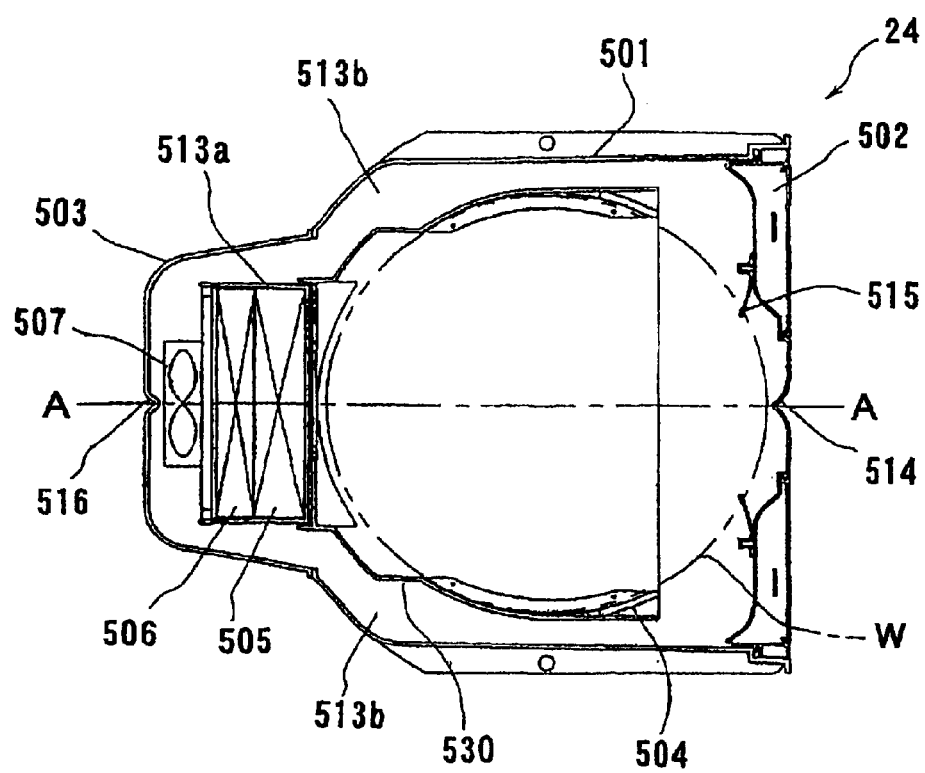
FIG. 19 is a sectional plan view showing a different example of the substrate transport box.
Figure 20:
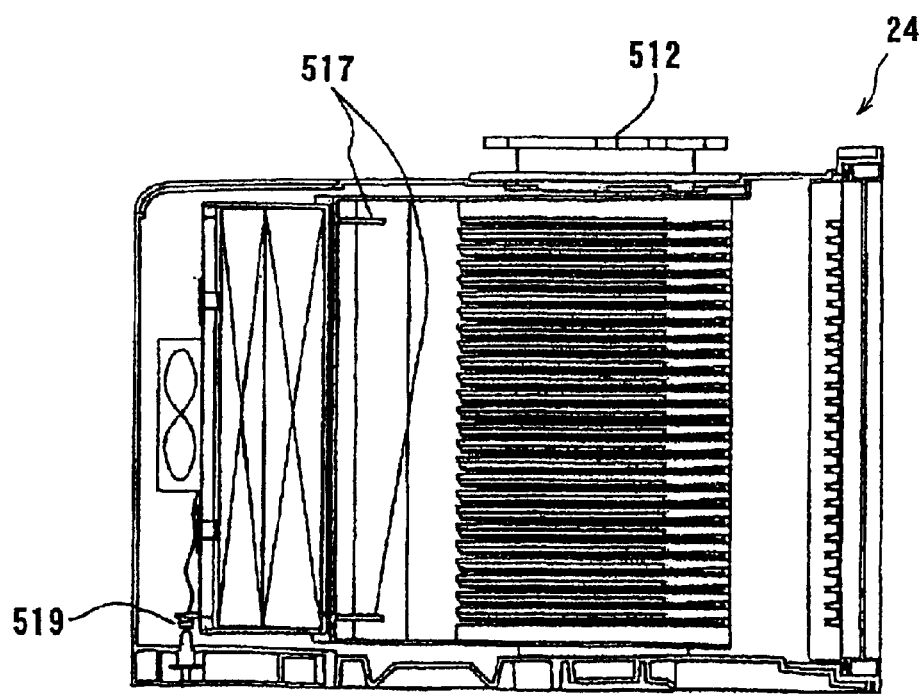
FIG. 20 is a sectional view taken on line A—A of FIG. 19.
Figure 21:
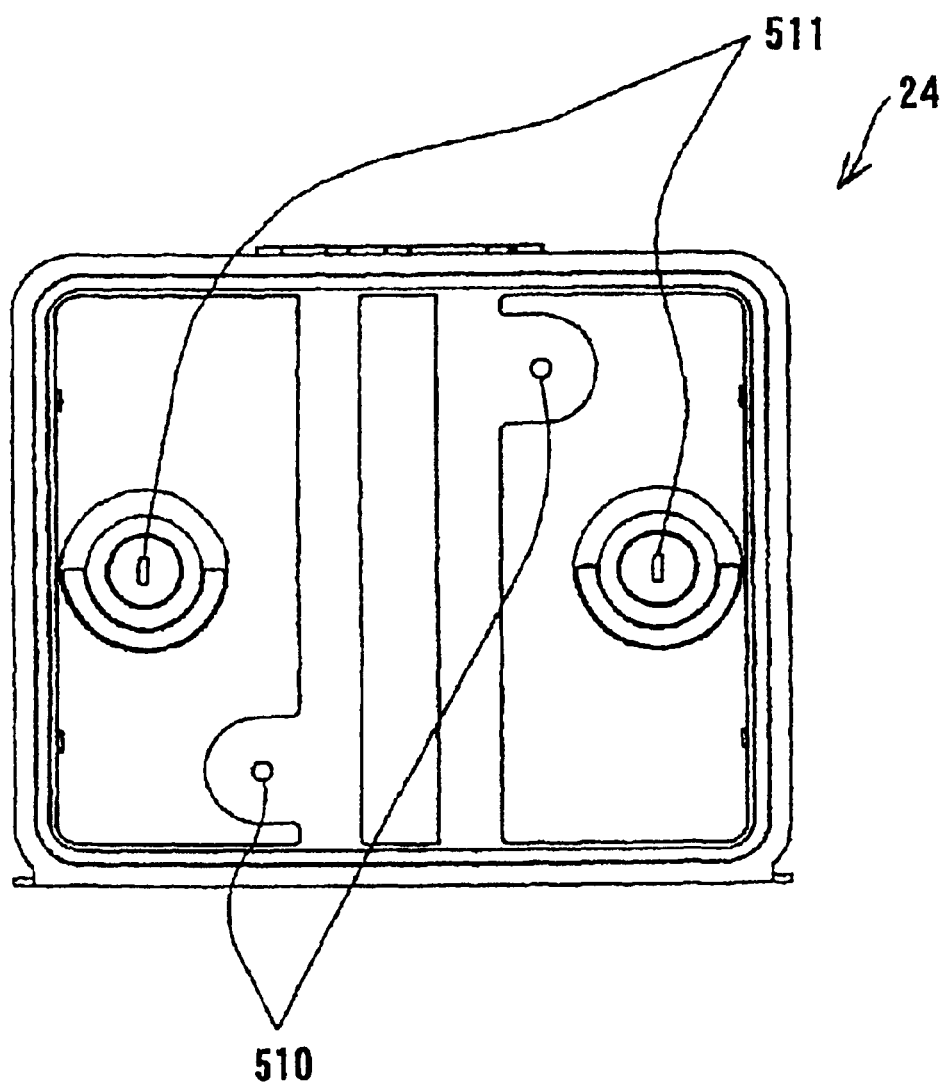
FIG. 21 is a front view of the different substrate transport box.
Figure 22:
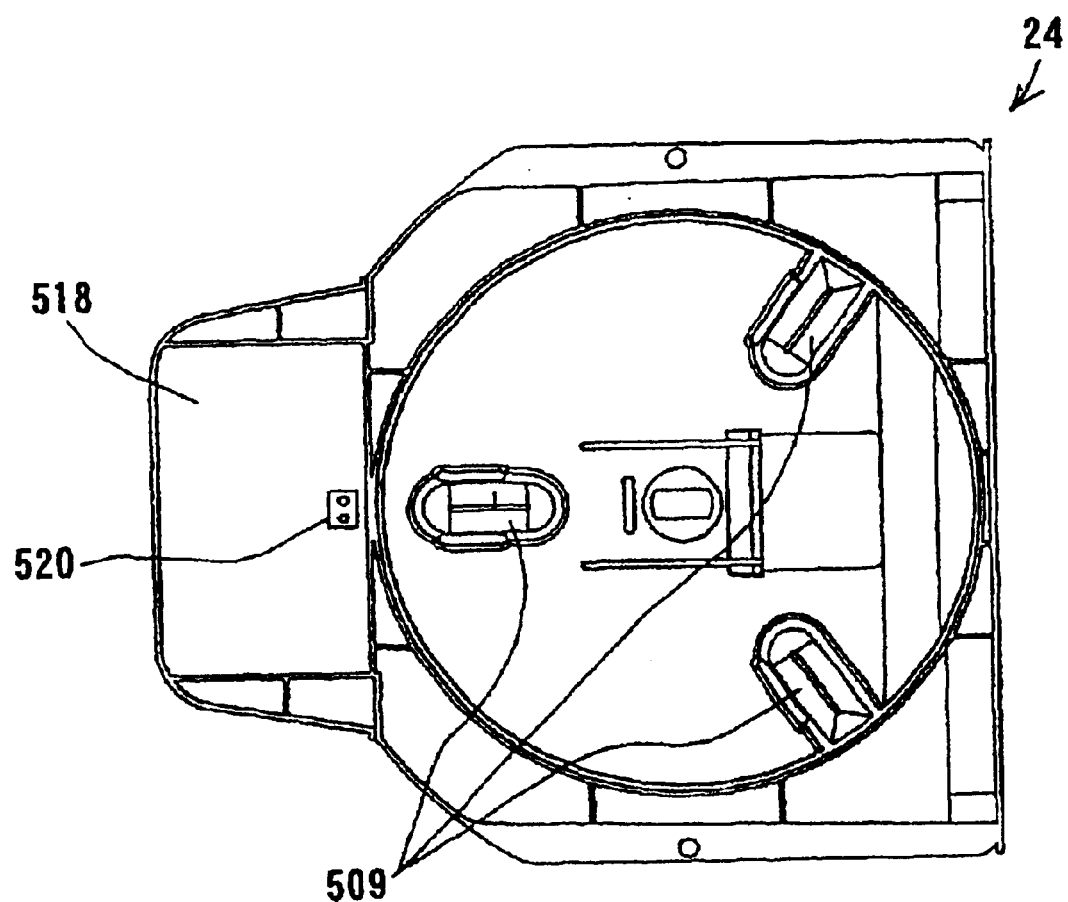
FIG. 22 is a bottom view of the different substrate transport box.

FIGS. 17 and 18 show an example of the substrate transport box 24 in which the substrate cassette 22 accommodating the substrates W with the exposed copper film on the surface thereof is housed and sealed up, and the substrates W in the enclosed state are transported together with the substrate cassette 22. The substrate transport box 24 comprises general SMIF or HOOP. A particle removal filter and a fan motor may be installed within the substrate transport box 24 to circulate and purify the gas inside the substrate transport box 24, whereby cross contamination between the substrates can be prevented. Also, particles and ions can be removed by installing both of a chemisorption filter and a particle filter inside the substrate transport box 24. Of course, only a particle filter, and a deionization filter as a chemical filter may be used. When a fan motor, etc. are installed in the substrate transport box 24, it is permissible to flow an electric current from a socket-outlet provided in a base member or the like when the substrate transport box 24 is mounted on the base member or the like, thereby rotating the fan motor, instead of providing batteries inside the substrate transport box 24.

Furthermore, the occurrence of an oxide film can be prevented by providing dehumidification means, such as a dehumidifying agent, in the substrate transport box 24 to control the humidity inside the substrate transport box 24. In this case, the humidity inside the substrate transport box 24 is decreased, preferably, to 10% or less, and more preferably, to 5% or less. If there is a possibility for destruction of the semiconductor device by generation of static electricity at a low humidity, it is desirable that the copper surface of each substrate be grounded to allow the static electricity to escape while the substrate is transported and/or stored.

The interior of the substrate transport box 24 is normally filled with air, but the use of an inert gas or the like with a restricted amount of oxygen can prevent oxidation of copper. The amount of oxygen is preferably 10,000 ppm or less, more preferably 1,000 ppm or less.

FIGS. 19 to 22 show other example of the substrate transport box 24. This substrate transport box 24, for example, serves to transport and store a plurality of 300 mm substrates W accommodated in groove-shaped pockets 504 fixed to the inside of a box body 501. The substrate transport box 24 comprises a rectangular tubular box body 501, a substrate carry-in/carry-out door 502 for mechanically opening/closing an opening portion formed in a side surface of the box body 501 by connected to a substrate carry-in/carry-out door automatic opening/closing device, a closure 503 located on a side opposite to the opening portion and adapted to cover an opening for mounting and dismounting filters and a fan motor, groove-shaped pockets 504 for holding substrates W, a ULPA filter 505, a chemical filter 506, and a fan motor 507.

The substrate carry-in/carry-out door 502 can be opened and closed mechanically. V grooves 509 for engagement with kinematic coupling pins 508 (see FIG. 23) for performing high accuracy positioning at the substrate carry-in/carry-out door automatic opening/closing device are provided at the bottom of the box body 501. Positioning pin receiving portions 510, and accepting portions 511 into which latch keys for opening/closing the door are inserted are provided in the substrate carry-in/carry-out door 502 so that automatic opening/closing can be done from the substrate carry-in/carry-out door automatic opening/closing device side. Also, a robotic handling flange 512 is provided so that transport can be performed using a transport device such as OHT (overhead hoist transport) or AGV (automatic guided vehicle). The V grooves 509, positioning pin receiving portions 510, accepting portions 511 into which latch keys for opening/closing the door are inserted, robotic handling flange 512, and other matters concerned with automated interface are designed in compliance with SEMI Standards E1.9, E47.1, E57 and E62.

The interior of the box body 501 is partitioned into a central chamber 513a at the center, and a pair of side chambers 513b located on both sides of the central chamber 513a, by a partition plate 530. The partition plate 530 integrated with the right and left groove-shaped pockets 504 as pairs is positioned to have gaps between the substrate carry-in/carry-out door 502 and the closure 503. The groove-shaped pockets 504 having taper portions fanning out toward the door so as to engage the substrates W are integrally provided in a portion of the partition plate 530 facing the substrate carry-in/carry-out door 502.

In a portion of the central chamber 513a facing the closure 503, the ULPA filter 505 constituting a particle removing filter mainly intended to remove particles, and the chemical filter 506 constituting a gaseous impurities trapping filter for removing impurity gases are disposed such that air can flow from the closure 503 toward the substrate carry-in/carry-out door 502. Upstream from the trapping filter 506, the fan motor 507 is disposed so as to send air toward the substrate carry-in/carry-out door 502.

Opposite end portions of the substrate carry-in/carry-out door 502 are in an inwardly smoothly curved form, and a triangular stream regulating plate 514 is provided at the center of the substrate carry-in/carry-out door 502. The substrate carry-in/carry-out door 502 is also equipped with fixing jigs 515 for preventing displacement of the substrate. Similarly, an inner surface of the closure 503 is in an inwardly curved form, and a triangular stream regulating plate 516 is provided at the center of the closure 503. Furthermore, stream regulating plates 517 intended to supply clean air uniformly to the plurality of substrates W are mounted at two locations adjacent to the inward clean air supply opening.

When 25 of the substrates W are accommodated, for example, the gap between each of the first and twenty-fifth substrates W and the inner wall surface of the substrate transport box 24 is set to be wider than the spacing between the other adjacent substrates W. With this arrangement, the supply of a uniform flow rate to the substrates W is inhibited, but the provision of the stream regulating plates 517 at the inward clean air supply opening uniformizes the flow rate between each of the first and twenty-fifth substrates W and the carrier body relative to the flow rate between the adjacent substrates, thereby performing purification efficiently.

A power supply unit 518 incorporating a secondary battery is disposed at the bottom of the closure 503, and has a contact for connection to a terminal 519 of the fan motor 507. An operation control substrate for the fan motor 507 is incorporated in the power supply unit 518. The fan motor 507 is controlled in terms of the timings of operation and stoppage and the number of rotations in compliance with control programs which have been programmed in the control substrate. A charging terminal 520 is provided at the bottom of the power supply unit 518. When the substrate transport box 24 is seated on the substrate carry-in/carry-out door automatic opening/closing device or on a charging station, the charging terminal 520 is connected to the terminal present in this device, whereby the secondary battery can be charged automatically.

The gaseous impurities trapping filter 506, in the present embodiment, is constituted by wrapping particulate activated carbon for organic substrate removal in an ion exchange unwoven fabric for inorganic ions removal. The medium may be pulverized activated carbon, activated carbon fibers, high purity silicon, zeolite, ceramic or impregnation activated carbon. The activated carbon fibers can be obtained by shaping rayon, kainol, polyacrylonitrile, petroleum, or petroleum pitch into a fibrous form, and subjecting the fibrous carbonaceous material to a so-called activation reaction, i.e., a gasification reaction with steam or carbon dioxide at a high temperature of 800° C. or higher. The activated carbon fibers may contain a binder or the like, which does not contribute to adsorption, for the purpose of maintaining strength and preventing dust generation. However, a lower content of the binder or the like is desirable as a material.

Activated carbon has many pores among the basic crystals, because unstructured carbon, etc. have been removed during the process of activation. These pores and a large specific surface area impart high physical adsorptivity to activated carbon. An activated carbon filter filled with particulate activated carbon taking advantage of the above property is commercially available. Also on the market, as film materials for an air filter are a filter comprising activated carbon fibers with little dust formation, high workability, finer pores than particulate activated carbon, and a large specific surface area, and a filter having particulate activated carbon of about 0.5 mm in diameter carried on a urethane foam of an open porous structure.

High purity silicon, the same material as that of the semiconductor substrate, can be used as an adsorbent. The surface state of high purity silicon comes in two types, hydrophilic and hydrophobic, and the hydrophilic and hydrophobic ones are different in adsorption properties.

Generally, the hydrophobic surface washed with dilute hydrofluoric acid is susceptible to environment, and shows high adsorbing properties toward hydrocarbon even at a very low concentration. However, the hydrophobic-surface silicon changes into a hydrophilic surface as an oxide film grows. Thus, the hydrophobic-surface silicon has the drawback of the adsorption properties changing over time. The hydrophilic surface highly adsorbs an organic substance having polarity, for example, BHT (2,6-di-t-butyl-p-cresol) or DBP (dibutyl phthalate). Either high purity silicon is effectively used not alone, but in combination with activated carbon.

The ion exchange unwoven fabric or fibers can be obtained, for example, by introducing ion exchange groups by a radiation graft polymerization reaction. That is, a base material composed of an organic polymer, for example, a polymer such as polyethylene or polypropylene, or a naturally occurring high molecular fiber or woven fabric, such as cotton or wool, is irradiated with radiation, such as electron rays or gamma rays, to generate many active points. These active points have very high activity, and are called radicals. A monomer is chemically bonded to these radicals, whereby the properties of the monomer which are different from the properties of the base material can be imparted.

This technique grafts the monomer to the base material, and thus is called graft polymerization. When a monomer having a sulfone group, carboxyl group, amino group or the like, which is an ion exchange group, for example, sodium styrenesulfonate, acrylic acid, or arylamine, is bonded to the polyethylene unwoven fabric base material by radiation graft polymerization, there can be obtained an unwoven fabric type ion exchanger with a much higher ion exchange rate than ion exchange beads usually called an ion exchange resin.

Similarly, a monomer capable of accepting an ion exchange group, such as styrene, chloromethylstyrene, glycidyl methacrylate, acrylonitrile, or acrolein, may be radiation graft polymerized with the base material, and then an ion exchange group may be introduced. In this case as well, an ion exchanger can be prepared in the form of the base material.

For a filter medium of a ULPA filter or HEPA filter, glass fibers have been used. However, it has been found that glass fibers react with a hydrogen fluoride (HF) vapor used in the manufacturing process for a semiconductor device to produce $BF_3$, thus posing a problem. In recent years, a ULPA filter and an HEPA filter using as a filter medium PTFE (polytetrafluoroethylene), which is free from impurities such as boron or metal and is unaffected by acids, alkalis, and organic solvents, have been marketed. Glass fibers or PTFE may be selected as the need arises.

Figure 23:
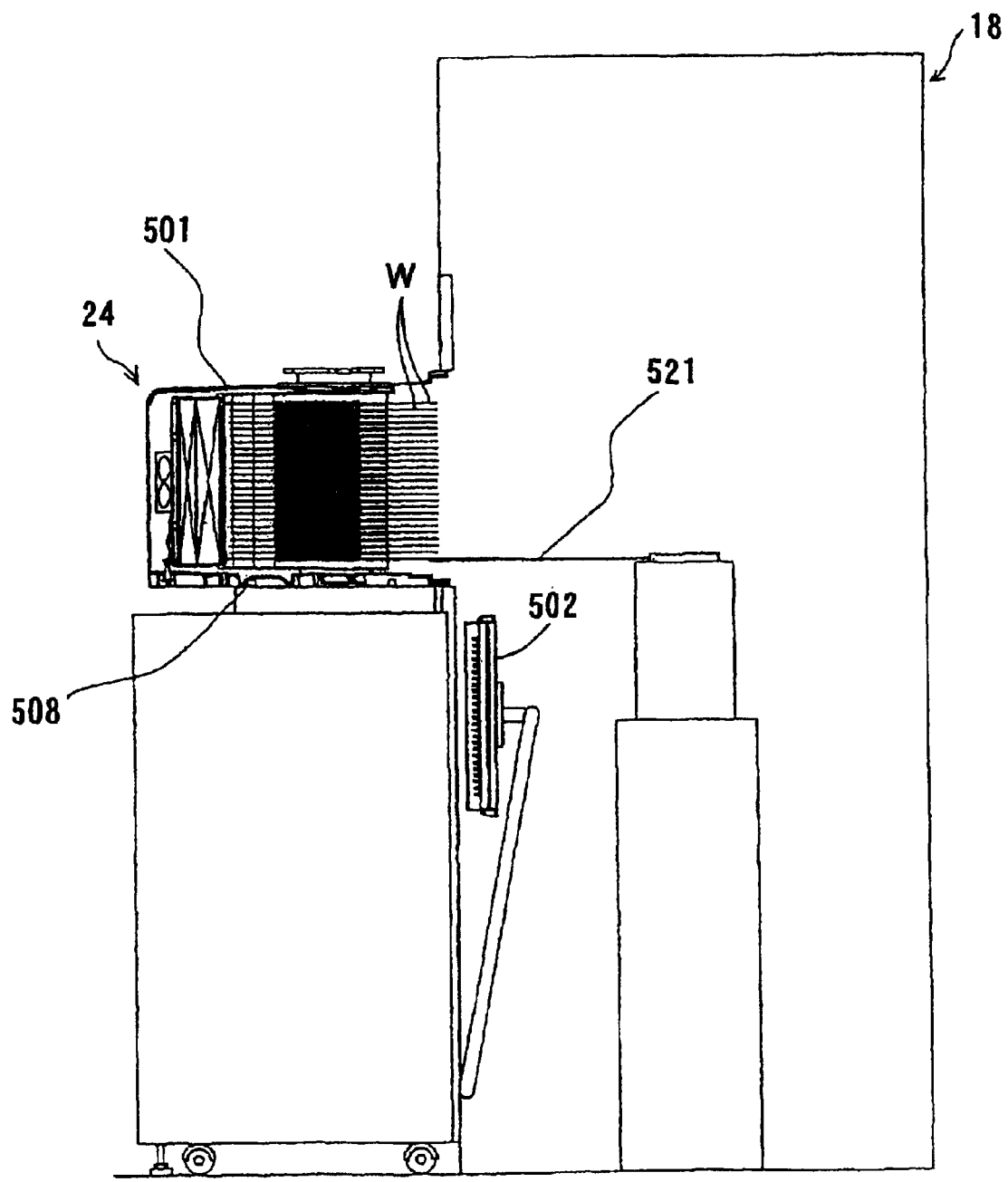
FIG. 23 is a view attached to a description of the state of use of the different substrate transport box.

Actions to be done when the substrate transport box 24 accommodating a plurality of substrates W is carried in the copper plating device 18 shown in FIG. 1, for example, will be described with reference to FIG. 23.

The copper plating device 18 has a substrate carry-in/carry-out door automatic opening/closing device. When the substrate transport box 24 is transported into the copper plating device 18, it is placed at a predetermined position. When the substrate transport box 24 is cut off from the clean room via a gate valve or the like, the substrate carry-in/carry-out door automatic opening/closing device opens the substrate carry-in/carry-out door 502. Then, the substrate W is withdrawn by a substrate handling robot 521 within the plating device 18, and processed. The substrate W after process is returned to the substrate transport box 24. After process of all the substrates W is completed, the substrate carry-in/carry-out door 502 is closed by the substrate carry-in/carry-out door automatic opening/closing device to seal up the substrate transport box 24. From this moment onward, an operation of the fan motor 507 is started to purify air inside the substrate transport box 24. When the substrate carry-in/carry-out door 502 is closed, the substrate transport box 24 is transported to a subsequent process or device, or a storage warehouse by OHT or AGV.

The fan motor 507 is operated in accordance with a preset program, whereby a flow of air from the fan motor 507 to the gaseous impurities trapping filter (chemical filter) 506, ULPA filter 505, and central chamber 513a occurs. Air flowing into the central chamber 513a is smoothly bifurcated by the stream regulating plate 514 provided at the substrate carry-in/carry-out door 502, and the respective air streams pass through the side chambers 513b and return to the fan motor 507. In this manner, a circulation path of air is formed.

Air is purified while being passed through the gaseous impurities trapping filter 506 and ULPA filter 505, and is then guided into the gaps among the substrates W by the inlet stream regulating plates 517 positioned at the inside of the opening of the partition plate 530 integrated with the groove-shaped pockets 504. By providing the inlet stream regulating plates 517, air is prevented from excessively flowing into the gaps between the substrates W and the partition plate 530 integrated with the groove-shaped pockets 504. Air which has passed between the substrates W flows along the inner surfaces of the stream regulating plate 514 and the substrate carry-in/carry-out door 502, changes in direction to reverse, passes through the side chambers 513b, and returns to the fan motor 507.

During this process, solid substances adhering to various parts, such as particles, or gaseous substances resulting therefrom are carried by the circulating airflow. The circulating air flow is purified by the two filters 505 and 506 located upstream from the substrates W, and comes to the substrates W. Thus, not only contamination from the outside, but also so-called self-contamination with objects present inside the substrate transport box 24 is prevented.

The operation pattern of the fan motor 507 may be considered in suitable modes adapted to the status of use of the substrate transport box 24. Generally, the operation is performed continuously or at a high flow velocity in the initial stage to positively eliminate contamination which has been brought into the substrate transport box 24. After a certain period of time elapses, the flow velocity is decreased, or the operation is carried out intermittently to prevent contamination occurring from the substrates W housed in the substrate transfer box 24 and the components installed inside the substrate transport box 24. By this classified operation, the electric power consumption of the fan motor 507 can be decreased, with the result that the charging frequency for the secondary battery can be diminished.

When the substrate transport box 24 is set at a width W of 389.5 mm, a depth D of 450 mm, and a height H of 335 mm, and 25 of the substrates measuring 300 mm are housed in the substrate transport box 24, the total weight including the substrates W is about 10 kg. In the present embodiment, by actuating the fan motor 507, circulating air in an air volume of 0.12 $m^3$/min can be flowed in the substrate transport box 24 so that the velocity of air passing through the center of the gap between the substrates W will be 0.03 m/s. The circulating air volume can be increased or decreased by changing the fan motor 507.

Figure 24:
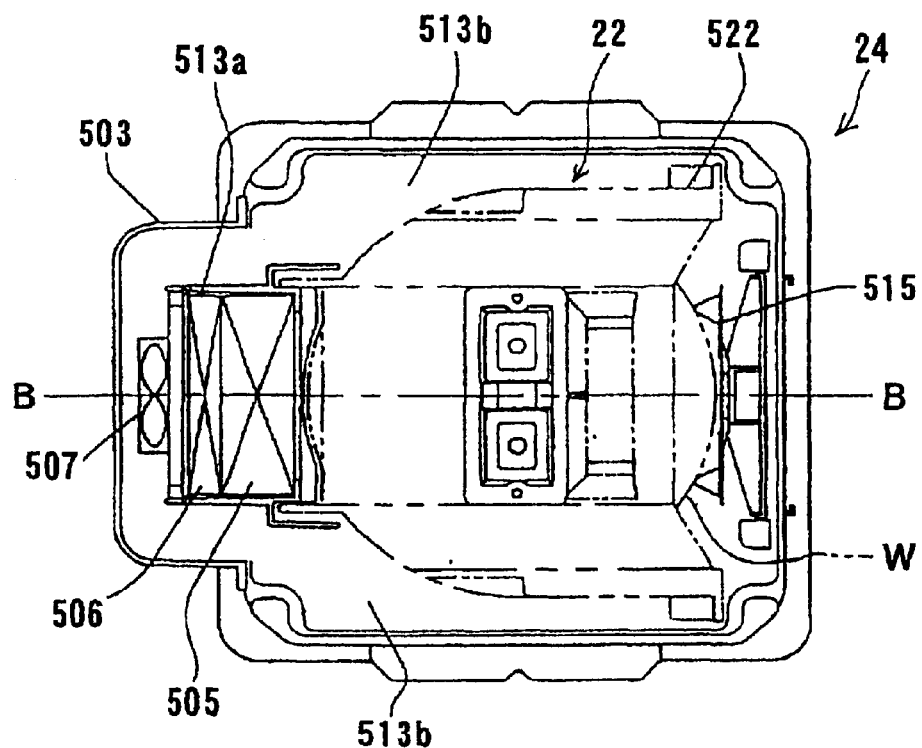
FIG. 24 is a sectional plan view showing a further different example of the substrate transport box.
Figure 25:
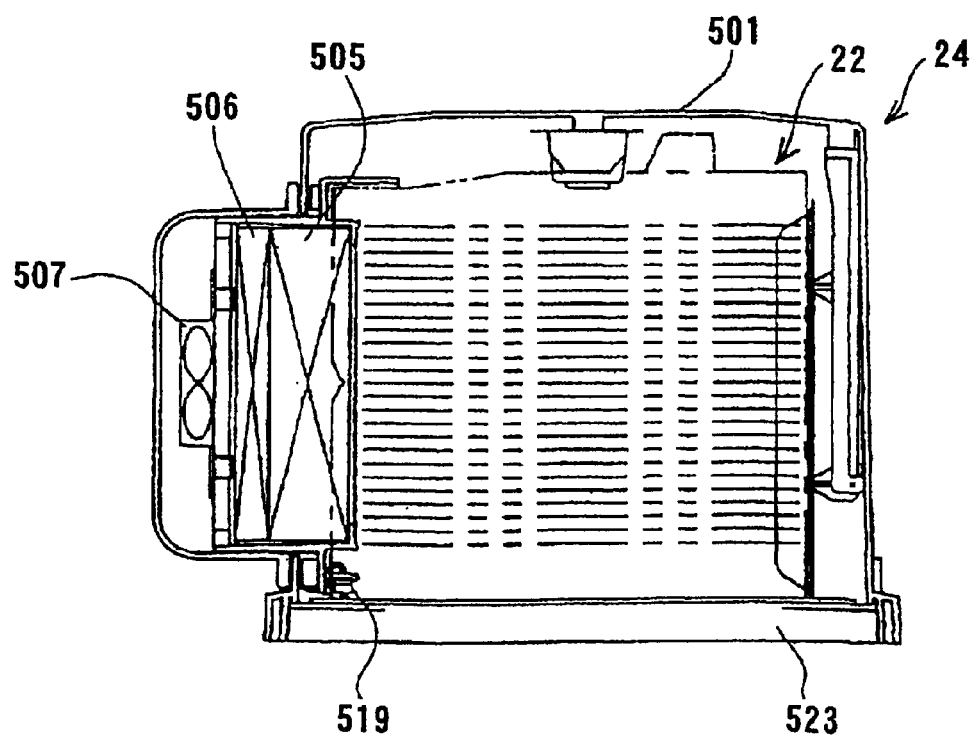
FIG. 25 is a sectional view taken on line B—B of FIG. 24.

FIGS. 24 and 25 show still another example of the substrate transport box 24. The differences of this example from the example shown in FIGS. 19 to 22 are that the size of the substrate W is 200 mm, that a door 523 for mechanical interface is located at the bottom of the box, and that the substrates W are housed in a substrate cassette 22 and, in this condition, accommodated in the substrate transport box 24. The method of purifying air in the substrate transport box 24 is the same as in the example shown in FIGS. 19 to 22. In this example, a secondary battery for driving the fan motor 507 and a fan motor control circuit are incorporated in the box door 523.

When the substrate transport box 24 is set at a width W of 283 mm, a depth D of 342 mm, and a height H of 254 mm, and 25 of the substrates measuring 200 mm are housed in the substrate transport box 24, the total weight including the substrates W and the substrate cassette 22 is about 6 kg. In the present example, by actuating the fan motor 507, circulating air in an air volume of 0.05 m$^3$/min can be flowed in the substrate transport box 24 so that the velocity of air passing through the center of the gap between the substrates W will be 0.03 m/s.

Figure 26:
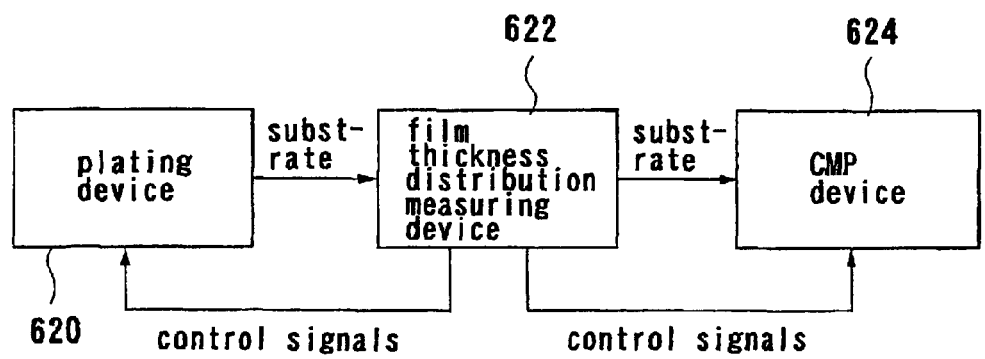
FIG. 26 is a view showing another example of the entire constitution of the substrate processing apparatus.
Figure 62C:
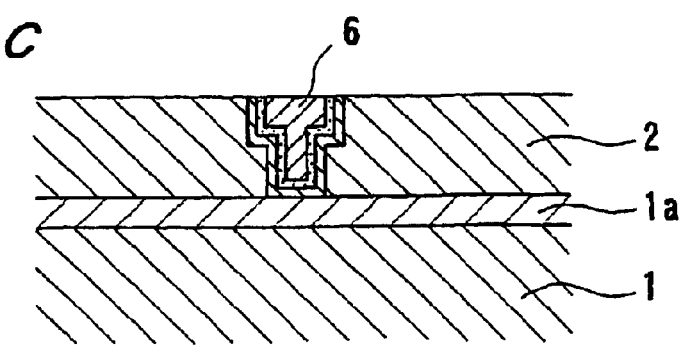
Figure 63:
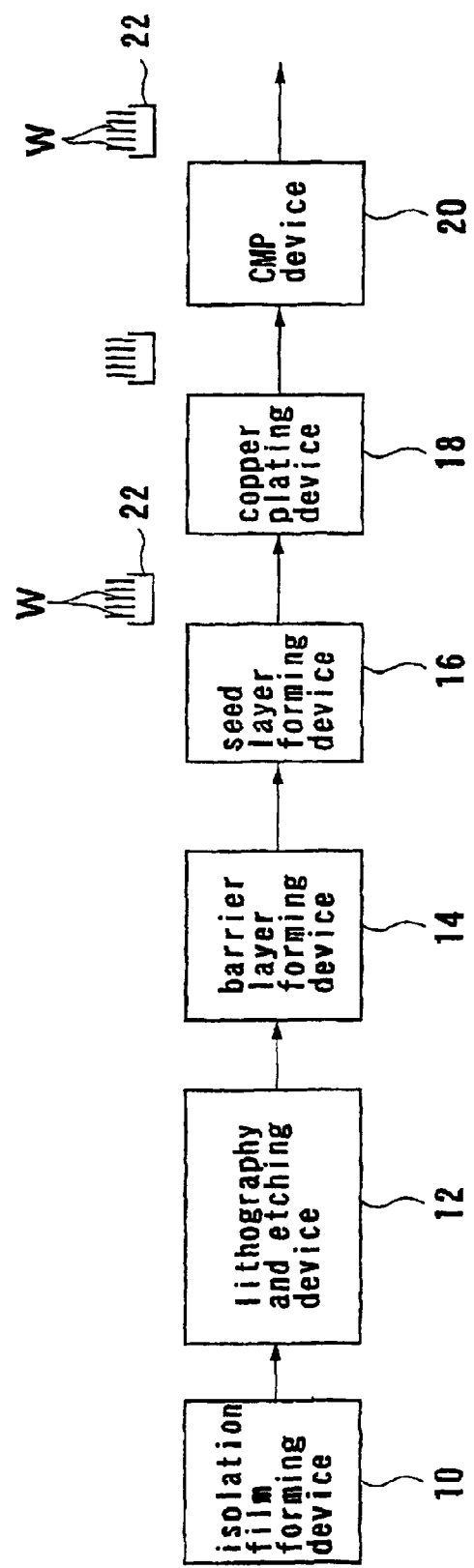
FIG. 63 is a view showing the entire constitution of a conventional substrate processing apparatus.

FIG. 26 shows the entire constitution of another substrate processing apparatus of the present invention. The copper film (plated copper film) 6 shown in FIG. 62B is formed by use of a copper plating device 620 having a film thickness distribution adjusting function. The thickness of the copper film (plated copper film) 6 on the surface of the substrate is generally equal to or less than 2 micron meter, preferably equal to or less than 1 micron meter. The film thickness distribution of the copper film 6 over the entire surface is measured with a film thickness distribution measuring device 622. Chemical mechanical polishing is applied to the surface of the substrate by a polishing device (CMP device) 624 having a polishing amount adjusting function to form a copper interconnection composed of the copper film 6 as shown in FIG. 62C. For this procedure, based on the results of measurement by the film thickness distribution measuring device 622, control signals, such as an electric field control signal and a plating time control signal, are inputted into the copper plating device 620 to control the copper plating device 620, and control signals, such as a press control signal, are inputted into the CMP device 624 to control the CMP device 624.

Details of the control are as follows: For the copper plating device 620, the film thickness distribution of the copper film (plated copper film) 6 over the entire surface formed on the substrate is measured with the film thickness distribution measuring device 622 making use of, for example, the principle of eddy current thickness testing to find the difference between the film thickness of the copper film (plated copper film) 6 at the center of the substrate and the film thickness on the periphery of the substrate. Based on the results obtained, the copper plating device 620 is feedback controlled so that a plated copper film with a more uniform thickness will be deposited on the surface of the substrate to be processed after the target substrate measured, namely, that the difference between the film thickness of the plated copper film at the center of the substrate and the film thickness on the periphery of the substrate will be minimized. For the CMP device 624 as a subsequent processing step, the amounts of polishing at the center and on the periphery of the substrate are adjusted based on the results of measurements of the film thickness distribution over the entire surface, for example, by adjusting the pressure imposed on the center and the periphery of the substrate, whereby a flat copper film (plated copper film) 6 is finally obtained after polishing.

As described above, the copper plating device 620 having the film thickness distribution adjusting function is used, and feedback controlled to deposit a plated copper film more uniformly on the surface of the substrate. Furthermore, the CMP device 624 having the polishing amount adjusting function is used, and the amount of polishing of the plated copper film is adjusted based on the actual measurements of the film thickness distribution, whereby a flat plated copper film can be obtained finally.

Figure 27:
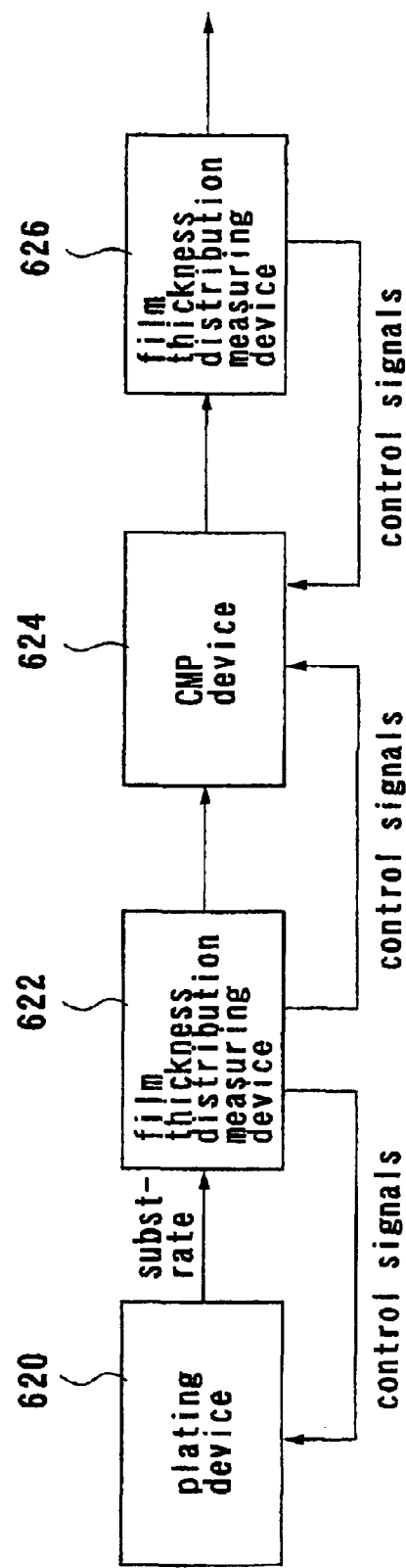
FIG. 27 is a view showing still another example of the entire constitution of the substrate processing apparatus.

As shown in FIG. 27, the film thickness distributions over the entire surface at the center and the periphery of the plated copper film after polishing with the CMP device 624 may be measured with a film thickness distribution measuring device 626, and based on the results of these measurements, the CMP device 624 may be feedback controlled (for fine adjustment of the pressure against the substrate).

Figure 64:
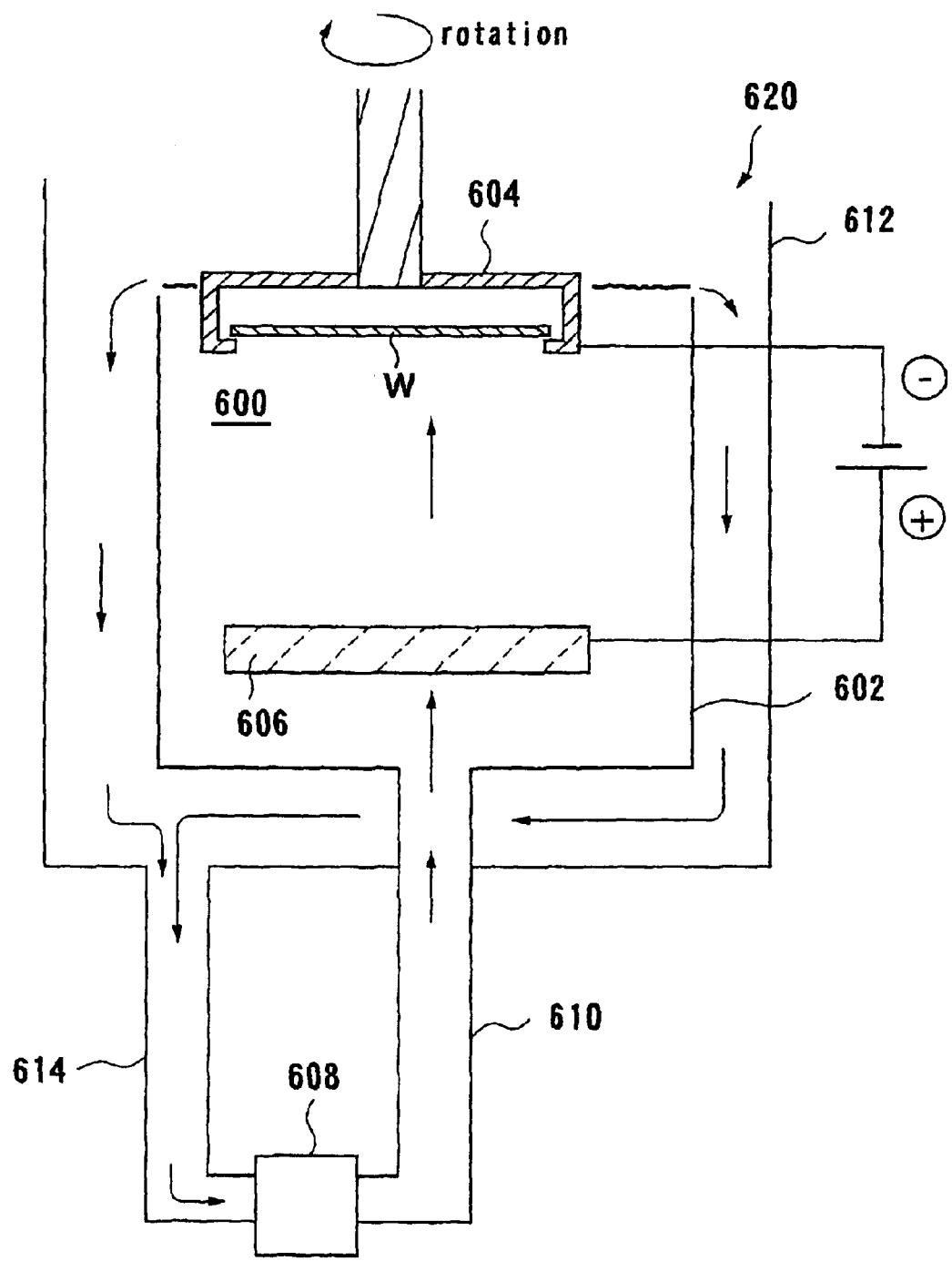
FIG. 64 is a schematic sectional view showing a conventional plating device.

FIGS. 28 to 40 show different examples of the copper plating device 620 having the film thickness distribution adjusting mechanism. Members identical with or corresponding to the members of the conventional example shown in FIG. 64 will be assigned the same numerals, and their explanation will be omitted partially.

FIG. 28 shows a copper plating device 620 which includes a flat plate-shaped, high resistance structure (virtual anode) 630 disposed between an anode plate (anode) 606 immersed in a plating liquid 600 in a plating tank 602, and a substrate W held by a substrate holder 604 and disposed in an upper part of the plating tank 602. The high resistance structure 630 has higher electrical resistivity than that of the plating liquid 600, and comprises, for example, a film or a ceramic plate. The high resistance structure 630 is placed parallel to the anode plate 606 over the entire region of a cross section of the plating tank 602.

According to this arrangement, the electric resistance between the anode plate 606 and the copper seed layer 7 (see FIG. 62A) formed on the surface (lower surface) of the substrate W can be made higher via the high resistance structure 630 than the electric resistance produced when the gap between them consists of the copper plating liquid 600 alone. This can diminish the difference in electric current density over the entire surface due to the influence of the electric resistance of the copper seed layer 7 formed on the surface of the substrate W. Consequently, the influence of the electric resistance of the copper seed layer can be decreased, without fully lengthening the distance between the anode plate 606 and the substrate W, so that the film thickness of the plated copper film can be rendered more uniform.

Figure 29:
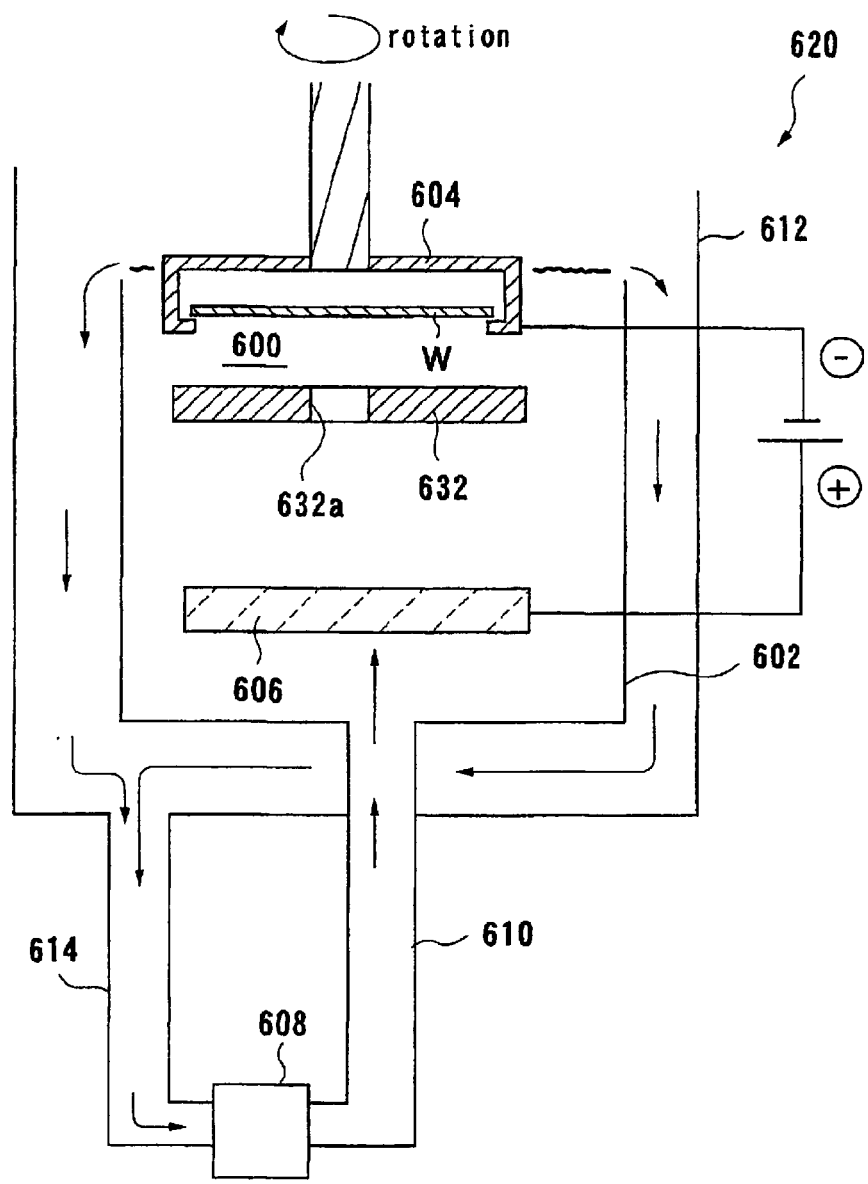
FIG. 29 is a schematic sectional view showing another example of the copper plating device having the film thickness distribution adjusting function.

FIG. 29 shows a copper plating device 620 which includes a flat plate-shaped insulator (virtual anode) 632 placed between an anode plate 606 and a substrate W parallel to them instead of the high resistance structure 630 in FIG. 28. The insulator 632 has a central hole 632a at the center, and is a size smaller than the cross section of a plating tank 602. Because of this insulator 632, a plating electric current flows only through the interior of the central hole 632a of the insulator 632 and through the gaps between the outer peripheral end surface of the insulator 632 and the inner circumferential surface of the plating tank 602, thereby thickening a plated copper film deposited, particularly, at the center of the substrate W.

Figure 30:
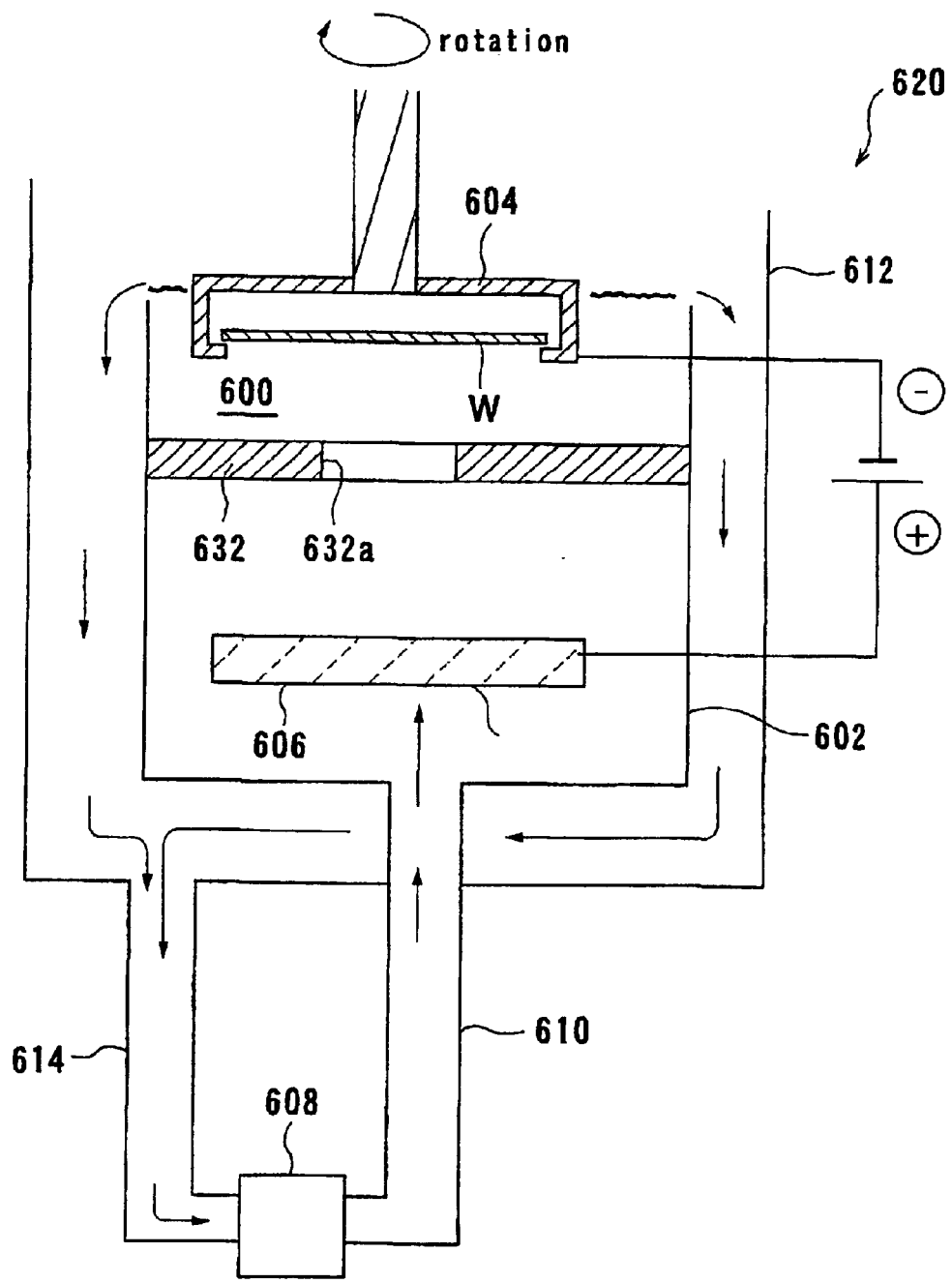
FIG. 30 is a schematic sectional view showing another example of the copper plating device having the film thickness distribution adjusting function.

FIG. 30 shows a copper plating device 620 which includes the insulator 632 of FIG. 29 having a larger size, and having an outer peripheral end surface brought into contact with the inner circumferential surface of the plating tank 602. Because of this configuration, a plating electric current flows only through the interior of the central hole 632a of the insulator 632, thereby further thickening a plated copper film deposited at the center of the substrate W.

Figure 31:
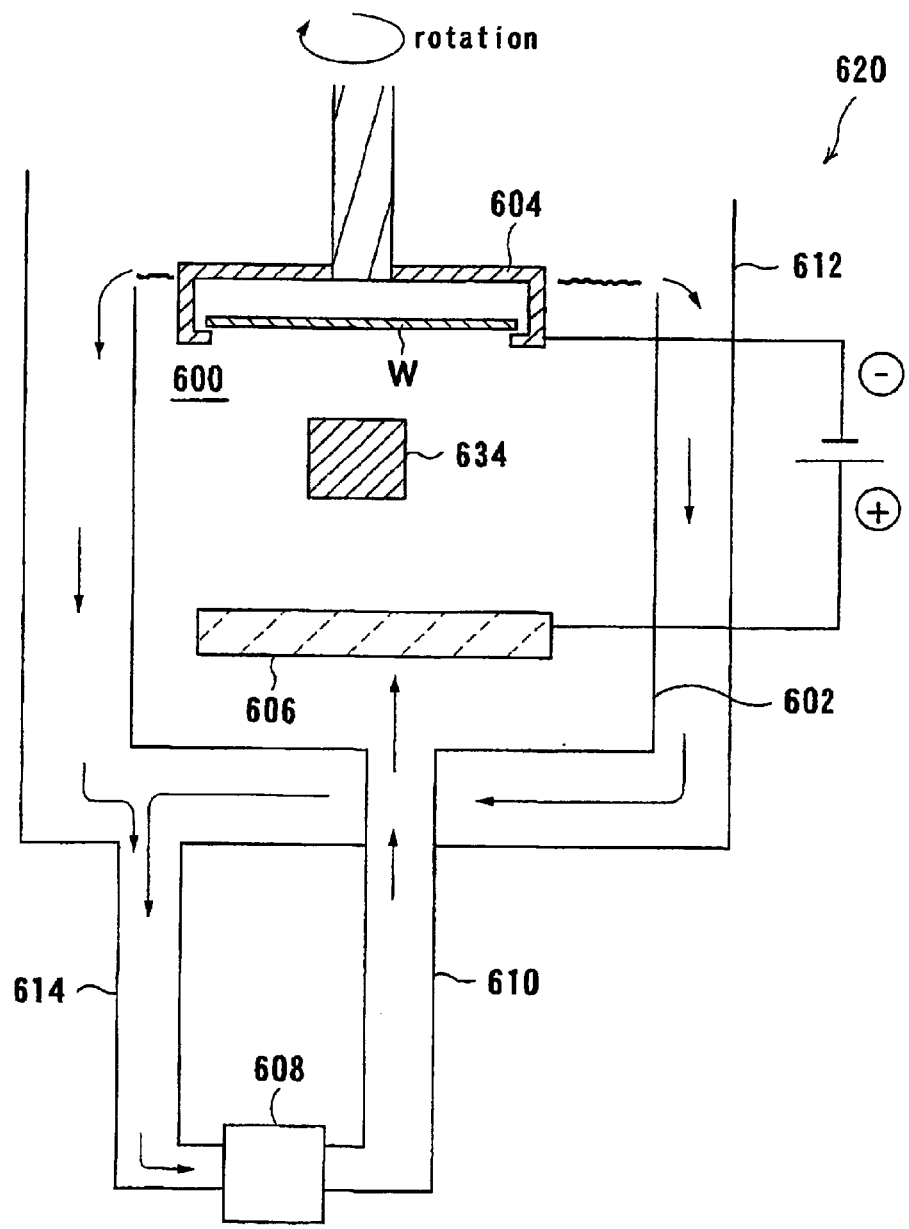
FIG. 31 is a schematic sectional view showing another example of the copper plating device having the film thickness distribution adjusting function.

FIG. 31 shows a copper plating device 620 which includes a conductor (virtual anode) 634 placed between an anode plate 606 and a substrate W at a position corresponding to the center of the substrate W. The conductor 634 has lower electric resistivity than that of a plating liquid 600. More plating electric current flows through the conductor 634, thereby making a thicker plated copper film deposited at the center of the substrate W.

Figure 32:
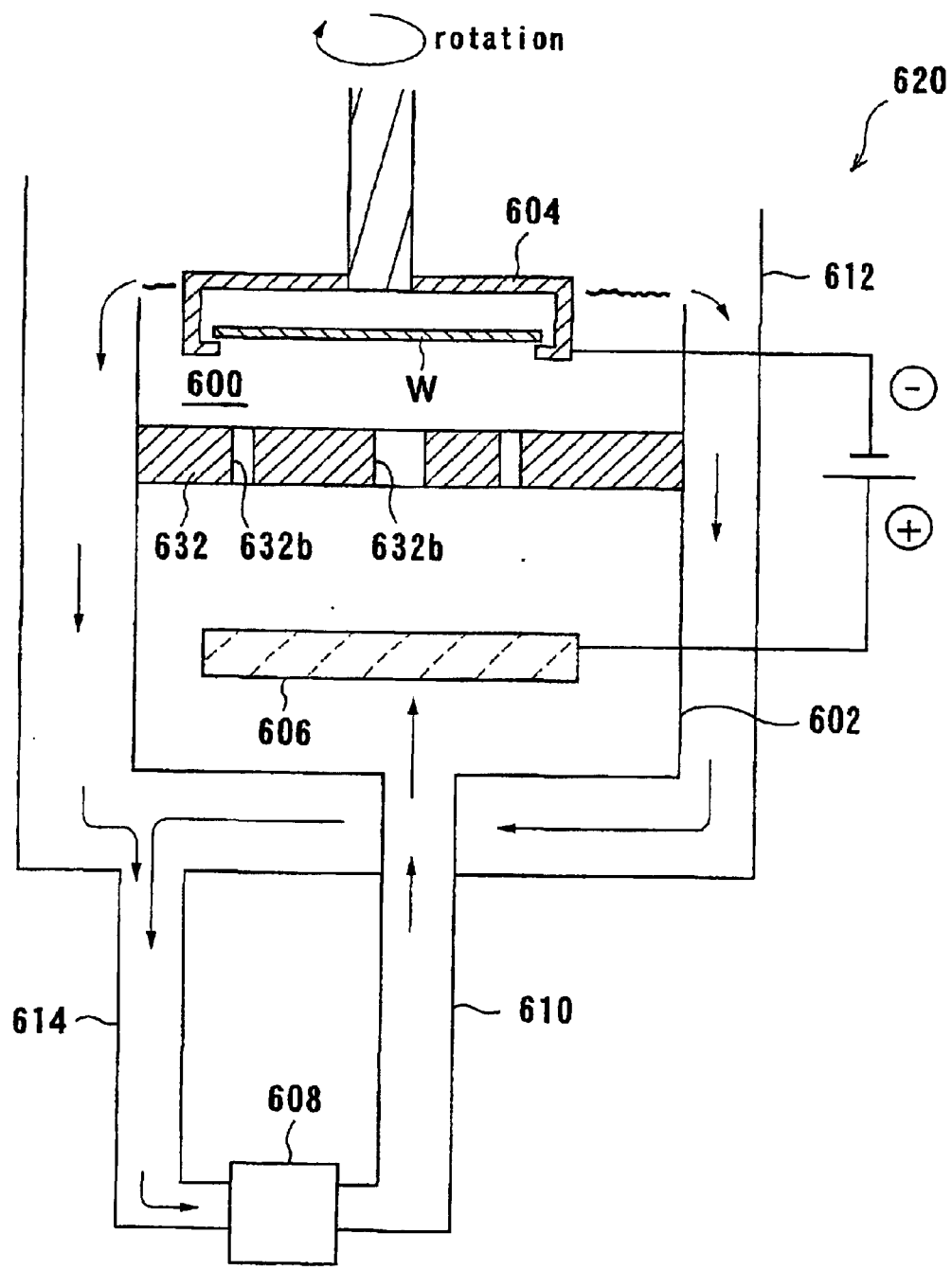
FIG. 32 is a schematic sectional view showing another example of the copper plating device having the film thickness distribution adjusting function.

FIG. 32 is a modification of FIG. 29, showing a copper plating device 620 which includes an insulator 632 having a plurality of through-holes 632b of an arbitrary size (internal diameter) at arbitrary positions thereof. Because of this configuration, a plating electric current flows only through the interior of the through-holes 632b, thereby making larger the film thickness of a plated copper film at the arbitrary positions of the substrate W.

Figure 33:
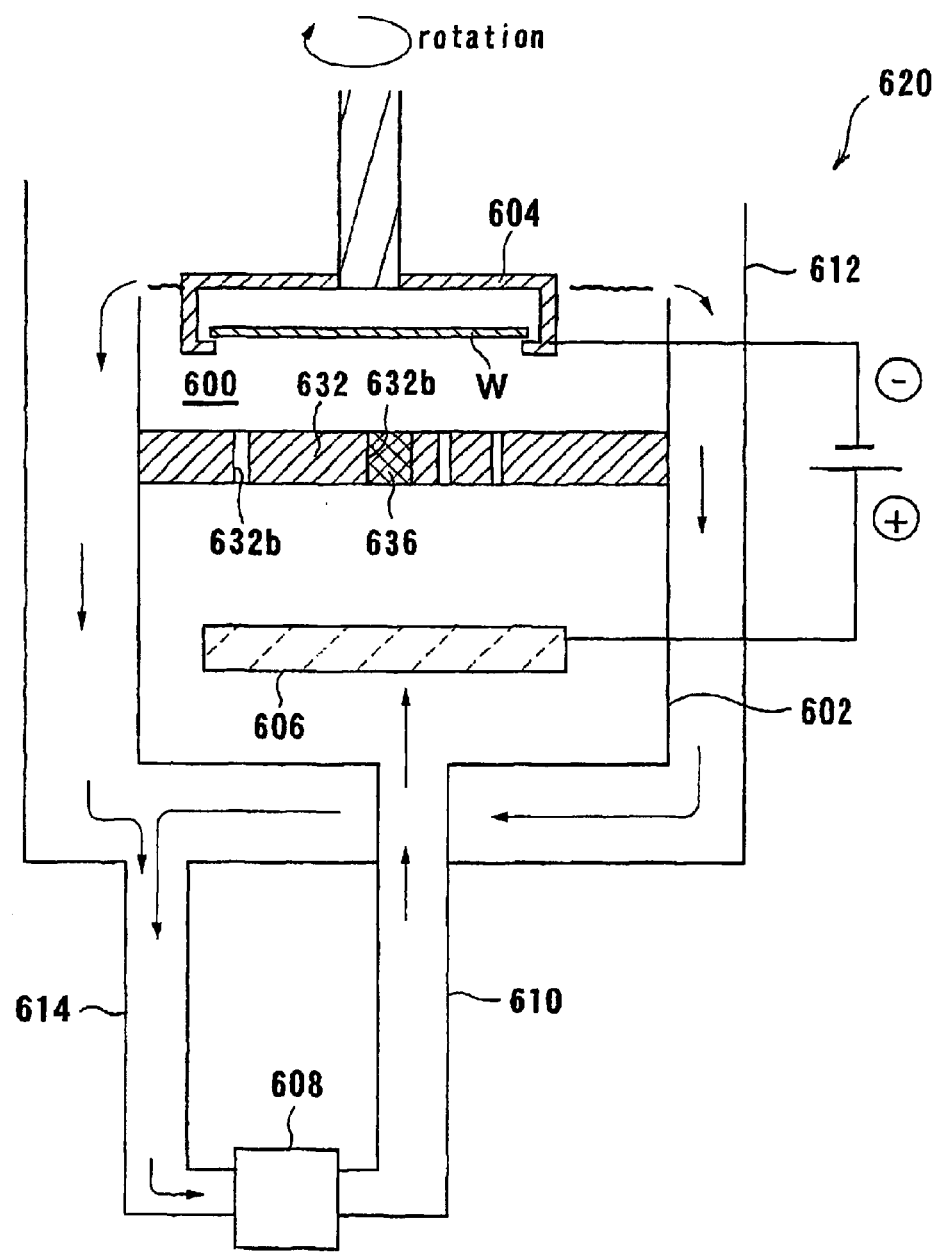
FIG. 33 is a schematic sectional view showing another example of the copper plating device having the film thickness distribution adjusting function.

FIG. 33 is a modification of FIG. 32, showing a copper plating device 620 which includes insulator having a plurality of through-holes 632b of an arbitrary size at arbitrary positions thereof, and a conductor 636 buried in the arbitrary through-hole 632b. According to this configuration, a greater plating electric current flows through the interior of the conductor 636 than through the interior of the conductor-free through-holes 632b, thereby depositing a copper film of a larger thickness at the arbitrary position of the substrate W.

FIG. 34 shows a modification of FIG. 28, showing a copper plating device 620 which includes a high resistance structure 630 having higher electric resistivity than that of the plating liquid 600 and comprising, for example, a film or a ceramic plate. The high resistance structure 630 has a thickness gradually increasing, beginning at the center, toward the periphery. The electric resistance of the high resistance structure 630 is higher on the periphery than at the center, thus making the influence of the electric resistance of the copper seed layer smaller. As a result, a plated copper film with a more uniform thickness is deposited on the surface of the substrate W.

Figure 35:
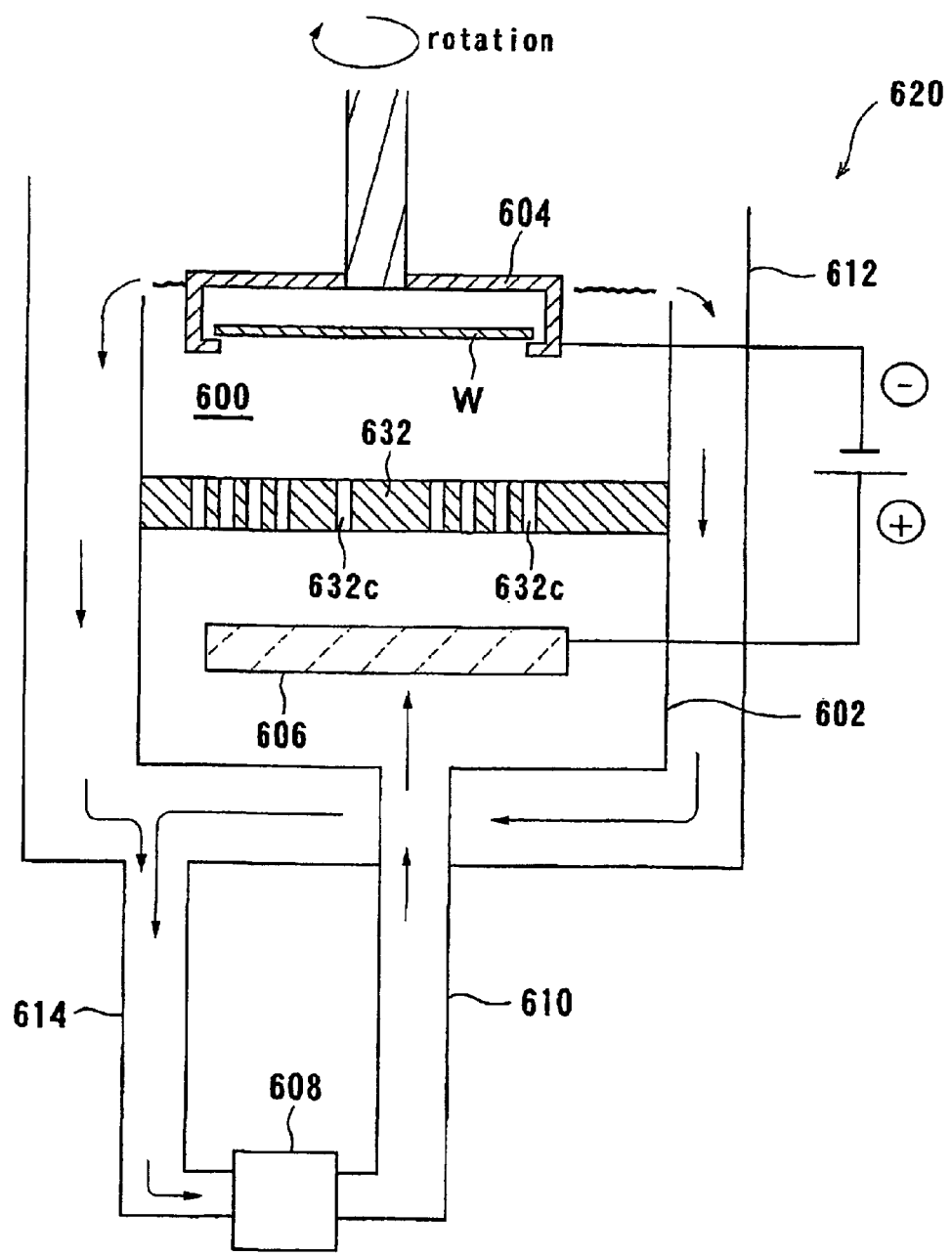
FIG. 35 is a schematic sectional view showing another example of the copper plating device having the film thickness distribution adjusting function.

FIG. 35 shows a modification of FIG. 32, showing a copper plating device 620 which includes an insulator 632 having a plurality of through-holes 632c of the same size (internal diameter) at arbitrary positions thereof to distribute the through-holes 632c of the same size arbitrarily over the plane of the substrate W. By so doing, the insulator 632 can be made easily.

FIG. 36 shows a copper plating device 620 which includes an anode plate 606 bulges upward like a mountain at the center compared with the peripheral edge. Thus, the distance of the center of the anode plate 606 from the substrate W is shorter than the distance of the periphery of the anode plate 606 from the substrate W. As a result, a greater plating electric current than in a normal situation flows through the center of the substrate, thereby depositing a plated copper film of a uniform thickness on the substrate.

FIG. 37 shows a modification of FIG. 36, showing a copper plating device 630 which includes a flat plate-shaped anode plate 606 curved upward in the form of a spherical crust, whereby the distance of the center of the anode plate 606 from the substrate W is shorter than the distance of the periphery of the anode plate 606 from the substrate W.

Figure 38:
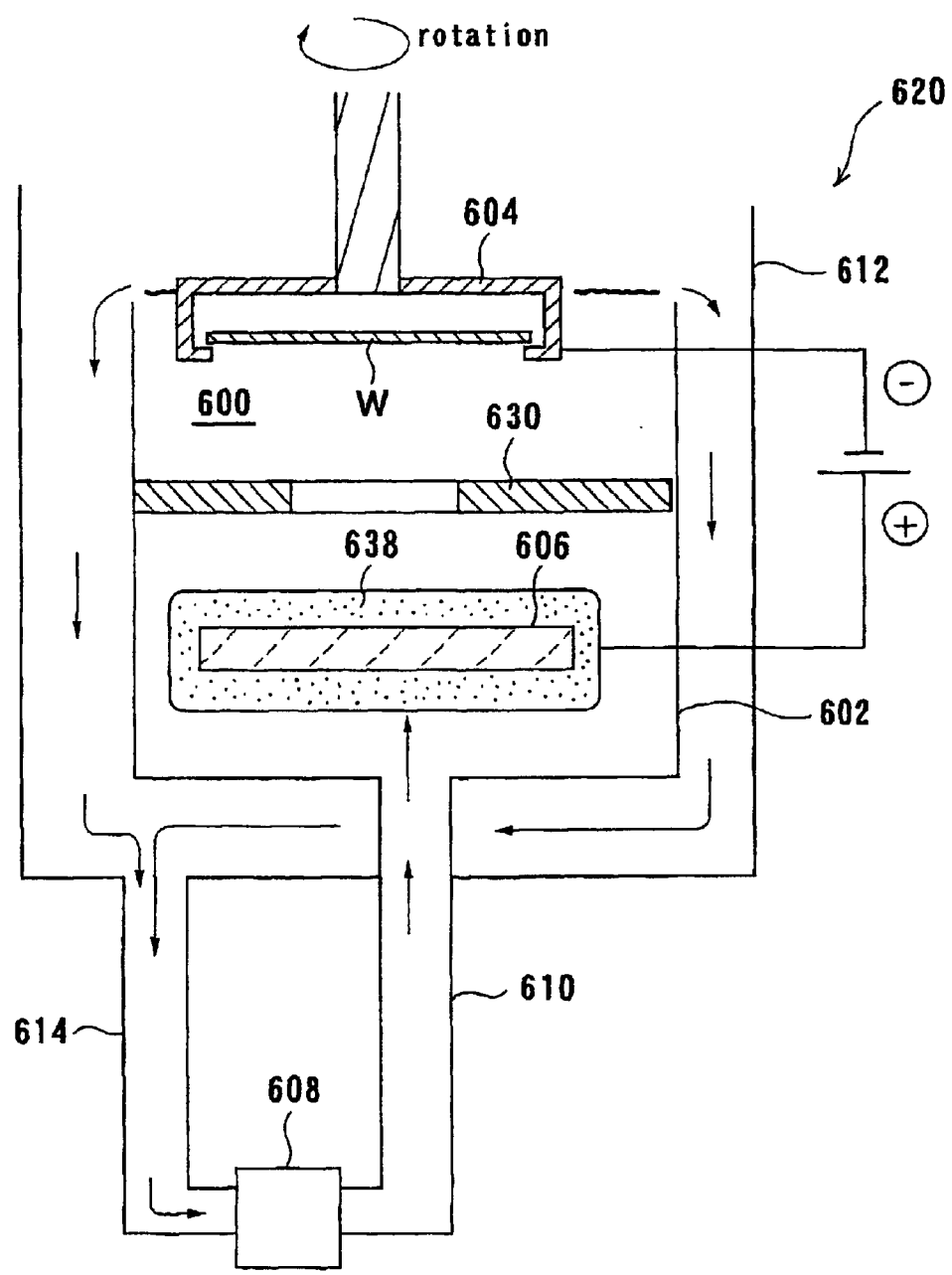
FIG. 38 is a schematic sectional view showing another example of the copper plating device having the film thickness distribution adjusting function.

A so-called black film is formed on the surface of the anode plate (anode) 606. If a peeled piece of the black film approaches and adheres to the treated surface (surface) of the substrate W, it adversely affects the plated copper film. Thus, it is preferred to surround the anode plate 606 with a filter film 638, as shown in FIG. 38, and prevent the outflow of the peeled piece of the black film by use of the filter film 638. In this example, provision of the filter film 636 is applied to the example shown in FIG. 30, but needless to say, can be similarly applied to other examples.

Figure 39:
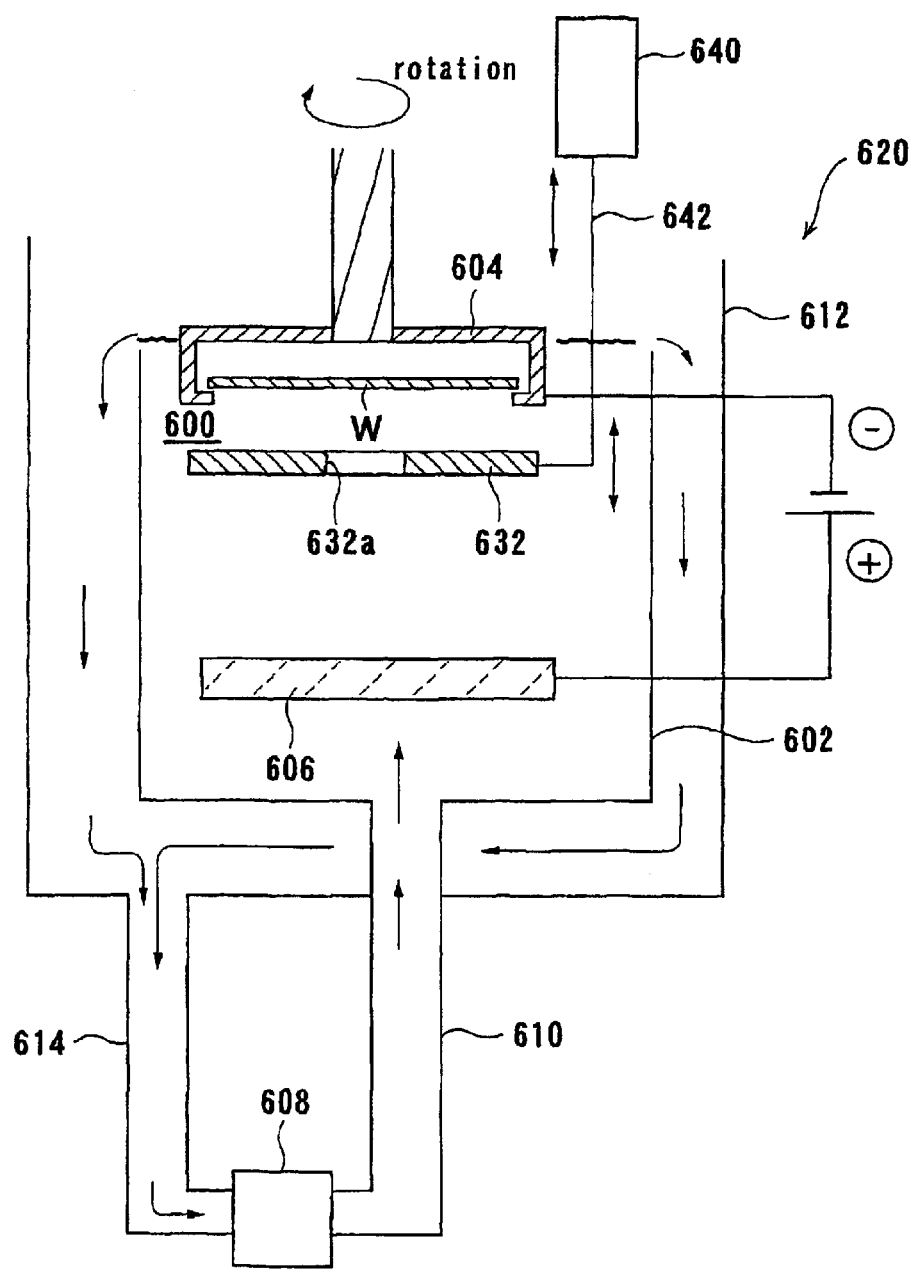
FIG. 39 is a schematic sectional view showing another example of the copper plating device having the film thickness distribution adjusting function.

FIG. 39 shows a copper plating device 630 which includes the same insulator 632 having the central hole 632a shown in FIG. 29. This insulator 632 is connected to an upwardly and downwardly moving rod 642 of an upwardly and downwardly moving mechanism 640, and the relative position of the insulator 632 relative to the positive electrode 606 and the substrate W is changed in accordance with driving of the upwardly and downwardly moving mechanism 640. According to this contrivance, the electric field between the anode plate 606 and the substrate W can be adjusted via the insulator 632.

Figure 40:
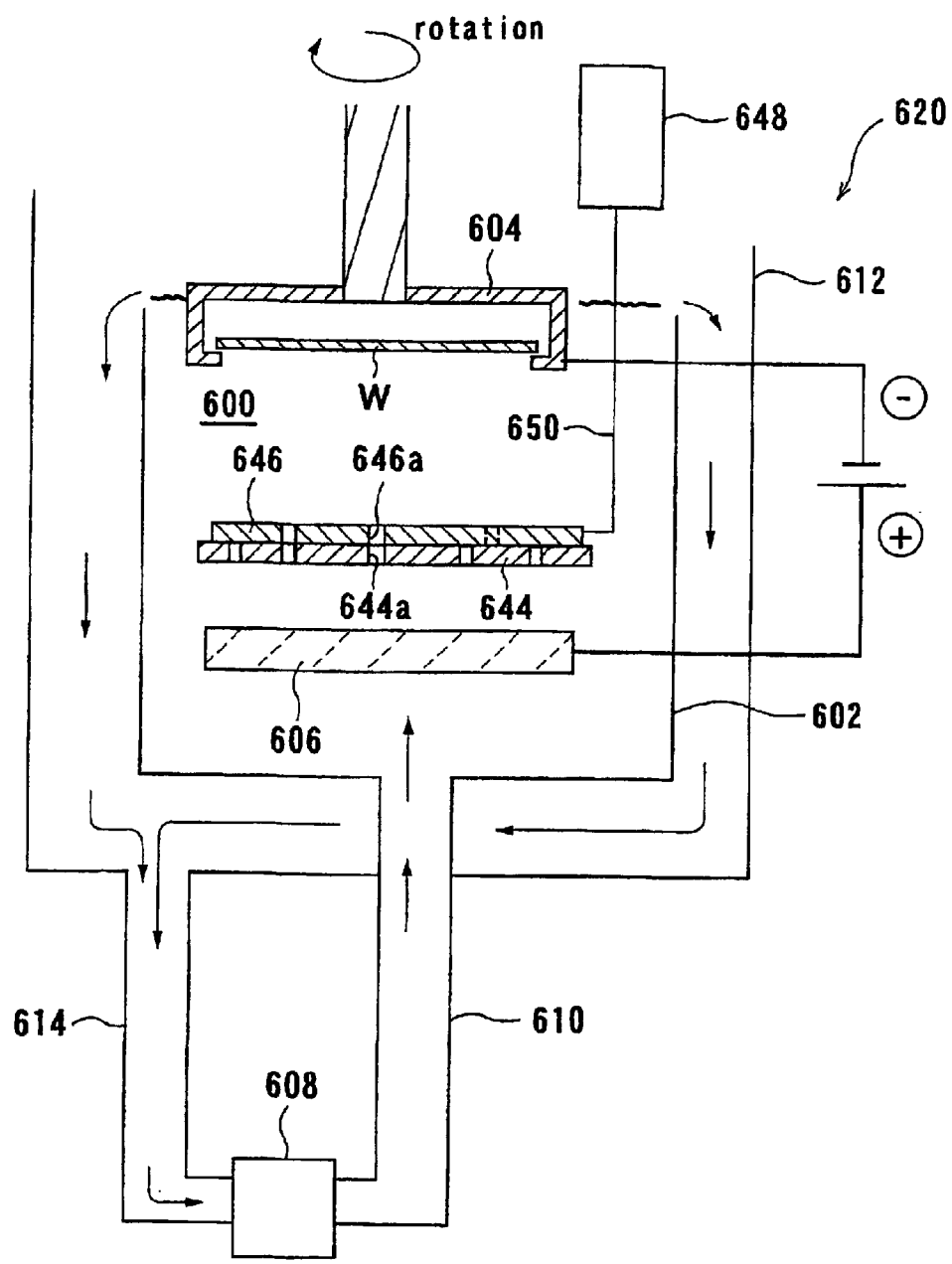
FIG. 40 is a schematic sectional view showing another example of the copper plating device having the film thickness distribution adjusting function.

FIG. 40 shows a copper plating device 630 which includes a disk-shaped insulator (virtual anode) 644 having a plurality of through-holes 644a, and a similarly disk-shaped insulator (virtual anode) 646 having a plurality of through-holes 646a and stacked rotatably on the insulator 644. One of the insulators 646, is rotated via a rotating rod 650 of a rotating mechanism 648 to change the phases of both insulators 644 and 646. The number of the through-holes 644a and 646a of the insulators 644 and 646 communicating with each other is changed in accordance with the change in the phases. According to this design, the electric field between the anode plate 606 and the substrate W can be adjusted by adjusting the angle of rotation of the insulator 646.

FIGS. 41 to 46 show the CMP device (polishing device) 624 having a polishing amount adjusting mechanism.

Figure 41:
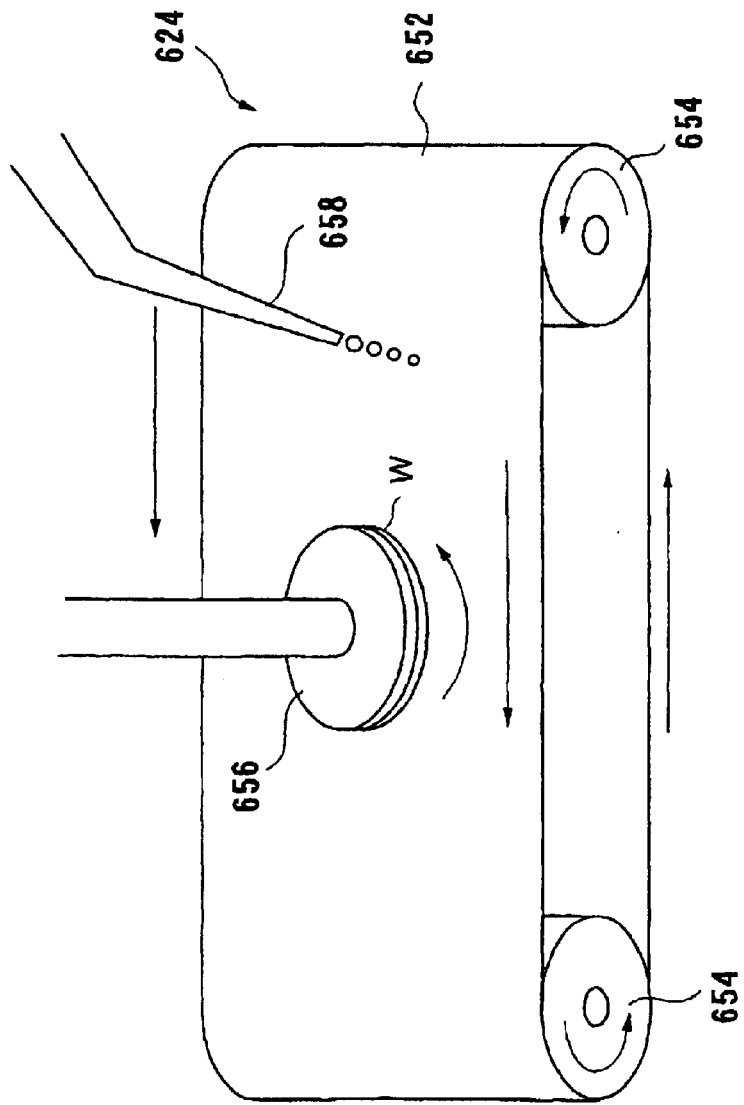
FIG. 41 is a perspective view showing an example of a CMP device having a polishing amount adjusting function.
Figure 42:
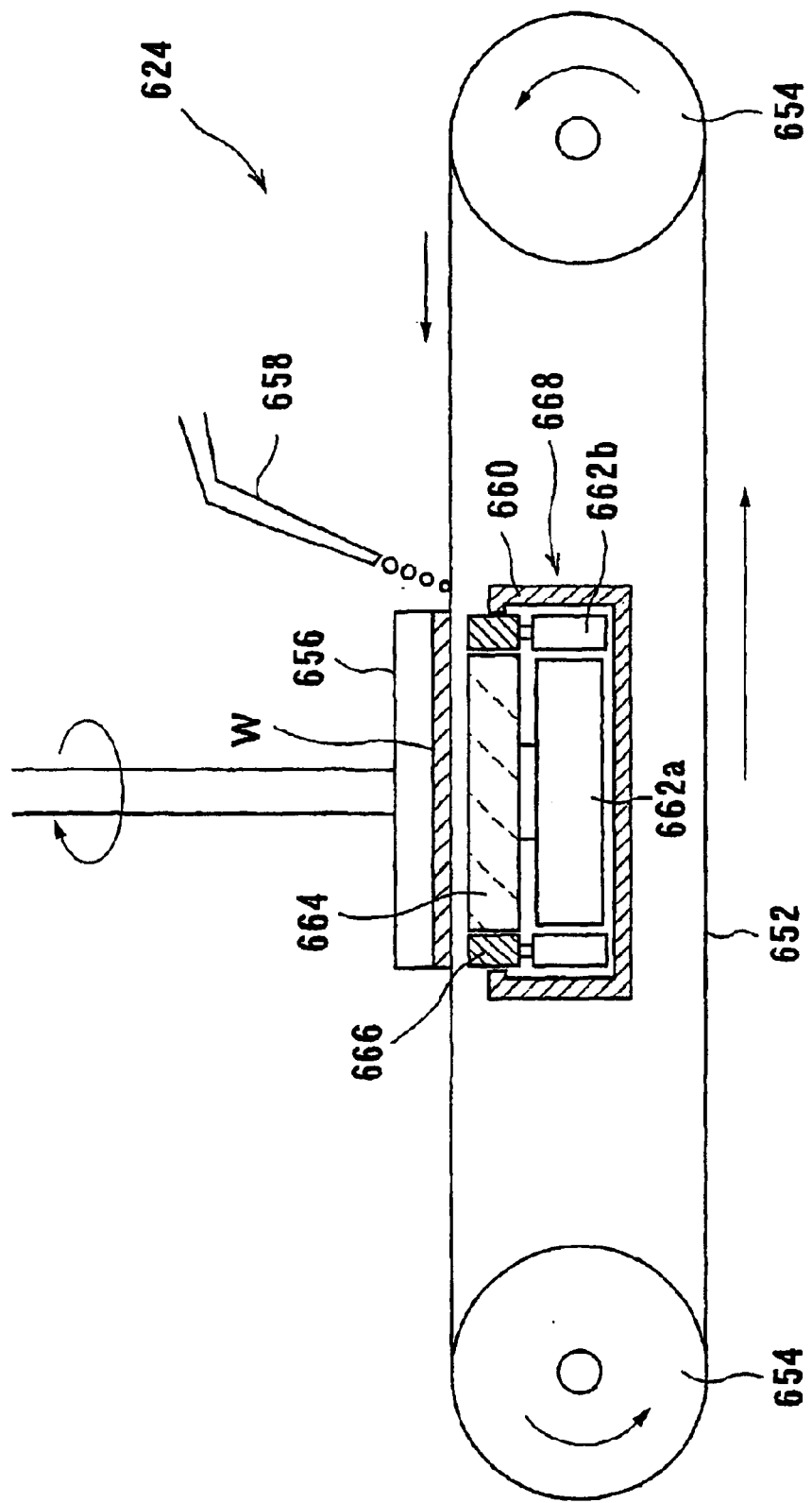
FIG. 42 is a longitudinally sectional front view of FIG. 41.

FIGS. 41 and 42 show a CMP device 624 which includes a polishing belt 652 composed of belt-shaped polishing cloth or a cloth having abrasive grains fixed thereto. The polishing belt 652 is looped between a pair of rollers 654 and 654, with its polishing surface directed outward. A substrate W attracted and held by a polishing head 656 is pressed against the polishing belt 652 which is traveling, with the substrate W being rotated. The polishing surface of the polishing belt 652 is supplied with an abrasive liquid or pure water (containing a pH adjustor) from an abrasive liquid supply nozzle 658.

A press device 668 is disposed below the polishing head 656 and at a position at which the press device 668 and the polishing head 656 sandwich the polishing belt 652 running upper side. The press device 668 comprises a central disk 664 and an annular plate 666 surrounding the central disk 664. The central disk 664 and the annular plate 666 are housed in a housing 660 and can be raised and lowered individually via actuators 662a, 662b. Because of this press device 668, the upper surface of the annular plate 666, for example, can be caused to protrude above the upper surface of the central disk 664, thereby making it possible to make the amount of polishing of the peripheral edge portion of the substrate W larger than that of the central portion of the substrate W.

In this case, the polishing head 656 may be one exerting a single pressure on the entire surface of the substrate, or may be a top ring 300 as shown in FIGS. 9 to 16.

Figure 43A:
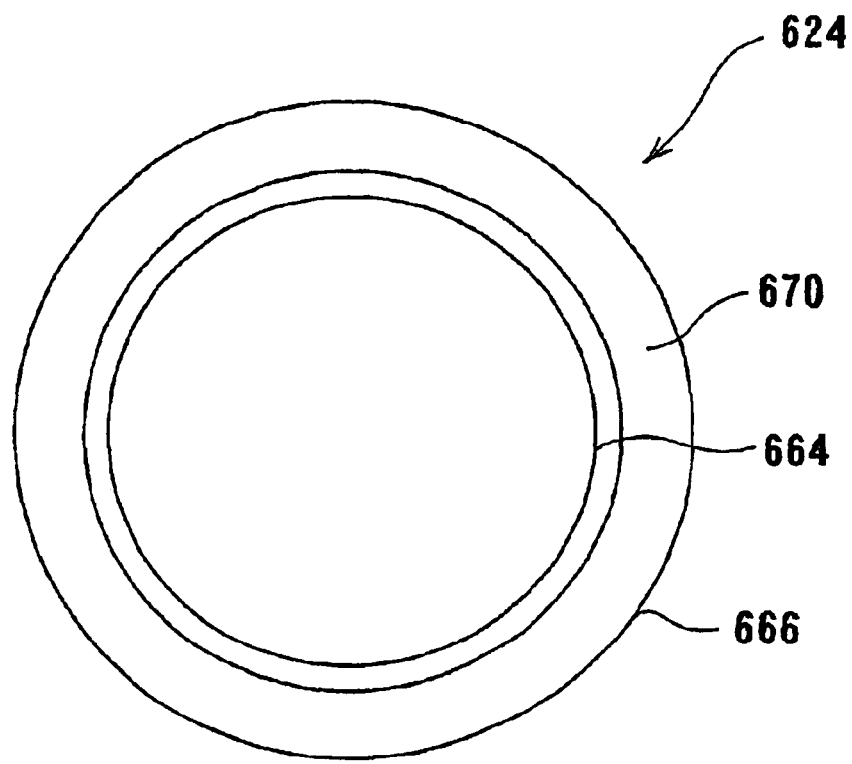
FIGS. 43A and 43B are views showing a modification of FIG. 42, FIG. 43A being a plan view, and FIG. 43B being a longitudinally sectional front view.
Figure 43B:
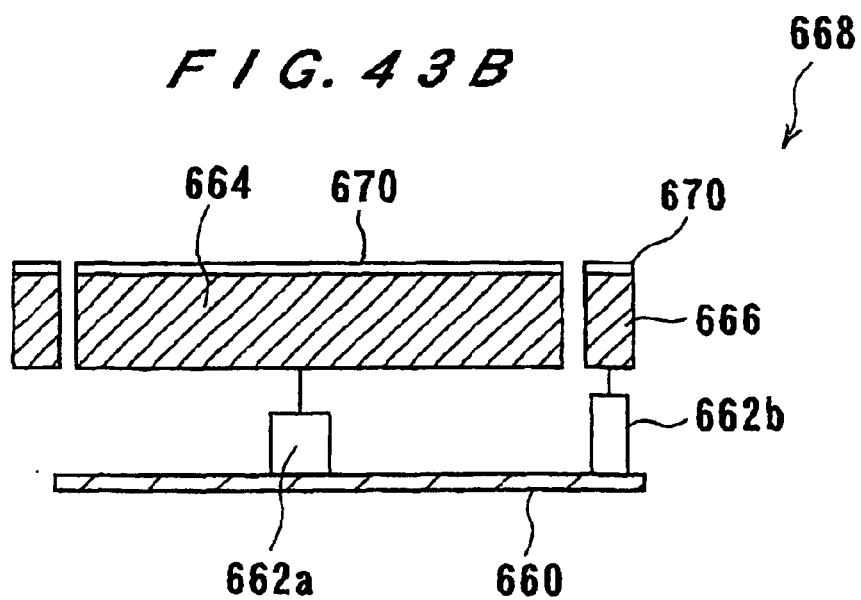

As shown in FIGS. 43A and 43B, Teflon 670 (trademark) may be bonded to the upper surfaces of the central disk 664 and the annular plate 666, whereby friction occurring between the polishing belt 652 and the central disk 664, and the polishing belt 652 and the annular plate 666 can be diminished.

In polishing copper, the use of abrasive grains fixed to the belt is preferred to the use of the polishing cloth as the polishing surface supplied with an abrasive liquid, because dishing can be minimized for copper which is a soft metal.

Figure 45:
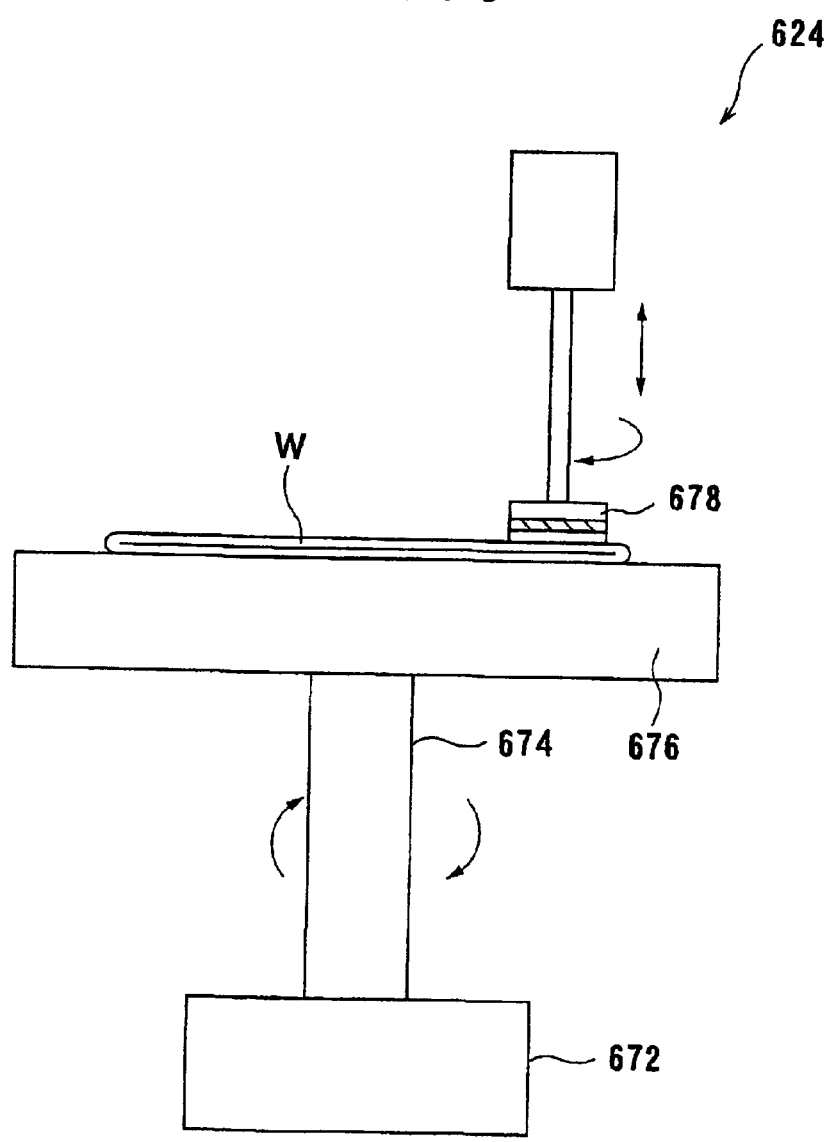
FIG. 45 is a longitudinally sectional front view of FIG. 44.
Figure 46:
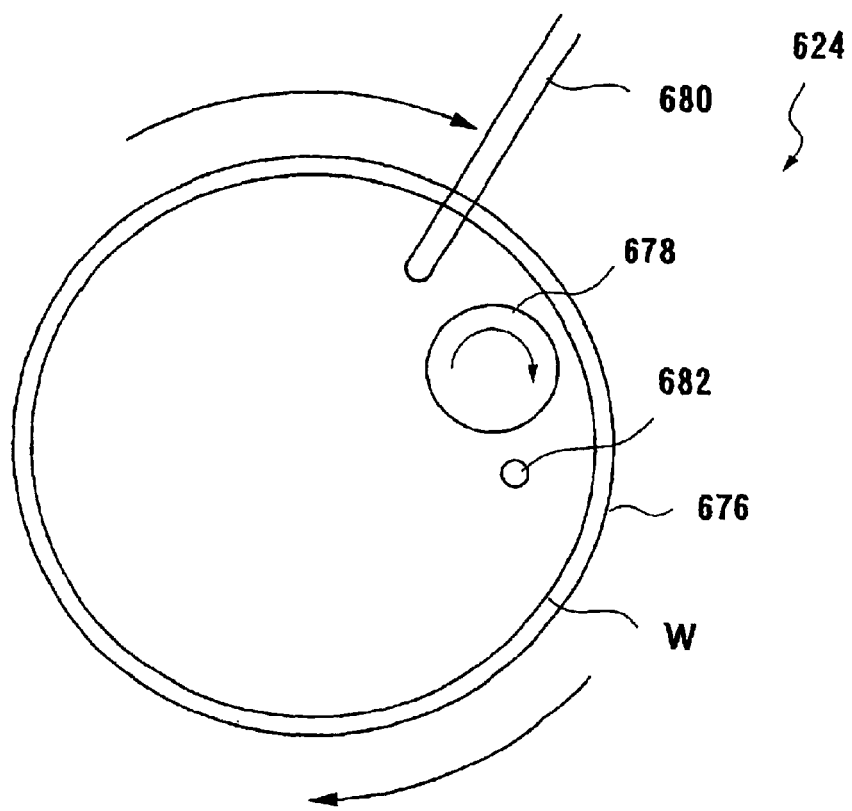
FIG. 46 is a plan view of FIG. 45.

FIGS. 44 to 46 show another example of the CMP device 624. In the CMP device 624, a rotary table 676 of a larger diameter than that of a substrate W is coupled to the upper end of a rotating shaft 674 which rotates in accordance with the rotation of a motor 672. The substrate W is held to the upper surface of the rotary table 676, with its device-formed face (surface) directed upward, and is rotated in this state. A polishing tool 678 having abrasive grains or an abrasive cloth fixed thereto and having a diameter smaller than the radius of the substrate W is pressed, while being rotated, against the substrate W, and simultaneously an abrasive liquid or pure water is supplied from an abrasive liquid supply nozzle 680 to the surface of the substrate W to polish the substrate W. The film thickness of the plated copper film after polished is measured by a film thickness sensor 682 at the position located beside the polishing tool 678.

The polishing tool 678 is moved in the diametrical direction of the substrate to perform polishing of the entire surface of the substrate. If the plated copper film is thicker on the periphery of the substrate than at the center of the substrate, the radially moving speed of the polishing tool 678 on the periphery of the substrate should be slowed. Moreover, the film thickness sensor 682, such as an optical sensor, is mounted in order to control the radially moving speed of the polishing tool 678 while measuring the plated copper film thickness at the annular zone of the substrate being polished. By so doing, the plated copper film of a film thickness different between the center and periphery of the substrate can be flattened. In this case, as shown in FIG. 46, the position of the film thickness sensor 682 is preferably downstream from the polishing tool 678 in the rotating direction of the substrate, and position of the supply of the abrasive liquid is desirably upstream from the polishing tool 678 in the rotating direction of the substrate.

Some or all of the copper plating device 620 having the film thickness adjusting mechanism for the plated copper film at the center and the periphery of the substrate W, the film thickness distribution measuring device 622, and the CMP device (polishing device) 624 capable of adjusting the amount of polishing at the center and the periphery of the substrate W may be integrated into a single apparatus.

Figure 47:
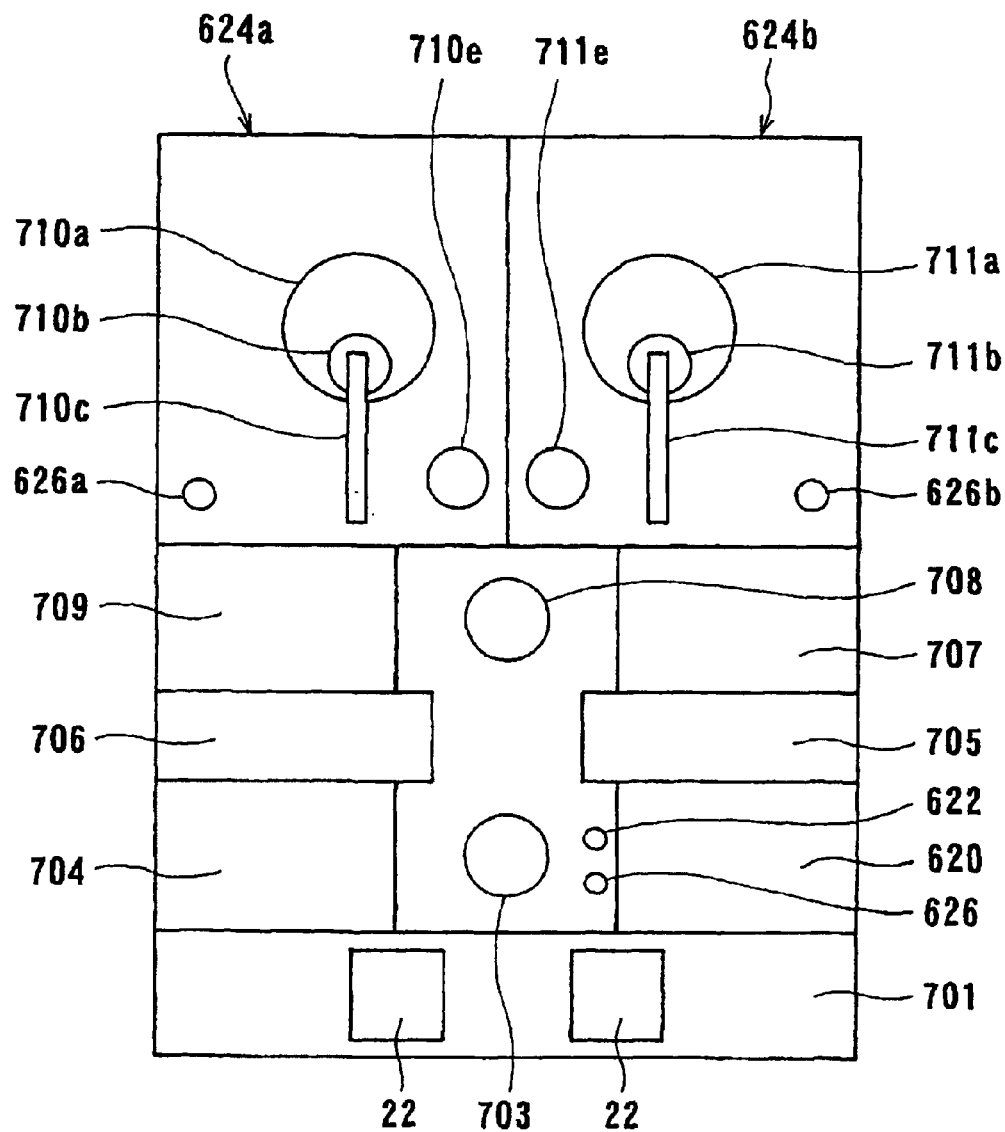
FIG. 47 is a layout plan view showing another example of the substrate processing apparatus.

The following embodiments show examples of the integrated apparatus. A seed layer forming chamber may be added to an integrated apparatus as shown in FIG. 47. Formation of the seed layer can be performed using an ordinary CVD device or sputtering device, or by electroless-plating. A barrier layer forming device may be included in the integral type.

FIG. 47 is a view showing a plan configuration of a semiconductor substrate processing apparatus. The present semiconductor substrate processing apparatus comprises a loading/unloading portion 701, a copper plating device 620, a first robot 703, a third cleaner 704, an inverting machine 705, an inverting machine 706, a second cleaner 707, a second robot 708, a first cleaner 709, a first CMP device 624a, and a second CMP device 624b. A film thickness distribution measuring device 622 for measuring the film thicknesses of the plated film before and after plating, and a film thickness distribution measuring device 626 for measuring the film thickness of the dry plated copper film on the semiconductor substrate W after polishing are disposed near the first robot 703.

The film thickness distribution measuring devices 622, 626, especially, the film thickness distribution measuring device 626 for measuring the film thickness distribution after polishing, may be provided on the hand of the first robot 703. The film thickness distribution measuring device 622, although not illustrated, may be provided at the semiconductor substrate carry-in/carry-out port of the copper plating device 620 to measure the film thickness of the semiconductor substrate W carried in, and the film thickness of the semiconductor substrate W carried out.

The first CMP device 624a comprises a polishing table 710a, a top ring 710b, a top ring head 710c, a film thickness distribution measuring device 626a, and a pusher 710e. The second CMP device 624b comprises a polishing table 711a, a top ring 711b, a top ring head 711c, a film thickness distribution measuring device 626b, and a pusher 711e.

A box housing a substrate cassette 22 accommodating semiconductor substrates W having a contact hole 3 and a trench 4 for an interconnection, and a seed layer 7 formed thereon is placed on the stage of the loading/unloading portion 701. The box is opened by a box opening/closing mechanism, and then the semiconductor substrate W is withdrawn from the substrate cassette 22 by the first robot 703, and carried into the copper plating device 620 for forming a copper film 6. Before formation of the copper film 6, the film thickness of the seed layer 7 is measured with the film thickness distribution measuring device 626. Formation of the copper film 6 is carried out by copper plating device 620. After formation of the copper film 6, the substrate is rinsed or cleaned by the copper plating device 620. If time permits, the substrate may be dried.

When the semiconductor substrate W is withdrawn from the copper plating device 620 by the first robot 703, the film thickness distribution of the copper film (plated copper film) 6 is measured with the film thickness distribution measuring device 626. The measuring method is the same as for the seed layer 7. The results of the measurement are recorded in a recorder (not shown) as recorded data on the semiconductor substrate, and are also used for judgement of an abnormality of the copper plating device 620. After the film thickness is measured, the first robot 703 transfers the semiconductor substrate W to the inverting machine 705, which turns the semiconductor substrate W upside down (the surface where the copper film 6 has been formed is directed downward).

The second robot 708 picks up the semiconductor substrate W on the inverting machine 705, and places the semiconductor substrate W on the pusher 710e of the CMP device 624a. The top ring 710b attracts the semiconductor substrate W on the pusher 710e, and presses the surface, where the copper film 6 has been formed, of the semiconductor substrate W against the polishing surface of the polishing table 710a to carry out polishing.

Silica, alumina or ceria is used as abrasive grains for polishing of the copper film 6, and a material for oxidizing copper mainly with an acidic material, such as hydrogen peroxide, is used as an oxidizing agent. An adjusted temperature fluid piping for passing a liquid adjusted to a predetermined temperature is connected to the interior of the polishing table 710a in order to maintain the temperature of the polishing table 710a at a predetermined value. In order that the temperature of a slurry containing the abrasive grains and oxidizing agent is also maintained at a predetermined value, a temperature adjustor is provided in a slurry nozzle for ejecting the slurry. The temperature of water or the like for dressing is also adjusted, although this is not shown. In this manner, the temperature of the polishing table 710a, the temperature of the slurry, and the temperature of water or the like for dressing are kept at predetermined values, whereby the chemical reaction rate is kept constant. As the polishing table 710a, in particular, alumina or ceramic, such as SiC, with high thermal conductivity is used.

To detect the end point of polishing, there is performed film thickness measurement of the copper film 6 by use of an eddy current type film thickness measuring machine or an optical film thickness measuring machine provided on the polishing table 710a; or surface detection of the barrier layer 5. The time when the film thickness of the copper film 6 is found to be zero or when the surface of the barrier layer 5 is detected is taken as the end point of polishing.

After polishing of the copper film 6 is completed, the top ring 710b returns the semiconductor substrate W onto the pusher 710e. The second robot 708 takes up the semiconductor substrate W, and puts it into the first cleaner 709. At this time, a chemical liquid may be jetted at the face side and back side of the semiconductor substrate Won the pusher 710e to remove particles or make particles difficult to adhere.

In the first cleaner 709, the face side and back side of the semiconductor substrate W are scrub cleaned with, for example, a PVA sponge roll. In the first cleaner 709, cleaning fluid ejected from the nozzle is mainly pure water, but may be one mixed with a surfactant and/or a chelating agent, and then pH adjusted in harmony with the zeta potential of copper oxide. Also, an ultrasonic vibratory element may be provided on the nozzle to apply ultrasonic vibrations to the cleaning fluid ejected. During scrub cleaning, the semiconductor substrate W is gripped by a rotating roller and rotated in a horizontal plane.

After completion of cleaning, the second robot 708 transfers the semiconductor substrate W to the second CMP device 624b, and places the semiconductor substrate Won the pusher 711e. The top ring 711b attracts the semiconductor substrate W on the pusher 711e, and presses the surface, where the barrier layer 5 has been formed, of the semiconductor substrate W against the polishing surface of the polishing table 711a to carry out polishing. The configurations of the polishing table 711a and top ring 711b are the same as those of the polishing table 710a and top ring 710b.

The polishing surface on the top of the polishing table 711a is composed of a polyurethane foam such as IC1000, or the one having abrasive grains fixed thereto or impregnated with abrasive grains. Polishing is performed by the relative movement of the polishing surface and the semiconductor substrate W. At this time, silica, alumina or ceria is used for abrasive grains or slurry. A chemical liquid is adjusted according to the type of the film to be polished.

After polishing is completed, the top ring 711b transfers the semiconductor substrate W to the pusher 711e. The second robot 708 takes up the semiconductor substrate W on the pusher 711e. At this time, a chemical liquid may be jetted at the face side and back side of the semiconductor substrate W on the pusher 711e to remove particles or make particles difficult to adhere.

The second robot 708 transfers the semiconductor substrate W to the second cleaner 707 for cleaning. The configuration of the second cleaner 707 is also the same as the configuration of the first cleaner 709. Pure water is mainly used as a cleaning fluid for removal of particles, and a surfactant, a chelating agent, or a pH adjusting agent may be used. The surface of the semiconductor substrate W is scrub cleaned with a PVA sponge roll. A strong chemical liquid, such as DHF, is ejected from the nozzle toward the back side of the semiconductor substrate W to etch diffused copper. Without the problem of diffusion, the back side of the semiconductor substrate W is scrub cleaned with a PVA sponge roll using the same chemical liquid as for the surface of the semiconductor substrate W.

Upon completion of the above cleaning, the second robot 708 takes up the semiconductor substrate W, and transfers it to the inverting machine 706, which turns the semiconductor substrate W upside down. The thus inverted semiconductor substrate W is picked up by the first robot 703 and placed in the third cleaner 704. The third cleaner 704 jets megasonic water, which has been excited by ultrasonic vibrations, at the surface of the semiconductor substrate W to clean the semiconductor substrate W. At this time, pure water, a surfactant, a chelating agent, or a pH adjusted agent may be added, and the surface of the semiconductor substrate W may be cleaned with a publicly known pencil type sponge. Then, the semiconductor substrate W is dried by spin drying.

Figure 48:
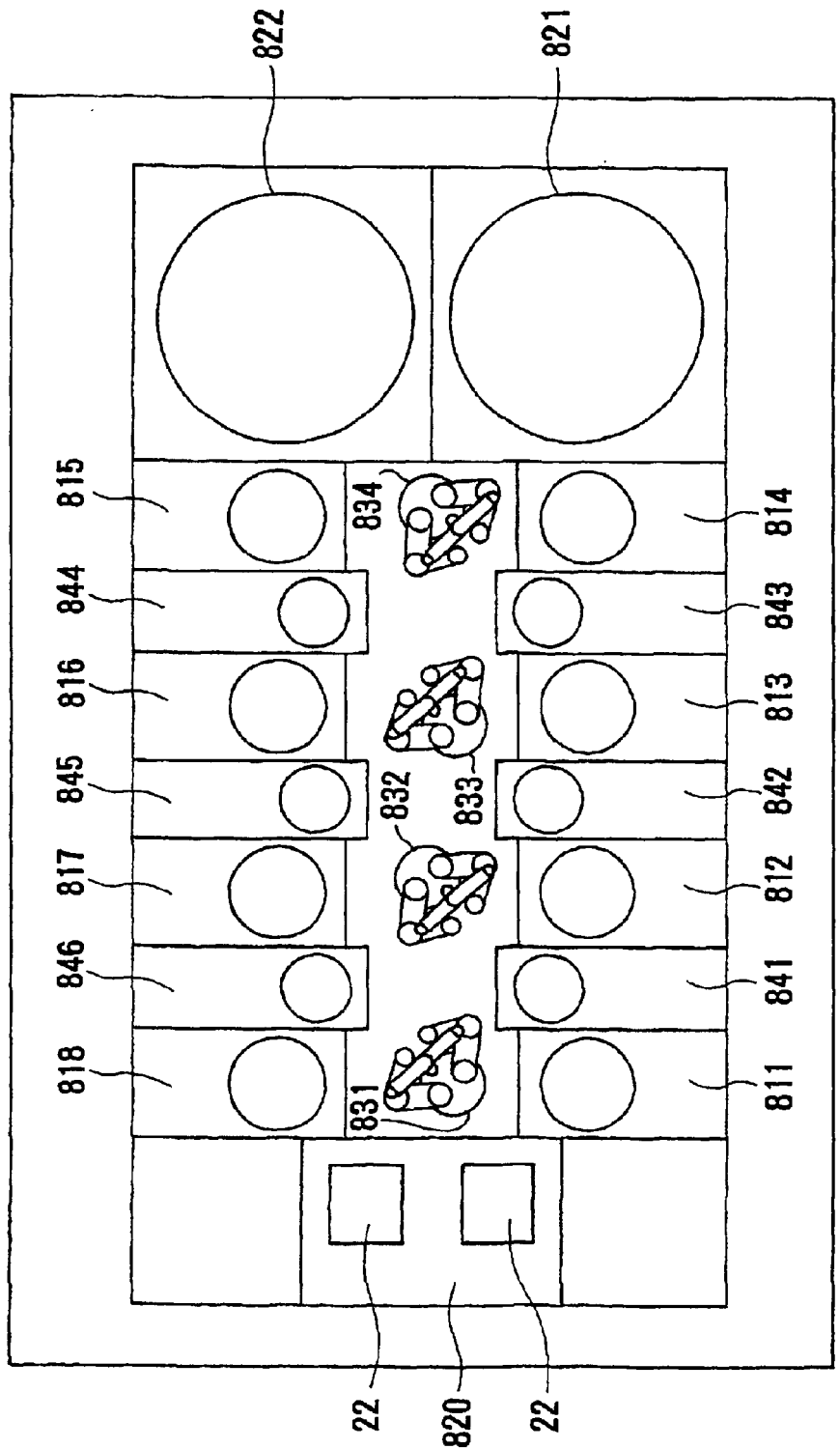
FIG. 48 is a layout plan view showing still another example of the substrate processing apparatus.

FIG. 48 is a view showing the plan layout of another example of the substrate processing apparatus. This substrate processing apparatus comprises a barrier layer forming unit 811, a seed layer forming unit 812, a plating film forming unit (plating device) 813, an annealing unit 814, a first cleaning unit 815, a bevel/back side cleaning unit 816, a cap-plating unit 817, a second cleaning unit 818, a first aligner and film thickness measuring instrument 841, a second aligner and film thickness measuring instrument 842, a first substrate inverting machine 843, a second substrate inverting machine 844, a substrate temporary placing table 845, a third film thickness measuring instrument 846, a loading/unloading portion 820, a first CMP device 821, a second CMP device 822, a first robot 831, a second robot 832, a third robot 833, and a fourth robot 834.

In this example, an electroless copper plating device can be used as the barrier layer forming unit 811, an electroless copper plating device can be used as the seed layer forming unit 812, and an electric plating device can be used as the plating film forming unit 813.

Figure 49A:
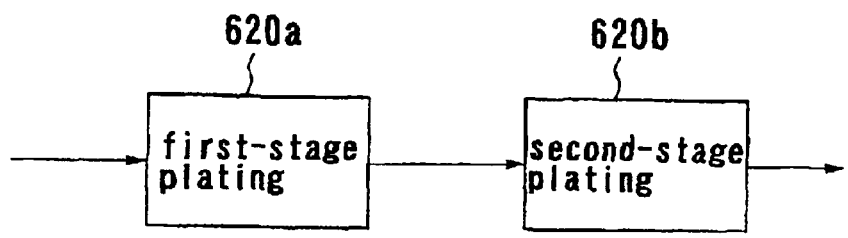
FIGS. 49A through 49E are views attached to a description of two-stage plating.
Figure 49B:
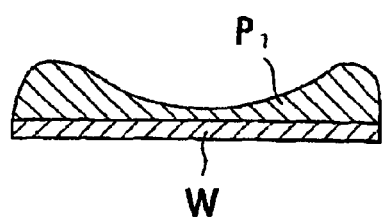
Figure 49C:
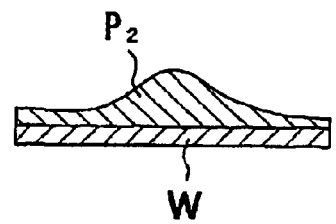

FIGS. 49A to 49E show an example in which the film thickness distribution is adjusted more uniformly by two copper plating devices having different film thickness distribution characteristics. As shown in FIG. 49B, the first-stage plating device 620a is one designed to deposit a plated copper film $P_1$ having film thickness distribution characteristics with the film thickness increasing on the periphery. As shown in FIG. 49C, the second-stage plating device 620b is one designed to deposit a plated copper film $P_2$ having film thickness distribution characteristics with the film thickness increasing at the center.

Figure 49D:
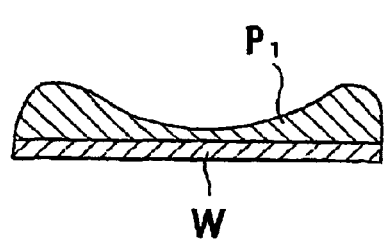
Figure 49E:
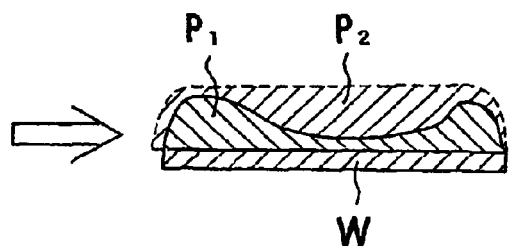

These two copper plating devices 620a and 620b are arranged in series to perform copper plating of the substrate, thereby depositing the plated copper film $P_1$ as shown in FIG. 49D, and then depositing the plated copper film $P_2$ thereon as shown in FIG. 49E. By adjusting the periods of time for these plating steps, a plated copper film with a more uniform film thickness distribution can be obtained. This method can change the thickness distribution at the center and periphery of the substrate even during plating. Since the method needs only changes in the plating time and does not require a mechanical adjusting mechanism, it can adjust the plated copper film thickness distribution in situ.

If the film thickness of the plated copper film after the second-stage plating is larger at the center, an adjustment is made to increase the plating time or the plating electric current for the first-stage plating, or to decrease the plating time or the plating electric current for the second-stage plating. This adjustment makes it possible to decrease variations in the film thickness of the plated copper film at the center and periphery of the substrate after the second-stage plating.

It goes without saying that the first-stage plating device may be one designed to deposit a plated copper film having film thickness distribution characteristics with the film thickness increasing at the center, and the second-stage plating device may be one designed to deposit a plated copper film having film thickness distribution characteristics with the film thickness increasing on the periphery.

As shown in FIG. 50, it is acceptable to perform the first-stage plating by the first-stage plating device 620a, measure the film thickness distribution of the plated copper film by a film thickness distribution measuring device 622a, and adjust the plating period of the second-stage plating device 620b on the basis of the results of measurement. In this case, it is possible to further decrease variations in the film thickness of the plated copper film at the center and periphery of the substrate after the second-stage plating.

In this manner, the combined use of the plating device capable of adjusting the film thickness of the plated copper film at the center and periphery of the substrate, and the film thickness distribution measuring device for the center and periphery of the substrate enables an adjustment to be made so as to decrease variations in the film thickness of the plated copper film at the center and periphery of the substrate after plating. This can be achieved by a simple adjustment, as well as automation by a control device using common techniques such as feedback control and/or feed forward control. Furthermore, it is possible not only to make an adjustment so as to decrease variations in the film thickness of the plated copper film at the center and periphery of the substrate, but also to plate a plated copper film having a distribution of the film thickness of the plated copper film at the center and periphery of the substrate, the distribution adapted to the polishing properties of a CMP device for the periphery and center of the substrate. For example, when the plating device is combined with a polishing device which polishes more at the center than on the periphery of the substrate, it is recommendable to plate a plated copper film thicker at the center than on the periphery of the substrate.

To polish the plated copper film, the CMP device used here, which can adjust the pressures on the center and the periphery of the substrate independently, may be an ordinary CMP device which presses a substrate held by a rotating head against a polishing cloth attached to an ordinary rotary table, and polishes the substrate with an abrasive liquid supplied to the polishing cloth. However, a fixed abrasive grain type polishing device having abrasive grains fixed thereto is desired in order to prevent dishing. The desired head is one which presses the substrate by a fluid pressure. When the fixed abrasive grain type polishing device is used, scratches due to polishing may occur on the surface of the plated copper film. To remove them, it is desirable to polish the substrate with the fixed abrasive grains at the first stage, and carry out ordinary polishing with a polishing cloth and an abrasive liquid at the second stage, thereby removing the scratches.

The plating device having the film thickness distribution adjusting mechanism for the plated copper film at the center and periphery of the substrate, the film thickness distribution measuring device, and the CMP device capable of adjusting the polishing amount for the center and periphery of the substrate may be housed separately in the clean room. In this case, in order to prevent oxidation of the surface of the plated copper film, it is desirable to use the substrate transport box such as SMIF or HOOP mentioned in the previous embodiments, and further use a transport device adapted to circulate gases inside the substrate transport box, and isolate the gases in the atmosphere around the substrate from the clean room by a particle filter placed inside the substrate transport box, or this particle filter combined with a chemical filter and further a dehumidifier, thereby controlling the amount of particles, the amount of oxygen, or the amount of steam. Moreover, the atmosphere inside each device is desirably isolated from the clean room by a partition or the like, with the amount of oxygen or steam inside the device being controlled.

Figure 51:
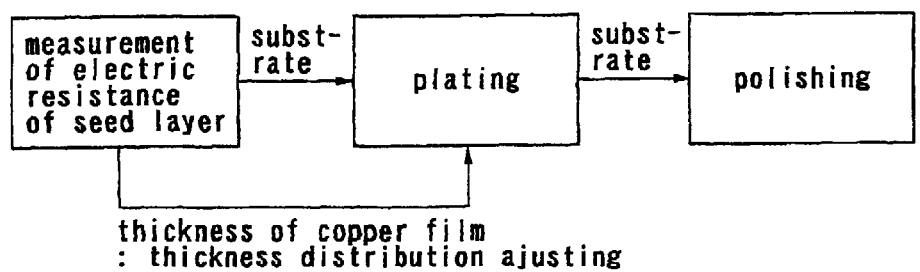
FIG. 51 is a block diagram showing an example of measuring the electric resistance of a copper seed layer to control the copper plating device and the CMP device.

Further, as shown in FIG. 51, the electric resistance of the copper seed layer 7 formed on the surface of the substrate may be measured before copper plating, and based on the results, the film thickness distribution adjusting mechanism of the copper plating device for the center and periphery of the plated copper film may be adjusted. This measurement of the electric resistance of the copper seed layer may be made using a device other than the plating device. However, it is desired to measure the resistance between the cathode and the copper seed layer in the actual plating state, so that the electric resistance of the copper seed layer should be measured using the cathode contacts of the plating device.

FIGS. 52 to 63 show examples of an electric terminal members serving concurrently as copper seed layer resistance measuring terminals and a cathode. As shown in FIGS. 52 and 53, a semiconductor substrate W is placed on a substrate placing stand 900 composed of an isolator, with the copper seed layer formed surface of the substrate being directed downward. On a surface of the substrate placing stand 900 receiving the substrate W, a plurality of electric terminals 902 are arranged with a predetermined pitch along the circumferential direction. When concurrently used as a cathode, the electric terminals 902, at least, need to be prevented from contacting with a plating liquid. For this purpose, sealing members 904, 906 are arranged on both sides (outside and inside) of the electric terminals 902, and the sealing member 609 is pressed by a seal press 908, whereby a sealing mechanism is constituted in this example. Only the inner sealing material 906 for the electric terminal 902 may be provided.

Figure 54A:
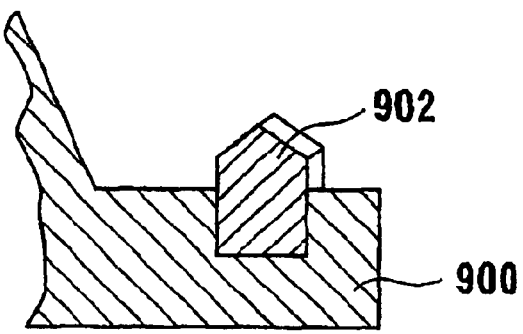
FIGS. 54A through 54C are sectional views showing different examples of the electric terminal.

The electric terminal 902 is formed in a rectangular shape in this embodiment, but may be in the form of a knife edge making linear contact with the copper seed layer, as shown in FIG. 54A. Also, the electric terminal 902 may be pinnacle-shaped so as to make point contact with the copper seed layer, although this is not shown. The point contact can decrease electric resistance between the electric terminal and the copper seed layer.

Figure 54B:
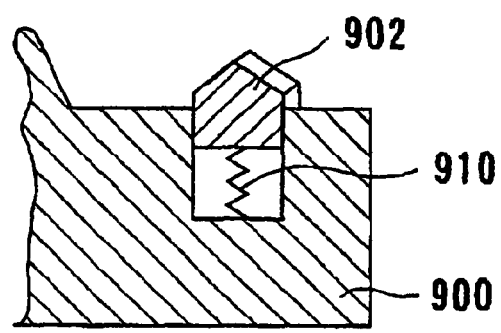
Figure 54C:
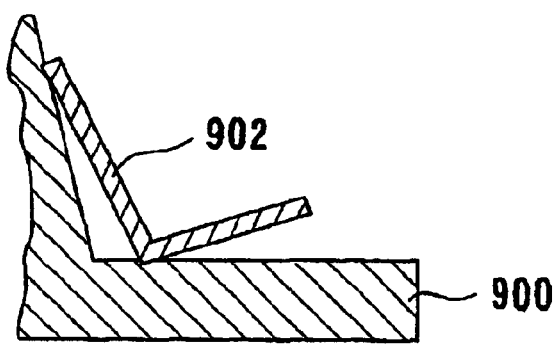

As shown in FIG. 54B, moreover, it is desired to provide a structure in which a spring 910 is disposed beneath each electric terminal 902, whereby each electric terminal 902 is urged upward by the elastic force of the spring 910 and independently pressed against the copper seed layer with a constant force. In addition, as shown in FIG. 54C, there may be a structure in which the electric terminal 902 is composed of a bent metallic plate and can be pressed, by itself, against the copper seed layer. At least the surface of the electric terminal 902 is desirably made of metal or platinum in order to decrease contact resistance between the electric terminal and the copper seed layer.

The substrate placing stand 900 desirably has a centering mechanism in order that the electric terminal 902 does not disengage from the substrate W. Examples of the centering structure are one in which an inner circumferential surface of the substrate placing stand 900 brought in contact with the substrate W is a tapered surface 900a, as shown in FIG. 55A, and one in which a metal plate is bent so as to have a centering mechanism for the substrate, thereby constituting an electric terminal 902, and a centering mechanism for the substrate is imparted to the electric terminal 902 itself, as shown in FIG. 55B.

In these examples, the device for measuring the resistance of the copper seed layer measures the resistance, with the copper seed layer facing downward. Needless to say, however, the resistance may be measured, with the copper seed layer facing upward.

Next, the method of measuring the electric resistance of the copper seed layer will be described.

Figure 56:
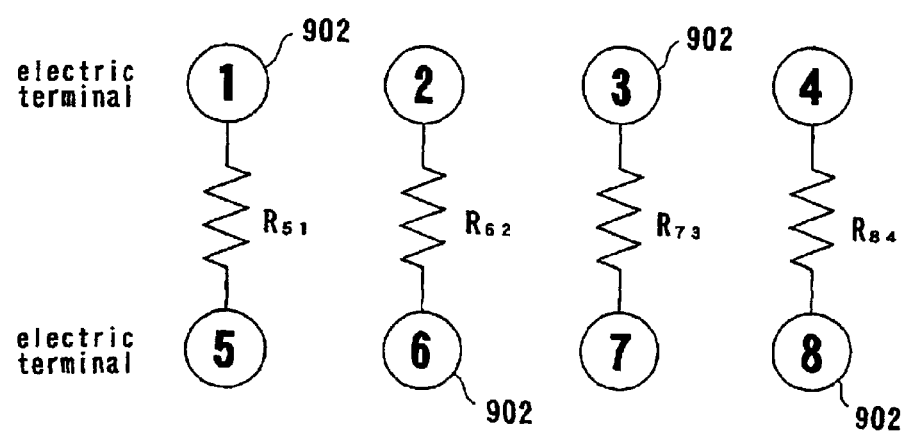
FIG. 56 is a view attached to a description of measurement of the electric resistance of the copper seed layer with the use of the electric terminal member shown in FIG. 52.

To measure the resistance of the copper seed layer, it is recommendable to apply a direct current voltage between the two electric terminals 902 and 902 located opposite to each other with respect to the center of the substrate W, and measure an electric current flowing between the two electric terminals 902 and 902. By performing this measurement between the electric terminals 902 and 902 sandwiching the enter of the substrate W, as shown in FIG. 56, a plurality of data (four data in this example, because eight of the electric terminals are present) can be obtained. Since errors exist in the measurements of electric resistance, the resistance value of the entire substrate can be found by various methods, such as calculating the arithmetic mean of the data, calculating the root mean square, and averaging the measured data with the exception of the maximum value and the minimum value.

The thus obtained measured value of the electric resistance of the seed layer is compared with the standard value of the electric resistance of the seed layer. If the measured value is greater than the standard value, there is a possibility that the plated copper film will be thicker on the periphery of the substrate than at the center of the substrate. Thus, the substrate center/periphery film thickness adjusting mechanism of the copper plating device is adjusted so that the plated copper film will be flat.

Figure 58A:
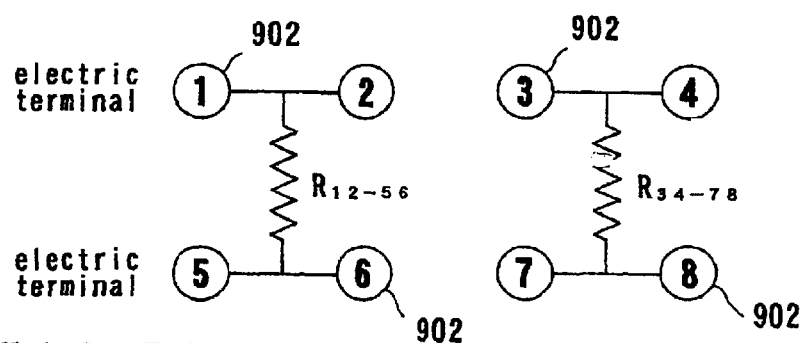
FIGS. 58A and 58B are views attached to a description of still another method for measuring the electric resistance of the copper seed layer.
Figure 58B:
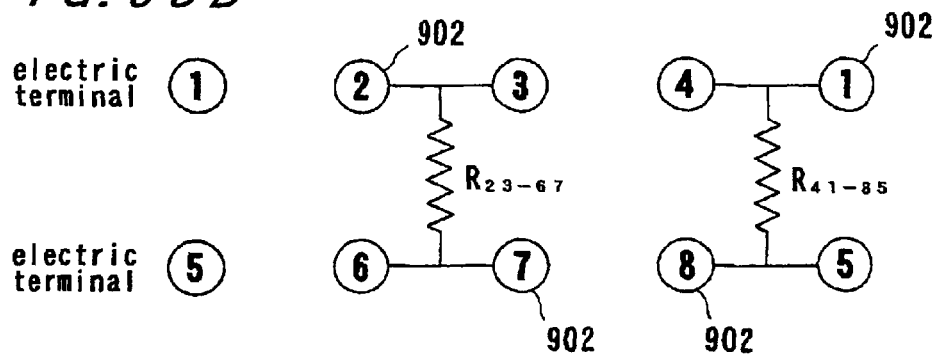

Furthermore, as shown in FIG. 57, two adjacent electric terminals 902 and 902 may be used as one electrode to measure resistance between these two adjacent electric terminals and the corresponding two adjacent electric terminals located on the opposite side relative to the center of the substrate. In this case, as shown in FIGS. 58A and 58B, combinations of the electric terminals 902 may be changed sequentially using the adjacent electric terminals 902 to make measurements.

Figure 59A:
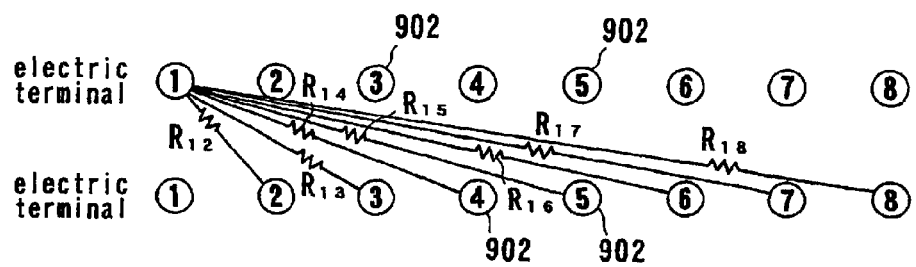
FIGS. 59A through 59C are views attached to a description of a further method for measuring the electric resistance of the copper seed layer.
Figure 59B:
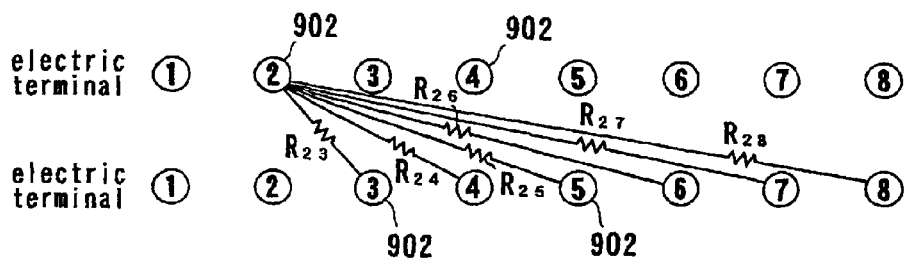
Figure 59C:
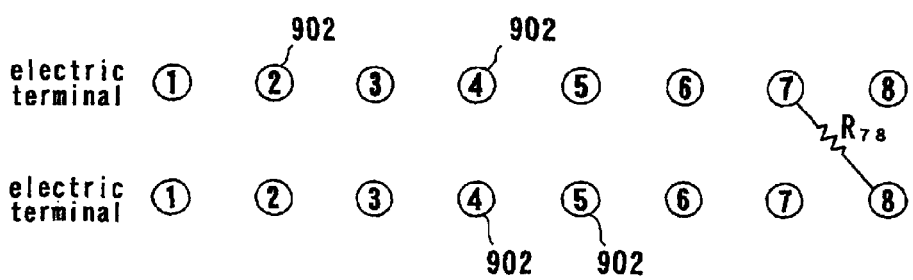

In addition, as shown in FIGS. 59A to 59C, the electric resistances between the arbitrary electric terminals 902 and 902 arranged around the edge of the substrate W may be measured (for example, the number of the electric terminals in this example is eight, so that there are at most 720 measurements), and the corresponding simultaneous equations may be solved, whereby the planar distribution of the electric resistance of the copper seed layer can be approximatively obtained. The use of this method approximatively gives the electric resistances $R_{10}$ to $R_{80}$ between the center of the substrate and the surroundings of the substrate edge as shown in FIG. 61.

Figure 60:
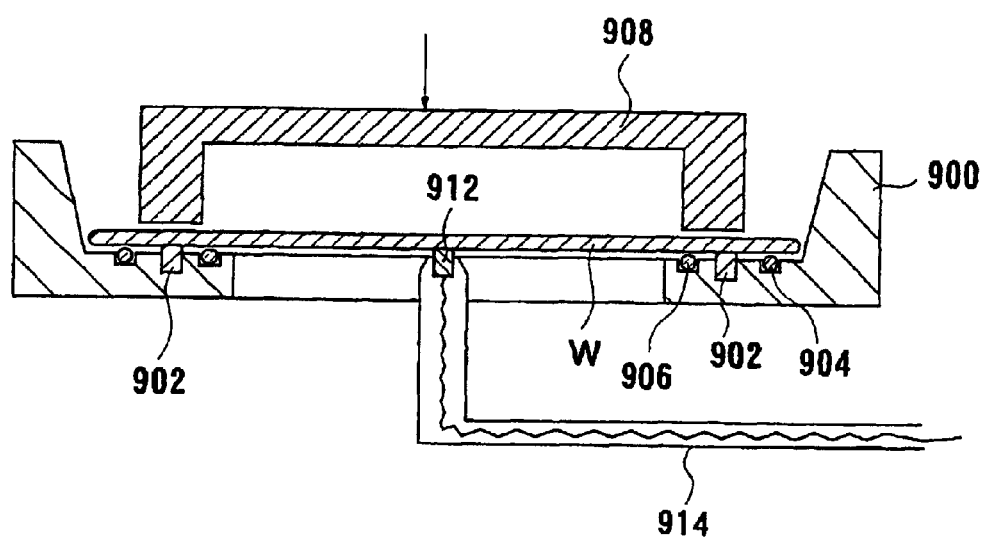
FIG. 60 is a sectional view showing another example of the electric terminal member serving concurrently as a copper seed layer resistance measuring terminal and a cathode.

FIGS. 60 and 61 show other example of measuring the distribution of the electric resistance of the copper seed layer. This example includes an electrode terminal arm 914 having a central electric terminal 912, brought into contact with the copper seed layer at the center of the substrate W. In this example, the electrode terminal arm 914 is of a movable type, and moves to the center of the substrate W only when measuring the electric resistance, and retreats when plating is performed.

In this example, a direct current voltage is sequentially applied between the central electric terminal 912 at the center of the substrate and the respective electric terminals 902 arranged around the edge of the substrate. The values of electric current flowing at this time are measured, thereby making it possible to find the electric resistances $R_{10}$, $R_{20}$ . . . $R_{80}$ of the copper seed layer between the central electric terminal 912 disposed at the center of the substrate and the respective electric terminals 902 arranged around the edge of the substrate as shown in FIG. 61.

Based on the thus found electric resistance distribution (e.g., $R_{10}$ to $R_{80}$) of the copper seed layer, voltages to be applied to the respective electric terminals of the cathode at the time of copper plating are adjusted and controlled independently, thus making it possible to adjust not only the distribution of the film thickness of the plated copper film in the radial direction of the substrate, but also the distribution of the film thickness of the plated copper film in the circumferential direction of the substrate. These adjustments may be made automatically by use of an ordinary control device adopting feed forward sequence control.

Figure 65:
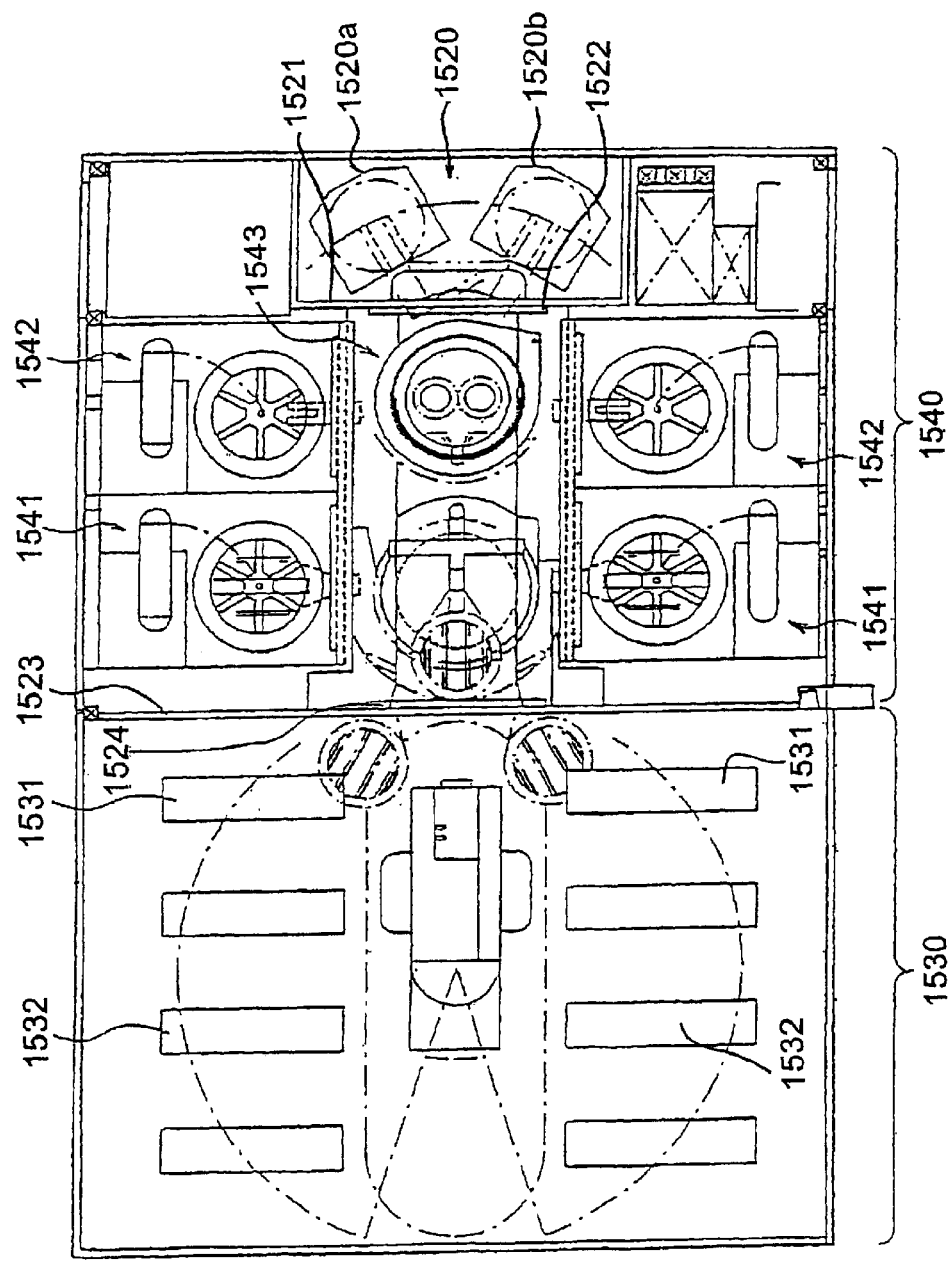
FIG. 65 is a plan view of an example of a substrate plating apparatus.

FIG. 65 is a plan view of an example of a substrate plating apparatus. The substrate plating apparatus shown in FIG. 65 comprises a loading/unloading area 1520 for housing substrate cassettes which accommodate semiconductor substrates, a processing area 1530 for processing semiconductor substrates, and a cleaning/drying area 1540 for cleaning/drying plated semiconductor substrates. The cleaning/drying area 1540 is positioned between the loading/unloading area 1520, and the processing area 1530. A partition 1521 is disposed between the loading/unloading area 1520, and the cleaning/drying area 1540. And a partition 1523 is disposed between the cleaning/drying area 1540, and the processing area 1530.

The partition 1521 has a passage (not shown) defined therein for transferring semiconductor substrates therethrough between the loading/unloading area 1520, and the cleaning/drying area 1540, and supports a shutter 1522 for opening/closing the passage. The partition 1523 has a passage (not shown) defined therein for transferring semiconductor substrates therethrough between the cleaning/drying area 1540, and the processing area 1530, and supports a shutter 1524 for opening/closing the passage. The cleaning/drying area 1540 and the processing area 1530 can independently be supplied with and discharge air.

The substrate plating apparatus shown in FIG. 65 is placed in a clean room, which accommodates semiconductor fabrication facilities. The pressures in the loading/unloading area 1520, the processing area 1530, and the cleaning/drying area 1540 are selected as follows:

The pressure in the loading/unloading area 1520>the pressure in the cleaning/drying area 1540>the pressure in the processing area 1530.

The pressure in the loading/unloading area 1520 is lower than the pressure in the clean room. Therefore, air does not flow from the processing area 1530 into the cleaning/drying area 1540, and air does not flow from the cleaning/drying area 1540 into the loading/unloading area 1520. Furthermore, air does not flow from the loading/unloading area 1520 into the clean room.

The loading/unloading area 1520 houses a loading unit 1520a and an unloading unit 1520b, each accommodating a substrate cassette for storing semiconductor substrates. The cleaning/drying area 1540 houses two water cleaning units 1541 for cleaning plated semiconductor substrates with water, and two drying units 1542 for drying plated semiconductor substrates. Each of the water cleaning units 1541 may comprise a pencil-shaped cleaner with a sponge layer mounted on a front end thereof or a roller with a sponge layer mounted on an outer circumferential surface thereof. Each of the drying units 1542 may comprise a drier for spinning a semiconductor substrate at a high speed to dehydrate and dry. The cleaning/drying area 1540 also has a transfer unit (transfer robot) 1543 for transferring semiconductor substrates.

The processing area 1530 houses a plurality of pretreatment chambers 1531 for pretreating semiconductor substrates prior to being plated, and a plurality of plating chambers 1532 for plating semiconductor substrates with copper. The processing area 1530 also has a transfer unit (transfer robot) 1543 for transferring semiconductor substrates.

Figure 66:
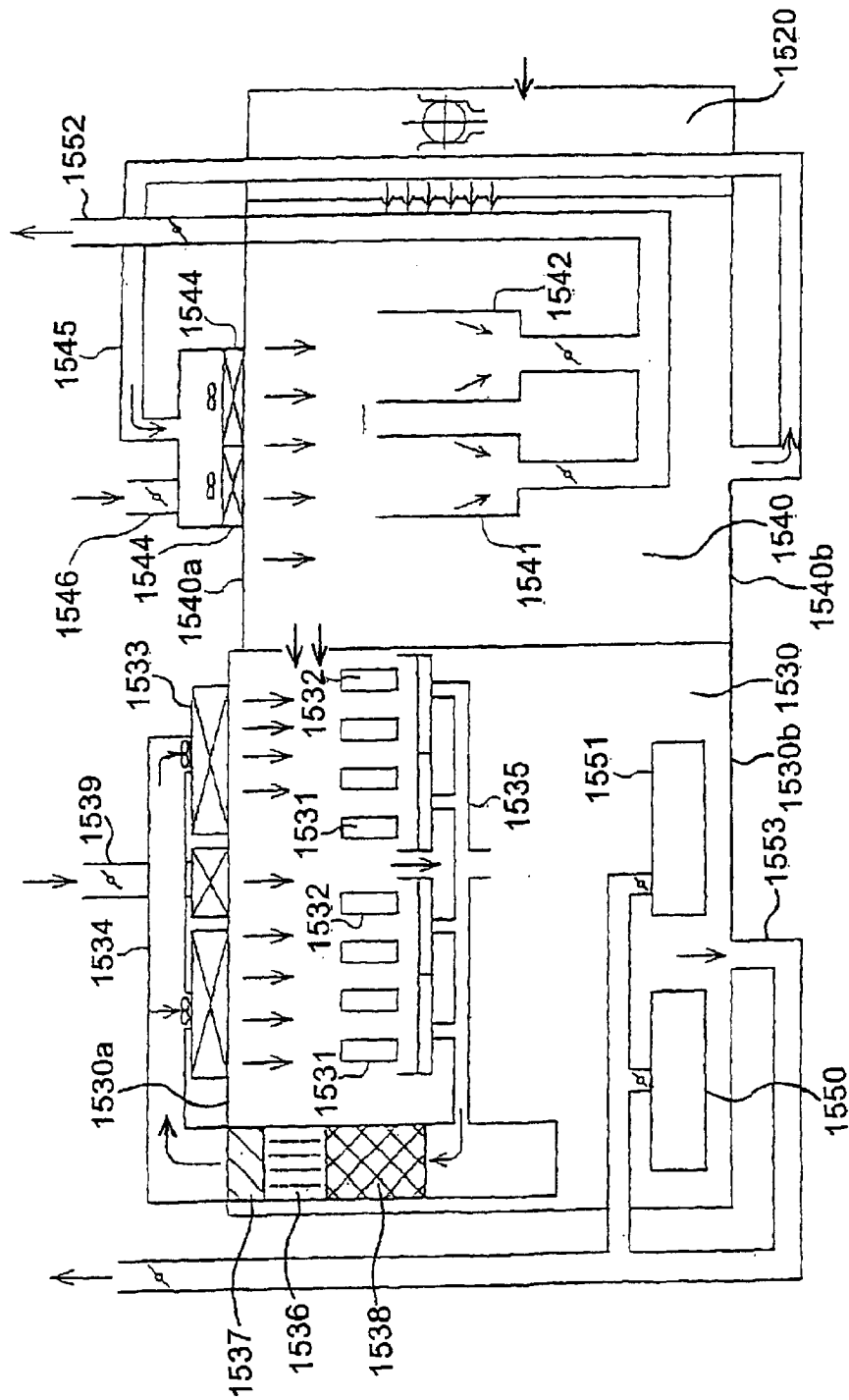
FIG. 66 is a schematic view showing airflow in the substrate plating apparatus shown in FIG. 65.

FIG. 66 shows in side elevation air flows in the substrate plating apparatus. As shown in FIG. 66, fresh air is introduced from the exterior through a duct 1546 and forced through high-performance filters 1544 by fans from a ceiling 1540a into the cleaning/drying area 1540 as downward clean air flows around the water cleaning units 1541 and the drying units 1542. Most of the supplied clean air is returned from a floor 1540b through a circulation duct 1545 to the ceiling 1540a, from which the clean air is forced again through the filters 1544 by the fans into the cleaning/drying area 1540. Part of the clean air is discharged from the wafer cleaning units 1541 and the drying units 1542 through a duct 1552 out of the cleaning/drying area 1540.

In the processing area 1530 which accommodates the pretreatment chambers 1531 and the plating chambers 1532, particles are not allowed to be applied to the surfaces of semiconductor substrates even though the processing area 1530 is a wet zone. To prevent particles from being applied to semiconductor substrates, downward clean air flows around the pretreatment chambers 1531 and the plating chambers 1532. Fresh air is introduced from the exterior through a duct 1539 and forced through high-performance filters 1533 by fans from a ceiling 1530a into the processing area 1530.

If the entire amount of clean air as downward clean air flows introduced into the processing area 1530 were always supplied from the exterior, then a large amount of air would be required to be introduced into and discharged from the processing area 1530 at all times. According to this embodiment, air is discharged from the processing area 1530 through a duct 1553 at a rate sufficient enough to keep the pressure in the processing area 530 lower than the pressure in the cleaning/drying area 1540, and most of the downward clean air introduced into the processing area 1530 is circulated through circulation ducts 1534, 1535. The circulation duct 1534 extends from the cleaning/drying area 1540 and is connected to the filters 1533 over the ceiling 1530a. The circulation duct 1535 is disposed in the cleaning/drying area 1540 and connected to the pipe 1534 in the cleaning/drying area 1540.

The circulating air that has passed through the processing area 1530 contains a chemical mist and gases from solution bathes. The chemical mist and gases are removed from the circulating air by a scrubber 1536 and mist separators 1537, 1538 which are disposed in the pipe 1534 that is connected to the pipe 1535. The air which circulates from the cleaning/drying area 1540 through the scrubber 1536 and the mist separators 1537, 1538 back into the circulation duct 1534 over the ceiling 1530a is free of any chemical mist and gases. The clean air is then forced through the filters 1533 by the fans to circulate back into the processing area 1530.

Part of the air is discharged from the processing area 1530 through the duct 1553 connected to a floor 1530b of the processing area 1530. Air containing a chemical mist and gases is also discharged from the processing area 1530, through the duct 1553. An amount of fresh air which is commensurate with the amount of air discharged through the duct 1553 is supplied from the duct 1539 into the plating chamber 1530 under the negative pressure developed therein with respect to the pressure in the clean room.

Figure 67:
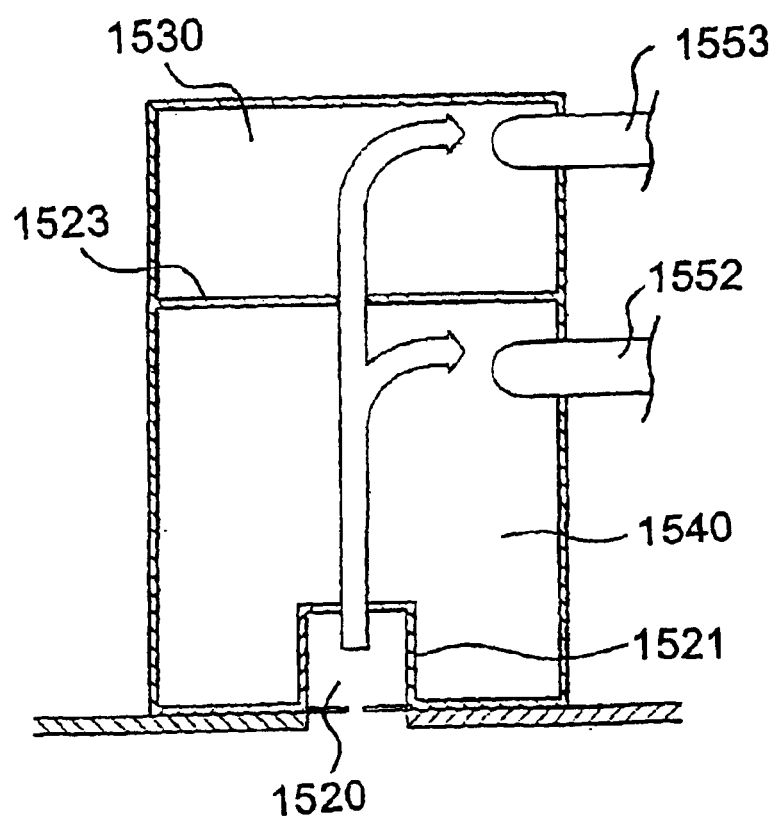
FIG. 67 is a cross-sectional view showing airflows among areas in the substrate plating apparatus shown in FIG. 65.

As described above, the pressure in the loading/unloading area 1520 is higher than the pressure in the cleaning/drying area 1540 which is higher than the pressure in the processing area 1530. When the shutters 1522, 1524 (see FIG. 65) are opened, therefore, air flows successively through the loading/unloading area 1520, the cleaning/drying area 1540, and the processing area 1530, as shown in FIG. 67. Air discharged from the cleaning/drying area 1540 and the processing area 1530 flows through the ducts 1552, 1553 into a common duct 1554 (see FIG. 68) which extends out of the clean room.

Figure 68:
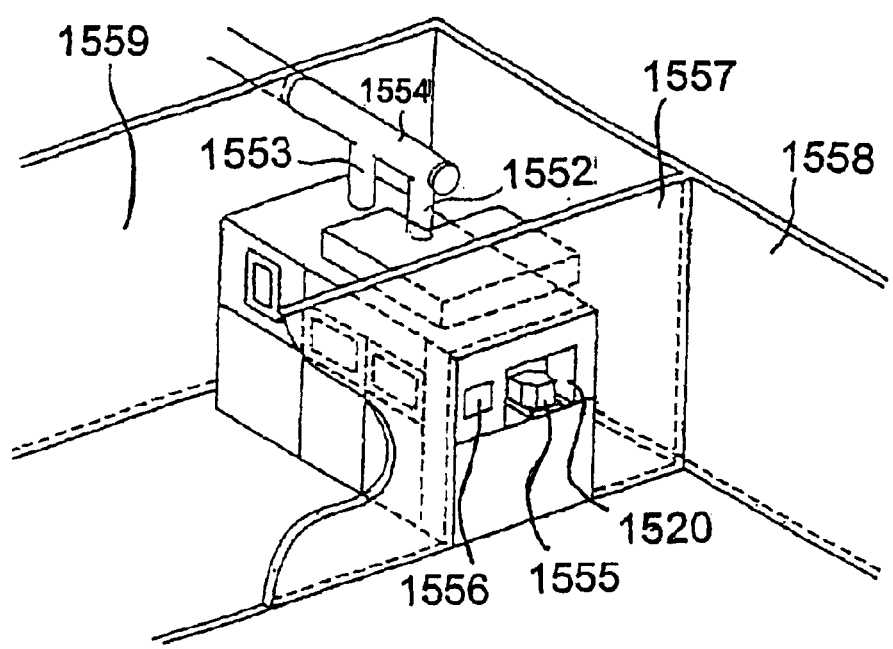
FIG. 68 is a perspective view of the substrate plating apparatus shown in FIG. 65, which is placed in a clean room.

FIG. 68 shows in perspective the substrate plating apparatus shown in FIG. 65, which is placed in the clean room. The loading/unloading area 1520 includes a side wall which has a cassette transfer port 1555 defined therein and a control panel 1556, and which is exposed to a working zone 1558 that is compartmented in the clean room by a partition wall 1557. The partition wall 1557 also compartments a utility zone 1559 in the clean room in which the substrate plating apparatus is installed. Other sidewalls of the substrate plating apparatus are exposed to the utility zone 1559 whose air cleanness is lower than the air cleanness in the working zone 1558.

As described above, the cleaning/drying area 1540 is disposed between the loading/unloading area 1520, and the processing area 1530. The partition 1521 is disposed between the loading/unloading area 1520, and the cleaning/drying area 1540. The partition 1523 is disposed between the cleaning/drying area 1540, and the processing area 1530. A dry semiconductor substrate is loaded from the working zone 1558 through the cassette transfer port 1555 into the substrate plating apparatus, and then plated in the substrate plating apparatus. The plated semiconductor substrate is cleaned and dried, and then unloaded from the substrate plating apparatus through the cassette transfer port 1555 into the working zone 1558. Consequently, no particles and mist are applied to the surface of the semiconductor substrate, and the working zone 1558 which has higher air cleanness than the utility zone 1557 is prevented from being contaminated by particles, chemical mists, and cleaning solution mists.

In the embodiment shown in FIGS. 65 and 66, the substrate plating apparatus has the loading/unloading area 1520, the cleaning/drying area 1540, and the processing area 1530. However, an area accommodating a chemical mechanical polishing unit may be disposed in or adjacent to the processing area 1530, and the cleaning/drying area 1540 may be disposed in the processing area 1530 or between the area accommodating the chemical mechanical polishing unit and the loading/unloading area 1520. Any of various other suitable area and unit layouts may be employed insofar as a dry semiconductor substrate can be loaded into the substrate plating apparatus, and a plated semiconductor substrate can be cleaned and dried, and thereafter unloaded from the substrate plating apparatus.

In the embodiment described above, the present invention is applied to the substrate plating apparatus for plating a semiconductor substrate. However, the principles of the present invention are also applicable to a substrate plating apparatus for plating a substrate other than a semiconductor substrate. Furthermore, a region on a substrate plated by the substrate plating apparatus is not limited to an interconnection region on the substrate. The substrate plating apparatus may be used to plate substrates with a metal other than copper.

Figure 69:
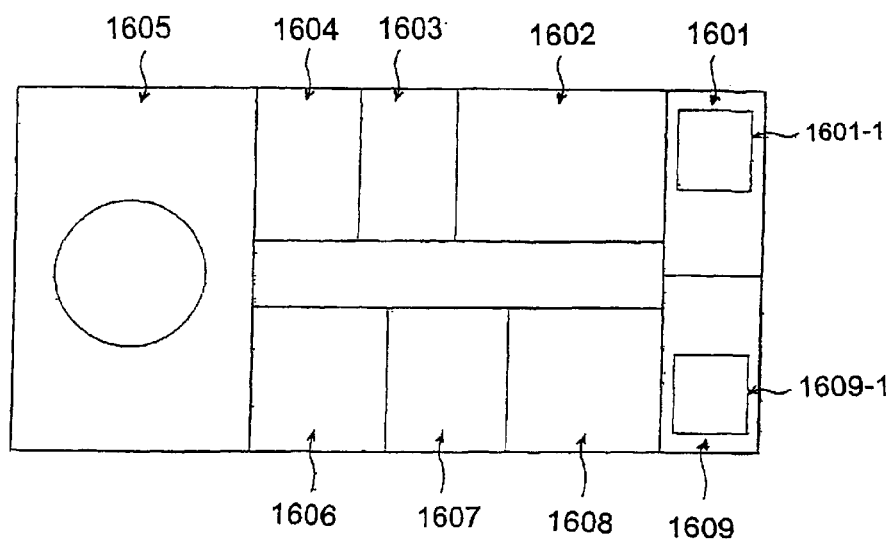
FIG. 69 is a plan view of another example of a substrate plating apparatus.

FIG. 69 is a plan view of another example of a substrate plating apparatus. The substrate plating apparatus shown in FIG. 69 comprises a loading unit 1601 for loading a semiconductor substrate, a copper plating chamber 1602 for plating a semiconductor substrate with copper, a pair of water cleaning chambers 1603, 1604 for cleaning a semiconductor substrate with water, a chemical mechanical polishing unit 1605 for chemically and mechanically polishing a semiconductor substrate, a pair of water cleaning chambers 1606, 1607 for cleaning a semiconductor substrate with water, a drying chamber 1608 for drying a semiconductor substrate, and an unloading unit 1609 for unloading a semiconductor substrate with an interconnection film thereon. The substrate plating apparatus also has a wafer transfer mechanism (not shown) for transferring semiconductor substrates to the chambers 1602, 1603, 1604, the chemical mechanical polishing unit 1605, the chambers 1606, 1607, 1608, and the unloading unit 1609. The loading unit 1601, the chambers 1602, 1603, 1604, the chemical mechanical polishing unit 1605, the chambers 1606, 1607, 1608, and the unloading unit 1609 are combined into a single unitary arrangement as apparatus.

The substrate plating apparatus operates as follows: The wafer transfer mechanism transfers a semiconductor substrate W on which an interconnection film has not yet been formed from a substrate cassette 1601-1 placed in the loading unit 1601 to the copper plating chamber 1602. In the copper plating chamber 1602, a plated copper film is formed on a surface of the semiconductor substrate W having an interconnection region composed of an interconnection trench and an interconnection hole (contact hole).

After the plated copper film is formed on the semiconductor substrate W in the copper plating chamber 1602, the semiconductor substrate W is transferred to one of the water cleaning chambers 1603, 1604 by the wafer transfer mechanism and cleaned by water in one of the water cleaning chambers 1603, 1604. The cleaned semiconductor substrate W is transferred to the chemical mechanical polishing unit 1605 by the wafer transfer mechanism. The chemical mechanical polishing unit 1605 removes the unwanted plated copper film from the surface of the semiconductor substrate W, leaving a portion of the plated copper film in the interconnection trench and the interconnection hole. A barrier layer made of TiN or the like is formed on the surface of the semiconductor substrate W, including the inner surfaces of the interconnection trench and the interconnection hole, before the plated copper film is deposited.

Then, the semiconductor substrate W with the remaining plated copper film is transferred to one of the water cleaning chambers 1606, 1607 by the wafer transfer mechanism and cleaned by water in one of the water cleaning chambers 1607, 1608. The cleaned semiconductor substrate W is then dried in the drying chamber 1608, after which the dried semiconductor substrate W with the remaining plated copper film serving as an interconnection film is placed into a substrate cassette 1609-1 in the unloading unit 1609.

Figure 70:
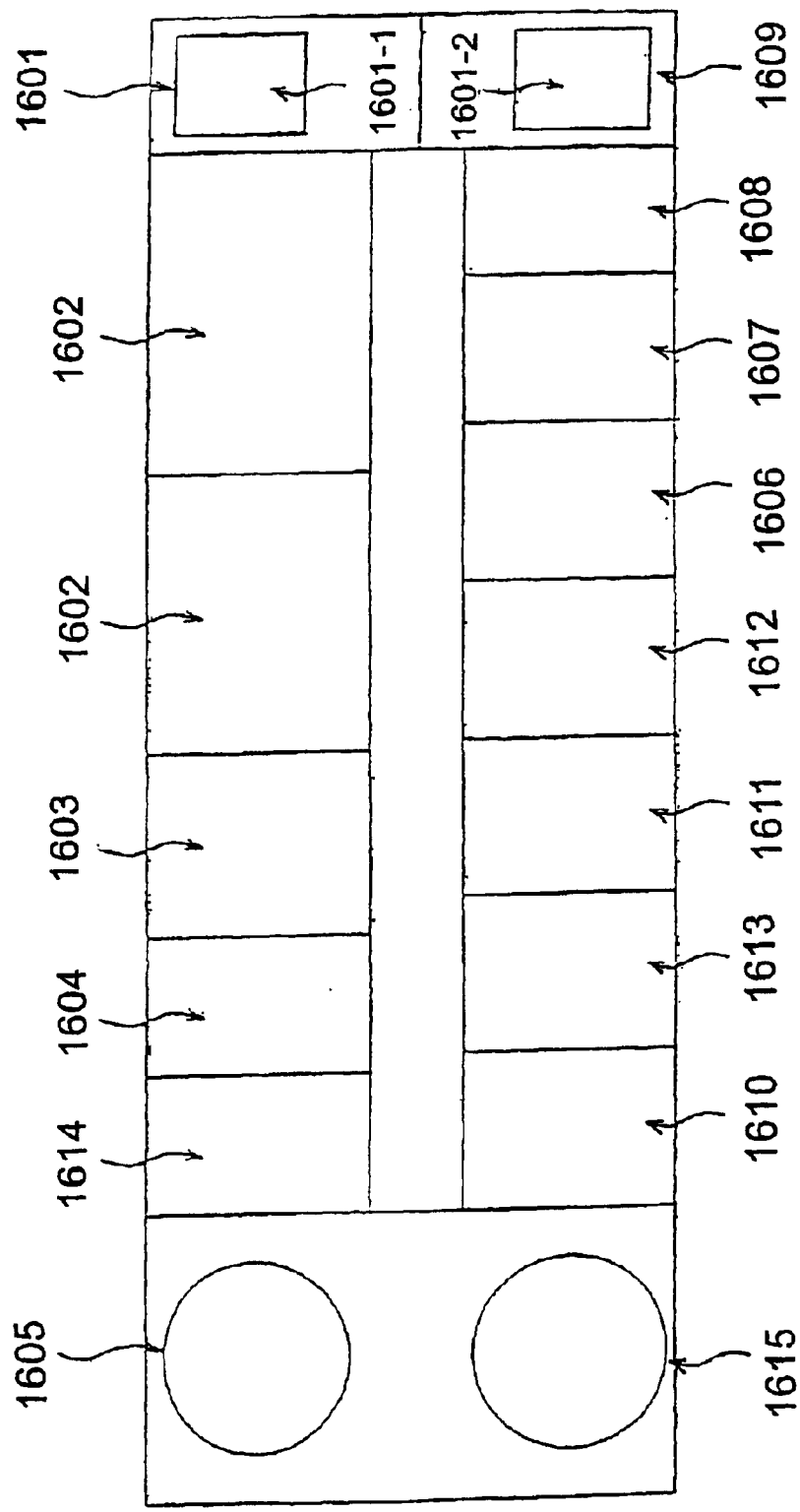
FIG. 70 is a plan view of still another example of a substrate plating apparatus.

FIG. 70 shows a plan view of still another example of a substrate plating apparatus. The substrate plating apparatus shown in FIG. 70 differs from the substrate plating apparatus shown in FIG. 69 in that it additionally includes a copper plating chamber 1602, a water cleaning chamber 1610, a pretreatment chamber 1611, a protective layer plating chamber 1612 for forming a protective plated layer on a plated copper film on a semiconductor substrate, water cleaning chamber 1613, 1614, and a chemical mechanical polishing unit 615. The loading unit 1601, the chambers 1602, 1602, 1603, 1604, 1614, the chemical mechanical polishing unit 1605, 1615, the chambers 1606, 1607, 1608, 1610, 1611, 1612, 1613, and the unloading unit 1609 are combined into a single unitary arrangement as an apparatus.

The substrate plating apparatus shown in FIG. 70 operates as follows: A semiconductor substrate W is supplied from the substrate cassette 1601-1 placed in the loading unit 1601 successively to one of the copper plating chambers 1602, 1602. In one of the copper plating chamber 1602, 1602, a plated copper film is formed on a surface of a semiconductor substrate W having an interconnection region composed of an interconnection trench and an interconnection hole (contact hole). The two copper plating chambers 1602, 1602 are employed to allow the semiconductor substrate W to be plated with a copper film for a long period of time. Specifically, the semiconductor substrate W may be plated with a primary copper film according to electroplating in one of the copper plating chamber 1602, and then plated with a secondary copper film according to electroless-plating in the other copper plating chamber 1602. The substrate plating apparatus may have more than two copper plating chambers.

The semiconductor substrate W with the plated copper film formed thereon is cleaned by water in one of the water cleaning chambers 1603, 1604. Then, the chemical mechanical polishing unit 1605 removes the unwanted portion of the plated copper film from the surface of the semiconductor substrate W, leaving a portion of the plated copper film in the interconnection trench and the interconnection hole.

Thereafter, the semiconductor substrate W with the remaining plated copper film is transferred to the water cleaning chamber 1610, in which the semiconductor substrate W is cleaned with water. Then, the semiconductor substrate W is transferred to the pretreatment chamber 1611, and pretreated therein for the deposition of a protective plated layer. The pretreated semiconductor substrate W is transferred to the protective layer-plating chamber 1612. In the protective layer plating chamber 1612, a protective plated layer is formed on the plated copper film in the interconnection region on the semiconductor substrate W. For example, the protective plated layer is formed with an alloy of nickel (Ni) and boron (B) by electroless-plating.

After semiconductor substrate is cleaned in one of the water cleaning chamber 1613, 1614, an upper portion of the protective plated layer deposited on the plated copper film is polished off to planarize the protective plated layer, in the chemical mechanical polishing unit 1615, After the protective plated layer is polished, the semiconductor substrate W is cleaned by water in one of the water cleaning chambers 1606, 1607, dried in the drying chamber 1608, and then transferred to the substrate cassette 1609-1 in the unloading unit 1609.

Figure 71:
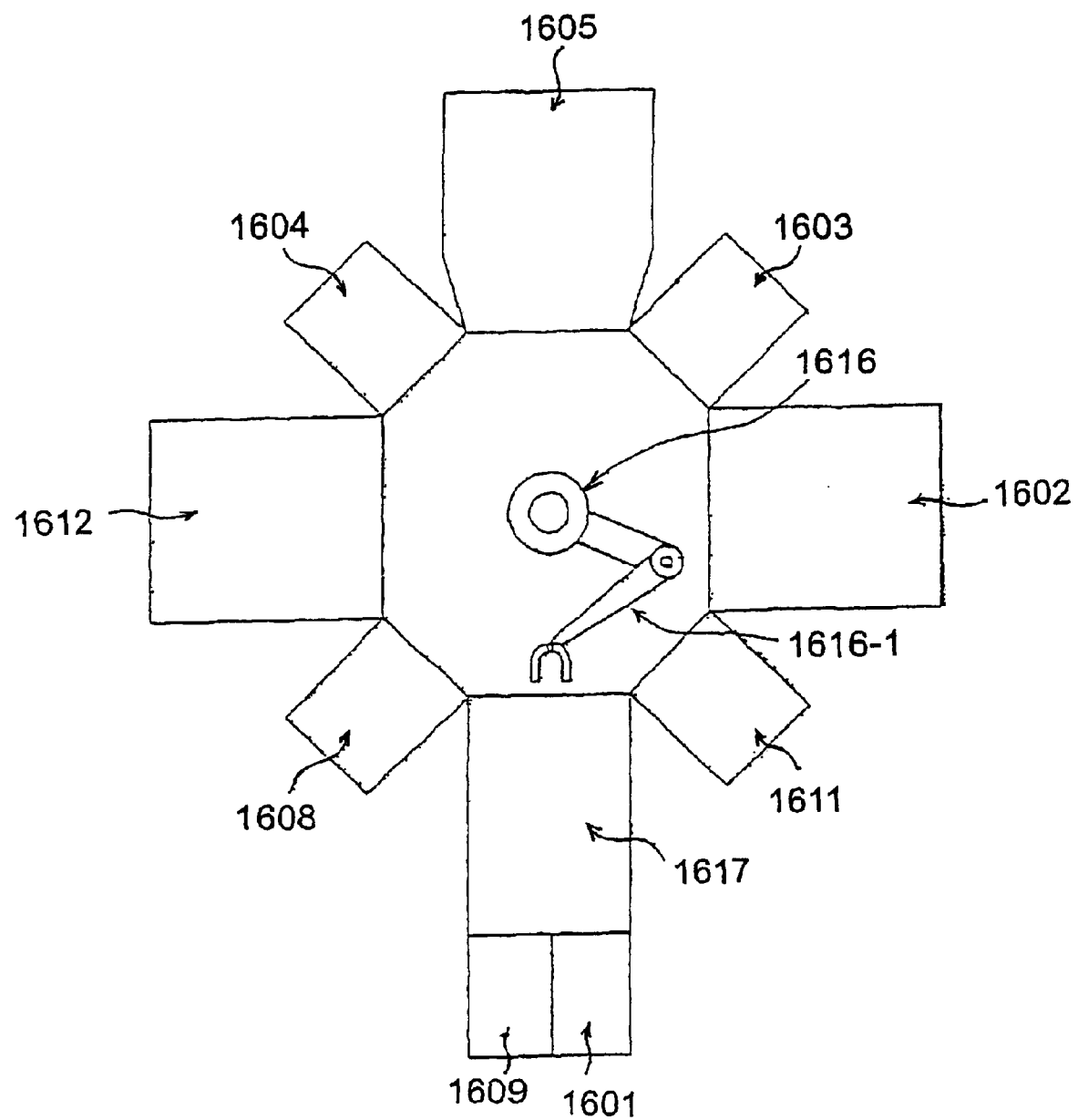
FIG. 71 is a plan view of still another example of a substrate plating apparatus.

FIG. 71 is a plan view of still another example of a substrate plating apparatus. As shown in FIG. 71, the substrate plating apparatus includes a robot 1616 at its center which has a robot arm 1616-1, and also has a copper plating chamber 1602, a pair of water cleaning chambers 1603, 1604, a chemical mechanical polishing unit 1605, a pretreatment chamber 1611, a protective layer plating chamber 1612, a drying chamber 1608, and a loading/unloading portion 1617 which are disposed around the robot 1616 and positioned within the reach of the robot arm 1616-1. A loading unit 1601 for loading semiconductor substrates and an unloading unit 1609 for unloading semiconductor substrates is disposed adjacent to the loading/unloading portion 1617. The robot 1616, the chambers 1602, 1603, 1604, the chemical mechanical polishing unit 1605, the chambers 1608, 1611, 1612, the loading/unloading portion 1617, the loading unit 1601, and the unloading unit 1609 are combined into a single unitary arrangement as an apparatus.

The substrate plating apparatus shown in FIG. 71 operates as follows:

A semiconductor substrate to be plated is transferred from the loading unit 1601 to the loading/unloading portion 1617, from which the semiconductor substrate is received by the robot arm 1616-1 and transferred thereby to the copper plating chamber 1602. In the copper plating chamber 1602, a plated copper film is formed on a surface of the semiconductor substrate which has an interconnection region composed of an interconnection trench and an interconnection hole. The semiconductor substrate with the plated copper film formed thereon is transferred by the robot arm 1616-1 to the chemical mechanical polishing unit 1605. In the chemical mechanical polishing unit 1605, the plated copper film is removed from the surface of the semiconductor substrate W, leaving a portion of the plated copper film in the interconnection trench and the interconnection hole.

The semiconductor substrate is then transferred by the robot arm 1616-1 to the water-cleaning chamber 1604, in which the semiconductor substrate is cleaned by water. Thereafter, the semiconductor substrate is transferred by the robot arm 1616-1 to the pretreatment chamber 1611, in which the semiconductor substrate is pretreated therein for the deposition of a protective plated layer. The pretreated semiconductor substrate is transferred by the robot arm 1616-1 to the protective layer plating chamber 1612. In the protective layer plating chamber 1612, a protective plated layer is formed on the plated copper film in the interconnection region on the semiconductor substrate W. The semiconductor substrate with the protective plated layer formed thereon is transferred by the robot arm 1616-1 to the water cleaning chamber 1604, in which the semiconductor substrate is cleaned by water. The cleaned semiconductor substrate is transferred by the robot arm 1616-1 to the drying chamber 1608, in which the semiconductor substrate is dried. The dried semiconductor substrate is transferred by the robot arm 1616-1 to the loading/unloading portion 1617, from which the plated semiconductor substrate is transferred to the unloading unit 1609.

Figure 72:
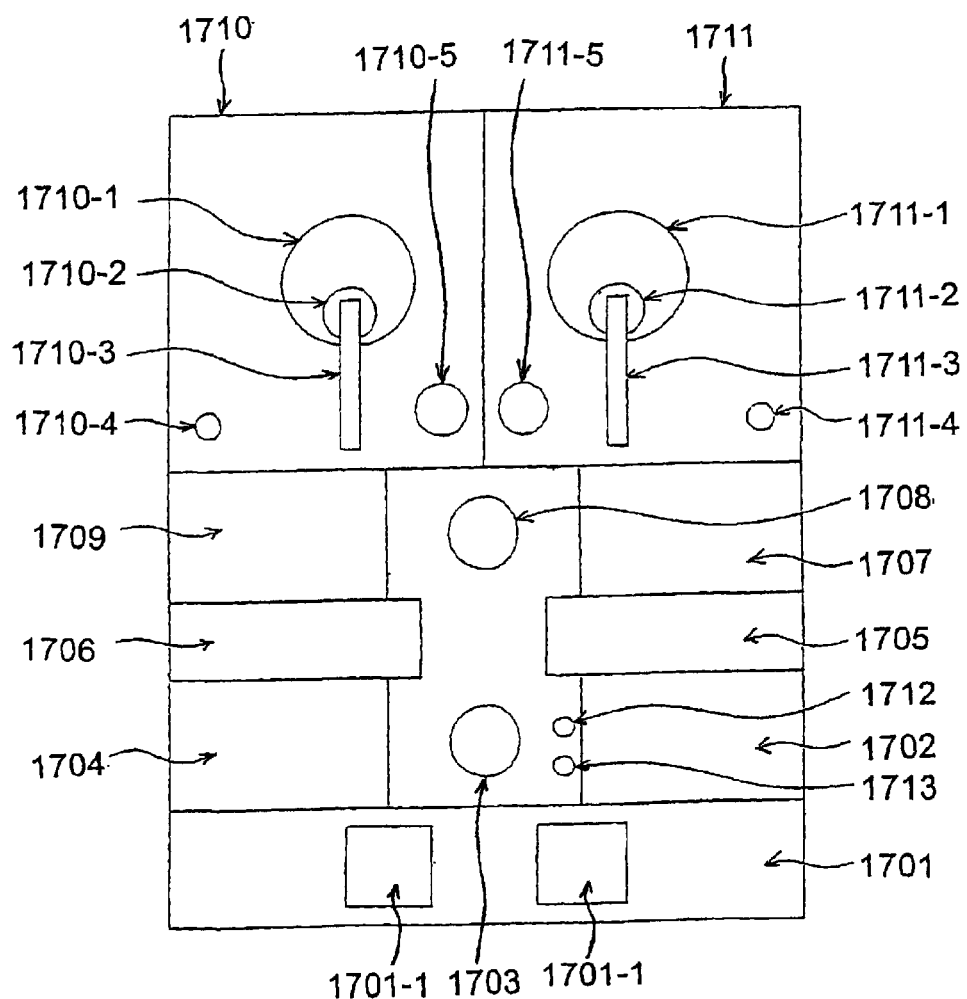
FIG. 72 is a view showing a plan constitution example of the semiconductor substrate processing apparatus.

FIG. 72 is a view showing the plan constitution of another example of a semiconductor substrate processing apparatus. The semiconductor substrate processing apparatus is of a constitution in which there are provided a loading/unloading section 1701, a copper plating unit 1702, a first robot 1703, a third cleaning machine 1704, a reversing machine 1705, a reversing machine 1706, a second cleaning machine 1707, a second robot 1708, a first cleaning machine 1709, a first polishing apparatus 1710, and a second polishing apparatus 1711. A before-plating and after-plating film thickness measuring instrument 1712 for measuring the film thicknesses before and after plating, and a dry state film thickness measuring instrument 1713 for measuring the film thickness of a semiconductor substrate W in a dry state after polishing are placed near the first robot 1703.

The first polishing apparatus (polishing unit) 1710 has a polishing table 1710-1, a top ring 1710-2, a top ring head 1710-3, a film thickness measuring instrument 1710-4, and a pusher 1710-5. The second polishing apparatus (polishing unit) 1711 has a polishing table 1711-1, atop ring 1711-2, atop ring head 1711-3, a film thickness measuring instrument 1711-4, and a pusher 1711-5.

A cassette 1701-1 accommodating the semiconductor substrates W, in which a via hole and a trench for interconnect are formed, and a seed layer is formed thereon is placed on a loading port of the loading/unloading section 1701. The first robot 1703 takes out the semiconductor substrate W from the cassette 1701-1, and carries the semiconductor substrate W into the copper plating unit 1702 where a plated Cu film is formed. At this time, the film thickness of the seed layer is measured with the before-plating and after-plating film thickness measuring instrument 1712. The plated Cu film is formed by carrying out hydrophilic treatment of the face of the semiconductor substrate W, and then Cu plating. After formation of the plated Cu film, rinsing or cleaning of the semiconductor substrate W is carried out in the copper plating unit 1702.

When the semiconductor substrate W is taken out from the copper plating unit 1702 by the first robot 1703, the film thickness of the plated Cu film is measured with the before-plating and after-plating film thickness measuring instrument 1712. The results of its measurement are recorded into a recording device (not shown) as record data on the semiconductor substrate, and are used for judgment of an abnormality of the copper plating unit 1702. After measurement of the film thickness, the first robot 1703 transfers the semiconductor substrate W to the reversing machine 1705, and the reversing machine 1705 reverses the semiconductor substrate W (the surface on which the plated Cu film has been formed faces downward). The first polishing apparatus 1710 and the second polishing apparatus 1711 perform polishing in a serial mode and a parallel mode. Next, polishing in the serial mode will be described.

In the serial mode polishing, a primary polishing is performed by the polishing apparatus 1710, and a secondary polishing is performed by the polishing apparatus 1711. The second robot 1708 picks up the semiconductor substrate W on the reversing machine 1705, and places the semiconductor substrate W on the pusher 1710-5 of the polishing apparatus 1710. The top ring 1710-2 attracts the semiconductor substrate W on the pusher 1710-5 by suction, and brings the surface of the plated Cu film of the semiconductor substrate W into contact with a polishing surface of the polishing table 1710-1 under pressure to perform a primary polishing. With the primary polishing, the plated Cu film is basically polished. The polishing surface of the polishing table 1710-1 is composed of foamed polyurethane such as IC1000, or a material having abrasive grains fixed thereto or impregnated therein. Upon relative movements of the polishing surface and the semiconductor substrate W, the plated Cu film is polished.

After completion of polishing of the plated Cu film, the semiconductor substrate W is returned onto the pusher 1710-5 by the top ring 1710-2. The second robot 1708 picks up the semiconductor substrate W, and introduces it into the first cleaning machine 1709. At this time, a chemical liquid may be ejected toward the face and backside of the semiconductor substrate W on the pusher 1710-5 to remove particles therefrom or cause particles to be difficult to adhere thereto.

After completion of cleaning in the first cleaning machine 1709, the second robot 1708 picks up the semiconductor substrate W, and places the semiconductor substrate W on the pusher 1711-5 of the second polishing apparatus 1711. The top ring 1711-2 attracts the semiconductor substrate W on the pusher 1711-5 by suction, and brings the surface of the semiconductor substrate W, which has the barrier layer formed thereon, into contact with a polishing surface of the polishing table 1711-1 under pressure to perform the secondary polishing. The constitution of the polishing table is the same as the top ring 1711-2. With this secondary polishing, the barrier layer is polished. However, there may be a case in which a Cu film and an oxide film left after the primary polishing are also polished.

A polishing surface of the polishing table 1711-1 is composed of foamed polyurethane such as IC1000, or a material having abrasive grains fixed thereto or impregnated therein. Upon relative movements of the polishing surface and the semiconductor substrate W, polishing is carried out. At this time, silica, alumina, ceria, on the like is used as abrasive grains or a slurry. A chemical liquid is adjusted depending on the type of the film to be polished.

Detection of an end point of the secondary polishing is performed by measuring the film thickness of the barrier layer mainly with the use of the optical film thickness measuring instrument, and detecting the film thickness which has become zero, or the surface of an insulating film comprising $SiO_2$ shows up. Furthermore, a film thickness measuring instrument with an image processing function is used as the film thickness measuring instrument 1711-4 provided near the polishing table 1711-1. By use of this measuring instrument, measurement of the oxide film is made, the results are stored as processing records of the semiconductor substrate W, and used for judging whether the semiconductor substrate W in which secondary polishing has been finished can be transferred to a subsequent step or not. If the end point of the secondary polishing is not reached, repolishing is performed. If over-polishing has been performed beyond a prescribed value due to any abnormality, then the semiconductor substrate processing apparatus is stopped to avoid next polishing so that defective products will not increase.

After completion of the secondary polishing, the semiconductor substrate W is moved to the pusher 1711-5 by the top ring 1711-2. The second robot 1708 picks up the semiconductor substrate W on the pusher 1711-5. At this time, a chemical liquid may be ejected toward the face and backside of the semiconductor substrate W on the pusher 1711-5 to remove particles therefrom or cause particles to be difficult to adhere thereto.

The second robot 1708 carries the semiconductor substrate W into the second cleaning machine 1707 where cleaning of the semiconductor substrate W is performed. The constitution of the second cleaning machine 1707 is also the same as the constitution of the first cleaning machine 1709. The face of the semiconductor substrate W is scrubbed with the PVA sponge rolls using a cleaning liquid comprising pure water to which a surface active agent, a chelating agent, or a pH regulating agent is added. A strong chemical liquid such as DHF is ejected from a nozzle toward the backside of the semiconductor substrate W to perform etching of the diffused Cu thereon. If there is no problem of diffusion, scrubbing cleaning is performed with the PVA sponge rolls using the same chemical liquid as that used for the face.

After completion of the above cleaning, the second robot 1708 picks up the semiconductor substrate W and transfers it to the reversing machine 1706, and the reversing machine 1706 reverses the semiconductor substrate W. The semiconductor substrate W which has been reversed is picked up by the first robot 1703, and transferred to the third cleaning machine 1704. In the third cleaning machine 1704, megasonic water excited by ultrasonic vibrations is ejected toward the face of the semiconductor substrate W to clean the semiconductor substrate W. At this time, the face of the semiconductor substrate W may be cleaned with a known pencil type sponge using a cleaning liquid comprising pure water to which a surface active agent, a chelating agent, or a pH regulating agent is added. Thereafter, the semiconductor substrate W is dried by spin-drying.

As described above, if the film thickness has been measured with the film thickness measuring instrument 1711-4 provided near the polishing table 1711-1, then the semiconductor substrate W is not subjected to further process and is accommodated into the cassette placed on the unloading port of the loading/unloading section 1771.

Figure 73:
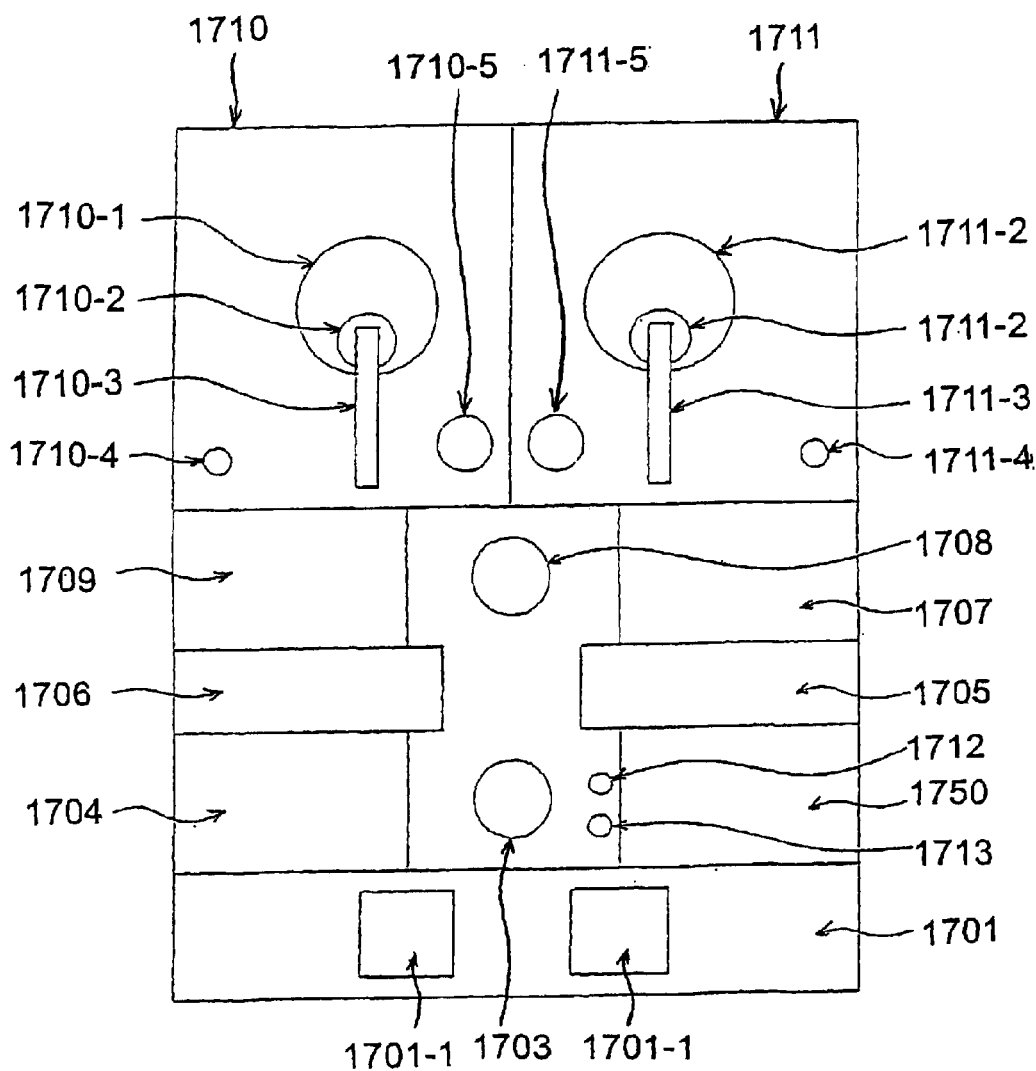
FIG. 73 is a view showing another plan constitution example of the semiconductor substrate processing apparatus.

FIG. 73 is a view showing the plan constitution of another example of a semiconductor substrate processing apparatus. The substrate processing apparatus differs from the substrate processing apparatus shown in FIG. 72 in that a cap-plating unit 1750 is provided instead of the copper plating unit 1702 in FIG. 72.

A cassette 1701-1 accommodating the semiconductor substrates W formed plated Cu film is placed on a load port of a loading/unloading section 1701. The semiconductor substrate W taken out from the cassette 1701-1 is transferred to the first polishing apparatus 1710 or second polishing apparatus 1711 in which the surface of the plated Cu film is polished. After completion of polishing of the plated Cu film, the semiconductor substrate W is cleaned in the first cleaning machine 1709.

After completion of cleaning in the first cleaning machine 1709, the semiconductor substrate W is transferred to the cap-plating unit 1750 where cap-plating is applied onto the surface of the plated Cu film with the aim of preventing oxidation of plated Cu film due to the atmosphere. The semiconductor substrate to which cap-plating has been applied is carried by the second robot 1708 from the cap-plating unit 1750 to the second cleaning unit 1707 where it is cleaned with pure water or deionized water. The semiconductor substrate after completion of cleaning is returned into the cassette 1701-1 placed on the loading/unloading section 1701.

Figure 74:
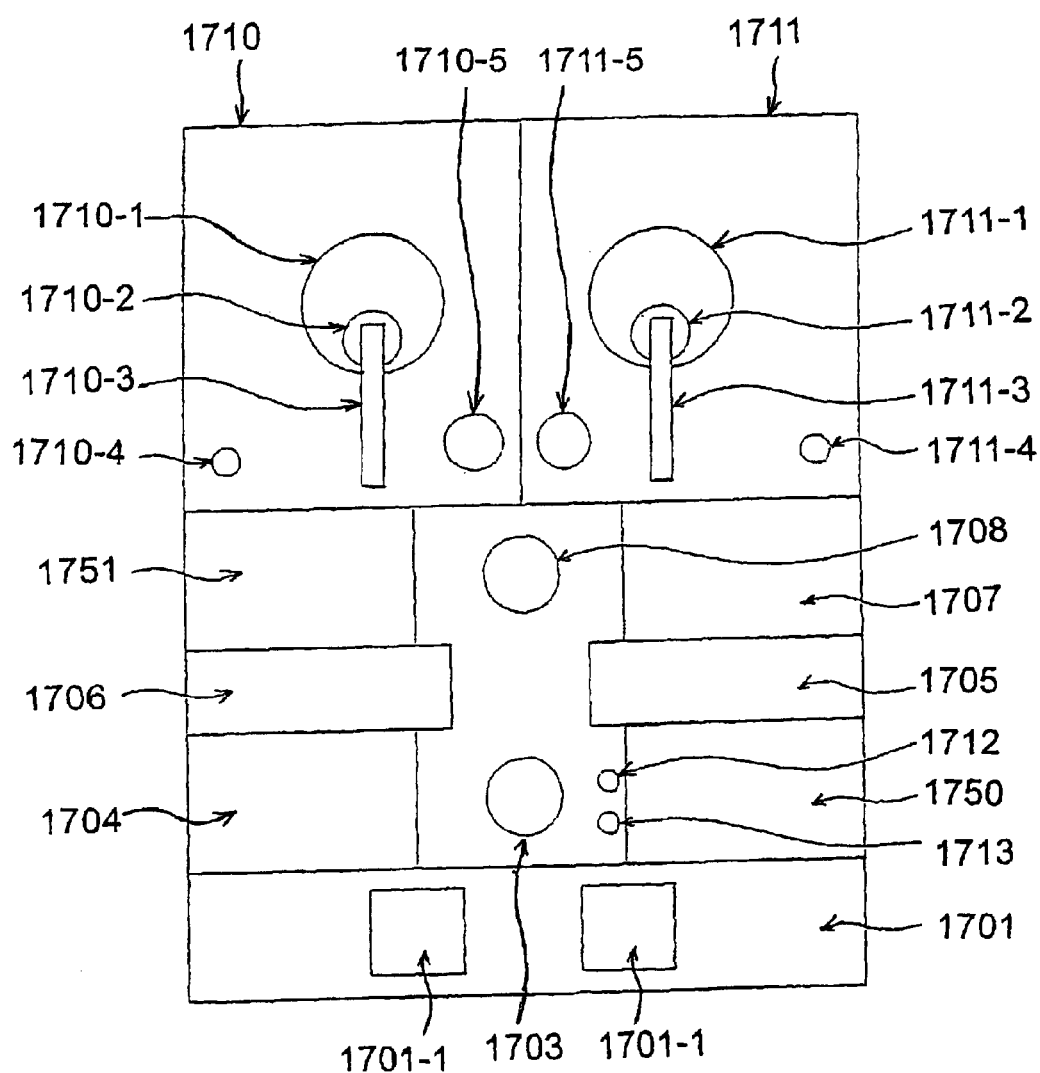
FIG. 74 is a view showing still another plan constitution example of the semiconductor substrate processing apparatus.

FIG. 74 is a view showing the plan constitution of still another example of a semiconductor substrate processing apparatus. The substrate processing apparatus differs from the substrate processing apparatus shown in FIG. 73 in that an annealing unit 1751 is provided instead of the third cleaning machine 1709 in FIG. 73.

The semiconductor substrate W, which is polished in the polishing unit 1710 or 1711, and cleaned in the first cleaning machine 1709 described above, is transferred to the cap-plating unit 1750 where cap-plating is applied onto the surface of the plated Cu film. The semiconductor substrate to which cap-plating has been applied is carried by the second robot 1732 from the cap-plating unit 1750 to the first cleaning unit 1707 where it is cleaned.

After completion of cleaning in the first cleaning machine 1709, the semiconductor substrate W is transferred to the annealing unit 1751 in which the substrate is annealed, whereby the plated Cu film is alloyed so as to increase the electromigration resistance of the plated Cu film. The semiconductor substrate W to which annealing treatment has been applied is carried from the annealing unit 1751 to the second cleaning unit 1707 where it is cleaned with pure water or deionized water. The semiconductor substrate W after completion of cleaning is returned into the cassette 1701-1 placed on the loading/unloading section 1701.

Figure 75:
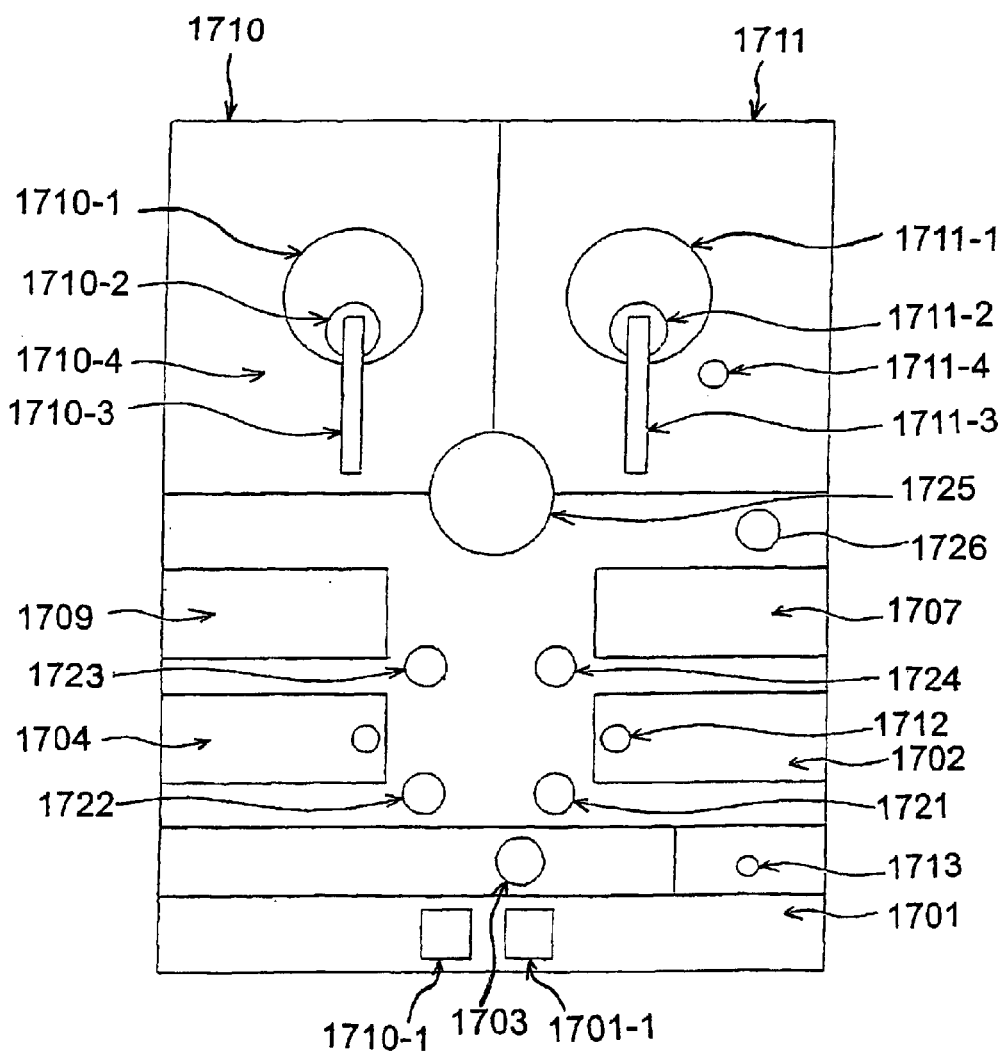
FIG. 75 is a view showing still another plan constitution example of the semiconductor substrate processing apparatus.

FIG. 75 is a view showing a plan layout constitution of another example of the substrate processing apparatus. In FIG. 75, portions denoted by the same reference numerals as those in FIG. 72 show the same or corresponding portions. In the substrate processing apparatus, a pusher indexer 1725 is disposed close to a first polishing apparatus 1710 and a second polishing apparatus 1711. Substrate placing tables 1721, 1722 are disposed close to a third cleaning machine 1704 and a copper plating unit 1702, respectively. A robot 1723 is disposed close to a first cleaning machine 1709 and the third cleaning machine 1704. Further, a robot 1724 is disposed close to a second cleaning machine 1707 and the copper plating unit 1702, and a dry state film thickness measuring instrument 1713 is disposed close to a loading/unloading section 1701 and a first robot 1703.

In the substrate processing apparatus of the above constitution, the first robot 1703 takes out a semiconductor substrate W from a cassette 1701-1 placed on the load port of the loading/unloading section 1701. After the film thicknesses of a barrier layer and a seed layer are measured with the dry state film thickness measuring instrument 1713, the first robot 1703 places the semiconductor substrate W on the substrate placing table 1721. In the case where the dry state film thickness measuring instrument 1713 is provided on the hand of the first robot 1703, the film thicknesses are measured thereon, and the substrate is placed on the substrate placing table 1721. The second robot 1723 transfers the semiconductor substrate W on the substrate placing table 1721 to the copper plating unit 1702 in which a plated Cu film is formed. After formation of the plated Cu film, the film thickness of the plated Cu film is measured with a before-plating and after-plating film thickness measuring instrument 1712. Then, the second robot 1723 transfers the semiconductor substrate W to the pusher indexer 1725 and loads it thereon.

[Serial Mode]

In the serial mode, a top ring head 1710-2 holds the semiconductor substrate W on the pusher indexer 1725 by suction, transfers it to a polishing table 1710-1, and presses the semiconductor substrate W against a polishing surface on the polishing table 1710-1 to perform polishing. Detection of the end point of polishing is performed by the same method as described above. The semiconductor substrate W after completion of polishing is transferred to the pusher indexer 1725 by the top ring head 1710-2, and loaded thereon. The second robot 1723 takes out the semiconductor substrate W, and carries it into the first cleaning machine 1709 for cleaning. Then, the semiconductor substrate W is transferred to the pusher indexer 1725, and loaded thereon.

A top ring head 1711-2 holds the semiconductor substrate W on the pusher indexer 1725 by suction, transfers it to a polishing table 1711-1, and presses the semiconductor substrate W against a polishing surface on the polishing table 1711-1 to perform polishing. Detection of the end point of polishing is performed by the same method as described above. The semiconductor substrate W after completion of polishing is transferred to the pusher indexer 1725 by the top ring head 1711-2, and loaded thereon. The third robot 1724 picks up the semiconductor substrate W, and its film thickness is measured with a film thickness measuring instrument 1726. Then, the semiconductor substrate W is carried into the second cleaning machine 1707 for cleaning. Thereafter, the semiconductor substrate W is carried into the third cleaning machine 1704, where it is cleaned and then dried by spin-drying. Then, the semiconductor substrate W is picked up by the third robot 1724, and placed on the substrate placing table 1722.

[Parallel Mode]

In the parallel mode, the top ring head 1710-2 or 1711-2 holds the semiconductor substrate W on the pusher indexer 1725 by suction, transfers it to the polishing table 1710-1 or 1711-1, and presses the semiconductor substrate W against the polishing surface on the polishing table 1710-1 or 1711-1 to perform polishing. After measurement of the film thickness, the third robot 1724 picks up the semiconductor substrate W, and places it on the substrate placing table 1722.

The first robot 1703 transfers the semiconductor substrate W on the substrate placing table 1722 to the dry state film thickness measuring instrument 1713. After the film thickness is measured, the semiconductor substrate W is returned to the cassette 1701-1 of the loading/unloading section 1701.

Figure 76:
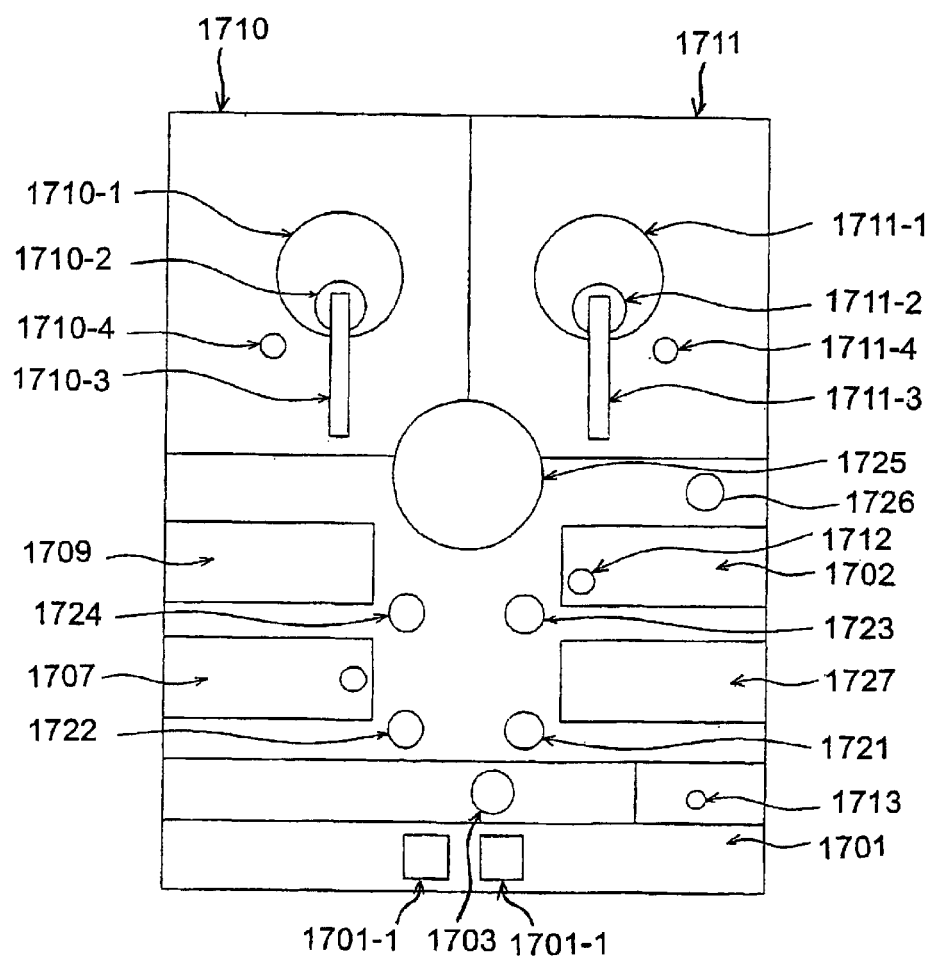
FIG. 76 is a view showing still another plan constitution example of the semiconductor substrate processing apparatus.

FIG. 76 is a view showing another plan layout constitution of the substrate processing apparatus. The substrate processing apparatus is such a substrate processing apparatus which forms a seed layer and a plated Cu film on a semiconductor substrate W having no seed layer formed thereon, and polishes these films to form interconnects.

In the substrate polishing apparatus, a pusher indexer 1725 is disposed close to a first polishing apparatus 1710 and a second polishing apparatus 1711, substrate placing tables 1721, 1722 are disposed close to a second cleaning machine 1707 and a seed layer forming unit 1727, respectively, and a robot 1723 is disposed close to the seed layer forming unit 1727 and a copper plating unit 1702. Further, a robot 1724 is disposed close to a first cleaning machine 1709 and the second cleaning machine 1707, and a dry state film thickness measuring instrument 1713 is disposed close to a loading/unloading section 1701 and a first robot 1702.

The first robot 1703 takes out a semiconductor substrate W having a barrier layer thereon from a cassette 1701-1 placed on the load port of the loading/unloading section 1701, and places it on the substrate placing table 1721. Then, the second robot 1723 transports the semiconductor substrate W to the seed layer forming unit 1727 where a seed layer is formed. The seed layer is formed by electroless-plating. The second robot 1723 enables the semiconductor substrate having the seed layer formed thereon to be measured in thickness of the seed layer by the before-plating and after-plating film thickness measuring instrument 1712. After measurement of the film thickness, the semiconductor substrate is carried into the copper plating unit 1702 where a plated Cu film is formed.

After formation of the plated Cu film, its film thickness is measured, and the semiconductor substrate is transferred to a pusher indexer 1725. A top ring 1710-2 or 1711-2 holds the semiconductor substrate W on the pusher indexer 1725 by suction, and transfers it to a polishing table 1710-1 or 1711-1 to perform polishing. After polishing, the top ring 1710-2 or 1711-2 transfers the semiconductor substrate W to a film thickness measuring instrument 1710-4 or 1711-4 to measure the film thickness. Then, the top ring 1710-2 or 1711-2 transfers the semiconductor substrate W to the pusher indexer 1725, and places it thereon.

Then, the third robot 1724 picks up the semiconductor substrate W from the pusher indexer 1725, and carries it into the first cleaning machine 1709. The third robot 1724 picks up the cleaned semiconductor substrate W from the first cleaning machine 1709, carries it into the second cleaning machine 1707, and places the cleaned and dried semiconductor substrate on the substrate placing table 1722. Then, the first robot 1703 picks up the semiconductor substrate W, and transfers it to the dry state film thickness measuring instrument 1713 in which the film thickness is measured, and the first robot 1703 carries it into the cassette 1701-1 placed on the unload port of the loading/unloading section 1701.

In the substrate processing apparatus shown in FIG. 76, interconnects are formed by forming a barrier layer, a seed layer and a plated Cu film on a semiconductor substrate W having a via hole or a trench of a circuit pattern formed therein, and polishing them.

The cassette 1701-1 accommodating the semiconductor substrates W before formation of the barrier layer is placed on the load port of the loading/unloading section 1701. The first robot 1703 takes out the semiconductor substrate W from the cassette 1701-1 placed on the load port of the loading/unloading section 1701, and places it on the substrate placing table 1721. Then, the second robot 1723 transports the semiconductor substrate W to the seed layer forming unit 1727 where a barrier layer and a seed layer are formed. The barrier layer and the seed layer are formed by electroless-plating. The second robot 1723 brings the semiconductor substrate W having the barrier layer and the seed layer formed thereon to the before-plating and after-plating film thickness measuring instrument 1712 which measures the film thicknesses of the barrier layer and the seed layer. After measurement of the film thicknesses, the semiconductor substrate W is carried into the copper plating unit 1702 where a plated Cu film is formed.

Figure 77:
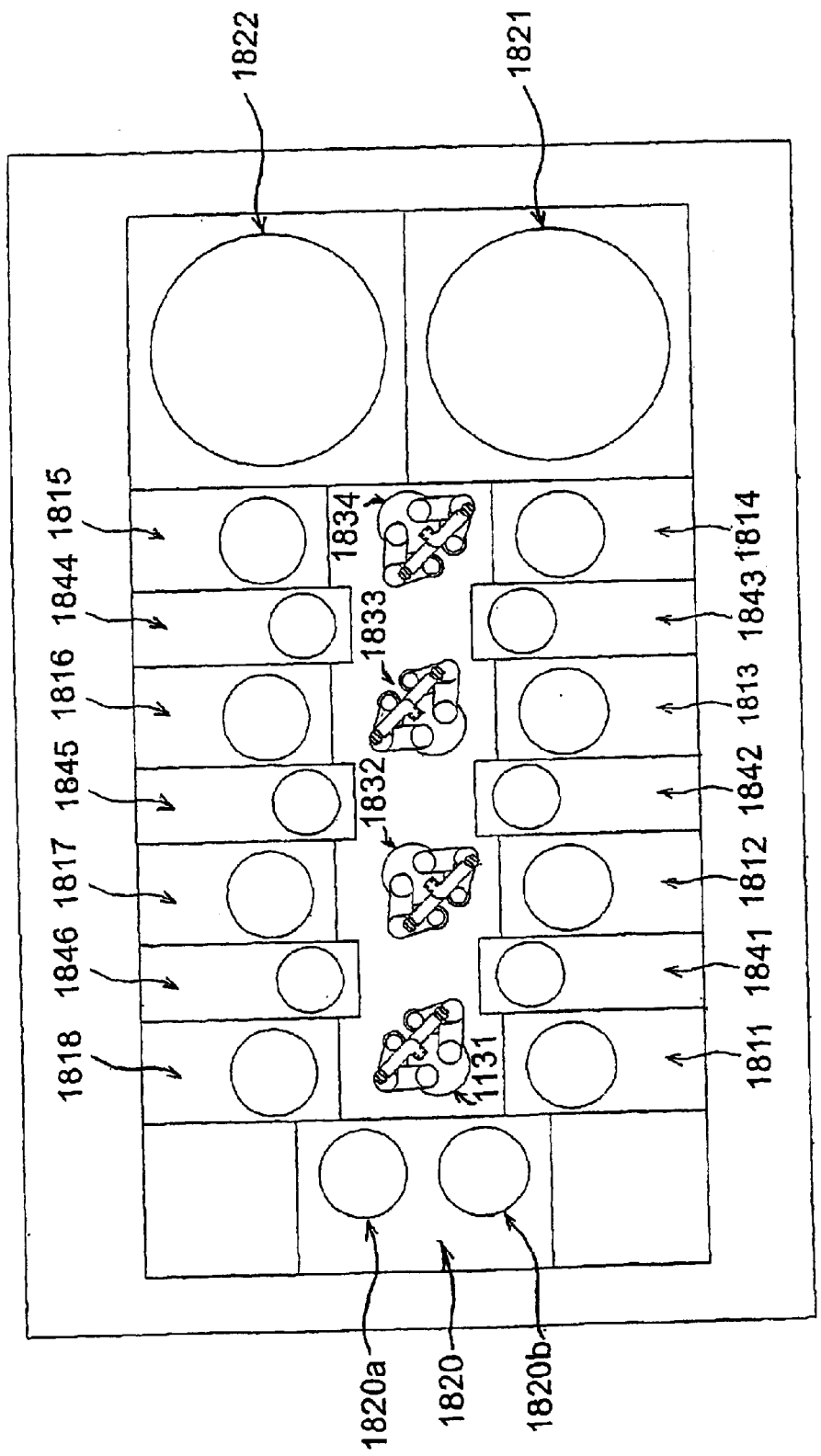
FIG. 77 is a view showing still another plan constitution example of the semiconductor substrate processing apparatus.

FIG. 77 is a view showing plan layout constitution of another example of the substrate processing apparatus. In the substrate processing apparatus, there are provided a barrier layer forming unit 1811, a seed layer forming unit 1812, a plating unit 1813, an annealing unit 1814, a first cleaning unit 1815, a bevel and backside cleaning unit 1816, a cap-plating unit 1817, a second cleaning unit 1818, a first aligner and film thickness measuring instrument 1841, a second aligner and film thickness measuring instrument 1842, a first substrate reversing machine 1843, a second substrate reversing machine 1844, a substrate temporary placing table 1845, a third film thickness measuring instrument 1846, a loading/unloading section 1820, a first polishing apparatus 1821, a second polishing apparatus 1822, a first robot 1831, a second robot 1832, a third robot 1833, and a fourth robot 1834. The film thickness measuring instruments 1841, 1842, and 1846 are units, have the same size as the frontage dimension of other units (plating, cleaning, annealing units, and the like), and are thus interchangeable.

In this example, an electroless Ru plating apparatus can be used as the barrier layer forming unit 1811, an electroless Cu plating apparatus as the seed layer forming unit 1812, and an electroplating apparatus as the plating unit 1813.

Figure 78:
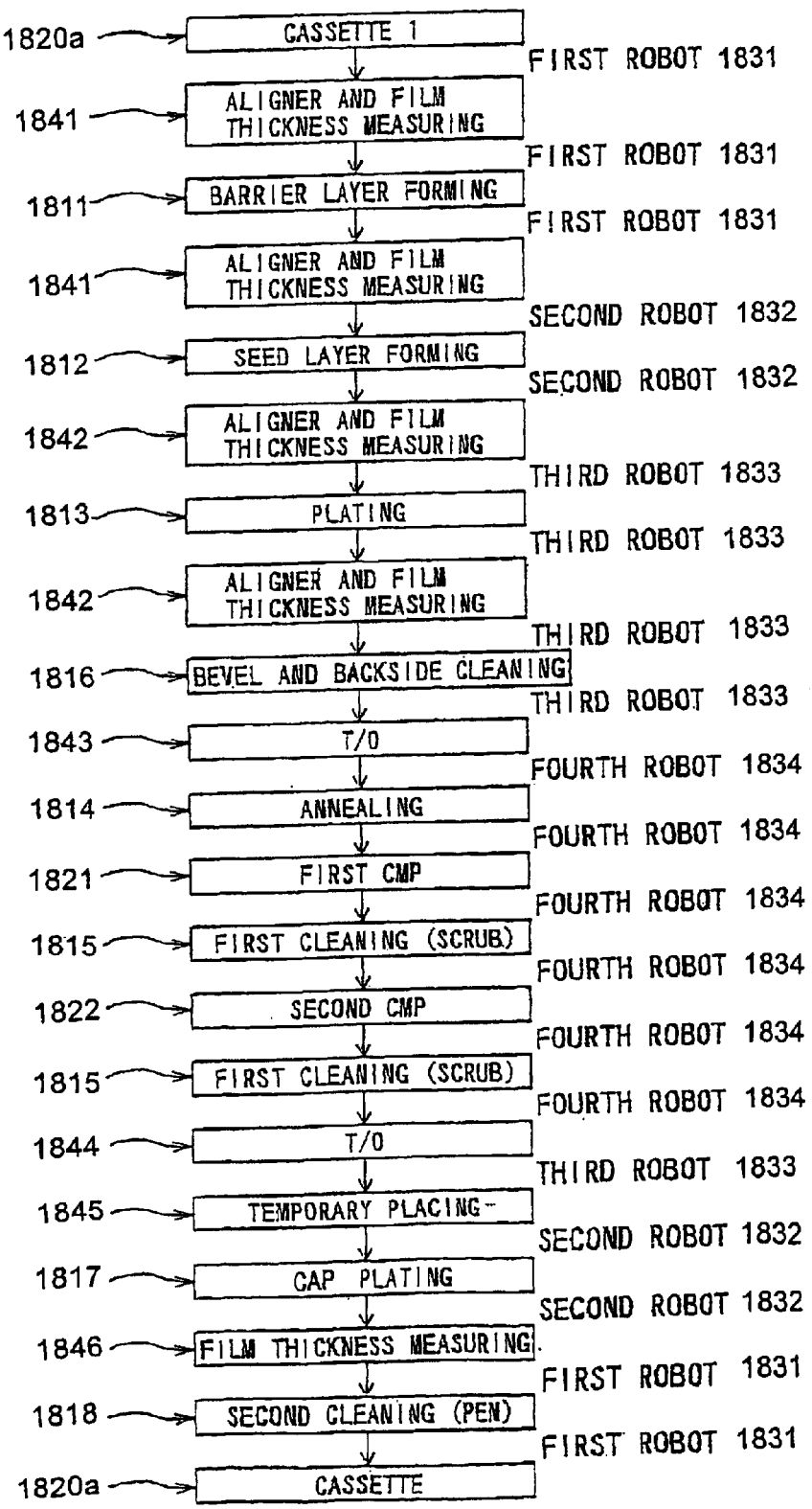
FIG. 78 is a view showing a flow of the respective steps in the semiconductor substrate processing apparatus illustrated in FIG. 77.

FIG. 78 is a flow chart showing the flow of the respective steps in the present substrate processing apparatus. The respective steps in the apparatus will be described according to this flow chart. First, a semiconductor substrate taken out by the first robot 1831 from a cassette 1820a placed on the load and unload unit 1820 is placed in the first aligner and film thickness measuring unit 1841, in such a state that its surface, to be plated, faces upward. In order to set a reference point for a position at which film thickness measurement is made, notch alignment for film thickness measurement is performed, and then film thickness data on the semiconductor substrate before formation of a Cu film are obtained.

Then, the semiconductor substrate is transported to the barrier layer forming unit 1811 by the first robot 1831. The barrier layer forming unit 1811 is such an apparatus for forming a barrier layer on the semiconductor substrate by electroless Ru plating, and the barrier layer forming unit 1811 forms an Ru film as a film for preventing Cu from diffusing into an interlayer insulator film (e.g. $SiO_2$) of a semiconductor device. The semiconductor substrate discharged after cleaning/drying steps is transported by the first robot 1831 to the first aligner and film thickness measuring unit 1841, where the film thickness of the semiconductor substrate, i.e., the film thickness of the barrier layer is measured.

The semiconductor substrate after film thickness measurement is carried into the seed layer forming unit 1812 by the second robot 1832, and a seed layer is formed on the barrier layer by electroless Cu plating. The semiconductor substrate discharged after cleaning/drying steps is transported by the second robot 1832 to the second aligner and film thickness measuring instrument 1842 for determination of a notch position, before the semiconductor substrate is transported to the plating unit 1813, which is an impregnation plating unit, and then notch alignment for Cu plating is performed by the film thickness measuring instrument 1842. If necessary, the film thickness of the semiconductor substrate before formation of a Cu film may be measured again in the film thickness measuring instrument 1842.

The semiconductor substrate which has completed notch alignment is transported by the third robot 1833 to the plating unit 1813 where Cu plating is applied to the semiconductor substrate. The semiconductor substrate discharged after cleaning/drying steps is transported by the third robot 1833 to the bevel and backside cleaning unit 1816 where an unnecessary Cu film (seed layer) at a peripheral portion of the semiconductor substrate is removed. In the bevel and backside cleaning unit 1816, the bevel is etched in a preset time, and Cu adhering to the backside of the semiconductor substrate is cleaned with a chemical liquid such as hydrofluoric acid. At this time, before transporting the semiconductor substrate to the bevel and backside cleaning unit 1816, film thickness measurement of the semiconductor substrate may be made by the second aligner and film thickness measuring instrument 1842 to obtain the thickness value of the Cu film formed by plating, and based on the obtained results, the bevel etching time may be changed arbitrarily to carry out etching. The region etched by bevel etching is a region which corresponds to a peripheral edge portion of the substrate and has no circuit formed therein, or a region which is not utilized finally as a chip although a circuit is formed. A bevel portion is included in this region.

The semiconductor substrate discharged after cleaning/drying steps in the bevel and backside cleaning unit 1816 is transported by the third robot 1833 to the substrate reversing machine 1843. After the semiconductor substrate is turned over by the substrate reversing machine 1843 to cause the plated surface to be directed downward, the semiconductor substrate is introduced into the annealing unit 1814 by the fourth robot 1834 for thereby stabilizing an interconnection portion. Before and/or after annealing treatment, the semiconductor substrate is carried into the second aligner and film thickness measuring unit 1842 where the film thickness of a copper film formed on the semiconductor substrate is measured. Then, the semiconductor substrate is carried by the fourth robot 1834 into the first polishing apparatus 1821 in which the Cu film and the seed layer of the semiconductor substrate are polished.

At this time, desired abrasive grains or the like are used, but fixed abrasive may be used in order to prevent dishing and enhance flatness of the face. After completion of primary polishing, the semiconductor substrate is transported by the fourth robot 1834 to the first cleaning unit 1815 where it is cleaned. This cleaning is scrub-cleaning in which rolls having substantially the same length as the diameter of the semiconductor substrate are placed on the face and the backside of the semiconductor substrate, and the semiconductor substrate and the rolls are rotated, while pure water or deionized water is flowed, thereby performing cleaning of the semiconductor substrate.

After completion of the primary cleaning, the semiconductor substrate is transported by the fourth robot 1834 to the second polishing apparatus 1822 where the barrier layer on the semiconductor substrate is polished. At this time, desired abrasive grains or the like are used, but fixed abrasive may be used in order to prevent dishing and enhance flatness of the face. After completion of secondary polishing, the semiconductor substrate is transported by the fourth robot 1834 again to the first cleaning unit 1815 where scrub-cleaning is performed. After completion of cleaning, the semiconductor substrate is transported by the fourth robot 1834 to the second substrate reversing machine 1844 where the semiconductor substrate is reversed to cause the plated surface to be directed upward, and then the semiconductor substrate is placed on the substrate temporary placing table 1845 by the third robot.

The semiconductor substrate is transported by the second robot 1832 from the substrate temporary placing table 1845 to the cap-plating unit 1817 where cap-plating is applied onto the Cu surface with the aim of preventing oxidation of Cu due to the atmosphere. The semiconductor substrate to which cap-plating has been applied is carried by the second robot 1832 from the cover plating unit 1817 to the third film thickness measuring instrument 146 where the thickness of the copper film is measured. Thereafter, the semiconductor substrate is carried by the first robot 1831 into the second cleaning unit 1818 where it is cleaned with pure water or deionized water. The semiconductor substrate after completion of cleaning is returned into the cassette 1820a placed on the loading/unloading section 1820.

Figure 95A:
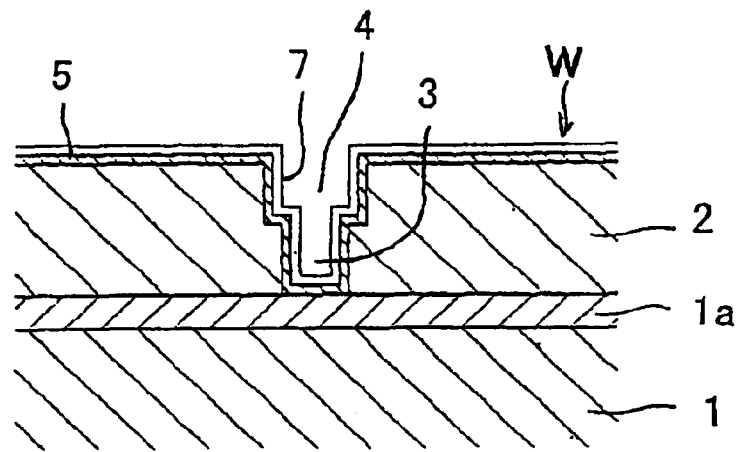
FIGS. 95A through 95C illustrate, in a sequence of process steps, for forming interconnects made of copper by plating a surface of a substrate, thereafter forming a protective layer on the interconnects selectively.
Figure 95B:
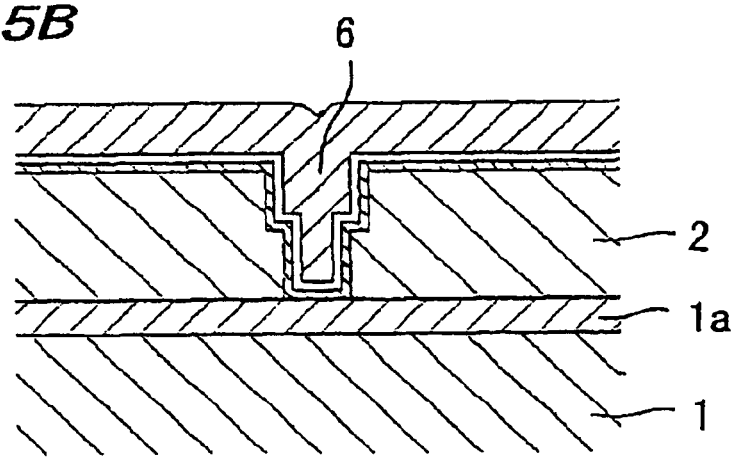
Figure 95C:
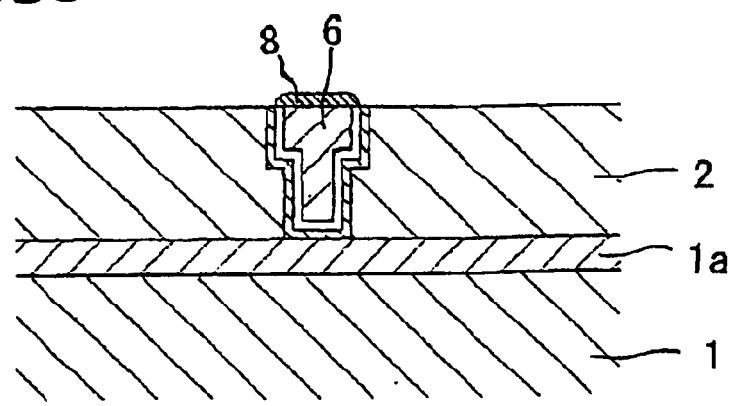

In this manner, shown in FIGS. 95A through 95C, interconnects made of copper is formed, thereafter a protective layer is formed on the interconnects selectively by electroless cap-plating for protecting the interconnects.

Specifically, as shown in FIG. 95A, an insulating film 2 of $SiO_2$ is deposited on a conductive layer 1a of a substrate 1 on which semiconductor devices are formed, a contact hole 3 and a trench 4 for an interconnect are formed by lithography and etching technology, a barrier layer 5 comprising TiN or the like is formed thereon, and a seed layer 7 is further formed thereon.

Then, as shown in FIG. 95B, copper plating is applied onto the surface of the semiconductor substrate W to fill copper into the contact hole 3 and the trench 4 of the semiconductor substrate W and deposit a copper film 6 on the insulating film 2. Thereafter, the copper film 6 on the insulating film 2 is removed by chemical mechanical polishing (CMP) to make the surface of the copper film 6, filled into the contact hole 3 and the trench 4 for an interconnect, flush with the surface of the insulating film 2, as shown in FIG. 95C. An interconnect protective layer 8 is formed on the exposed metal surface.

Figure 94:
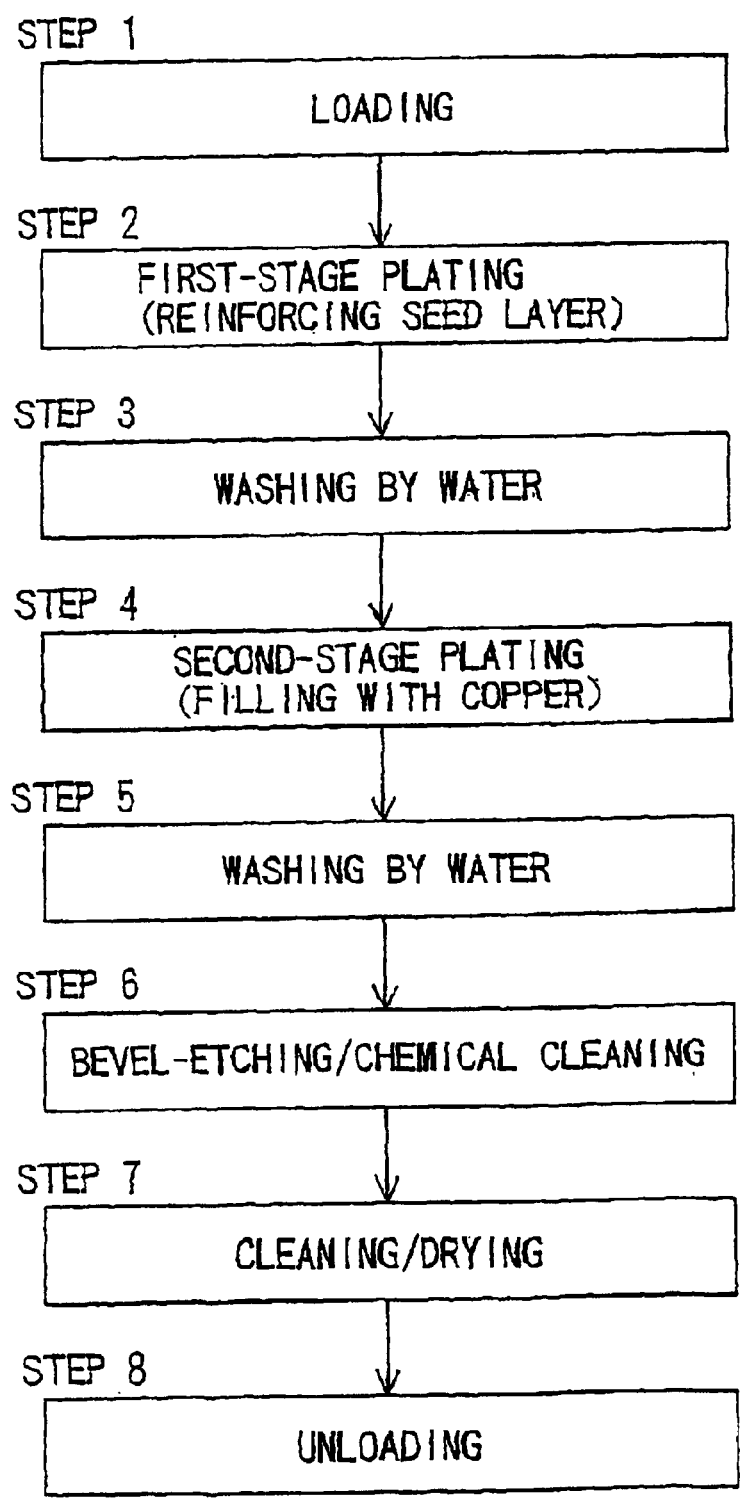
FIG. 94 is a flow diagram showing the flow of reinforcing process steps of a seed layer.

In this case, the seed layer 7 may be reinforced so as to become a complete layer without a thin portion. FIG. 94 is a flow diagram showing the flow of reinforcing process steps.

First, the substrate W having a seed layer 7 (see FIG. 95A) is transported to a pre-plating unit comprising an electroplating unit or an electroless-plating unit for depositing an additional metal on the seed layer 7 (step 1).

Next, the first-stage plating (pre-plating) is carried out in the electroplating unit or the electroless-plating unit, thereby reinforcing and completing the thin portion of the seed layer 7 (step 2).

After the completion of the first-stage plating, the substrate W is, according to necessity, transported to the washing section for washing by water (step 3), and is then transported a plating unit for filling the metal in the trenches.

Next, the second-stage plating is performed onto the surface of the substrate W in the plating unit, thereby effecting filling with copper (step 4). Since the seed layer 7 has been reinforced by the first-stage plating to become a complete layer without a thin portion, electric current flows evenly through the seed layer 7 in the second-stage plating, whereby the filling with copper can be completed without the formation of any voids.

After the completion of the second-stage plating, the substrate W is, according to necessity, transported to the washing section for washing by water (step 5). Thereafter, the substrate W is transported to the bevel-etching/chemical cleaning unit where the substrate W is cleaned by using a chemical liquid, and a thin copper film, etc. formed on the bevel portion of the substrate W is etched away (step 6). The substrate is then transported to the cleaning/drying section for cleaning and drying (step 7). Thereafter, the substrate is returned to the cassette of the loading/unloading section by the first transporting device (step 8).

An electrolytic plating process for plating a semiconductor substrate W shown in FIG. 95A will be described bellow.

A first plating process is performed by immersing the semiconductor substrate W into a first plating liquid, such as a high throwing power copper sulfate plating liquid used for printed circuit boards. This process forms a uniform initial thin plated film over the entire surface of the trenches formed in the surface of the semiconductor substrate W, wherein the surface includes the bottom and side walls of the trenches. Here, the high throwing power copper sulfate solution has a low concentration of copper sulfate, a high concentration of sulfuric acid, and is superior in throwing power and coating uniformity. An example composition of this solution is 5–100 g/l of copper sulfate and 100–250 g/l of sulfuric acid.

Since the plating liquid has a low concentration of copper sulfate and a high concentration of sulfuric acid, the conductivity of the solution is high and the polarization is great, thereby improving throwing power. As a result, plating metal is uniformly deposited on the surface of the semiconductor substrate W, eliminating unplated areas formed on the side and bottom surfaces of the fine trench.

After washing the semiconductor substrate W, a second plating process is performed by immersing the semiconductor substrate W into a second plating liquid, such as a copper sulfate plating liquid for decorative uses. This process fills copper into the trenches and forms a plated film having a flat surface on the surface of the substrate. Here, the copper sulfate plating liquid has a high concentration of copper sulfate and a low concentration of sulfuric acid and is superior in leveling ability. An example composition of the solution is 100–300 g/l of copper sulfate and 10–100 g/l of sulfuric acid.

Here, leveling ability defines a quality describing the degree of smoothness on the plating surface.

The pre-plating unit comprising an electroplating unit or an electroless-plating may be placed in the electroplating apparatus.

The aligner and film thickness measuring instrument 1841 and the aligner and film thickness measuring instrument 1842 perform positioning of the notch portion of the substrate and measurement of the film thickness.

The seed layer forming unit 1812 may be omitted. In this case, a plated film may be formed on a barrier layer directly in a plating unit 1813.

The seed layer forming unit may be comprises an electroplating unit or an electoroless-plating unit. In this case, a seed layer made of copper film, for example, is formed on the barrier layer by electroplating or electoroless-plating, thereafter a plated film may be formed on a barrier layer in a plating unit 1813.

Figure 79:
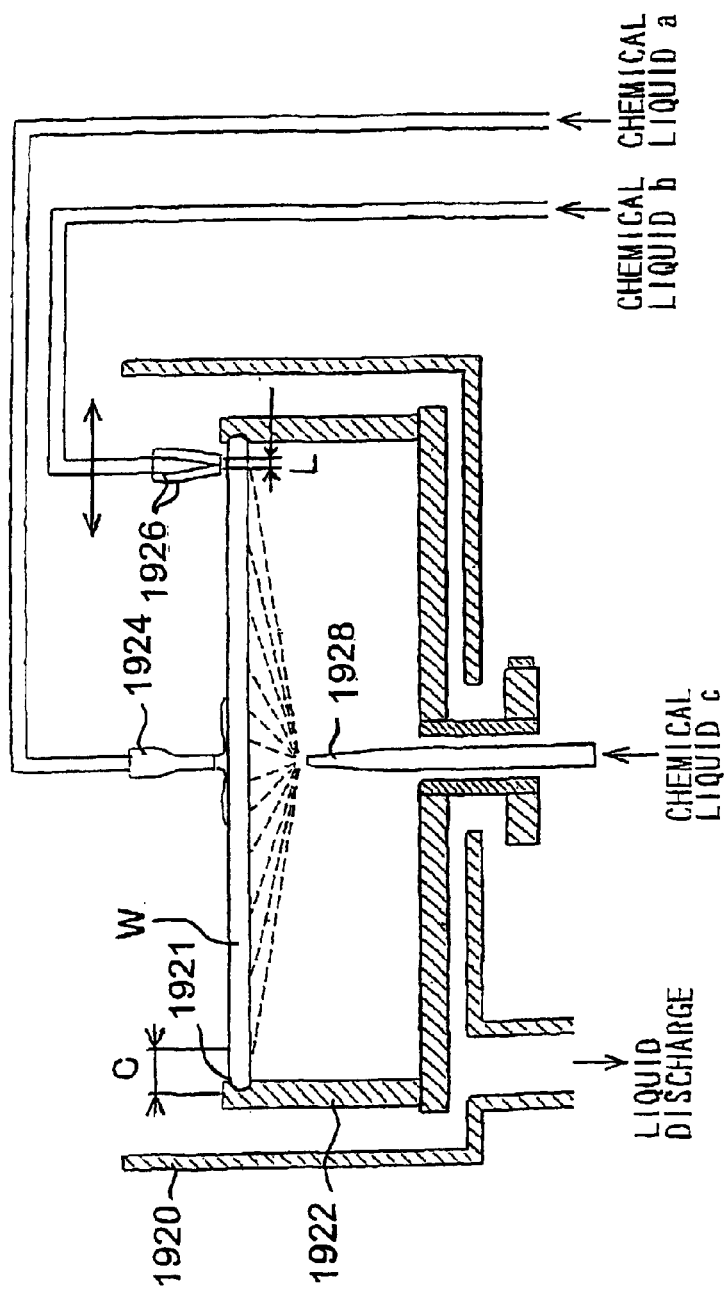
FIG. 79 is a view showing a schematic constitution example of a bevel and backside cleaning unit.

The bevel and backside cleaning unit 1816 can perform an edge (bevel) Cu etching and a backside cleaning at the same time, and can suppress growth of a natural oxide film of copper at the circuit formation portion on the surface of the substrate. FIG. 79 shows a schematic view of the bevel and backside cleaning unit 1816. As shown in FIG. 79, the bevel and backside cleaning unit 1816 has a substrate holding portion 1922 positioned inside a bottomed cylindrical waterproof cover 1920 and adapted to rotate a substrate W at a high speed, in such a state that the face of the substrate W faces upwardly, while holding the substrate W horizontally by spin chucks 1921 at a plurality of locations along a circumferential direction of a peripheral edge portion of the substrate; a center nozzle 1924 placed above a nearly central portion of the face of the substrate W held by the substrate holding portion 1922; and an edge nozzle 1926 placed above the peripheral edge portion of the substrate W. The center nozzle 1924 and the edge nozzle 1926 are directed downward. A back nozzle 1928 is positioned below a nearly central portion of the backside of the substrate W, and directed upward. The edge nozzle 1926 is adapted to be movable in a diametrical direction and a height direction of the substrate W.

The width of movement L of the edge nozzle 1926 is set such that the edge nozzle 1926 can be arbitrarily positioned in a direction toward the center from the outer peripheral end surface of the substrate, and a set value for L is inputted according to the size, usage, or the like of the substrate W. Normally, an edge cut width C is set in the range of 2 mm to 5 mm. In the case where a rotational speed of the substrate is a certain value or higher at which the amount of liquid migration from the backside to the face is not problematic, the copper film within the edge cut width C can be removed.

Next, the method of cleaning with this cleaning apparatus will be described. First, the semiconductor substrate W is horizontally rotated integrally with the substrate holding portion 1922, with the substrate being held horizontally by the spin chucks 1921 of the substrate holding portion 1922. In this state, an acid solution is supplied from the center nozzle 1924 to the central portion of the face of the substrate W. The acid solution may be a non-oxidizing acid, and hydrofluoric acid, hydrochloric acid, sulfuric acid, citric acid, oxalic acid, or the like is used. On the other hand, an oxidizing agent solution is supplied continuously or intermittently from the edge nozzle 1926 to the peripheral edge portion of the substrate W. As the oxidizing agent solution, one of an aqueous solution of ozone, an aqueous solution of hydrogen peroxide, an aqueous solution of nitric acid, and an aqueous solution of sodium hypochlorite is used, or a combination of these is used.

In this manner, the copper film, or the like formed on the upper surface and end surface in the region of the peripheral edge portion C of the semiconductor substrate W is rapidly oxidized with the oxidizing agent solution, and is simultaneously etched with the acid solution supplied from the center nozzle 1924 and spread on the entire face of the substrate, whereby it is dissolved and removed. By mixing the acid solution and the oxidizing agent solution at the peripheral edge portion of the substrate, a steep etching profile can be obtained, in comparison with a mixture of them which is produced in advance being supplied. At this time, the copper etching rate is determined by their concentrations. If a natural oxide film of copper is formed in the circuit-formed portion on the face of the substrate, this natural oxide is immediately removed by the acid solution spreading on the entire face of the substrate according to rotation of the substrate, and does not grow any more. After the supply of the acid solution from the center nozzle 1924 is stopped, the supply of the oxidizing agent solution from the edge nozzle 1926 is stopped. As a result, silicon exposed on the surface is oxidized, and deposition of copper can be suppressed.

On the other hand, an oxidizing agent solution and a silicon oxide film etching agent are supplied simultaneously or alternately from the back nozzle 1928 to the central portion of the backside of the substrate. Therefore, copper or the like adhering in a metal form to the backside of the semiconductor substrate W can be oxidized with the oxidizing agent solution, together with silicon of the substrate, and can be etched and removed with the silicon oxide film etching agent. This oxidizing agent solution is preferably the same as the oxidizing agent solution supplied to the face, because the types of chemicals are decreased in number. Hydrofluoric acid can be used as the silicon oxide film etching agent, and if hydrofluoric acid is used as the acid solution on the face of the substrate, the types of chemicals can be decreased in number. Thus, if the supply of the oxidizing agent is stopped first, a hydrophobic surface is obtained. If the etching agent solution is stopped first, a water-saturated surface (a hydrophilic surface) is obtained, and thus the backside surface can be adjusted to a condition which will satisfy the requirements of a subsequent process.

In this manner, the acid solution, i.e., etching solution is supplied to the substrate to remove metal ions remaining on the surface of the substrate W. Then, pure water is supplied to replace the etching solution with pure water and remove the etching solution, and then the substrate is dried by spin-drying. In this way, removal of the copper film in the edge cut width C at the peripheral edge portion on the face of the semiconductor substrate, and removal of copper contaminants on the backside are performed simultaneously to thus allow this treatment to be completed, for example, within 80 seconds. The etching cut width of the edge can be set arbitrarily (to 2 mm to 5 mm), but the time required for etching does not depend on the cut width.

Annealing treatment performed before the CMP process and after plating has a favorable effect on the subsequent CMP treatment and on the electrical characteristics of interconnection. Observation of the surface of broad interconnection (unit of several micrometers) after the CMP treatment without annealing showed many defects such as microvoids, which resulted in an increase in the electrical resistance of the entire interconnection. Execution of annealing ameliorated the increase in the electrical resistance. In the absence of annealing, thin interconnection showed no voids. Thus, the degree of grain growth is presumed to be involved in these phenomena. That is, the following mechanism can be speculated: Grain growth is difficult to occur in thin interconnection. In broad interconnection, on the other hand, grain growth proceeds in accordance with annealing treatment. During the process of grain growth, ultrafine pores in the plated film, which are too small to be seen by the SEM (scanning electron microscope), gather and move upward, thus forming microvoid-like depressions in the upper part of the interconnection. The annealing conditions in the annealing unit 1814 are such that hydrogen (2% or less) is added in a gas atmosphere, the temperature is in the range of 300° C. to 400° C., and the time is in the range of 1 to 5 minutes. Under these conditions, the above effects were obtained.

Figure 82:
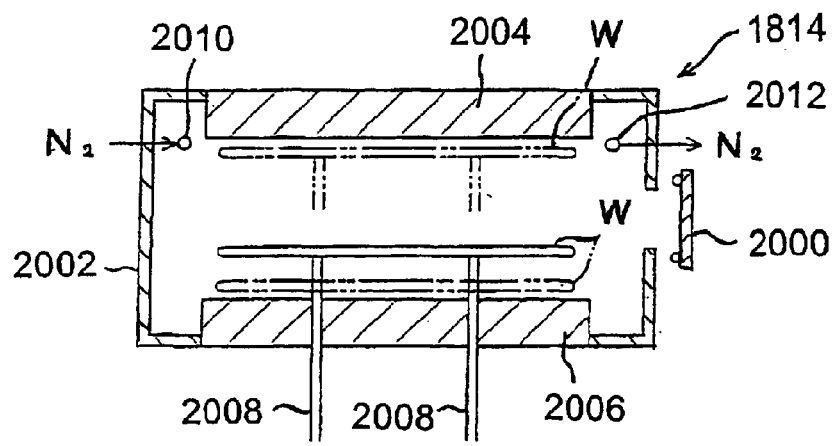
FIG. 82 is a vertical sectional view of an example of an annealing unit.
Figure 83:
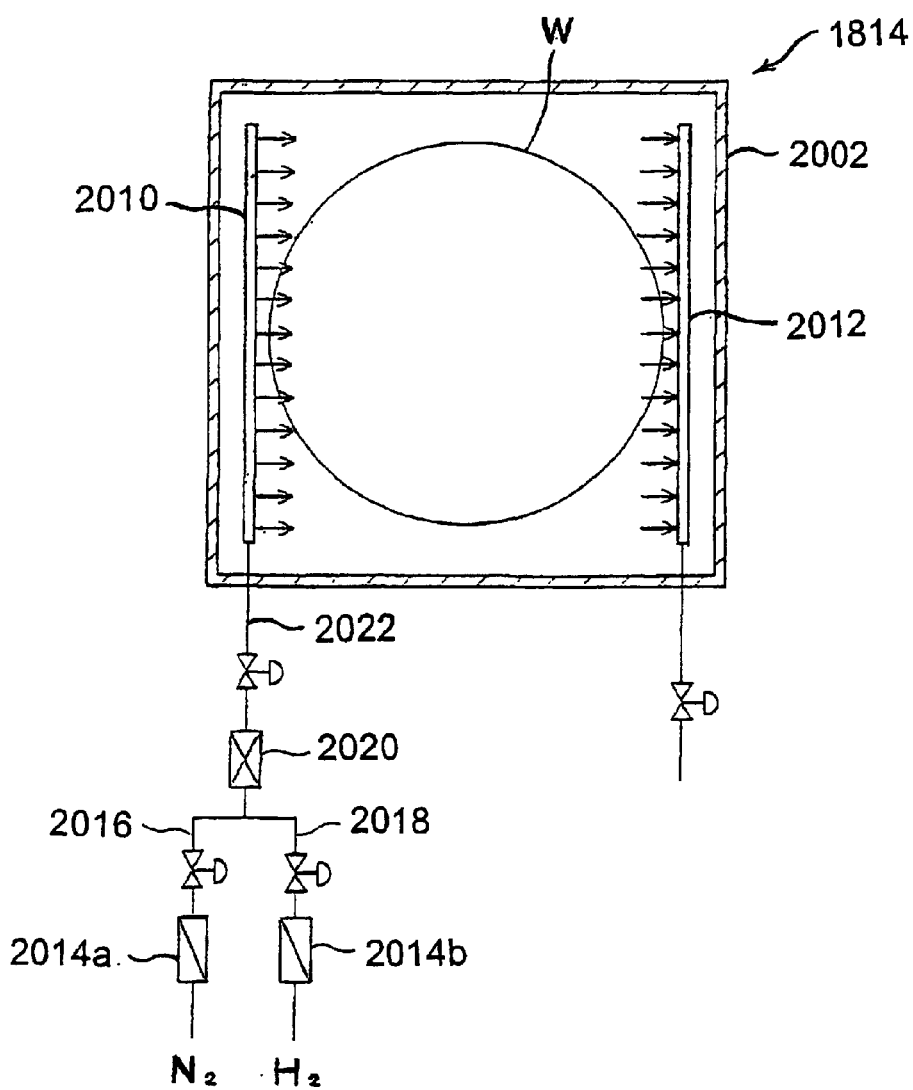
FIG. 83 is a transverse sectional view of the annealing unit.

FIGS. 82 and 83 show the annealing unit 1814. The annealing unit 1814 comprises a chamber 1002 having a gate 1000 for taking in and taking out the semiconductor substrate W, a hot plate 1004 disposed at an upper position in the chamber 1002 for heating the semiconductor substrate W to e.g. 400° C., and a cool plate 1006 disposed at a lower position in the chamber 1002 for cooling the semiconductor substrate W by, for example, flowing a cooling water inside the plate. The annealing unit 1002 also has a plurality of vertically movable elevating pins 1008 penetrating the cool plate 1006 and extending upward and downward therethrough for placing and holding the semiconductor substrate W on them. The annealing unit further includes a gas introduction pipe 1010 for introducing an antioxidant gas between the semiconductor substrate W and the hot plate 1004 during annealing, and a gas discharge pipe 1012 for discharging the gas which has been introduced from the gas introduction pipe 1010 and flowed between the semiconductor substrate W and the hot plate 1004. The pipes 1010 and 1012 are disposed on the opposite sides of the hot plate 1004.

The gas introduction pipe 1010 is connected to a mixed gas introduction line 1022 which in turn is connected to a mixer 1020 where a $N_2$ gas introduced through a $N_2$ gas introduction line 1016 containing a filter 1014$a$, and a $H_2$ gas introduced through a $H_2$ gas introduction line 1018 containing a filter 1014$b$, are mixed to form a mixed gas which flows through the line 1022 into the gas introduction pipe 1010.

In operation, the semiconductor substrate W, which has been carried in the chamber 1002 through the gate 1000, is held on the elevating pins 1008 and the elevating pins 1008 are raised up to a position at which the distance between the semiconductor substrate W held on the lifting pins 1008 and the hot plate 1004 becomes e.g. 0.1–1.0 mm. In this state, the semiconductor substrate W is then heated to e.g. 400° C. through the hot plate 1004 and, at the same time, the antioxidant gas is introduced from the gas introduction pipe 1010 and the gas is allowed to flow between the semiconductor substrate W and the hot plate 1004 while the gas is discharged from the gas discharge pipe 1012, thereby annealing the semiconductor substrate W while preventing its oxidation. The annealing treatment may be completed in about several tens of seconds to 60 seconds. The heating temperature of the substrate may be selected in the range of 100–600° C.

After the completion of the annealing, the elevating pins 1008 are lowered down to a position at which the distance between the semiconductor substrate W held on the elevating pins 1008 and the cool plate 1006 becomes e.g. 0–0.5 mm. In this state, by introducing a cooling water into the cool plate 1006, the semiconductor substrate W is cooled by the cool plate to a temperature of 100° C. or lower in e.g. 10–60 seconds. The cooled semiconductor substrate is sent to the next step.

A mixed gas of $N_2$ gas with several % of $H_2$ gas is used as the above antioxidant gas. However, $N_2$ gas may be used singly.

The annealing unit may be placed in the electroplating apparatus.

Figure 80:
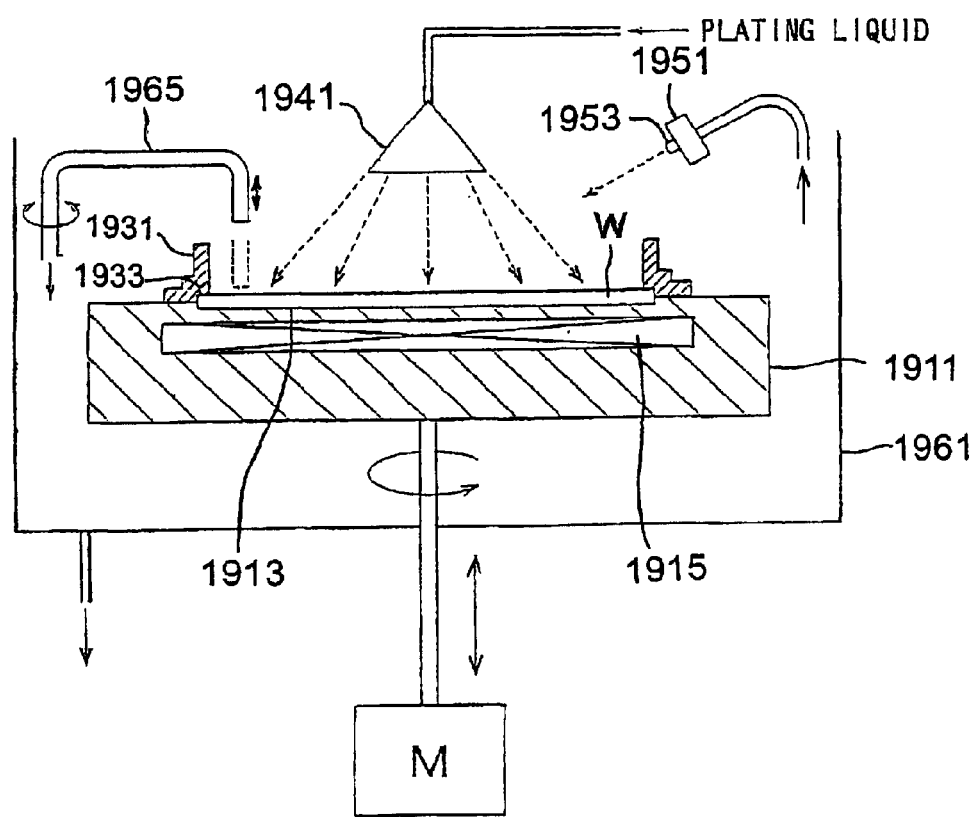
FIG. 80 is a view showing a schematic constitution of an example of an electroless-plating apparatus.

FIG. 80 is a schematic constitution drawing of the electroless-plating apparatus. As shown in FIG. 80, this electroless-plating apparatus comprises holding means 1911 for holding a semiconductor substrate W to be plated on its upper surface, a dam member 1931 for contacting a peripheral edge portion of a surface to be plated (upper surface) of the semiconductor substrate W held by the holding means 1911 to seal the peripheral edge portion, and a shower head 1941 for supplying a plating liquid to the surface, to be plated, of the semiconductor substrate W having the peripheral edge portion sealed with the dam member 1931. The electroless-plating apparatus further comprises cleaning liquid supply means 1951 disposed near an upper outer periphery of the holding means 1911 for supplying a cleaning liquid to the surface, to be plated, of the semiconductor substrate W, a recovery vessel 1961 for recovering a cleaning liquid or the like (plating waste liquid) discharged, a plating liquid recovery nozzle 1965 for sucking in and recovering the plating liquid held on the semiconductor substrate W, and a motor M for rotationally driving the holding means 1911. The respective members will be described below.

The holding means 1911 has a substrate placing portion 1913 on its upper surface for placing and holding the semiconductor substrate W. The substrate placing portion 1913 is adapted to place and fix the semiconductor substrate W. Specifically, the substrate placing portion 1913 has a vacuum attracting mechanism (not shown) for attracting the semiconductor substrate W to a backside thereof by vacuum suction. A backside heater 1915, which is planar and heats the surface, to be plated, of the semiconductor substrate W from underside to keep it warm, is installed on the backside of the substrate placing portion 1913. The backside heater 1915 is composed of, for example, a rubber heater. This holding means 1911 is adapted to be rotated by the motor M and is movable vertically by raising and lowering means (not shown).

The dam member 1931 is tubular, has a seal portion 1933 provided in a lower portion thereof for sealing the outer peripheral edge of the semiconductor substrate W, and is installed so as not to move vertically from the illustrated position.

The shower head 1941 is of a structure having many nozzles provided at the front end for scattering the supplied plating liquid in a shower form and supplying it substantially uniformly to the surface, to be plated, of the semiconductor substrate W. The cleaning liquid supply means 1951 has a structure for ejecting a cleaning liquid from a nozzle 1953.

The plating liquid recovery nozzle 1965 is adapted to be movable upward and downward and swingable, and the front end of the plating liquid recovery nozzle 1965 is adapted to be lowered inwardly of the dam member 1931 located on the upper surface peripheral edge portion of the semiconductor substrate W and to suck in the plating liquid on the semiconductor substrate W.

Next, the operation of the electroless-plating apparatus will be described. First, the holding means 1911 is lowered from the illustrated state to provide a gap of a predetermined dimension between the holding means 1911 and the dam member 1931, and the semiconductor substrate W is placed on and fixed to the substrate placing portion 1913. An 8 inch wafer, for example, is used as the semiconductor substrate W.

Then, the holding means 1911 is raised to bring its upper surface into contact with the lower surface of the dam member 1931 as illustrated, and the outer periphery of the semiconductor substrate W is sealed with the seal portion 1933 of the dam member 1931. At this time, the surface of the semiconductor substrate W is in an open state.

Then, the semiconductor substrate W itself is directly heated by the backside heater 1915 to render the temperature of the semiconductor substrate W, for example, 70° C. (maintained until termination of plating). Then, the plating liquid heated, for example, to 50° C. is ejected from the shower head 1941 to pour the plating liquid over substantially the entire surface of the semiconductor substrate W. Since the surface of the semiconductor substrate W is surrounded by the dame member 1931, the poured plating liquid is all held on the surface of the semiconductor substrate W. The amount of the supplied plating liquid may be a small amount which will become a 1 mm thickness (about 30 ml) on the surface of the semiconductor substrate W. The depth of the plating liquid held on the surface to be plated may be 10 mm or less, and may be even 1 mm as in this embodiment. If a small amount of the supplied plating liquid is sufficient, the heating apparatus for heating the plating liquid may be of a small size. In this example, the temperature of the semiconductor substrate W is raised to 70° C., and the temperature of the plating liquid is raised to 50° C. by heating. Thus, the surface, to be plated, of the semiconductor substrate W becomes, for example, 60° C., and hence a temperature optimal for a plating reaction in this example can be achieved.

The semiconductor substrate W is instantaneously rotated by the motor M to perform uniform liquid wetting of the surface to be plated, and then plating of the surface to be plated is performed in such a state that the semiconductor substrate W is in a stationary state. Specifically, the semiconductor substrate W is rotated at 100 rpm or less for only 1 second to uniformly wet the surface, to be plated, of the semiconductor substrate W with the plating liquid. Then, the semiconductor substrate W is kept stationary, and electroless-plating is performed for 1 minute. The instantaneous rotating time is 10 seconds or less at the longest.

After completion of the plating treatment, the front end of the plating liquid recovery nozzle 1965 is lowered to an area near the inside of the dam member 1931 on the peripheral edge portion of the semiconductor substrate W to suck in the plating liquid. At this time, if the semiconductor substrate W is rotated at a rotational speed of, for example, 100 rpm or less, the plating liquid remaining on the semiconductor substrate W can be gathered in the portion of the dam member 1931 on the peripheral edge portion of the semiconductor substrate W under centrifugal force, so that recovery of the plating liquid can be performed with a good efficiency and a high recovery rate. The holding means 1911 is lowered to separate the semiconductor substrate W from the dam member 1931. The semiconductor substrate W is started to be rotated, and the cleaning liquid (ultrapure water) is jetted at the plated surface of the semiconductor substrate W from the nozzle 1953 of the cleaning liquid supply means 1951 to cool the plated surface, and simultaneously perform dilution and cleaning, thereby stopping the electroless-plating reaction. At this time, the cleaning liquid jetted from the nozzle 1953 may be supplied to the dam member 1931 to perform cleaning of the dam member 1931 at the same time. The plating waste liquid at this time is recovered into the recovery vessel 1961 and discarded.

Then, the semiconductor substrate W is rotated at a high speed by the motor M for spin-drying, and then the semiconductor substrate W is removed from the holding means 1911.

Figure 81:
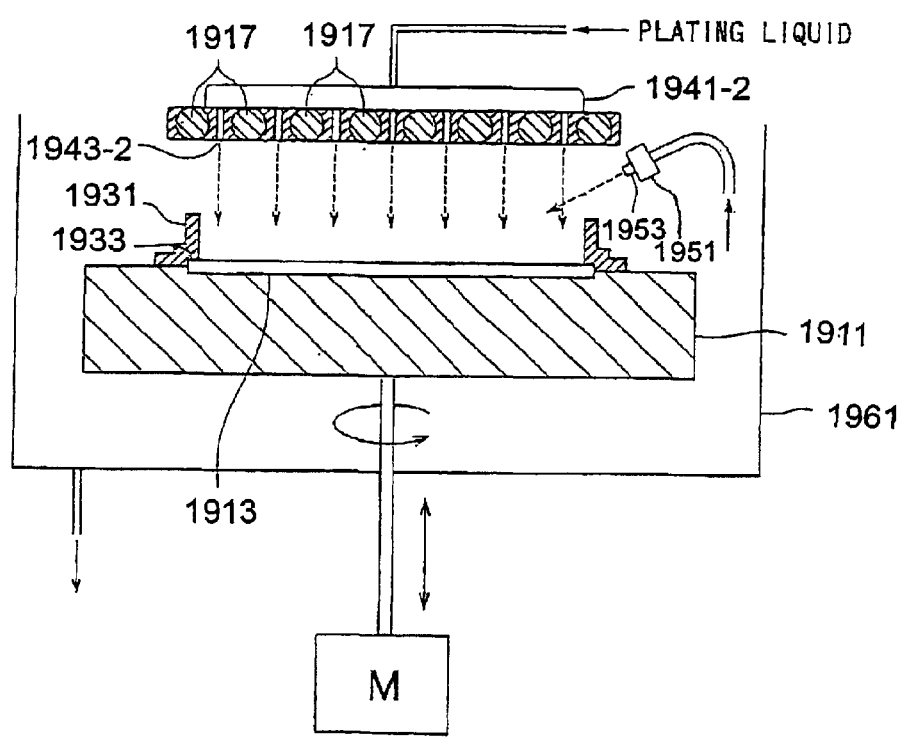
FIG. 81 is a view showing a schematic constitution of another example of an electroless-plating apparatus.

FIG. 81 is a schematic constitution drawing of another electroless-plating. The electroless-plating apparatus of FIG. 81 is different from the electroless-plating apparatus of FIG. 80 in that instead of providing the backside heater 1915 in the holding means 1911, lamp heaters 1917 are disposed above the holding means 1911, and the lamp heaters 1917 and a shower head 1941-2 are integrated. For example, a plurality of ring-shaped lamp heaters 1917 having different radii are provided concentrically, and many nozzles 1943-2 of the shower head 1941-2 are open in a ring form from the gaps between the lamp heaters 1917. The lamp heaters 1917 may be composed of a single spiral lamp heater, or may be composed of other lamp heaters of various structures and arrangements.

Even with this constitution, the plating liquid can be supplied from each nozzle 1943-2 to the surface, to be plated, of the semiconductor substrate W substantially uniformly in a shower form. Further, heating and heat retention of the semiconductor substrate W can be performed by the lamp heaters 1917 directly uniformly. The lamp heaters 1917 heat not only the semiconductor substrate W and the plating liquid, but also ambient air, thus exhibiting a heat retention effect on the semiconductor substrate W.

Direct heating of the semiconductor substrate W by the lamp heaters 1917 requires the lamp heaters 1917 with a relatively large electric power consumption. In place of such lamp heaters 1917, lamp heaters 1917 with a relatively small electric power consumption and the backside heater 1915 shown in FIG. 79 may be used in combination to heat the semiconductor substrate W mainly with the backside heater 1915 and to perform heat retention of the plating liquid and ambient air mainly by the lamp heaters 1917. In the same manner as in the aforementioned embodiment, means for directly or indirectly cooling the semiconductor substrate W may be provided to perform temperature control.

The cap-plating described above is preferably performed by electroless-plating process, but may be performed by electroplating process.

Although certain preferred embodiments of the present invention have been shown and described in detail, it should be understood that various changes and modifications may be made therein without departing from the scope of the appended claims.

Industrial Applicability

This invention is suitable to a substrate processing method, and more particularly, to those used to fill fine recesses formed on the surface of a semiconductor substrate with copper, thereby forming a copper interconnection pattern.

What is claimed is:

1. A method of filling a metal in fine trenches in a surface of a substrate, comprising:

forming a barrier layer on the substrate, and a seed layer on the barrier layer;

providing an electroplating apparatus having a first substrate holder for holding the substrate, a plating bath containing a plating liquid, an anode, and a virtual anode to adjust electromagnetic field;

providing a polishing apparatus having a second substrate holder for holding the substrate to press the substrate against a polishing surface at different pressures at a central portion and a peripheral portion of the substrate;

transferring the substrate with the barrier layer and the seed layer to the electroplating apparatus;

holding the substrate in the first substrate holder and placing the substrate in the plating liquid;

generating electromagnetic field;

filling a first metal in the trenches and forming a plated film of the first metal on an entire surface of the substrate by electroplating, wherein the electromagnetic field is adjusted by the virtual anode so that differences of thickness of the plated film between the central portion and the peripheral portion of the substrate being minimized;

removing the substrate from the plating bath;

washing and drying the substrate in the electroplating apparatus;

transferring the substrate to the polishing apparatus;

holding the substrate in the second substrate holder;

polishing and removing the plated film by pressing the substrate to the polishing surface, wherein the pressures pressing the substrate to the polishing surface at a central portion and a peripheral portion are adjusted;

washing and drying the substrate in the polishing apparatus; and transferring the substrate from the polishing apparatus.

2. The method of claim 1, further comprising the step of annealing the electroplated substrate.

3. The method of claim 2, wherein the step of annealing being performed in an annealing unit placed in the electroplating apparatus.

4. The method of claim 1, further comprising the step of cap-plating a second metal to form a protective plated layer on the plated film of the polished substrate after polishing.

5. The method of claim 4, wherein the step of cap-plating being performed in an electroless-plating apparatus.

6. The method of claim 5, wherein the electroless-plating apparatus is placed in the polishing apparatus.

7. The method of claim 4, further comprising the step of annealing the cap-plated substrate after cap-plating.

8. The method of claim 1, further comprising the step of measuring the thickness of the plated film on the substrate prior to the polishing.

9. The method of claim 8, wherein the pressures to press the substrate against the polishing surface at the polishing apparatus being adjusted based on output of the measuring step.

10. The method of claim 1, wherein the thickness of the plated film on the substrate is equal to or less than 2.0 micron meter.

11. The method of claim 10, wherein the thickness of the plated film on the substrate is equal to or less than 1.0 micron meter.

12. The method of claim 1, further comprising:

loading the substrate into a substrate transport box after forming the barrier layer on the substrate and the seed layer on the barrier layer; and transporting the substrate to the electroplating apparatus;

wherein the substrate being held in the substrate transport box within an atmosphere wherein at least one of particle contaminant, chemical contaminant, oxygen, and humidity being reduced compared to the outside of the substrate transport box.

13. The method of claim 1, further comprising;

loading the substrate into a substrate transport box prior to transferring the substrate from the polishing apparatus; and transporting the substrate from the polishing apparatus;

wherein the substrate being held in the substrate transport box within an atmosphere wherein at least one of particle contaminant, chemical contaminant, oxygen, and humidity being reduced compared to the outside of the substrate transport box.

14. The method of claim 1, wherein the pressures pressing the substrate are adjusted so that there is no barrier layer remained on the surface of the substrate except in the trenches.

15. The method of claim 1, further comprising;

reinforcing the seed layer by depositing an additional metal by an electroplating unit or an electroless-plating unit prior to the step of filling the first metal in the trenches.

16. The method of claim 15, wherein the electroplating unit or the electroless-plating unit is placed in the electroplating apparatus.

17. The method of claim 1, wherein the first metal comprises copper.

18. A method of filling a metal in trenches in a surface of a substrate, comprising;

providing an electroplating apparatus;

providing a polishing apparatus having a substrate holder for holding the substrate to press the substrate against a polishing surface at different pressures at a central portion and a peripheral portion of the substrate;

forming a barrier layer on the substrate;

transferring the substrate with the barrier layer to the electroplating apparatus;

holding the substrate in a first plating liquid in the electroplating apparatus;

electroplating a first layer on the entire surface of the barrier layer using the first plating liquid;

holding the substrate in a second plating liquid in the electroplating apparatus;

filling a metal in the trenches covered by the first layer and forming a second plating layer of the metal on the surface of the substrate using the second plating liquid;

washing and drying the substrate in the electroplating apparatus;

transferring the substrate to the polishing apparatus;

holding the substrate in the substrate holder;

polishing the second plating layer by pressing the substrate to the polishing surface, wherein the pressures pressing the substrate to the polishing surface at a central portion and a peripheral portion are adjusted;

washing and drying the substrate in the polishing apparatus; and transferring the substrate from the polishing apparatus.

19. The method of claim 18, further comprising the step of annealing the electroplated substrate.

20. The method of claim 19, wherein the step of annealing being performed in an annealing unit placed in the electroplating apparatus.

21. The method of claim 18, further comprising the step of cap-plating a second metal to form a protective plated layer on the plated film of the polished substrate after polishing.

22. The method of claim 21, wherein the step of cap-plating being performed in an electroless-plating apparatus.

23. The method of claim 22, wherein the electroless-plating apparatus is placed in the polishing apparatus.

24. The method of claim 21, further comprising the step of annealing the cap-plated substrate after cap-plating.

25. The method of claim 18, further comprising the step of measuring the thickness of the plated film on the substrate prior to the polishing.

26. The method of claim 25, wherein the pressures to press the substrate against the polishing surface at the polishing apparatus being adjusted based on output of the measuring step.

27. The method of claim 18, wherein the thickness of the plated film on the substrate is equal to or less than 2 micron meter.

28. The method of claim 27, wherein the thickness of the plated film on the substrate is equal to or less than 1 micron meter.

29. The method of claim 18, further comprising:

loading the substrate into a substrate transport box after forming the barrier layer on the substrate; and transporting the substrate to the electroplating apparatus;

wherein the substrate being held in the substrate transport box within an atmosphere wherein at least one of particle contaminant, chemical contaminant, oxygen, and humidity being reduced compared to the outside of the substrate transport box.

30. The method of claim 18, further comprising;

loading the substrate into a substrate transport box prior to transferring the substrate from the polishing apparatus; and transporting the substrate from the polishing apparatus;

wherein the substrate being held in the substrate transport box within an atmosphere wherein at least one of particle contaminant, chemical contaminant, oxygen, and humidity being reduced compared to the outside of the substrate transport box.

31. The method of claim 18, wherein the pressures pressing the substrate are adjusted so that there is no barrier layer remained on the surface of the substrate except in the trenches.

32. The method of claim 18, further comprising;

reinforcing the seed layer by depositing an additional metal in an electroplating unit or an electroless-plating unit prior to the step of filling the first metal in the trenches.

33. The method of claim 32, wherein the electroplating unit or the electroless-plating unit in the electroplating apparatus.

34. The method of claim 18, wherein the metal comprises copper.

35. A method of filling a metal in trenches in a surface of a substrate, comprising:

forming a barrier layer on the substrate, and a seed layer on the barrier layer;

providing an electroplating apparatus having a first substrate holder for holding the substrate, a plating bath containing a plating liquid, and an anode;

providing a polishing apparatus having a second substrate holder for holding the substrate to press the substrate against a polishing surface;

transferring the substrate with the barrier layer and the seed layer to the electroplating apparatus;

reinforcing the seed layer by depositing an additional metal in an electroplating unit or an electroless-plating unit;

holding the substrate in the first substrate holder and placing the substrate in the plating liquid;

generating electromagnetic field;

filling a first metal in the trenches and forming a plated film of the first metal on an entire surface of the substrate by electroplating;

removing the substrate from the plating bath;

washing and drying the substrate in the electroplating apparatus;

transferring the substrate to the polishing apparatus;

holding the substrate in the second substrate holder;

polishing and removing the plated film by pressing the substrate to the polishing surface;

cap-plating a second metal to form a protective plated layer on the plated film of the polished substrate after polishing; and washing and drying the substrate.

36. The method of claim 35, further comprising the step of annealing the electroplated substrate.

37. The method of claim 35, further comprising the step of annealing the cap-plated substrate after cap-plating.

38. The method of claim 35, wherein the first metal comprises a copper.

39. A method of filling a metal in trenches in a surface of a substrate, comprising;

providing a plating apparatus;

providing a polishing apparatus having a substrate holder for holding the substrate to press the substrate against a polishing surface at different pressures at a central portion and a peripheral portion of the substrate;

forming a barrier layer on the substrate;

transferring the substrate with the barrier layer to the plating apparatus;

holding the substrate in a first plating liquid in the plating apparatus;

electroless-plating a first layer on the entire surface of the barrier layer using the first plating liquid in the electroplating apparatus;

holding the substrate in a second plating liquid in the plating apparatus;

generating electromagnetic field between the substrate and an anode;

filling a metal in the trenches covered by the first layer and forming a second plating layer of the metal on the surface of the substrate using the second plating liquid;

washing and drying the substrate in the plating apparatus;

transferring the substrate to the polishing apparatus;

holding the substrate in the substrate holder;

polishing the second plating layer by pressing the substrate to the polishing surface, wherein the pressures pressing the substrate to the polishing surface at a central portion and a peripheral portion are adjusted;

washing and drying the substrate in the polishing apparatus; and transferring the substrate from the polishing apparatus.

* * * * *